(12) United States Patent
Itou et al.

(10) Patent No.: US 10,191,369 B2
(45) Date of Patent: Jan. 29, 2019

(54) COLORED COMPOSITION, CURED FILM, COLOR FILTER, COLOR-FILTER MANUFACTURING METHOD, SOLID-STATE IMAGING ELEMENT, IMAGE DISPLAY DEVICE, POLYMER, AND XANTHENE DYE

(71) Applicant: FUJIFILM Corporation, Tokyo (JP)

(72) Inventors: Junichi Itou, Shizuoka (JP); Akihiro Hara, Shizuoka (JP); Kazuya Oota, Shizuoka (JP); Yushi Kaneko, Shizuoka (JP); Daisuke Sasaki, Shizuoka (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/014,756

(22) Filed: Feb. 3, 2016

(65) Prior Publication Data
US 2016/0154303 A1 Jun. 2, 2016
Related U.S. Application Data

(63) Continuation of application No. PCT/JP2014/072213, filed on Aug. 26, 2014.

(30) Foreign Application Priority Data

Sep. 6, 2013 (JP) .................................. 2013-185377
Aug. 15, 2014 (JP) .................................. 2014-165546

(51) Int. Cl.
*G03F 7/00* (2006.01)
*C09B 11/24* (2006.01)
(Continued)

(52) U.S. Cl.
CPC ............ *G03F 7/0007* (2013.01); *C08F 12/14* (2013.01); *C09B 11/24* (2013.01); *C09B 11/28* (2013.01);
(Continued)

(58) Field of Classification Search
CPC .......... G03F 7/0007; G03F 7/028; G03F 7/20; G03F 7/32; C09B 69/109; C09B 11/24; G02B 1/12; G02B 5/223
(Continued)

(56) References Cited

U.S. PATENT DOCUMENTS 5,446,134 A * 8/1995 Armand ................ C07C 317/04
534/558
5,623,001 A 4/1997 Figov
(Continued)

FOREIGN PATENT DOCUMENTS

EP 0 779 540 A1 6/1997
JP 6-503842 A 4/1994
(Continued)

OTHER PUBLICATIONS

Communication dated Aug. 10, 2016 from the European Patent Office in counterpart Application No. 14842160.5.
(Continued)

*Primary Examiner* — Bijan Ahvazi
(74) *Attorney, Agent, or Firm* — Sughrue Mion, PLLC

(57) ABSTRACT

A colored composition of the present invention includes a dye compound having an anionic moiety including at least one of a structure represented by the following General Formula (A1), a structure represented by the following General Formula (A2), and a structure containing a boron atom, and a dye structure having a cationic moiety, in which the anionic moiety and the cationic moiety are bonded to each other via a covalent bond and present in the same molecule; a curable compound; and a solvent.

General Formula (A1)

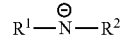

(in General Formula (A1), $R^1$ and $R^2$ each independently represent $-SO_2-$ or $-CO-$)
(Continued)

(P-29) ¹H-NMR

General Formula (A2)

$$R^3 - \overset{\ominus}{\underset{R^5}{C}} - R^4$$

(in General Formula (A2), $R^4$ represents —$SO_2$— or —CO—; and $R^4$ and $R^5$ each independently represent —$SO_2$—, —CO—, or —CN).

19 Claims, 2 Drawing Sheets

(51) Int. Cl.
| | |
|---|---|
| G02B 5/22 | (2006.01) |
| G03F 7/20 | (2006.01) |
| G03F 7/32 | (2006.01) |
| G02B 1/12 | (2006.01) |
| C08F 12/14 | (2006.01) |
| C09B 11/28 | (2006.01) |
| C09B 23/01 | (2006.01) |
| C09B 23/04 | (2006.01) |
| C09B 23/06 | (2006.01) |
| C09B 23/08 | (2006.01) |
| C09B 67/22 | (2006.01) |
| C09B 69/06 | (2006.01) |
| C09B 69/10 | (2006.01) |
| G03F 7/028 | (2006.01) |
| C09B 57/00 | (2006.01) |
| C09B 57/10 | (2006.01) |
| C09B 69/00 | (2006.01) |
| G03F 7/027 | (2006.01) |
| G03F 7/105 | (2006.01) |
| C09B 21/00 | (2006.01) |

(52) U.S. Cl.
CPC .......... *C09B 21/00* (2013.01); *C09B 23/0008* (2013.01); *C09B 23/0066* (2013.01); *C09B 23/04* (2013.01); *C09B 23/06* (2013.01); *C09B 23/08* (2013.01); *C09B 57/00* (2013.01); *C09B 57/007* (2013.01); *C09B 57/008* (2013.01); *C09B 57/10* (2013.01); *C09B 67/0033* (2013.01); *C09B 69/008* (2013.01); *C09B 69/06* (2013.01); *C09B 69/103* (2013.01); *C09B 69/105* (2013.01); *C09B 69/109* (2013.01); *G02B 1/12* (2013.01); *G02B 5/223* (2013.01); *G03F 7/027* (2013.01); *G03F 7/028* (2013.01); *G03F 7/105* (2013.01); *G03F 7/20* (2013.01); *G03F 7/32* (2013.01)

(58) Field of Classification Search
USPC .................. 216/12; 252/586; 430/7, 281.1; 526/243; 549/227
See application file for complete search history.

(56) References Cited

U.S. PATENT DOCUMENTS

| | | | |
|---|---|---|---|
| 5,741,632 A | 4/1998 | Kiekens | |
| 6,509,125 B1 | 1/2003 | Ito et al. | |
| 7,622,521 B2 | 11/2009 | Seto | |
| 7,901,851 B2 | 3/2011 | Mizukawa et al. | |
| 8,197,994 B2 | 6/2012 | Mizukawa et al. | |
| 8,367,282 B2 | 2/2013 | Mizukawa et al. | |
| 8,778,235 B2 | 7/2014 | Ito et al. | |
| 8,779,159 B2 | 7/2014 | Mizukawa et al. | |
| 2004/0129178 A1 | 7/2004 | Jung et al. | |
| 2005/0221120 A1 | 10/2005 | Owczarczyk et al. | |
| 2006/0163208 A1 | 7/2006 | Park et al. | |
| 2006/0199951 A1 | 9/2006 | Wang | |
| 2007/0112134 A1 | 5/2007 | Seto | |
| 2007/0117031 A1 | 5/2007 | Mizukawa et al. | |
| 2008/0076044 A1 | 3/2008 | Mizukawa et al. | |
| 2009/0098490 A1* | 4/2009 | Pham | G03F 7/0392 430/327 |
| 2009/0240329 A1 | 9/2009 | Gousse | |
| 2010/0230647 A1 | 9/2010 | Mizukawa et al. | |
| 2012/0138877 A1 | 6/2012 | Mizukawa et al. | |
| 2012/0187351 A1 | 7/2012 | Ito et al. | |
| 2012/0202145 A1 | 8/2012 | Arayama et al. | |
| 2012/0235099 A1 | 9/2012 | Ushijima et al. | |
| 2012/0238752 A1 | 9/2012 | Mizukawa et al. | |
| 2014/0349101 A1 | 11/2014 | Kaneko et al. | |
| 2016/0154303 A1 | 6/2016 | Itou et al. | |
| 2016/0327859 A1 | 11/2016 | Idei et al. | |

FOREIGN PATENT DOCUMENTS

| | | | | |
|---|---|---|---|---|
| JP | 9-179236 A | 7/1997 | | |
| JP | 2000-162429 A | 6/2000 | | |
| JP | 2000-212207 A | 8/2000 | | |
| JP | 2000-355660 A | 12/2000 | | |
| JP | 2002-40591 A | 2/2002 | | |
| JP | 2003-342494 A | 12/2003 | | |
| JP | 2004-115812 A | 4/2004 | | |
| JP | 2004-269565 A | 9/2004 | | |
| JP | 2005-002328 A | 1/2005 | | |
| JP | 2007-138051 A | 6/2007 | | |
| JP | 2007-139906 A | 6/2007 | | |
| JP | 2008-292970 A | 12/2008 | | |
| JP | 2008-297524 A | 12/2008 | | |
| JP | 2009-510209 A | 3/2009 | | |
| JP | 2010-18788 A | 1/2010 | | |
| JP | 2010-54808 A | 3/2010 | | |
| JP | 2011-95732 A | 5/2011 | | |
| JP | 2012-032754 | * 2/2012 | ............ G03F 7/884 | |
| JP | 2012-32754 A | 2/2012 | | |
| JP | 2012-046712 | * 3/2012 | | |
| JP | 2012-046712 A | 3/2012 | | |
| JP | 2012-46712 A | 3/2012 | | |
| JP | 2012-107192 A | 6/2012 | | |
| JP | 2012-108469 A | 6/2012 | | |
| JP | 2013-029760 A | 2/2013 | | |
| JP | 2013-87248 A | 5/2013 | | |
| JP | 2013-195854 A | 9/2013 | | |
| JP | 2015-071743 A | 4/2015 | | |
| SG | 178428 A1 | * 3/2012 | ............ G02B 5/20 | |
| WO | 2011/158748 A1 | 12/2011 | | |
| WO | 2013/011687 A1 | 1/2013 | | |
| WO | 2015/033814 A1 | 3/2015 | | |

OTHER PUBLICATIONS

Communication dated Aug. 2, 2016 from the Japanese Patent Office in counterpart Application No. 2014-165546.
International Search Report for PCT/JP2014/072213 dated Nov. 25, 2014 [PCT/ISA/210].
Written Opinion for PCT/JP2014/072213 dated Nov. 25, 2014 [PCT/ISA/237].
International Preliminary Report on Patentability, dated Mar. 8, 2016, is International Application No. PCT/JP2014/072213, 8 pages in English.
Communication dated Jan. 16, 2017 issued by the State Intellectual Property Office of People's Republic of China in counterpart application No. 201480038627.4.
Communication dated Feb. 28, 2017 issued by the Japanese Patent Office in counterpart application No. 2014-165546.
Communication dated May 23, 2016, from the State Intellectual Property Office of People's Republic of China in counterpart Application No. 201480038627.4.
International Search Report of PCT/JP2015/052168 dated Apr. 21, 2015.

(56) References Cited

OTHER PUBLICATIONS

Written Opinion of PCT/JP2015/052168 dated Apr. 21, 2015.
International Preliminary Report on Patentability dated Aug. 11, 2016, from the International Bureau in counterpart International Application No. PCT/JP2015/052168.
Office Action dated Apr. 18, 2017, issued from the Japan Patent Office in related Japanese Patent Application No. 2014-017699.
Bojinov, et al., *Novel polymerizable light emitting dyes—combination of a hindered amine with a 9-phenylxanthene fluorophore. Synthesis and photophysical investigations*, Dyes and Pigments, ScienceDirect, vol. 74, 2007, pp. 187-194, 8 pages total.
Office Action dated Jul. 4, 2017 from the Japanese Patent Office in counterpart Japanese Application No. 2014-017699.
Communication dated Jun. 8, 2017 from the State Intellectual Property Office of the P.R.C. in counterpart Application No. 201480038627.4.
Communication dated Jun. 27, 2017 from the Japanese Patent Office in counterpart Application No. 2014-017699.
Office Action dated Jan. 2, 2018 from the State Intellectual Property Office of the P.R.C. in counterpart Chinese Application No. 201610864555.X.
Office Action dated Nov. 28, 2017, issue by the Korean Intellectual Property Office in counterpart Korean Application No. 10-2016-7002478.
Office Action dated Oct. 24, 2017, from Taiwanese Intellectual Property Office in counterpart Taiwanese Application No. 103130325.
Office Action dated Mar. 15, 2018 from the Korean Intellectual Property Office in Korean Application No. 10-2016-7020021.
Office Action dated Apr. 11, 2018, from Korean Intellectual Property Office in counterpart Korean Application No. 10-2016-7002478.
Office Action dated Feb. 14, 2018 from the U.S. Patent and Trademark Office in copending U.S. Appl. No. 15/212,800.
English Machine Translation of Japanese Publication No. 2012-32754 A.
English Machine Translation of Japanese Publication No. 2004-269565 A.
English Machine Translation of Japanese Publication No. 2003-342494 A.
Notice of Allowance dated Sep. 5, 2018 from the United States Patent and Trademark Office in U.S. Appl. No. 15/212,800.
Office Action dated Sep. 25, 2018 from the Taiwanese Patent Office in Taiwanese application No. 104100132.

* cited by examiner

COLORED COMPOSITION, CURED FILM, COLOR FILTER, COLOR-FILTER MANUFACTURING METHOD, SOLID-STATE IMAGING ELEMENT, IMAGE DISPLAY DEVICE, POLYMER, AND XANTHENE DYE

CROSS-REFERENCE TO RELATED APPLICATIONS

This application is a Continuation of PCT International Application No. PCT/JP2014/072213 filed on Aug. 26, 2014, which claims priority under 35 U.S.C § 119 (a) to Japanese Patent Application No. 2013-185377 filed on Sep. 6, 2013 and Japanese Patent Application No. 2014-165546 filed on Aug. 15, 2014. Each of the above application(s) is hereby expressly incorporated by reference, in its entirety, into the present application.

BACKGROUND OF THE INVENTION

1. Field of the Invention

The present invention relates to a colored composition and a cured film using the same. The present invention further relates to a color filter having a cured film, a method for manufacturing a color filter, and a solid-state imaging element and an image display device, each of which has the color filter. In addition, the present invention relates to a polymer and a xanthene dye.

2. Description of the Related Art

As one of the methods for manufacturing a color filter which is used for a liquid crystal display device, a solid-state imaging element, or the like, there is a pigment dispersion method. As the pigment dispersion method, there is a method for manufacturing a color filter by photolithography using a coloring photosensitive composition which is obtained by dispersing pigments in various photosensitive compositions. That is, a colored photosensitive composition is applied onto a substrate by using a spin coater, a roll coater, or the like, the colored photosensitive composition is dried to form a coating film, and the coating film is pattern-wise exposed and developed, thereby obtaining colored pixels. This operation is repeated for the number of the desired hues to manufacture a color filter.

The color filter obtained by the above method is stable with respect to light or heat due to a use of pigments, and positional accuracy of the colored pixels is sufficiently secured since patterning is performed by photolithography. Accordingly, the method has been widely used as a method suitable for manufacturing a color filter for color display or the like.

However, it is common to use a colored composition including a dye or a pigment for the manufacture of a color filter. For example, JP1994-503842A (JP-H06-503842A) discloses a bis(perfluorosulfonyl)methane derivative. JP2012-107192A, JP2012-108469A, WO2013/011687A, and WO2011/158748A each disclose a composition including a compound having a counter salt type xanthene structure as a colorant.

SUMMARY OF THE INVENTION

The present inventors have conducted investigations and as a result, it was found that when a color filter is formed using the compound described in JP2012-107192A, JP2012-108469A, WO2013/011687A, or WO2011/158748A, the color filter tends to have deterioration in heat resistance.

The present invention has been made to solve the above-described problem, and accordingly, has an object to provide a colored composition which is capable of providing a color filter having excellent heat resistance, and another object to provide a polymer and a xanthene dye.

After the present inventors have conducted extensive investigations, it could be seen that the compound described in JP2012-107192A, JP2012-108469A, WO2013/011687A, or WO2011/158748A is formed of a dye compound having a weakly nucleophilic anion as a counter anion, and therefore, it has deterioration in heat resistance. That is, it was found that for a dye compound having a weakly nucleophilic anion as a counter anion, the counter anion is salt-exchanged with another anion, which causes deterioration in heat resistance. In addition, the present inventors have found out that by adopting a compound having a predetermined weakly nucleophilic anionic moiety and a predetermined cationic moiety in the same molecule as a dye compound, the above-described problems can be solved.

Specifically, the problems were solved by the following means <1>, and preferably by <2> to <21>.

<1> A colored composition including:
a dye compound having
a dye structure having a cationic moiety and
an anionic moiety including at least one of a structure represented by the following General Formula (A1), a structure represented by the following General Formula (A2), and a structure containing a boron atom
in which the anionic moiety and the cationic moiety are bonded to each other via a covalent bond and present in the same molecule;
a curable compound; and
a solvent.
General Formula

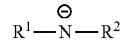

General Formula (A1)

(in General Formula (A1), $R^1$ and $R^2$ each independently represent $—SO_2—$ or $—CO—$;

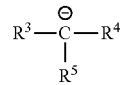

General Formula (A2)

(in General Formula (A2), $R^3$ represents $—SO_2—$ or $—CO—$; and $R^4$ and $R^5$ each independently represent $—SO_2—$, $—CO—$, or $—CN$)

<2> The colored composition as described in <1>, in which the dye structure having a cationic moiety has a dye structure selected from a xanthene dye, a cyanine dye, a squarylium dye, and a dipyrromethene dye.

<3> The colored composition as described in <1>, in which the dye structure having a cationic moiety is a xanthene structure.

<4> The colored composition as described in any one of <1> to <3>, having a structure in which at least any one of a fluorine atom, an aliphatic hydrocarbon group containing a fluorine atom, an aromatic hydrocarbon group containing a fluorine atom, an aromatic hydrocarbon group containing a nitro group, and an aromatic hydrocarbon group containing a cyano group is bonded to at least one of $R^1$ to $R^5$ in the structure represented by General Formula (A1) or General Formula (A2) via a covalent bond.

<5> The colored composition as described in any one of <1> to <4>, in which the anionic moiety has a structure represented by the following General Formula (A3-1) or (A3-2).

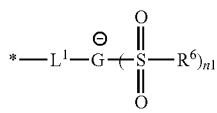

General Formula (A3-1)

(in General Formula (A3-1), $L^1$ represents —$SO_2$— or —CO—; G represents a carbon atom or a nitrogen atom; n1 represents 2 in the case where G is a carbon atom and represents 1 in the case where G is a nitrogen atom; $R^6$ represents an alkyl group containing a fluorine atom, an aryl group containing a fluorine atom, an aryl group containing a nitro group, or an aryl group containing a cyano group; in the case where n1 is 2, two $R^6$'s may be the same as or different from each other; and * represents a site bonding to another site)

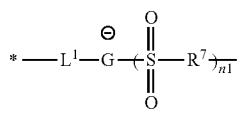

General Formula (A3-2)

(in General formula (A3-2), $L^1$ represents —$SO_2$— or —CO—; G represents a carbon atom or a nitrogen atom; n1 represents 2 in the case where G is a carbon atom and represents 1 in the case where G is a nitrogen atom; $R^7$ represents an alkylene group containing a fluorine atom, an arylene group containing a fluorine atom, an arylene group containing a nitro group, or an arylene group containing a cyano group; * represents a site bonding to another site; and in the case where n1 is 2, two $R^7$'s may be the same as or different from each other)

<6> The colored composition as described in any one of <1> to <5>, in which the dye compound is a dye multimer having two or more dye structures having a cationic moiety in the molecule.

<7> The colored composition as described in <6>, in which the dye compound is a polymer having a repeating unit represented by General Formula (A4-1) and/or General Formula (A4-3).

General Formula (A4-1)

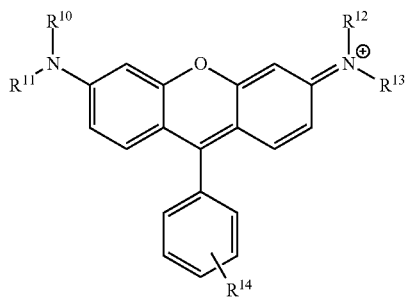

(in General Formula (A4-1), one of $R^{10}$ to $R^{14}$ is a repeating unit represented by the following General Formula (A4-1-2), at least one of $R^{10}$ to $R^{14}$ is a group represented by the following General Formula (A4-1-1), and the remainders of $R^{10}$ to $R^{14}$ each independently represent a hydrogen atom, an aliphatic hydrocarbon group, or an aromatic hydrocarbon group)

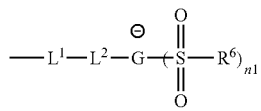

General Formula (A4-1-1)

(in General Formula (A4-1-1), $L^1$ represents a single bond or a divalent linking group; $L^2$ represents —$SO_2$— or —CO—; G represents a carbon atom or a nitrogen atom n1 represents 2 in the case where G is a carbon atom and represents 1 in the case where G is a nitrogen atom; $R^6$ represents an alkyl group containing a fluorine atom or an aryl group containing a fluorine atom; and in the case where n1 is 2, two $R^6$'s may be the same as or different from each other)

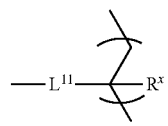

General Formula (A4-1-2)

(in General Formula (A4-1-2), $L^{11}$ represents a single bond or a divalent linking group; and $R^X$ represents a hydrogen atom, a methyl group, a hydroxymethyl group, or an alkoxymethyl group)

General Formula (A4-3)

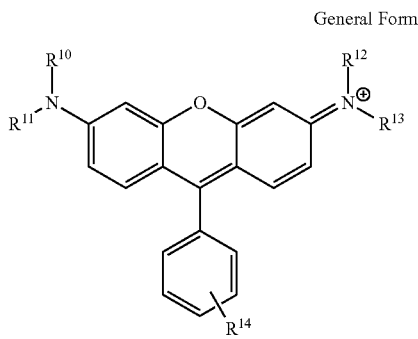

(in General Formula (A4-3), four of $R^{10}$ to $R^{14}$ each independently represent a hydrogen atom, an aliphatic hydrocarbon group, or an aromatic hydrocarbon group, and one of $R^{10}$ to $R^{14}$ is a repeating unit represented by the following General Formula (A4-3-1)) General Formula (A4-3-1)

General Formula (A4-3-1)

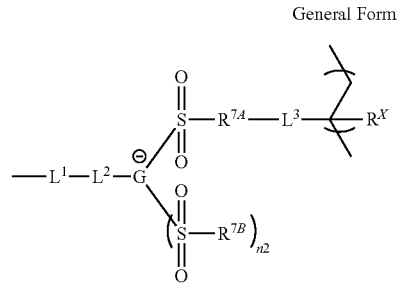

(in General Formula (A4-3-1), $L^1$ represents a single bond or a divalent linking group; $L^2$ represents —$SO_2$— or —CO—; $L^3$ represents a divalent linking group; G represents a carbon atom or a nitrogen atom; in the case where G is a carbon atom, n2 represents 1, and in the case where G represents a nitrogen atom, n2 represents 0; $R^{7A}$ and $R^{7B}$ each independently represent an alkylene group containing a fluorine atom or an arylene group containing a fluorine atom; and $R^X$ represents a hydrogen atom, a methyl group, a hydroxymethyl group, or an alkoxymethyl group)

<8> The colored composition as described in <7>, in which the dye compound is a polymer having the repeating unit represented by General Formula (A4-3).

<9> The colored composition as described in any one of <1> to <8>, in which the dye compound has a polymerizable group.

<10> The colored composition as described in any one of <1> to <8>, in which the dye compound has an alkali-soluble group.

<11> The colored composition as described in any one of <1> to <10>, further including a photopolymerization initiator.

<12> The colored composition as described in any one of <1> to <11>, further including a pigment having a phthalocyanine skeleton.

<13> The colored composition as described in any one of <1> to <12>, used for formation of a colored layer of a color filter.

<14> A cured film obtained by curing the colored composition as described in any one of <1> to <12>.

<15> A color filter including the cured film as described in <14>.

<16> A method for manufacturing a color filter, including a step of applying the colored composition as described in any one of <1> to <13> onto a support to form a colored composition layer, a step of patternwise exposing the colored composition layer, and a step of developing an unexposed area of the exposed colored composition layer.

<17> A method for manufacturing a color filter, including:

a step of applying the colored composition as described in any one of <1> to <13> onto a support to form a colored composition layer and curing the colored composition layer to form a colored layer, a step of forming a photoresist layer on the colored layer, a step of patterning the photoresist layer by exposure and development to obtain a resist pattern, and a step of dry-etching the colored layer using the resist pattern as an etching mask.

<18> A solid-state imaging element including the color filter as described in <15> or a color filter manufactured by the method for manufacturing a color filter as described in <16> or <17>.

<19> An image display device including the color filter as described in <15> or a color filter manufactured by the method for manufacturing a color filter as described in <16> or <17>.

<20> A polymer having a repeating unit represented by General Formula (A4-1) and/or General Formula (A4-3).

General Formula (A4-1)

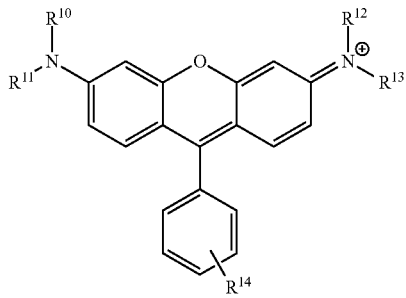

(in General Formula (A4-1), one of $R^{10}$ to $R^{14}$ is a repeating unit represented by the following General Formula (A4-1-2), at least one of $R^{10}$ to $R^{14}$ is a group represented by the following General Formula (A4-1-1), and the remainders of $R^{10}$ to $R^{14}$ each independently represent a hydrogen atom, an aliphatic hydrocarbon group, or an aromatic hydrocarbon group)

General Formula (A4-1-1)

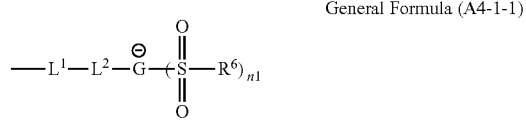

(in General Formula (A4-1-1). $L^1$ represents a single bond or a divalent linking group; $L^2$ represents —$SO_2$— or —CO—; G represents a carbon atom or a nitrogen atom; and n1 represents 2 in the case where G is a carbon atom and represents 1 in the case where G is a nitrogen atom $R^6$ represents an alkyl group containing a fluorine atom or an aryl group containing a fluorine atom; and in the case where n1 is 2, two $R^6$'s may be the same as or different from each other)

General Formula (A4-1-2)

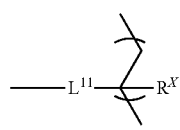

(in General Formula (A4-1-2), $L^{11}$ represents a single bond or a divalent linking group; and $R^X$ represents a hydrogen atom a methyl group, a hydroxymethyl group, or an alkoxymethyl group)

General Formula (A4-3)

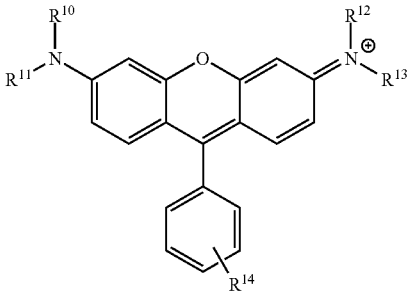

(in General Formula (A4-3), four of $R^{10}$ to $R^{14}$ each independently represent a hydrogen atom, an aliphatic hydrocarbon group, or an aromatic hydrocarbon group, and one of $R^{10}$ to $R^{14}$ is a repeating unit represented by the following General Formula (A4-3-1))

General Formula (A4-3-1)

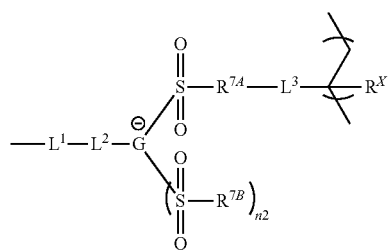

(in General Formula (A4-3-1). $L^1$ represents a single bond or a divalent linking group; $L^2$ represents —$SO_2$— or —CO—; $L^3$ represents a divalent linking group; G represents a carbon atom or a nitrogen atom; in the case where G is a carbon atom, n2 represents 1, and in the case where G represents a nitrogen atom, n2 represents 0; $R^{7A}$ and $R^{7B}$ each independently represent an alkylene group containing a fluorine atom or an arylene group containing a fluorine atom; and $R^X$ represents a hydrogen atom, a methyl group, a hydroxymethyl group, or an alkoxymethyl group)

<21> A xanthene dye represented by General Formula (A5).

General Formula (A5)

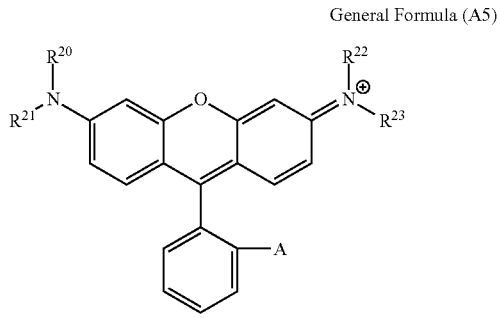

(in General Formula (A5), $R^{20}$ to $R^{23}$ each independently represent a hydrogen atom, an aliphatic hydrocarbon group, or an aromatic hydrocarbon group; and A represents an anionic moiety represented by any one of the following General Formula (AN-1) to (AN-4))

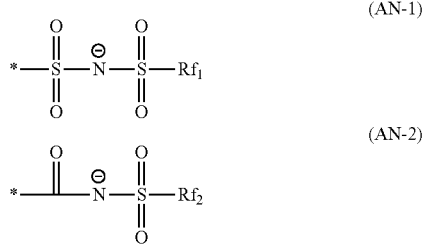

(AN-3)

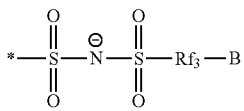

(AN-4)

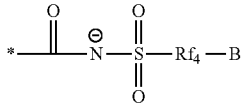

(in General Formula (AN-1). * represents a bonding site to a xanthene structure; and $Rf_1$ represents an aliphatic hydrocarbon group, a halogenated aliphatic hydrocarbon group, an aromatic hydrocarbon group, or a halogenated aromatic hydrocarbon group;

in General Formula (AN-2). * represents a bonding site to a xanthene structure; and $Rf_2$ represents a halogenated aliphatic hydrocarbon group:

in General Formula (AN-3), * represents a bonding site to a xanthene structure; $Rf_3$ represents an aliphatic hydrocarbon group, a halogenated aliphatic hydrocarbon group, an aromatic hydrocarbon group, or a halogenated aromatic hydrocarbon group; and B represents a substituent; and in General Formula (AN-4). * represents a bonding site to a xanthene structure; $Rf_4$ represents a halogenated aliphatic hydrocarbon group; and B represents a substituent)

According to the present invention, it became possible to provide a colored composition having excellent heat resistance.

BRIEF DESCRIPTION OF DRAWINGS

FIG. 1 is a view showing the $^1$H-NMR spectrum of a xanthene dye compound (P-25).

DESCRIPTION OF THE PREFERRED EMBODIMENTS

Figure 1:
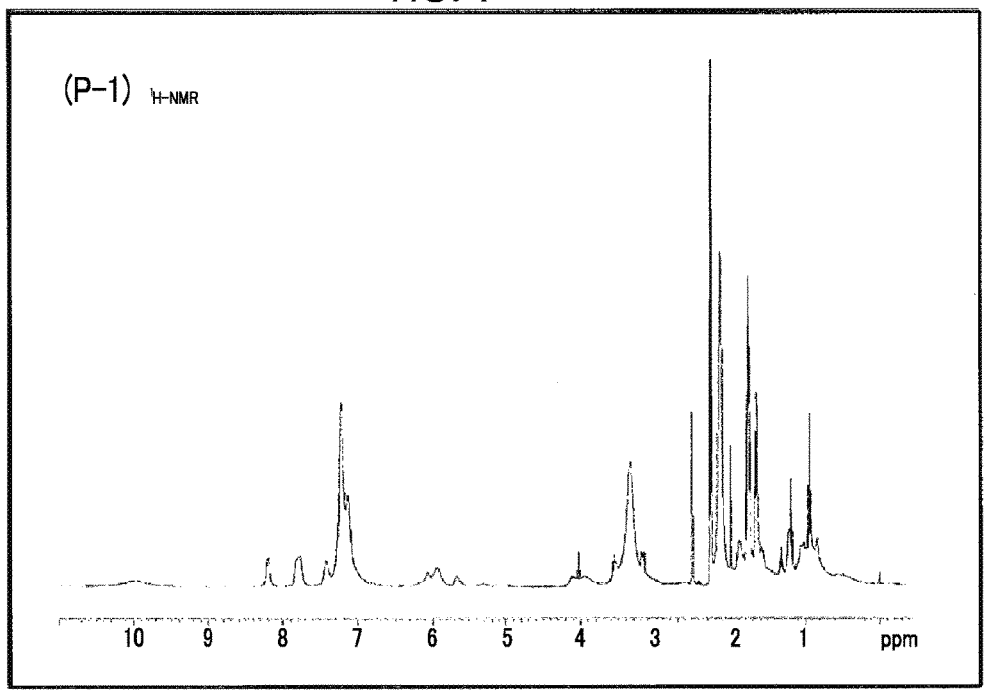
FIG. 1 is a view showing the H-NMR spectrum of a xanthene dye compound (P-1).

Hereinafter, the contents of the present invention will be described in detail. Further, in the present specification, "(a value) to (a value)" is used to mean a range including the numeral values described before and after are included as a lower limit value and an upper limit value, respectively. Further, the organic EL element in the present invention refers to an organic electroluminescence element.

In the specification, the total solid content refers to a total mass of the components of the entire composition of a colored composition excluding a solvent.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

Furthermore, in the present specification, "(meth)acrylate" represents either or both of an acrylate and a methacrylate. "(meth)acryl" represents either or both of an acryl and a methacryl, and "(meth)acryloyl" represents either or both of an acryloyl and a methacryloyl.

In addition, in the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, in the formulae, Me represents a methyl group, Et represents an ethyl group, Pr represents a propyl group, Bu represents a butyl group, and Ph represents a phenyl group.

In the present specification, a term "step" includes not only an independent step, but also steps which are not clearly distinguished from other steps if an intended action of the steps is obtained.

The colored composition of the present invention (hereinafter simply referred to as "the composition of the present invention" in some cases) may include a dye compound (A) having an anionic moiety including at least one of a structure represented by the following General Formula (A1), a structure represented by the following General Formula (A2), and a structure containing a boron atom, and a cationic moiety, in which the anionic moiety and the cationic moiety are bonded to each other via a covalent bond and present in the same molecule, a curable compound (B), and a solvent (C).

By adopting such a configuration, it is possible to provide a colored composition having excellent heat resistance. Further, the solubility in a solvent can also be improved. In addition, when forming a colored pattern, color migration properties can be improved and a change in spectrum between before and after the development can be inhibited.

The expression of the anionic moiety and the cationic moiety being bonded to each other via a covalent bond means that the anionic moiety may be directly bonded to a dye structure having a cationic moiety; the anionic moiety and the cationic moiety are linked via a linking group; or the bonds in these linking groups may all be covalent bonds.

<Dye Compound (A)>

The dye compound (A) which is used in the present invention has an anionic moiety including at least one of a structure represented by the following General Formula (A1), a structure represented by the following General Formula (A2), and a structure containing a boron atom, and a dye structure having a cationic moiety, in which the anionic moiety and the cationic moiety are bonded to each other via a covalent bond and present in the same molecule. It is preferable that the dye compound (A) includes an anionic moiety including a structure represented by the following General Formula (A1) and/or (A2).

The dye compound in the present invention is one which is referred to a so-called betaine structure, and it may include an anion structure having a counter cation or a cationic structure having a counter anion in the molecule within a range where there is no deviation from the gist of the present invention.

General Formula

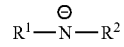

General Formula (A1)

(In General Formula (A1), $R^1$ and $R^2$ each independently represent —$SO_2$— or —CO—)

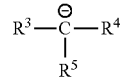

General Formula (A2)

(In General Formula (A2), $R^3$ represents —$SO_2$— or —CO—. $R^4$ and $R^5$ each independently represent —$SO_2$—, —CO—, or —CN.)

In General Formula (A1), $R^1$ and $R^2$ each independently represent —$SO_2$— or —CO—, it is preferable that at least one of $R^1$ and $R^2$ represents —$SO_2$—, and it is more preferable that both of $R^1$ and $R^2$ represent —$SO_2$—.

In General Formula (A2), R; represents —$SO_2$— or —CO—, and $R^4$ and $R^5$ each independently represent —$SO_2$—, —CO—, or —CN. It is preferable that at least one of $R^3$ to $R^5$ represents —$SO_2$—, and it is more preferable that at least two of $R^3$ to $R^5$ represent —$SO_2$—. It is particularly preferable that all of $R^3$ to $R^5$ represent —$SO_2$—; $R^3$ and $R^5$ represent —$SO_2$— and $R^4$ represents —CO—; or $R^4$ and $R^5$ represent —$SO_2$— and $R^3$ represents —CO—.

For the dye compound (A) which is used in the present invention, it is preferable that at least any one of a fluorine atom, an aliphatic hydrocarbon group containing a fluorine atom, an aromatic hydrocarbon group containing a fluorine atom, an aromatic hydrocarbon group containing a nitro group, and an aromatic hydrocarbon group containing a cyano group is directly bonded to at least one of $R^1$ to $R^5$ in the structure represented by General Formula (A1) or General Formula (A2) via a covalent bond.

This mechanism is presumed as follows: by adopting such a configuration, since the anionic moiety can be shielded by a more steric or hydrophobic effect, the intermolecular antistatic electric interactions can further be inhibited, and as a result, the solvent solubility can further be improved.

The aliphatic hydrocarbon group containing a fluorine atom is preferably an alkyl group containing a fluorine atom or an alkylene group containing a fluorine atom. The number of carbon atoms of the aliphatic hydrocarbon group containing a fluorine atom is preferably 1 to 6, more preferably 1 to 4, and still more preferably 1 to 3. Further, the aliphatic hydrocarbon group containing a fluorine atom may be linear, branched, or cyclic, but is more preferably linear.

The aromatic hydrocarbon group containing a fluorine atom is preferably an aryl group containing a fluorine atom or an arylene group containing a fluorine atom. The number of carbon atoms of the aromatic hydrocarbon group containing a fluorine atom is preferably 6 to 18, more preferably 6 to 12, and still more preferably 6.

The aromatic hydrocarbon group containing a fluorine atom preferably has a content of fluorine atoms of 50% or more, and is more preferably a perfluoro group. The content of fluorine atoms is shown as below.

Content of fluorine atoms=[(atomic weight of fluorine)×(number of fluorine atoms)/(molecular weight of the aliphatic hydrocarbon group containing a fluorine atom or the aromatic hydrocarbon group containing a fluorine atom)]×100

The aromatic hydrocarbon group containing a nitro group is preferably an aryl group containing a nitro group or an arylene group containing a nitro group. The number of carbon atoms of the aromatic hydrocarbon group is preferably 6 to 18, more preferably 6 to 12, and still more preferably 6.

The aromatic hydrocarbon group containing a cyano group is preferably an aryl group containing a nitro group or an arylene group containing a cyano group. The number of carbon atoms of the aromatic hydrocarbon group is preferably 6 to 18, more preferably 6 to 12, and still more preferably 6.

For the dye compound (A) which is used in the present invention, it is preferable that the anionic moiety has a structure represented by the following General Formula (A3-1) or (A3-2).

General Formula (A3-1)

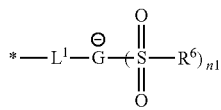

(In General Formula (A3-1). $L^1$ represents —SO$_2$— or —CO—. G represents a carbon atom or a nitrogen atom. n1 represents 2 in the case where G is a carbon atom and represents 1 in the case where G is a nitrogen atom. $R^6$ represents an alkyl group containing a fluorine atom, an aryl group containing a fluorine atom, an aryl group containing a nitro group, or an aryl group containing a cyano group. In the case where n1 is 2, two $R^6$'s may be the same as or different from each other. * represents a site bonding to another site.)

General Formula (A3-2)

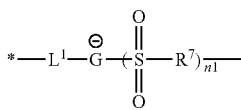

(In General Formula (A3-2), $L^1$ represents —SO$_2$— or —CO—. G represents a carbon atom or a nitrogen atom. n1 represents 2 in the case where G is a carbon atom and represents 1 in the case where G is a nitrogen atom. $R^1$ represents an alkylene group containing a fluorine atom, an arylene group containing a fluorine atom, an arylene group containing a nitro group, or an arylene group containing a cyano group. * represents a site bonding to another site. In the case where n1 is 2, two $R^7$'s may be the same as or different from each other.)

In General Formula (A3-1), $R^6$ represents an alkyl group containing a fluorine atom or an aryl group containing a fluorine atom, has the same definition as the aforementioned alkyl group containing a fluorine atom or an aryl group containing a fluorine atom, and is preferably a perfluoromethyl group.

In General Formula (A3-1), * represents a site bonding to another site. Here, another site represents a site other than the structure represented by General Formula (A3-1) in the dye compound (A). The bond between * in General Formula (A3-1) and another site is a covalent bond.

In General Formula (A3-2), $R^1$ represents an alkylene group containing a fluorine atom, an arylene group containing a fluorine atom, an arylene group containing a nitro group or an arylene group containing a cyano group, has the same definition as the aforementioned alkylene group containing a fluorine atom, arylene group containing a fluorine atom, arylene group containing a nitro group, or arylene group containing a cyano group, and is preferably an alkylene group containing a fluorine atom or an arylene group containing a fluorine atom, and more preferably a perfluoroalkylene group having 1 to 3 carbon atoms or a perfluoroarylene group having 6 to 12 carbon atoms.

In General Formula (A3-2), * represents a site bonding to another site and has the same definition as * in General Formula (A3-1).

<Dye Structure>

The dye structure having a cationic moiety, that is, a partial structure (hereinafter also referred to as a "dye structure") derived from a dye in the dye (A), is not particularly limited as long as it has a cation in the molecule, and various dye residues having known dye structures can be applied. Specific examples of the known dye structure include dye structures derived from a dye selected from a dipyrromethene dye, a carbonium dye (a diphenylmethane dye, a xanthene dye, an acridine dye, and the like), a polymethine dye (an oxonol dye, a merocyanine dye, an arylidene dye, a styryl dye, a cyanine dye, a squarylium dye, a croconium dye, and the like), a subphthalocyanine dye, and metal complex dyes of these.

Among these dye structures, from the viewpoint of color characteristics, dye structures derived from a dye selected from a dipyrromethene dye, a carbonium dye, and a polymethine dye are preferable, dye structures derived from a dye selected from a xanthene dye, a cyanine dye, a squarylium dye, and a dipyrromethene dye are preferable, and dye structures derived from a xanthene dye are particularly preferable.

<<Xanthene Dye>>

The dye structure derived from a xanthene dye is preferably represented by the following General Formula (J).

General Formula (J)

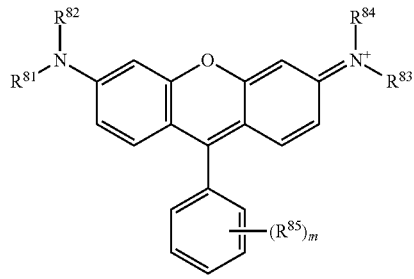

(In General Formula (J), $R^{81}$, $R^{82}$, $R^{83}$, and $R^{84}$ each independently represent a hydrogen atom or a monovalent substituent. $R^{85}$'s each independently represent a monovalent substituent, and m represents an integer of 0 to 5.)

In General Formula (J), $R^{81}$ and $R^{82}$, $R^{83}$ and $R^{84}$, and $R^{85}$'s in the case where m is 2 or more may be each independently bonded to each other to form a 5-, 6-, or 7-membered saturated ring or a 5-, 6-, or 7-membered unsaturated ring. In the case where the formed 5-, 6-, or 7-membered ring is a group which can be further substituted, the ring may be substituted with the substituents described for $R^{81}$ to $R^{85}$. In the case where the ring is substituted with two or more substituents, these substituents may be the same as or different from each other.

In General Formula (J), in the case where $R^{81}$ and $R^{82}$, $R^{83}$ and $R^{84}$, and $R^{85}$'s in the case where m is 2 or more are each independently bonded to each other to form 5-, 6-, and 7-membered saturated rings not having a substituent or form 5-, 6-, and 7-membered unsaturated rings, examples of the 5-, 6-, and 7-membered saturated rings not having a substituent or the 5-, 6-, and 7-membered unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

Examples of the substituent which $R^{81}$ to $R^{84}$ and $R^{85}$ in General Formula (J) may have include the substituent group A which will be described later.

In the dye structure, the cation is not localized, and thus, it is present on a nitrogen atom or a carbon atom of a xanthene ring, for example, as shown below.

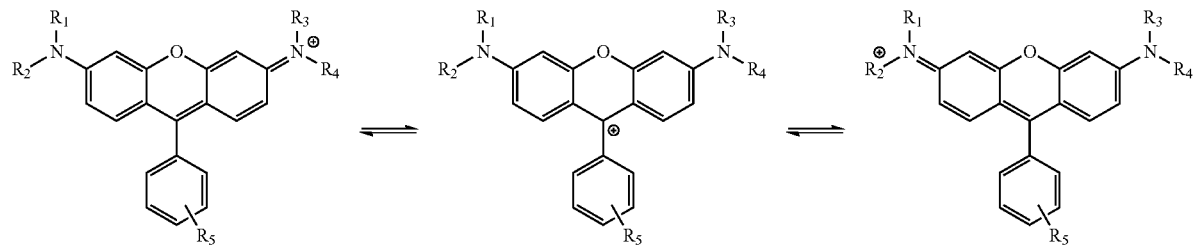

The compounds having xanthene skeletons represented by General Formula (J) may be synthesized using methods disclosed in literature. Specifically, the methods disclosed in Tetrahedron Letters, 2003, vol. 44, No. 23, pp. 4355 to 4360; Tetrahedron, 2005, vol. 61, No. 12, pp. 3097 to 3106; and the like can be applied.

Examples of the dye structure of the xanthene compounds are shown below, but the present invention is not limited thereto.

TABLE 1

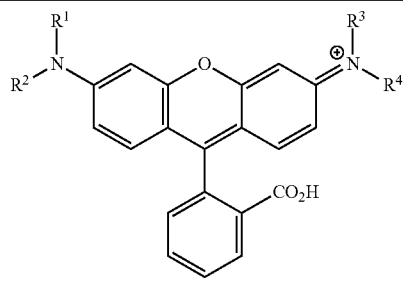

| No. | $R^1$ | $R^2$ | $R^3$ | $R^4$ |
|---|---|---|---|---|
| (XT-1) | Me | Me | Me | Me |
| (XT-2) | Et | Et | Et | Et |
| (XT-3) | n-Pr | n-Pr | n-Pr | n-Pr |
| (XT-4) | i-Pr | i-Pr | i-Pr | i-Pr |
| (XT-5) | n-Bu | n-Bu | n-Bu | n-Bu |
| (XT-6) | sec-Bu | sec-Bu | sec-Bu | sec-Bu |
| (XT-7) | i-Bu | i-Bu | i-Bu | i-Bu |
| (XT-8) | tert-Bu | tert-Bu | tert-Bu | tert-Bu |
| (XT-9) | n-$C_6H_{13}$ | n-$C_6H_{13}$ | n-$C_6H_{13}$ | n-$C_6H_{13}$ |
| (XT-10) | n-$C_{18}H_{37}$ | n-$C_{18}H_{37}$ | n-$C_{18}H_{37}$ | n-$C_{18}H_{37}$ |
| (XT-11) | Me | Et | Me | Et |
| (XT-12) | —$CH_2CH_2OCH_2CH_2$— | | —$CH_2CH_2OCH_2CH_2$— | |
| (XT-13) | —$(CH_2)_5$— | | —$(CH_2)_5$— | |
| (XT-14) | —$(CH_2)_4$— | | —$(CH_2)_4$— | |
| (XT-15) | —$(CH_2)_5$— | | —$(CH_2)_4$— | |
| (XT-16) | $CH_2Ph$ | $CH_2Ph$ | $CH_2Ph$ | $CH_2Ph$ |
| (XT-17) | Et | $CH_2CH_2OMe$ | Et | $CH_2CH_2OMe$ |

TABLE 1-continued

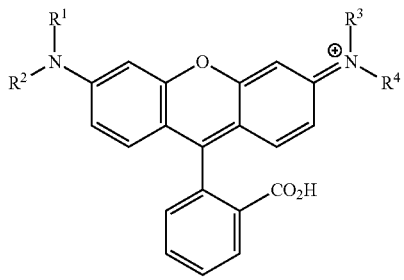

| No. | R¹ | R² | R³ | R⁴ |
|---|---|---|---|---|
| (XT-18) | Me | cyclo-C₆H₁₁ | Me | cyclo-C₆H₁₁ |
| (XT-19) | CH₂C≡CH | CH₂C≡CH | CH₂C≡CH | CH₂C≡CH |
| (XT-20) | CH₂CH=CH₂ | CH₂CH=CH₂ | CH₂CH=CH₂ | CH₂CH=CH₂ |
| (XT-21) | Me | H | Me | H |
| (XT-22) | Et | H | Et | H |
| (XT-23) | n-Pr | H | n-Pr | H |
| (XT-24) | i-Pr | H | i-Pr | H |
| (XT-25) | n-Bu | H | n-Bu | H |
| (XT-26) | H | H | H | H |
| (XT-27) | i-Bu | H | i-Bu | H |
| (XT-28) | tert-Bu | H | tert-Bu | H |
| (XT-29) | n-C₆H₁₃ | H | n-C₆H₁₃ | H |
| (XT-30) | n-C₁₈H₃₇ | H | n-C₁₈H₃₇ | H |
| (XT-31) | Ph | H | Ph | H |
| (XT-32) | CH₂Ph | H | CH₂Ph | H |
| (XT-33) | cyclo-C₆H₁₁ | H | cyclo-C₆H₁₁ | H |
| (XT-34) | cyclo-C₅H₉ | H | cyclo-C₅H₉ | H |
| (XT-35) | CH₂C≡CH | H | CH₂C≡CH | H |
| (XT-36) | CH₂CH=CH₂ | H | CH₂CH=CH₂ | H |
| (XT-37) | 2,6-dimethylphenyl | H | 2,6-dimethylphenyl | H |
| (XT-38) | 4-chlorophenyl | H | 4-chlorophenyl | H |

TABLE 2

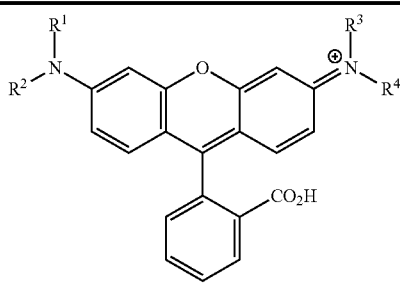

| No. | R¹ | R² | R³ | R⁴ |
|---|---|---|---|---|
| (XT-39) | Me | Me | Me | Me |
| (XT-40) | Et | Et | Et | Et |
| (XT-41) | n-Pr | n-Pr | n-Pr | n-Pr |
| (XT-42) | i-Pr | i-Pr | i-Pr | i-Pr |
| (XT-43) | n-Bu | n-Bu | n-Bu | n-Bu |
| (XT-44) | sec-Bu | sec-Bu | sec-Bu | sec-Bu |
| (XT-45) | i-Bu | i-Bu | i-Bu | i-Bu |

TABLE 2-continued

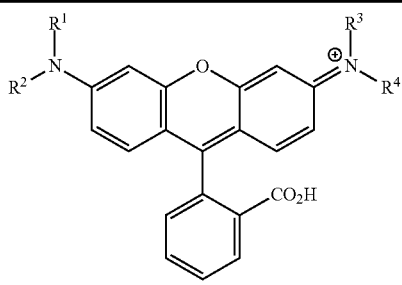

| No. | R¹ | R² | R³ | R⁴ |
|---|---|---|---|---|
| (XT-46) | tert-Bu | tert-Bu | tert-Bu | tert-Bu |
| (XT-47) | n-C$_6$H$_{13}$ | n-C$_6$H$_{13}$ | n-C$_6$H$_{13}$ | n-C$_6$H$_{13}$ |
| (XT-48) | n-C$_{18}$H$_{37}$ | n-C$_{18}$H$_{37}$ | n-C$_{18}$H$_{37}$ | n-C$_{18}$H$_{37}$ |
| (XT-49) | Me | Et | Me | Et |
| (XT-50) | —CH$_2$CH$_2$OCH$_2$CH$_2$— | | —CH$_2$CH$_2$OCH$_2$CH$_2$— | |
| (XT-51) | —(CH$_2$)$_5$— | | —(CH$_2$)$_5$— | |
| (XT-52) | —(CH$_2$)$_4$— | | —(CH$_2$)$_4$— | |
| (XT-53) | —(CH$_2$)$_5$— | | —(CH$_2$)$_4$— | |
| (XT-54) | CH$_2$Ph | CH$_2$Ph | CH$_2$Ph | CH$_2$Ph |
| (XT-55) | Et | CH$_2$CH$_2$OMe | Et | CH$_2$CH$_2$OMe |
| (XT-56) | Me | cyclo-C$_6$H$_{11}$ | Me | cyclo-C$_6$H$_{11}$ |
| (XT-57) | CH$_2$C≡CH | CH$_2$C≡CH | CH$_2$C≡CH | CH$_2$C≡CH |
| (XT-58) | CH$_2$CH=CH$_2$ | CH$_2$CH=CH$_2$ | CH$_2$CH=CH$_2$ | CH$_2$CH=CH$_2$ |
| (XT-59) | Me | H | Me | H |
| (XT-60) | Et | H | Et | H |
| (XT-61) | n-Pr | H | n-Pr | H |
| (XT-62) | i-Pr | H | i-Pr | H |
| (XT-63) | H | H | H | H |
| (XT-64) | sec-Bu | H | sec-Bu | H |
| (XT-65) | i-Bu | H | i-Bu | H |
| (XT-66) | tert-Bu | H | tert-Bu | H |
| (XT-67) | n-C$_6$H$_{13}$ | H | n-C$_6$H$_{13}$ | H |
| (XT-68) | n-C$_{18}$H$_{37}$ | H | n-C$_{18}$H$_{37}$ | H |
| (XT-69) | Ph | H | Ph | H |
| (XT-70) | CH$_2$Ph | H | CH$_2$Ph | H |
| (XT-71) | cyclo-C$_6$H$_{11}$ | H | cyclo-C$_6$H$_{11}$ | H |
| (XT-72) | cyclo-C$_5$H$_9$ | H | cyclo-C$_5$H$_9$ | H |
| (XT-73) | CH$_2$C≡CH | H | CH$_2$C≡CH | H |
| (XT-74) | CH$_2$CH=CH$_2$ | H | CH$_2$CH=CH$_2$ | H |

(XT-75) 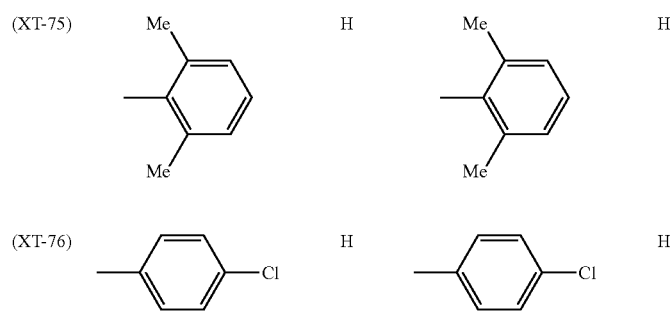 H  (2,6-dimethylphenyl) H (XT-76) 4-chlorophenyl H 4-chlorophenyl H

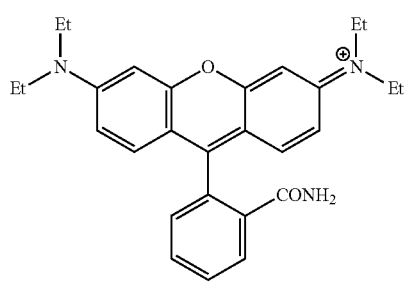

(XT-77)

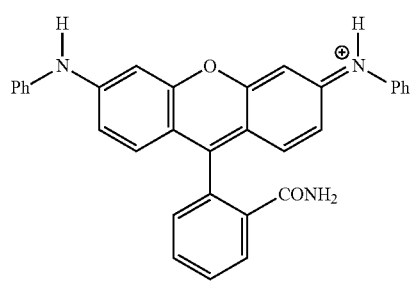

(XT-78)

-continued (XT-79)

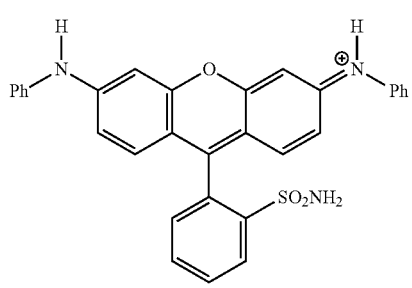

(XT-80)

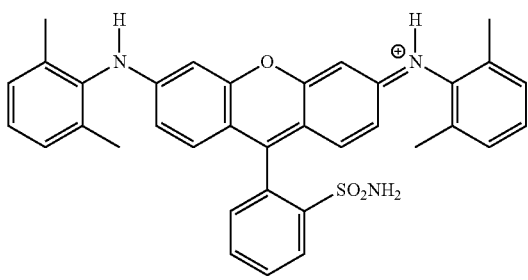

(XT-81)

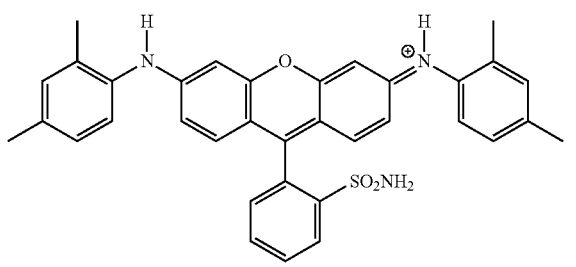

The dye compound (A) which is used in the colored composition of the present invention may be a dye monomer having one dye structure (hereinafter also referred to as a monomeric xanthene compound) having a cationic moiety as described above in the molecule or may be dye multimer (hereinafter also referred to as a polymeric xanthene compound) having two or more dye structures having a cationic moiety in the molecule. In particular, the dye compound (A) is preferably a dye multimer.

<Monomeric Xanthene Compound>

The monomeric xanthene compound which is used in the present invention preferably contains a polymerizable group.

By adopting such a configuration, the heat resistance tends to be improved. One kind or two or more kinds of polymerizable group may be contained.

As the polymerizable group, known polymerizable groups which can be crosslinked by a radical, an acid, or heat can be used, and examples thereof include a group having an ethylenically unsaturated bond, a cyclic ether group (an epoxy group or an oxetane group), and a methylol group. In particular, a group having an ethylenically unsaturated bond is preferable, and a (meth)acryloyl group is more preferable.

The number of the polymerizable group in one molecule of the monomeric xanthene compound is preferably 1 to 4, and more preferably 1 or 2.

The monomeric xanthene compound may contain an acid group. Examples of the acid group include a carboxylic acid group, a sulfonic acid group, and a phosphoric acid group.

Furthermore, the monomeric xanthene compound may have an alkali-soluble group. Examples of the alkali-soluble group include a phenolic hydroxyl group and a carboxylic acid group. Examples of a method for introducing the alkali-soluble group into the monomeric xanthene compound include a method in which an alkali-soluble group is introduced in advance into the monomeric xanthene compound.

The number of acid groups of the monomeric xanthene compound is preferably 1 to 4, and more preferably 1 or 2.

In addition, examples of the functional group which the monomeric xanthene compound may have include a development accelerator such as lactone, acid anhydride, amide, —COCH$_2$CO—, and a cyano group, a hydrophobicity-adjusting group such as an aralkyl group, an aryl group, a polyalkylene oxide group, a hydroxyl group, a maleimide group, and an amino group, which can be appropriately introduced.

The acid value of the monomeric xanthene compound which is used in the present invention is preferably 5 mgKOH/g to 200 mgKOH/g, and more preferably 10 mgKOH/g to 180 mgKOH/g.

The monomeric xanthene compound (xanthene dye) is preferably a compound represented by General Formula (A5).

General Formula (A5)

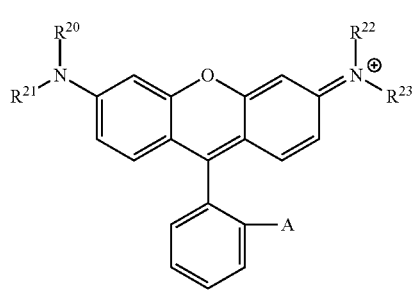

In General Formula (A5), $R^{20}$ to $R^{23}$ each independently represent a hydrogen atom, an aliphatic hydrocarbon group, or an aromatic hydrocarbon group; and A is an anionic moiety represented by any one of the following General Formula (AN-1) to (AN-4);

(AN-1)

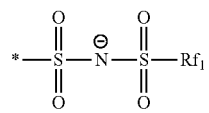

(AN-2)

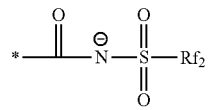

(AN-3)

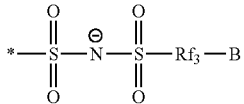

(AN-4)

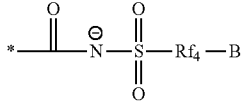

In General Formula (AN-1), * represents a bonding site to a xanthene structure; and Rf$_1$ represents an aliphatic hydrocarbon group, a halogenated aliphatic hydrocarbon group, an aromatic hydrocarbon group, or a halogenated aromatic hydrocarbon group;

in General Formula (AN-2), * represents a bonding site to a xanthene structure; and $Rf_2$ represents a halogenated aliphatic hydrocarbon group;

in General Formula (AN-3), * represents a bonding site to a xanthene structure; $Rf_3$ represents an aliphatic hydrocarbon group, a halogenated aliphatic hydrocarbon group, an aromatic hydrocarbon group, or a halogenated aromatic hydrocarbon group; and B represents a substituent;

in General Formula (AN-4), * represents a bonding site to a xanthene structure; $Rf_4$ represents a halogenated aliphatic hydrocarbon group; and B represents a substituent.

In General Formula (A5), $R^{20}$ preferably represents a hydrogen atom or an aliphatic hydrocarbon group, and more preferably a hydrogen atom. The number of carbon atoms of the aliphatic hydrocarbon group is preferably 1 to 6, and more preferably 1 to 3. The aliphatic hydrocarbon group is preferably an alkyl group. The aliphatic hydrocarbon group may have a substituent. Examples of the substituent include the substituent group A which will be described later.

In General Formula (A5), $R^{21}$ preferably represents an aliphatic hydrocarbon group or an aromatic hydrocarbon group, and more preferably an aromatic hydrocarbon group. The number of carbon atoms of the aliphatic hydrocarbon group is preferably 1 to 6, and more preferably 1 to 3. The aliphatic hydrocarbon group is preferably an alkyl group. The aromatic hydrocarbon group may be monocyclic or polycyclic, and preferably monocyclic. The number of carbon atoms of the aromatic hydrocarbon group carbon atoms is preferably 6 to 15, and more preferably 6 to 12. The aromatic hydrocarbon group is preferably an aryl group. The number of carbon atoms of the aromatic hydrocarbon group is preferably 6 to 12, and more preferably 6 to 9. The aliphatic hydrocarbon group and aromatic hydrocarbon group may have a substituent. Examples of the substituent include the substituent group A which will be described later.

In General Formula (A5), $R^{22}$ has the same definition as $R^{20}$ in General Formula (A5), and a preferred range thereof is also the same.

In General Formula (A5), $R^{23}$ has the same definition as $R^{21}$ in General Formula (A5), and a preferred range thereof is also the same.

In General Formula (AN-1), in the case where $Rf_1$ represents an aliphatic hydrocarbon group, the number of carbon atoms of the aliphatic hydrocarbon group is preferably 1 to 6, more preferably 1 to 3, and still more preferably 1 or 2. The aliphatic hydrocarbon group is preferably a methyl group.

In General Formula (AN-1), in the case where $Rf_1$ represents a halogenated aliphatic hydrocarbon group, the number of carbon atoms of the aliphatic hydrocarbon group is preferably 1 to 6, more preferably 1 to 3, and still more preferably 1 or 2. The halogenated aliphatic hydrocarbon group is preferably a fluorine atom-substituted alkyl group, and more preferably a perfluoroalkyl group.

In General Formula (AN-1), in the case where $Rf_1$ represents an aromatic hydrocarbon group, it may be monocyclic or polycyclic, and preferably monocyclic. The number of carbon atoms of the aromatic hydrocarbon group is preferably 6 to 12, and more preferably 6 to 9. The aromatic hydrocarbon group is preferably a phenyl group.

In General Formula (AN-1), in the case where $Rf_1$ represents a halogenated aromatic hydrocarbon group, it may be monocyclic or polycyclic, and preferably monocyclic. The number of carbon atoms of the aromatic hydrocarbon group is preferably 6 to 12, and more preferably 6 to 9. The halogenated aromatic hydrocarbon group is preferably a fluorine atom-substituted aryl group, and more preferably a perfluoroaryl group.

In General Formula (AN-2), $Rf_1$ represents a halogenated aliphatic hydrocarbon group, and has the same definition as in the case where $Rf_1$ in General Formula (AN-1) represents a halogenated aliphatic hydrocarbon group, and a preferred range thereof is also the same.

In General Formula (AN-3), in the case where $Rf_3$ represents an aliphatic hydrocarbon group, the number of carbon atoms of the aliphatic hydrocarbon group is preferably 1 to 6, more preferably 1 to 3, and still more preferably 1 or 2.

In General Formula (AN-3), in the case where $Rf_3$ represents a halogenated aliphatic hydrocarbon group, the number of carbon atoms of the aliphatic hydrocarbon group is preferably 1 to 6, and more preferably 1 to 3. The halogenated aliphatic hydrocarbon group is preferably a fluorine atom-substituted alkylene group, and more preferably a perfluoroalkylene group.

In General Formula (AN-3), in the case where $Rf_3$ represents an aromatic hydrocarbon group, it may be monocyclic or polycyclic, and preferably monocyclic. The number of carbon atoms of the aromatic hydrocarbon group is preferably 6 to 12, and more preferably 6 to 9.

In General Formula (AN-3), in the case where $Rf_3$ represents a halogenated aromatic hydrocarbon group, it may be monocyclic or polycyclic, and preferably monocyclic. The number of carbon atoms of the aromatic hydrocarbon group is preferably 6 to 12, and more preferably 6 to 9. The halogenated aromatic hydrocarbon group is preferably a fluorine atom-substituted arylene group, and more preferably a perfluoroarylene group.

In General Formula (AN-3), B represents a substituent, and preferably contains a crosslinkable group. The crosslinkable group is preferably at least one of a polymerizable group (for example, a (meth)acryloyloxy group and a vinyl group), a leaving group (for example, a fluorine group, a chlorine group, a bromine group, an iodine group, and a tosyl group), a hydroxyl group, a thiol group, an amino group, and a carboxyl group. In particular. B in General Formula (AN-3) is preferably a group formed by combination of a crosslinkable group and a linking group. Specifically, it is preferably a group formed by combination of a crosslinkable group and at least one linking group selected from an alkylene group having 1 to 6 carbon atoms, an arylene group having 6 to 12 carbon atoms, —O—, —S—, —CO—, —SO—, —SO$_2$—, and —NR—. R in —NR— is preferably a hydrogen atom or an alkyl group having 1 to 3 carbon atoms.

In General Formula (AN-4), $Rf_4$ represents a halogenated aliphatic hydrocarbon group, and has the same definition as in the case where $Rf_3$ General Formula (AN-3) represents a halogenated aliphatic hydrocarbon group, and a preferred range thereof is also the same.

In General Formula (AN-4), B has the same definition as B in General Formula (AN-3), and a preferred range thereof is also the same.

<Polymeric Xanthene Compound>

The polymeric xanthene compound which is used in the present invention preferably contains a structural unit represented by the following General Formula (A). The structural unit represented by General Formula (A) may be one kind or two or more kinds, or a combination thereof. In addition, it may also contain another structural unit as described later.

General Formula (A)

(In General Formula (A), $X_1$ represents a linking group formed by polymerization, and $L_1$ represents a single bond or a divalent linking group. DyeI represents a dye structure.)

Hereinafter, General Formula (A) will be described in detail.

In General Formula (A), $X_1$ represents a linking group formed by polymerization. That is, $X^1$ represents a portion that forms a repeating unit corresponding to a main chain formed by a polymerization reaction. Moreover, the moiety represented by two *s is a repeating unit. $X_1$ is not particularly limited as long as it is a linking group formed of a known polymerizable monomer. In particular, $X^1$ is preferably a linking group represented by the following (XX-1) to (XX-24), more preferably selected from (meth)acryl-based linking chains represented by (XX-1) and (XX-2), styrene-based linking chains represented by (XX-10) to (XX-17), and a vinyl-based linking chain represented by (XX-24), and still more preferably selected from (meth)acryl-based linking chains represented by (XX-1) and (XX-2), or a styrene-based linking chain represented by (XX-11).

In (XX-1) to (XX-24), * represents a moiety through which the linking groups are linked to $L_1$.

Me represents a methyl group. Further, R in (XX-18) and (XX-19) represents a hydrogen atom, an alkyl group having 1 to 5 carbon atoms, or a phenyl group.

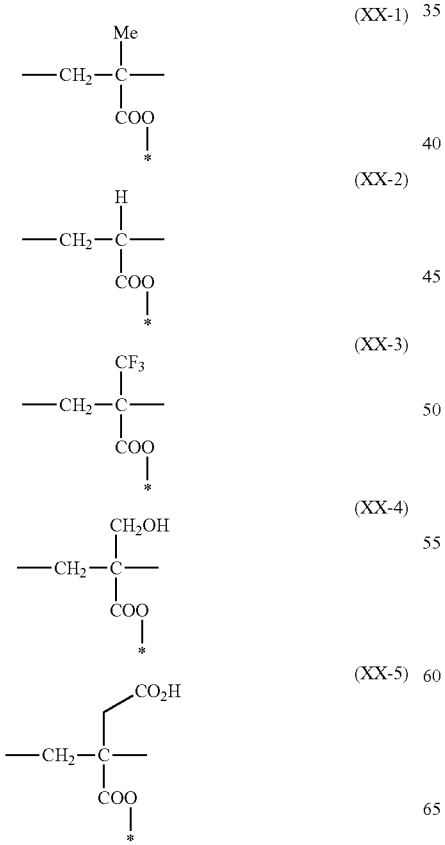

-continued

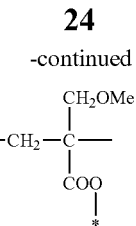

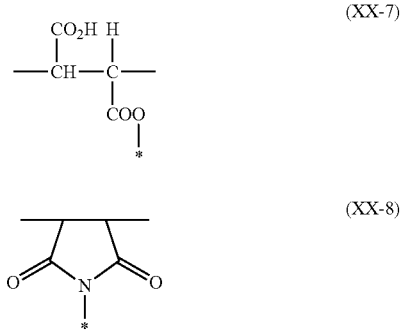

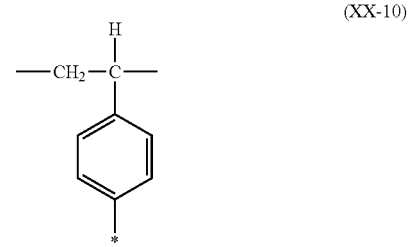

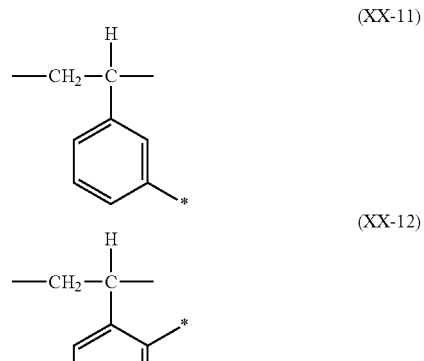

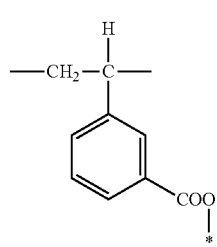

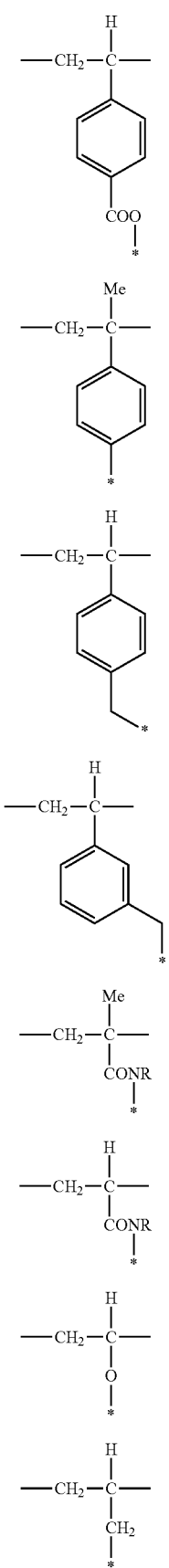

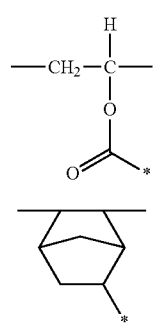

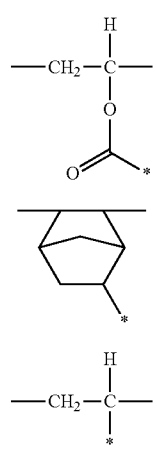

In General Formula (A), $L_1$ represents a single bond or a divalent linking group. The divalent linking group in the case where $L_1$ represents a divalent linking group represents a substituted or unsubstituted alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthalene group), a substituted or unsubstituted heterocyclic linking group, —CH=CH—, —O—, —S—, —C(=O)—, —CO$_2$—, —NR—, —CONR—, —O$_2$C—, —SO—, —SO$_2$—, and a linking group formed of two or more of these linked to each other. Here, R's each independently represent a hydrogen atom, an alkyl group, an aryl group, or a heterocyclic group.

In General Formula (A), DyeI represents a dye structure derived from the aforementioned dye compound.

The dye multimer having the structural unit represented by General Formula (A) can be synthesized by (1) a method of synthesizing the multimer by means of addition polymerization using a monomer having a dye residue, or (2) a method of synthesizing the multimer by causing a reaction between a polymer, which has a highly reactive functional group such as an isocyanate group, an acid anhydride group, or an epoxy group, and a dye which has a functional group (a hydroxyl group, a primary or secondary amino group, a carboxyl group, or the like) that can react with the highly reactive group.

The addition polymerization can be performed by applying known addition polymerization techniques (radical polymerization, anionic polymerization, and cationic polymerization), among which radical polymerization is especially preferred because of milder reaction conditions enough to protect the dye structure against degradation. For radical polymerization, known reaction conditions can be applied.

Among these, the dye multimer having a structural unit represented by General Formula (A) in the present invention is preferably a radical polymer obtained by radically polymerizing a dye monomer containing an ethylenically unsaturated bond from the viewpoint of heat resistance.

The polymeric xanthene compound is preferably a polymer having a repeating unit represented by General Formula (A4-1) and/or General Formula (A4-3), and more preferably a polymer having the repeating unit represented by General Formula (A4-3).

General Formula (A4-1)

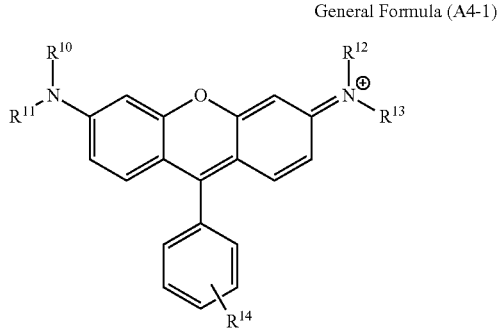

(In General Formula (A4-1), one of $R^{10}$ to $R^{14}$ represents a repeating unit represented by the following General Formula (A4-1-2), at least one of $R^{10}$ to $R^{14}$ is a group represented by the following General Formula (A4-1-1), and the remainders of $R^{10}$ to $R^{14}$ each independently represent a hydrogen atom, an aliphatic hydrocarbon group, or an aromatic hydrocarbon group.)

General Formula (A4-1-1)

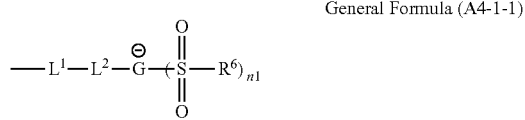

(In General Formula (A4-1-1), $L^1$ represents a single bond or a divalent linking group. $L^2$ represents —SO$_2$— or —CO—. G represents a carbon atom or a nitrogen atom. n1 represents 2 in the case where G is a carbon atom and represents 1 in the case where G is a nitrogen atom. $R^6$ represents an alkyl group containing a fluorine atom or an aryl group containing a fluorine atom. In the case where n1 is 2, two $R^6$'s may be the same as or different from each other.)

General Formula (A4-1-2)

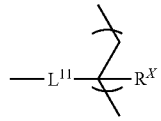

(In General Formula (A4-1-2), $L^{11}$ represents a single bond or a divalent linking group. $R^X$ represents a hydrogen atom, a methyl group, a hydroxymethyl group, or an alkoxymethyl group.)

General Formula (A4-3)

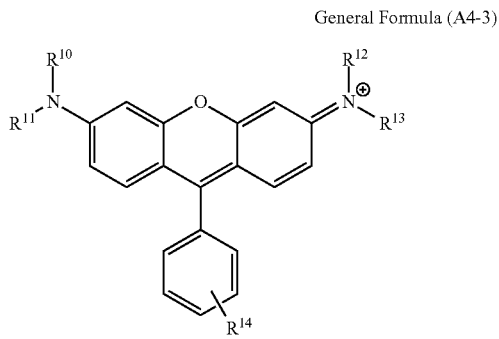

(In General Formula (A4-3), four of $R^{10}$ to $R^{14}$ each independently represent a hydrogen atom, an aliphatic hydrocarbon group, or an aromatic hydrocarbon group, and one of $R^{10}$ to $R^{14}$ is a repeating unit represented by the following General Formula (A4-3-1).)

General Formula (A4-3-1)

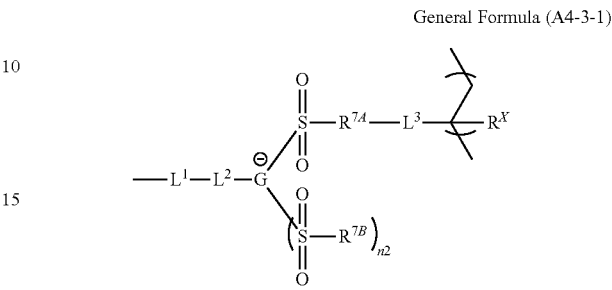

(In General Formula (A4-3-1), $L^1$ represents a single bond or a divalent linking group. $L^2$ represents —SO$_2$— or —CO—; $L^3$ represents a divalent linking group. G represents a carbon atom or a nitrogen atom; in the case where G is a carbon atom, n2 represents 1, and in the case where G represents a nitrogen atom, n2 represents 0. $R^{7A}$ and $R^{7B}$ each independently represent an alkylene group containing a fluorine atom or an arylene group containing a fluorine atom. $R^X$ represents a hydrogen atom, a methyl group, a hydroxymethyl group, or an alkoxymethyl group.)

In General Formula (A4-1), in the case where $R^{10}$ to $R^{14}$ represent an aliphatic hydrocarbon group, the group is preferably an alkyl group. The number of carbon atoms of the aliphatic hydrocarbon group is preferably 1 to 6, and more preferably 1 to 3, and the group is still more preferably a methyl group or an ethyl group.

In General Formula (A4-1), in the case where $R^{10}$ to $R^{14}$ represent an aromatic hydrocarbon group, the group is preferably an aryl group. The aromatic hydrocarbon group may be monocyclic or polycyclic, and preferably monocyclic. The number of carbon atoms of the aromatic hydrocarbon group is preferably 6 to 12, and more preferably 6 to 9.

The aliphatic hydrocarbon group and the aromatic hydrocarbon group may have a substituent. Examples of the substituent include the substituent group A which will be described later.

In General Formula (A4-1-1), $L^1$ represents a single bond or a divalent linking group, and it is preferably a single bond. Examples of the divalent linking group include an alkylene group having 1 to 6 carbon atoms, an arylene group having 6 to 12 carbon atoms, —O—, —S—, or a group formed by combination of these groups.

In General Formula (A4-1-1), $R^6$ represents an alkyl group containing a fluorine atom or an aryl group containing a fluorine atom, and has the same definition as in the case where $R^6$ in General Formula (A3-1) represents an alkyl group containing a fluorine atom or an aryl group containing a fluorine atom, and a preferred range thereof is also the same.

In General Formula (A4-1-2), $L^{11}$ represents a single bond or a divalent linking group. Examples of the divalent linking group include an alkylene group having 1 to 6 carbon atoms, an arylene group having 6 to 18 carbon atoms, —O—, —CO—, —S—, —SO$_2$—, —NR$^A$R$^B$—, and a group formed by combination of these groups. The alkylene group having 1 to 6 carbon atoms may be linear, branched, or cyclic. The arylene group having 6 to 18 carbon atoms may be monocyclic or polycyclic. In —NR$^A$R$^B$—, R$^A$ and R$^B$ each independently represent a hydrogen atom or an alkyl group having 1 to 6 carbon atoms, and R$^A$ and R$^B$ may be bonded to each other to form a ring.

In General Formula (A4-1-2), R$^X$ represents a hydrogen atom, a methyl group, a hydroxymethyl group, or an alkoxymethyl group, and it is preferably a hydrogen atom or a methyl group. In the case where R$^X$ represents an alkoxymethyl group, the number of carbon atoms of the alkoxymethyl group is preferably 1 to 3.

In General Formula (A4-3), four of R$^{10}$ to R$^{14}$ each independently represent a hydrogen atom, an aliphatic hydrocarbon group, or an aromatic hydrocarbon group, and one of R$^{10}$ to R$^{14}$ is a repeating unit represented by General Formula (A4-3-1). In particular, R$^{14}$ is preferably a group represented by General Formula (A4-3-1). The aliphatic hydrocarbon group and aromatic hydrocarbon group has the same definition as R$^{10}$ to R$^{14}$ in General Formula (A4-1), and a preferred range thereof is also the same.

In General Formula (A4-3-1), L$^1$ represents a single bond or a divalent linking group, and it is preferably a single bond. The divalent linking group has the same definition as L$^1$ in General Formula (A4-1-1).

In General Formula (A4-3-1), L$^3$ represents a divalent linking group. The divalent linking group has the same definition as in the case where L$^{11}$ in General Formula (A4-1-2) represents a divalent linking group, and it is preferably an arylene group having 6 to 18 carbon atoms (preferably a phenylene group), —O—, —CO—, —S—, —NR$^A$R$^B$—, or a group formed by combination of these groups, and more preferably a group formed by combination of a phenylene group, —O—, and —CO—. —NR$^A$R$^B$— has the same definition as —NR$^A$R$^B$— described in L$^{11}$ in General Formula (A4-1-2).

In General Formula (A4-3-1), R$^{7A}$ and R$^{7B}$ each independently represent an alkylene group containing a fluorine atom or an arylene group containing a fluorine atom and have the same definition as in the case where R$^7$ in General Formula (A3-2) represents an alkylene group containing a fluorine atom or arylene containing a fluorine atom, and a preferred range thereof is also the same.

In General Formula (A4-3-1), R$^X$ represents a hydrogen atom, a methyl group, a hydroxymethyl group, or an alkoxymethyl group and has the same definition as R$^X$ in General Formula (A4-1-2), and a preferred range thereof is also the same.

Moreover, the polymeric xanthene compound may be a polymer having at least any one of repeating units represented by General Formula (A4-1), General Formula (A4-3), and the following General Formula (A4-1a).

General Formula (A4-1a)

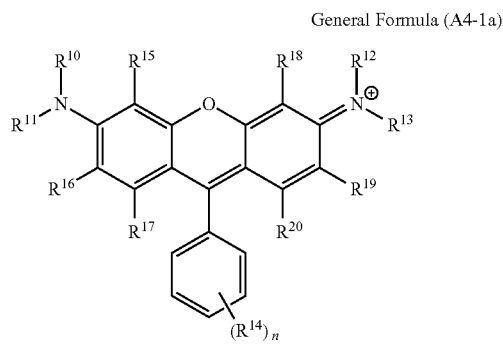

In General Formula (A4-1a), one of R$^{10}$ to R$^{14}$ is a repeating unit represented by General Formula (A4-1-2), at least one of R$^{10}$ to R$^{14}$ is a group represented by General Formula (A4-1-1), and the remainders of R$^{10}$ to R$^{13}$ each independently represent a hydrogen atom, an aliphatic hydrocarbon group, or an aromatic hydrocarbon group. Further, the remainders of R$^{14}$, and R$^{15}$ to R$^{20}$ each independently represent a hydrogen atom, halogen atom, an aliphatic hydrocarbon group, or an aromatic hydrocarbon group. n represents an integer of 0 to 5. R$^{10}$ and R$^{15}$, R$^{11}$ and R$^{16}$, R$^{12}$ and R$^{18}$, R$^{13}$ and R$^{19}$, and a plurality of R$^{14}$'s may be bonded to each other to form a ring.

In General Formula (A4-1a), in the case where R$^{10}$ to R$^{20}$ represent an aliphatic hydrocarbon group or an aromatic hydrocarbon group and has the same definition as in the case where R$^{10}$ to R$^{14}$ in General Formula (A4-1) represent an aliphatic hydrocarbon group or an aromatic hydrocarbon group, and a preferred range thereof is also the same.

The polymeric xanthene compound may have other repeating units, in addition to the repeating unit represented by General Formula (A4-3). Examples of the other repeating units include a repeating unit containing at least one of a polymerizable group, an acid group, and an alkali-soluble group.

The polymeric xanthene compound which is used in the present invention preferably contains a repeating unit having a polymerizable group. In the case where the polymeric xanthene compound which is used in the present invention contains a repeating unit having a polymerizable group, the amount thereof is, for example, preferably 1 mole to 60 moles, and more preferably 10 moles to 50 moles, with respect to 100 moles of the entire repeating units.

The acid value of the repeating unit having an acid group is preferably 5 mgKOH/g to 200 mgKOH/g, more preferably 10 mgKOH/g to 180 mgKOH/g, and still more preferably 20 mgKOH/g to 170 mgKOH/g. The acid value can be calculated by, for example, the average content of acid groups in the polymeric xanthene compound.

In the case where the polymeric xanthene compound contains a repeating unit having a polymerizable group. The amount thereof is, for example, preferably 1 mole to 90 moles, and more preferably 5 moles to 80 moles, with respect to 100 moles of the entire repeating units.

In the case where the polymeric xanthene compound contains a repeating unit having an acid group as the repeating unit represented by General Formula (A4-3), the proportion of the repeating unit having an acid group is, for example, preferably 5 moles to 90 moles, and more preferably 10 moles to 80 moles, with respect to 100 moles of the repeating units represented by General Formula (A4-3).

Specific examples of the repeating unit which may be contained in the polymeric xanthene compound are shown below, but the present invention is not limited thereto.

(B-1) 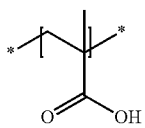
(B-2) 
(B-3) 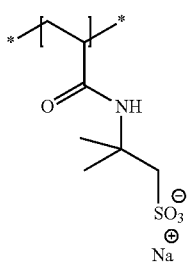
(B-4) 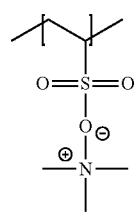
(B-5) 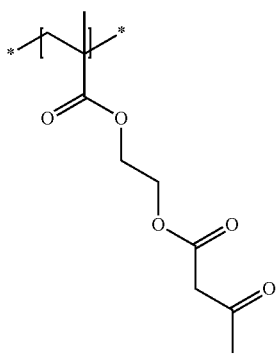
(B-6) 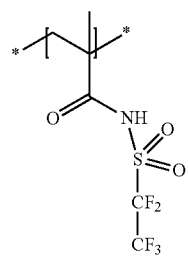
(B-7) 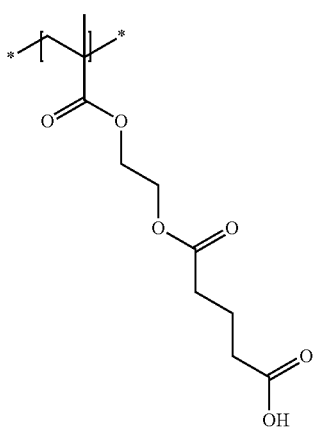
(B-8) 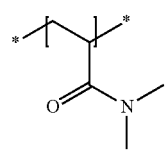
(B-9) 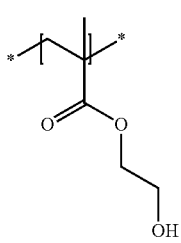
(B-10) 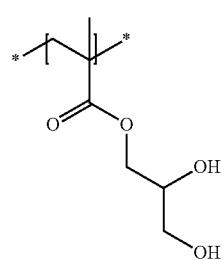

-continued
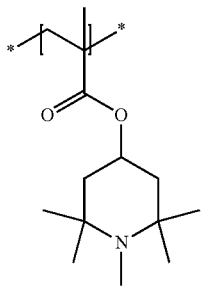
(B-11)
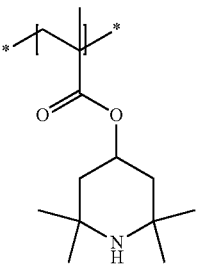
(B-12)
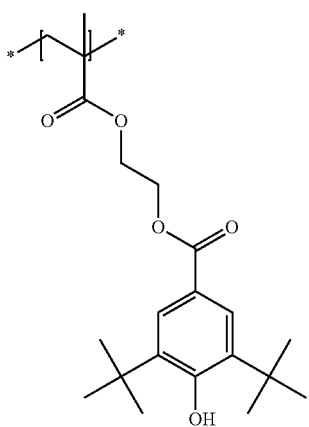
(B-13)
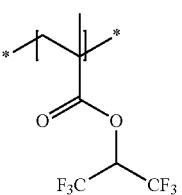
(B-14)
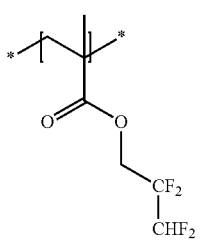
(B-15)
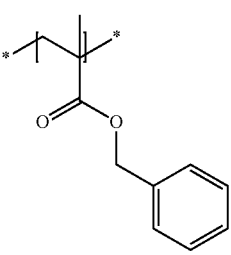
(B-16)
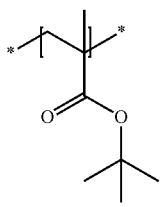
(B-17)
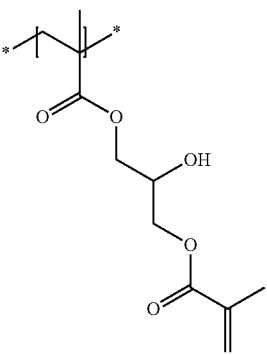
(B-18)

-continued
(B-19)
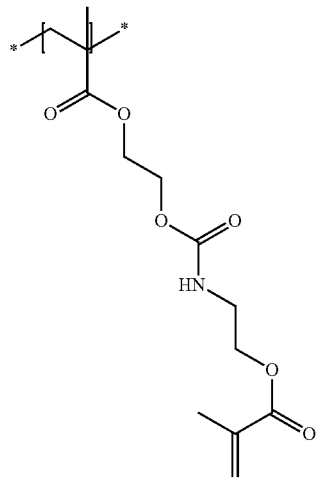
(B-20)
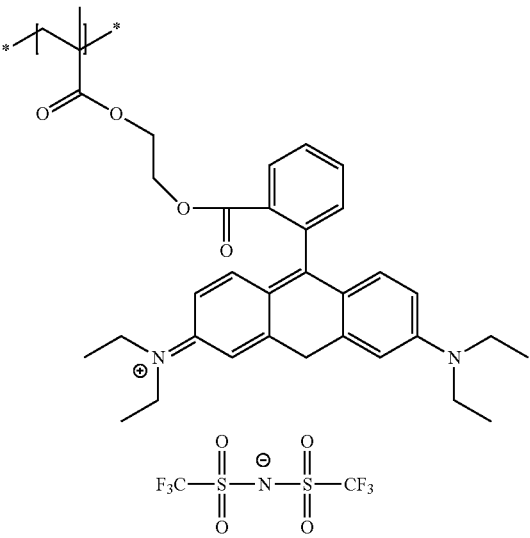
(B-21)
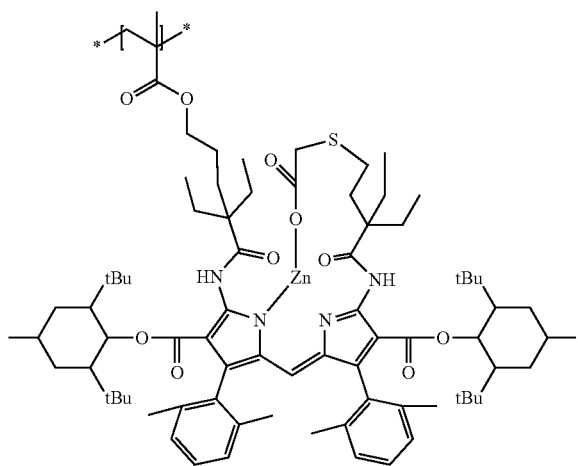
(B-22)
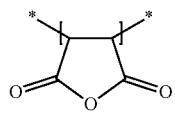
(B-23)
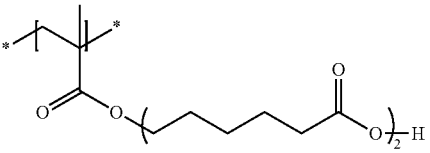
(B-24)
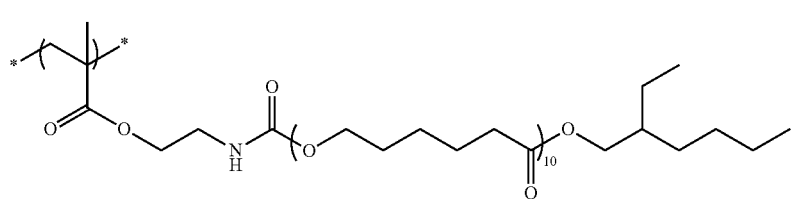
(B-25)
(B-26)
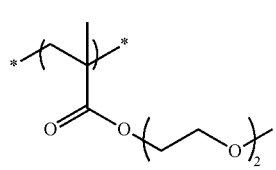
(B-27)
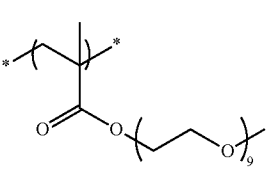

-continued
(B-28)
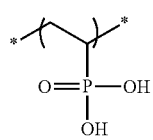
(B-29)
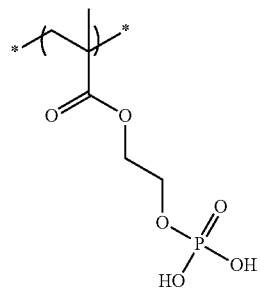
(B-30)
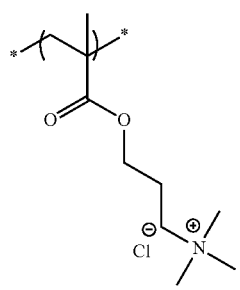
(B-31)
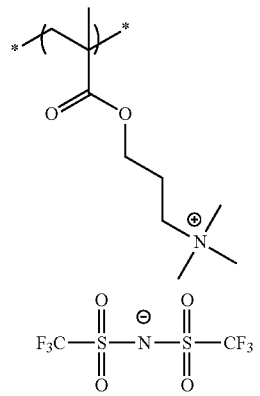
(B-32)
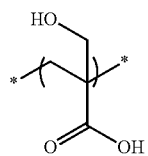
(B-33)
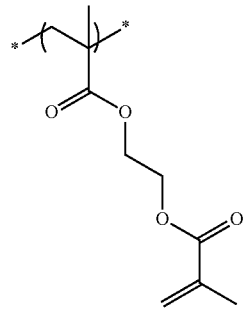
(G-1)
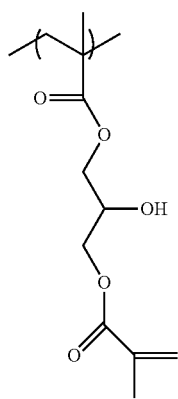
(G-2)
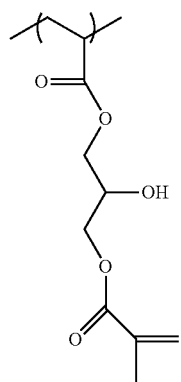

-continued
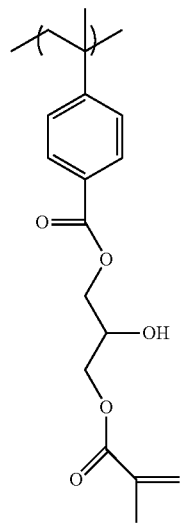 (G-3)
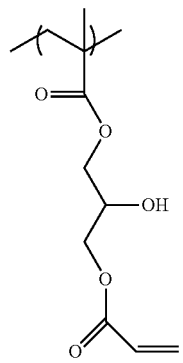 (G-4)
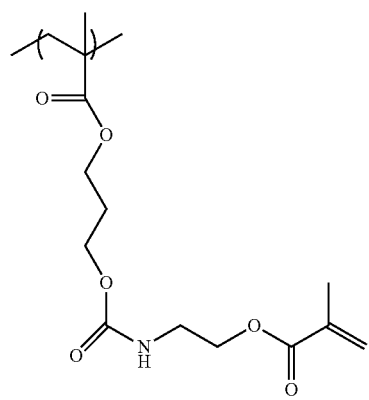 (G-5)
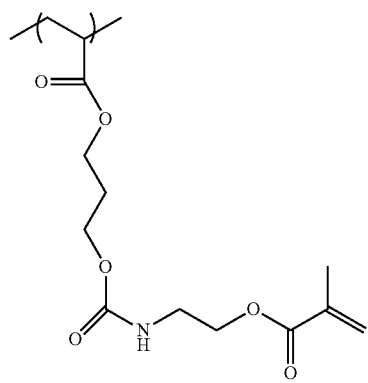 (G-6)
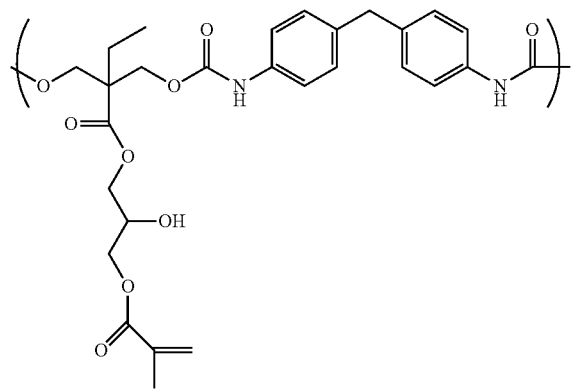 (G-7)
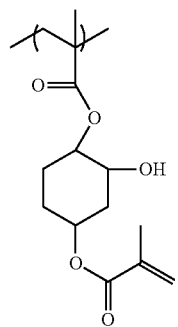 (G-8)

(G-9) 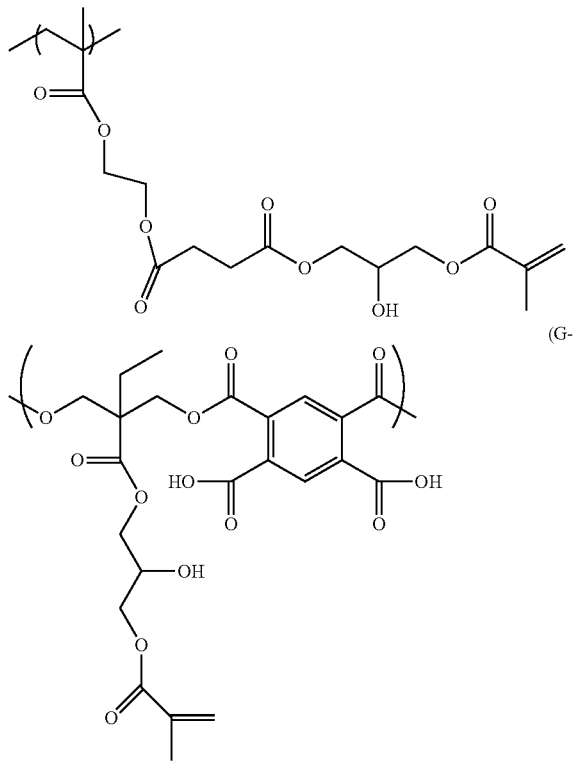

(G-10) 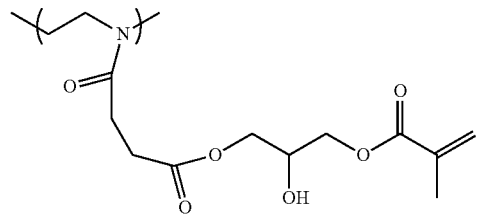

(G-11) 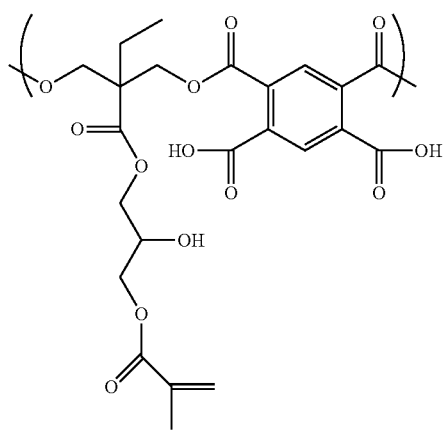

(G-12) 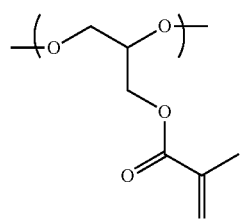

(G-13) 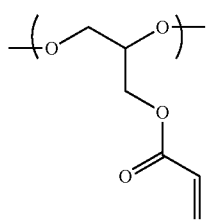

(G-14) 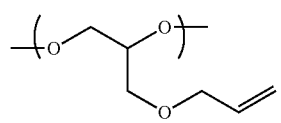

(G-15) 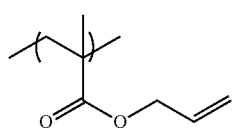

(G-16) 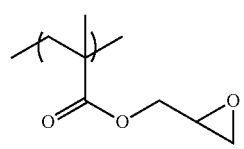

(G-17) 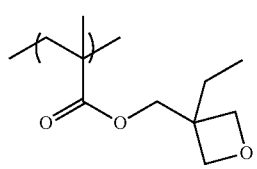

The weight-average molecular weight of the polymeric xanthene compound is preferably 2,000 to 40,000, more preferably 3,000 to 35,000, and particularly preferably 4,000 to 30,000.

In the present specification, the weight average molecular weight and the number-average molecular weight are defined as a value in terms of polystyrene by GPC measurement. In the present specification, the weight-average molecular weight (Mw) and the number-average molecular weight (Mn) can be determined with, for example, HLC-8220 GPC (manufactured by Tosoh Corporation) by using TSKgel Super AWM-H (manufactured by Tosoh Corporation, 6.0 mm ID×15.0 cm) as a column and a 10 mmol/L solution of lithium bromide in N-methylpyrrolidone (NMP) as an eluent.

Further, the ratio [(Mw)/(Mn)] of the weight average molecular weight (Mw) to the number-average molecular weight (Mn) is preferably 1.0 to 3.0, more preferably 1.6 to 2.5, and particularly preferably 1.6 to 2.0.

The glass transition temperature (Tg) of the polymeric xanthene compound which is used in the present invention is preferably 50° C. or higher, and more preferably 100° C. or higher. Further, a 5% weight reduction temperature measured by thermogravimetric analysis (TGA measurement) is preferably 120° C. or higher, more preferably 150° C. or higher, and still more preferably 200° C. or higher.

In addition, the absorption coefficient (hereinafter described as ε'. ε'=ε/average molecular weight, unit: L/g·cm) per unit weight of the dye compound (A) according to the present invention is preferably 30 or more, more preferably 60 or more, and still more preferably 100 or more. If the absorption coefficient is within the above range, in the case where a color filter is manufactured using the colored composition of the present invention, a color filter having excellent color reproducibility can be manufactured.

The maximum absorption wavelength of the dye compound (A) which is used in the present invention is preferably 400 nm to 650 nm, and more preferably 450 nm to 600 nm.

In the colored composition of the present invention, the dye compound (A) which is used in the present invention may be used alone or in combination of two or more kinds thereof. In the case of using two or more kinds of the dye compound (A), the total amount thereof preferably corresponds to the content which will be described later.

The blending amount of the dye compound (A) in the colored composition of the present invention is preferably 5% by mass to 60% by mass, and more preferably 10% by mass to 40% by mass, of the total solid content of the composition.

Furthermore, the content of the dye compound (A) in the colored composition of the present invention is preferably set in consideration of the content ratio of the dye compound (A) to the pigment. The mass ratio of the dye compound (A) to the pigment is preferably 10% to 50%, more preferably 15% to 45%, and still more preferably 20% to 40%.

For the dye compound (A) which is used in the present invention, a hydrogen atom in the dye structure may be substituted with a substituent selected from the following substituent group A as long as there is no deviation from the gist of the present invention.

Substituent Group A:

Examples of the substituent which may be contained in the dye include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imide group, a phosphino group, a phosphinyl group, a phosphinyloxy group, a phosphinylamino group, and a silyl group. These will be described in detail below.

Examples of the substituent include a halogen atom (for example, a fluorine atom, a chlorine atom a bromine atom, and an iodine atom), a linear or branched alkyl group (a linear or branched substituted or unsubstituted alkyl group, and preferably an alkyl group having 1 to 30 carbon atoms, for example, methyl, ethyl, n-propyl, isopropyl, tert-butyl, n-octyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl and cyclopentyl, or a polycycloalkyl group, for example, a group having a polycyclic structure such as a bicycloalkyl group (preferably a substituted or unsubstituted bicycloalkyl group having 5 to 30 carbon atoms, for example, bicyclo[1,2,2]heptan-2-yl and bicyclo[2,2,2]octan-3-yl), and a tricycloalkyl group. Among these, a monocyclic cycloalkyl group and a bicycloalkyl group are more preferable, and a monocyclic cycloalkyl group is particularly preferable), a linear or branched alkenyl group (a linear or branched substituted or unsubstituted alkenyl group, which is preferably an alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, for example, 2-cyclopenten-1-yl and 2-cyclohexen-1-yl, a polycyclic alkenyl group for example, a bicycloalkenyl group (preferably a substituted or unsubstituted bicycloalkenyl group having 5 to 30 carbon atoms, for example, bicyclo[2,2,1]hepto-2-en-1-yl and bicyclo[2,2,2]octo-2-en-4-yl), or a tricycloalkenyl group. Among these, a monocyclic cycloalkenyl group is particularly preferable) an alkynyl group (preferably a substituted or unsubstituted alkynyl group having 2 to 30 carbon atoms, for example, an ethynyl group, a propargyl group, and a trimethylsilylethynyl group), an aryl group (preferably a substituted or unsubstituted aryl group having 6 to 30 carbon atoms, for example, phenyl, p-tolyl, naphthyl, m-chlorophenyl, and o-hexadecanoylaminophenyl), a heterocyclic group (preferably a substituted or unsubstituted, saturated or unsaturated, aromatic or non-aromatic, and monocyclic or ring-fused 5- to 7-membered heterocyclic group, more preferably a heterocyclic group of which ring-constituting atoms are selected from a carbon atom, a nitrogen atom, and a sulfur atom, and which has at least any one of hetero atoms including a nitrogen atom an oxygen atom, and a sulfur atom and still more preferably a 5- or 6-membered aromatic heterocyclic group having 3 to 30 carbon atoms, for example, 2-furyl, 2-thienyl, 2-pyridyl, 4-pyridyl, 2-pyrimidinyl, and 2-benzothiazolyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, tert-butoxy, n-octyloxy, and 2-methoxyethoxy), an aryloxy group (preferably a substituted or unsubstituted aryloxy group having 6 to 30 carbon atoms, for example, phenoxy, 2-methylphenoxy, 2,4-di-tert-amylphenoxy, 4-tert-butylphenoxy, 3-nitrophenoxy, and 2-tetradecanoylaminophenoxv), a silyloxy group (preferably a silyloxy group having 3 to 20 carbon atoms, for example, trimethylsilyloxy and tert-butyldimethylsilyloxy), a heterocyclic oxy group (preferably a substituted or unsubstituted heterocyclic oxy group having 2 to 30 carbon atoms, with heterocyclic moiety being preferably the heterocyclic moiety explained for the aforementioned heterocyclic group and the heterocyclic oxy group being, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, and p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, tert-butoxycarbonyloxy, and n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, and p-n-hexadecyloxyphenoxycarbonyloxy), an amino group (preferably an amino group, a substituted or unsubstituted alkylamino group having 1 to 30 carbon atoms, a substituted or unsubstituted arylamino group having 6 to 30 carbon atoms, and a heterocyclic amino group having 0 to 30 carbon atoms, for example, amino, methylamino, dimethylamino, anilino, N-methyl-anilino, diphenylamino, and N-1,3,5-triazin-2-ylamino), an acylamino group (preferably a formylamino group, a substituted or unsubstituted alkylcarbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, and 3,4,5-tri-n-octyloxyphenylcarbonylamino), an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, tert-butoxycarbonylamino, n-octadecyloxycarbonylamino, and N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, and N-n-octylaminosulfonylamino), an alkylsulfonylamino or arylsulfonylamino group (preferably a substituted or unsubstituted alkylsulfonylamino group having 1 to 30 carbon atoms, or a substituted or unsubstituted arylsulfonylamino group having 6 to 30 carbon atoms, for example, methylsulfonylamino, butylsulfonylamino, phenylsulfonylamino, 2,3,5-trichlorophenylsulfonylamino, and p-methylphenylsulfonylamino), a mercapto group, an alkylthio group (preferably a substituted or unsubstituted alkylthio group having 1 to 30 carbon atoms, for example, methylthio, ethylthio, and n-hexadecylthio), an arylthio group (preferably a substituted or unsubstituted arylthio group having 6 to 30 carbon atoms, for example, phenylthio, p-chlorophenylthio, and m-methoxyphenylthio), a heterocyclic thio group (preferably a substituted or unsubstituted heterocyclic thio group having 2 to 30 carbon atoms, in which a heterocyclic moiety is preferably the heterocyclic moiety explained for the aforementioned heterocyclic group, for example, 2-benzothiazolylthio and 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N—(N'-phenylcarbamoyl)sulfamoyl), a sulfo group, an alkylsulfinyl or arylsulfinyl group (preferably a substituted or unsubstituted alkylsulfinyl group having 1 to 30 carbon atoms or a substituted or unsubstituted arylsulfinyl group having 6 to 30 carbon atoms, for example, methylsulfinyl, ethylsulfinyl, phenylsulfinyl, and p-methylphenylsulfinyl), an alkylsulfonyl or arylsulfonyl group (preferably a substituted or unsubstituted alkylsulfonyl group having 1 to 30 carbon atoms or a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having 2 to 30 carbon atoms, or a substituted or unsubstituted arylcarbonyl group having 7 to 30 carbon atoms, for example, acetyl, pivaloyl, 2-chloroacetyl, stearoyl, benzoyl, and p-n-octyloxyphenylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, and p-tert-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, tert-butoxycarbonyl, and n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an arylazo or heterocyclic azo group (preferably a substituted or unsubstituted arylazo group having 6 to 30 carbon atoms, or a substituted or unsubstituted heterocyclic azo group having 3 to 30 carbon atoms (in which a heterocyclic moiety is preferably the heterocyclic moiety explained for the aforementioned heterocyclic group), for example, phenylazo, p-chlorophenylazo, and 5-ethylthio-1,3,4-thiadiazol-2-ylazo), an imide group (preferably a substituted or unsubstituted imide group having 2 to 30 carbon atoms, for example, N-succinimide and N-phthalimide), a phosphino group (preferably a substituted or unsubstituted phosphino group having 2 to 30 carbon atoms, for example, dimethylphosphino, diphenylphosphino, and methylphenoxyphosphino), a phosphinyl group (preferably a substituted or unsubstituted phosphinyl group having 2 to 30 carbon atoms, for example, phosphinyl, dioctyloxyphosphinyl, and diethoxyphosphinyl).

a phosphinyloxy group (preferably a substituted or unsubstituted phosphinyloxy group having 2 to 30 carbon atoms, for example, diphenoxyphosphinyloxy and dioctyloxyphosphinyloxy), a phosphinylamino group (preferably a substituted or unsubstituted phosphinylamino group having 2 to 30 carbon atoms, for example, dimethoxyphosphinylamino and dimethylaminophosphinylamino), and a silyl group (preferably a substituted or unsubstituted silyl group having 3 to 30 carbon atoms, for example, trimethylsilyl, tert-butyldimethylsilyl, and phenyldimethylsilyl).

Among the above functional groups, in the functional groups having hydrogen atoms, the portion of hydrogen atoms in the functional groups may be substituted with any one of the above groups. Examples of the functional groups which can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include a methylsulfonylaminocarbonyl group, a p-methylphenylsulfonylaminocarbonyl group, an acetylaminosulfonyl group, and a benzoylaminosulfonyl group.

Specific examples of the dye compound (A) which is used in the present invention are shown below, but the present invention is not limited thereto. Further, among the following compounds, polymers containing repeating units derived from compounds (A-13 to A-26) containing a polymerizable group are also included in the dye compound (A) of the present invention.

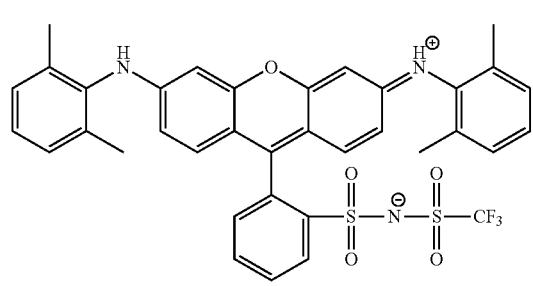
(A-1)
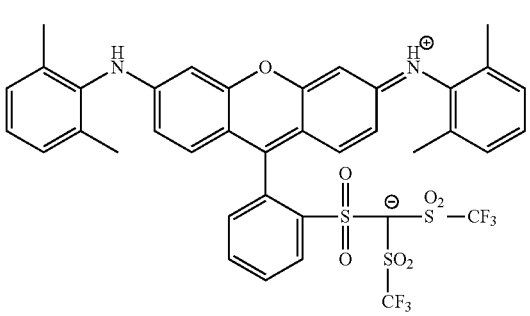
(A-2)
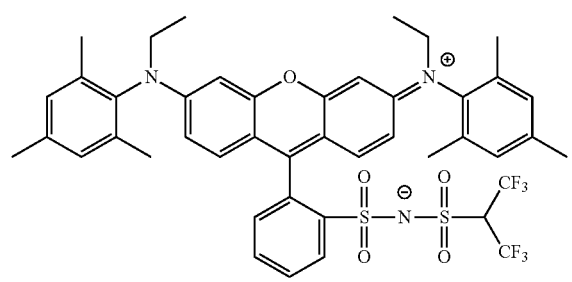
(A-3)
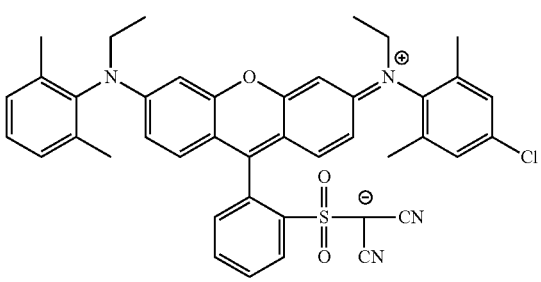
(A-4)
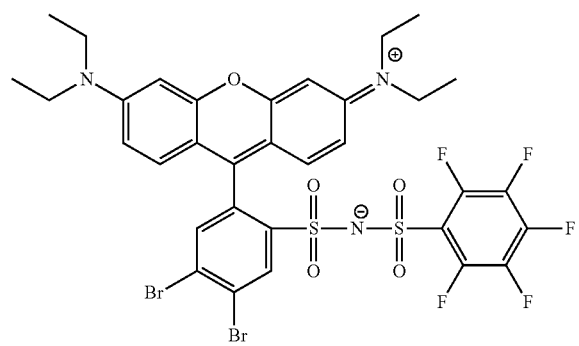
(A-5)
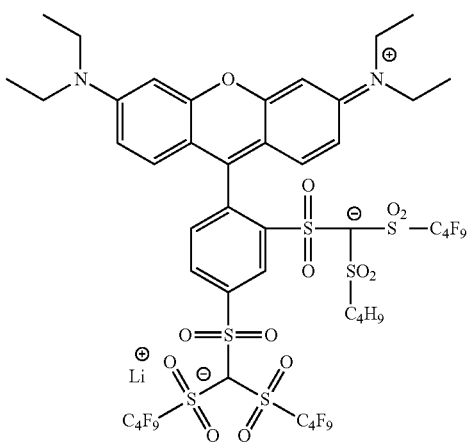
(A-6)
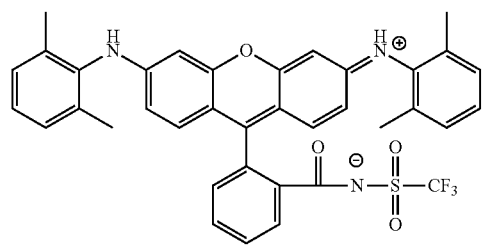
(A-7)
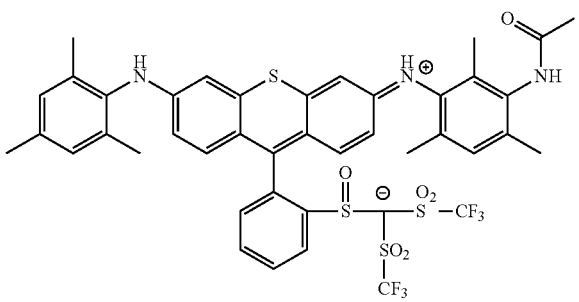
(A-8)

-continued
(A-9)
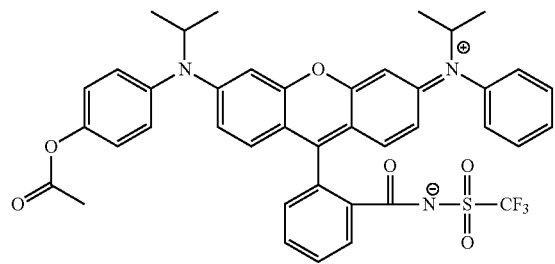
(A-10)
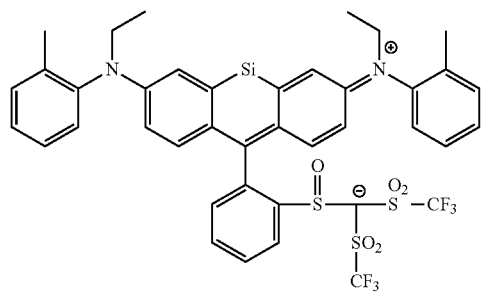
(A-11)
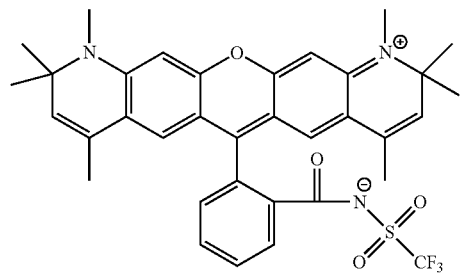
(A-12)
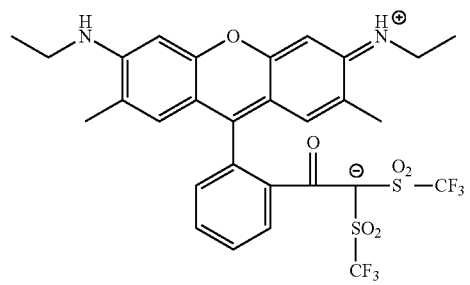
(A-13)
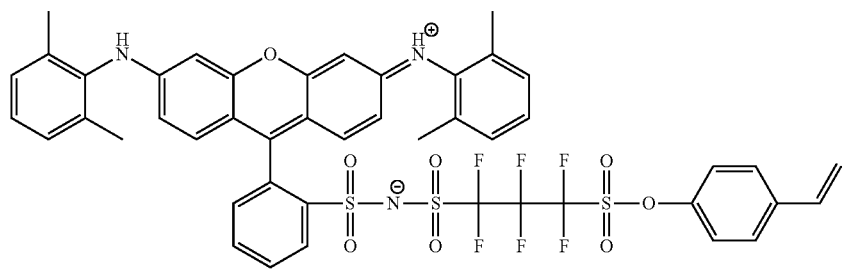
(A-14)
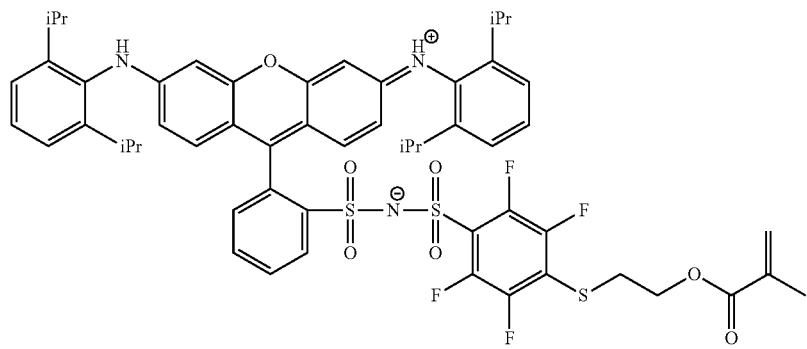
(A-15)
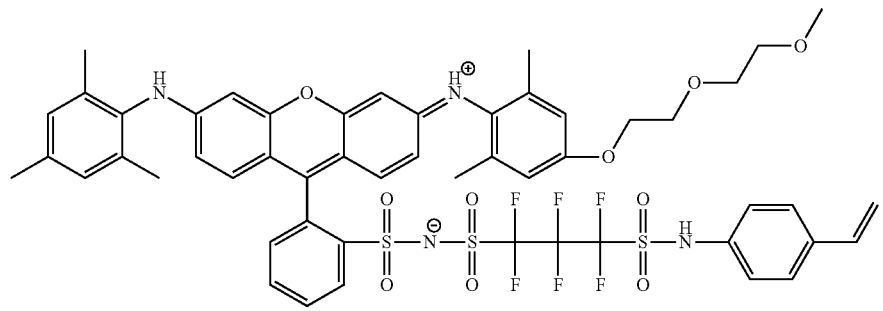

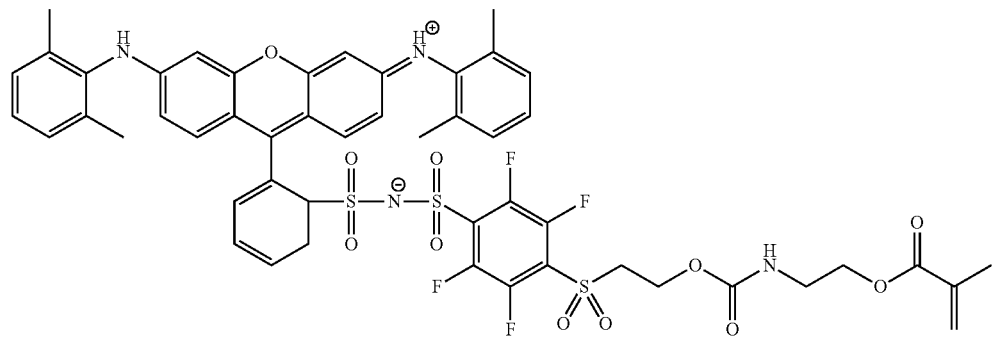
(A-16)
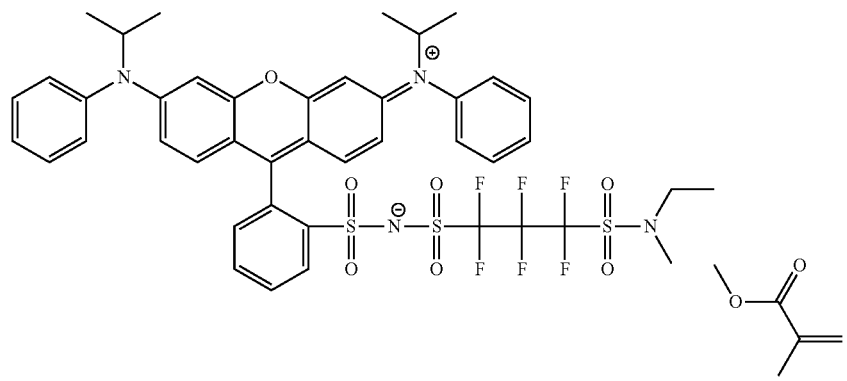
(A-17)
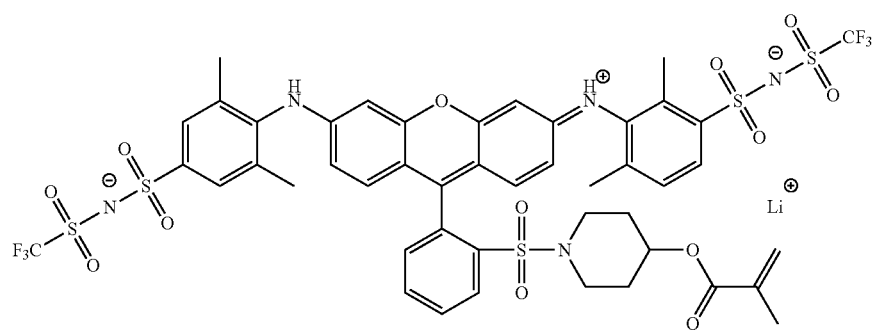
(A-18)
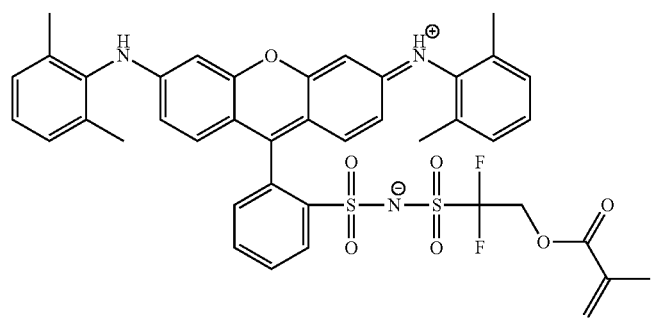
(A-19)

(A-20)
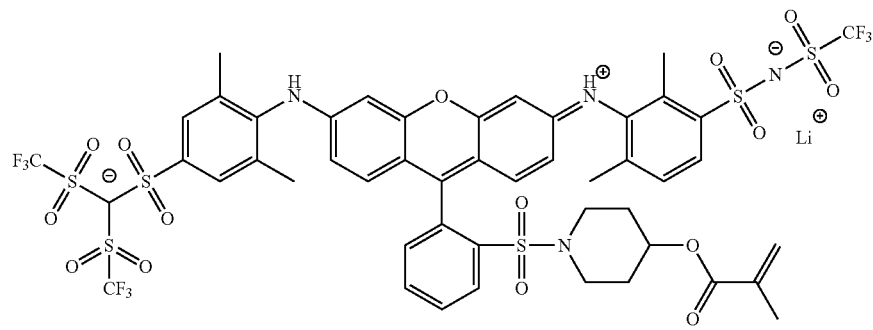
(A-21)
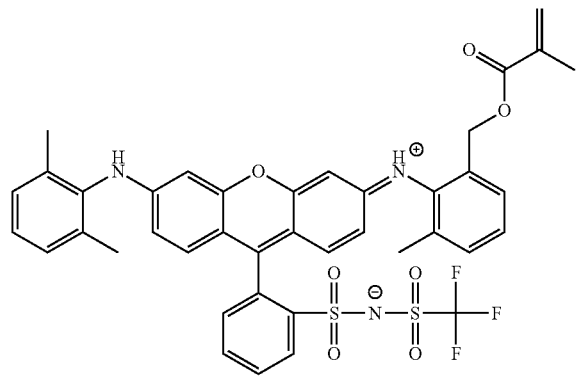
(A-22)
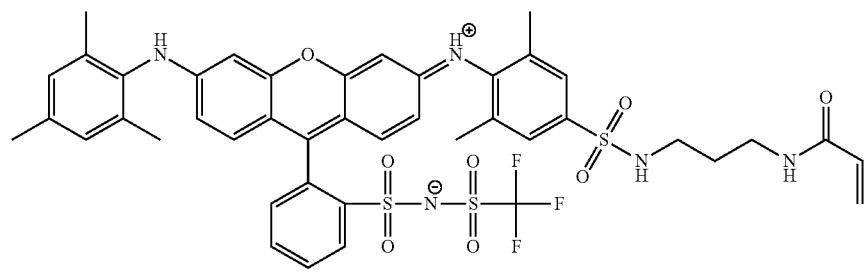
(A-23)
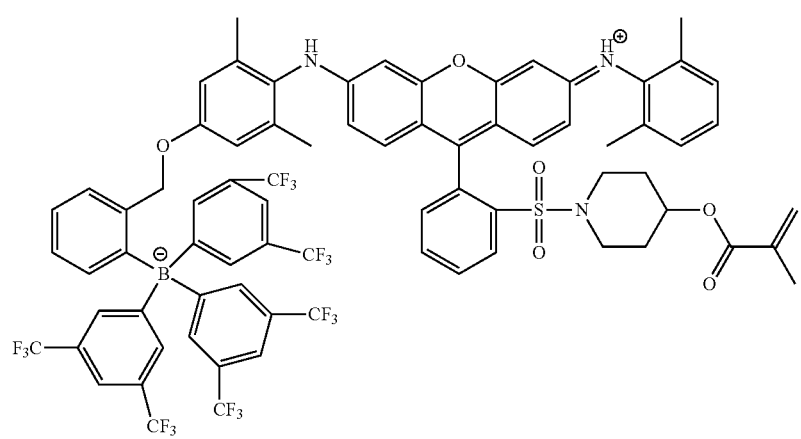

-continued
(A-24)
(A-25)
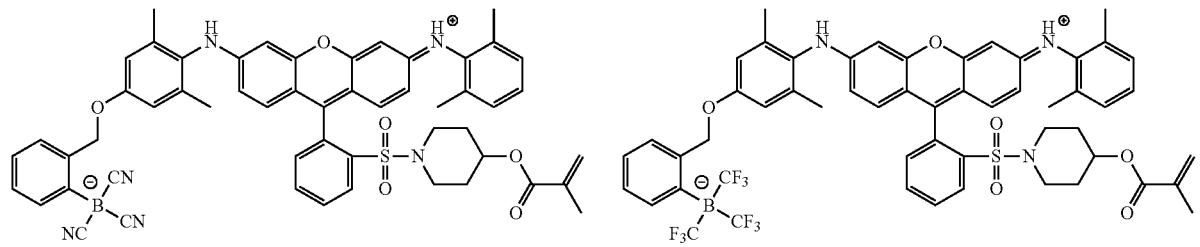
(A-26)
(A-40)
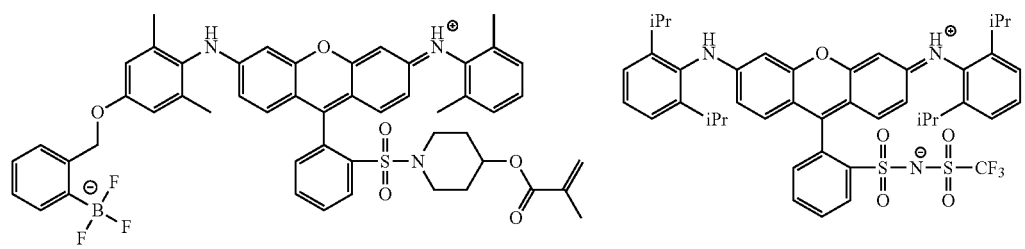
(A-41)
(A-42)
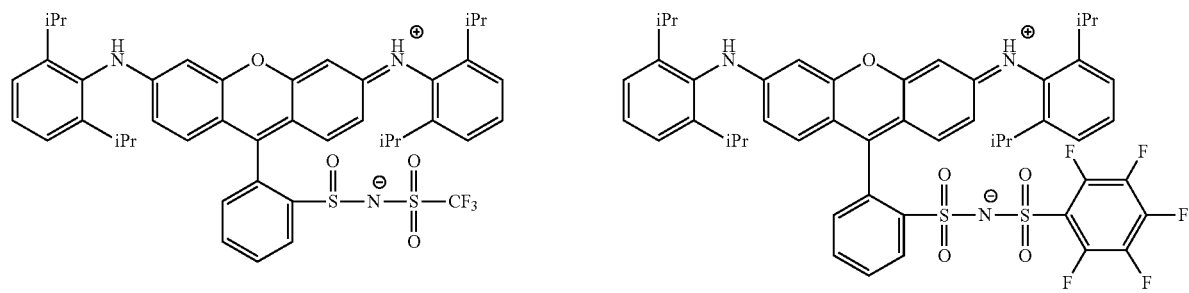
(A-43)
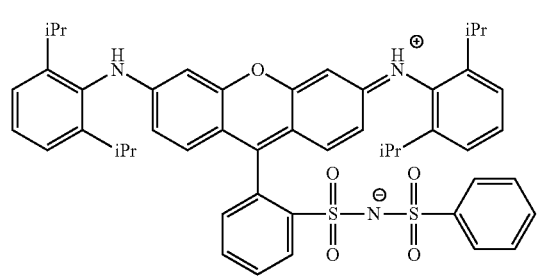
(A-44)
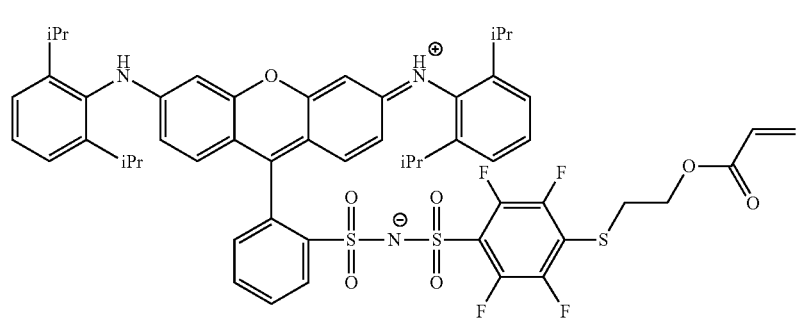

(A-45)
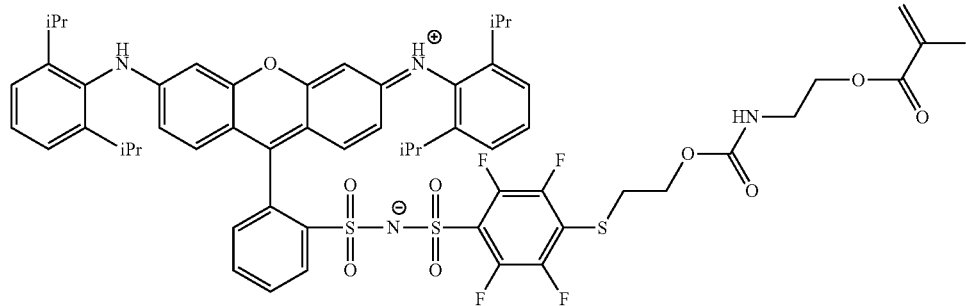
(A-46)
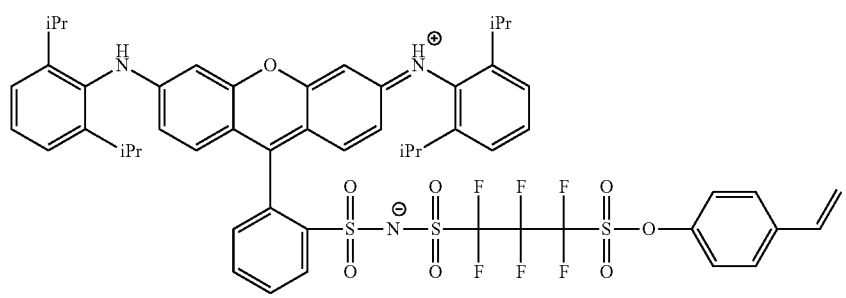
(A-47)
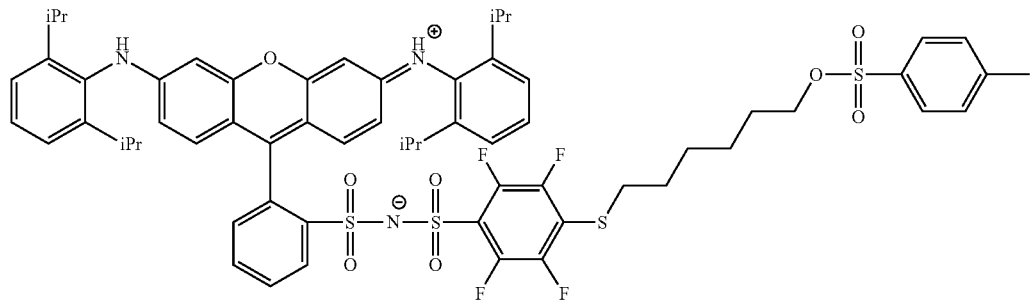
(A-48)
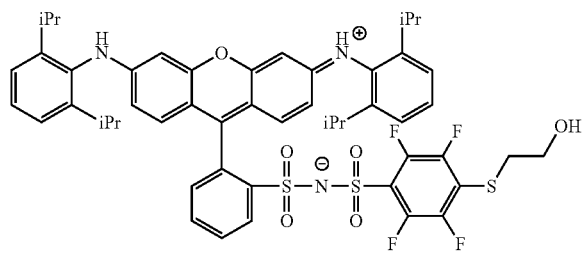
(A-49)
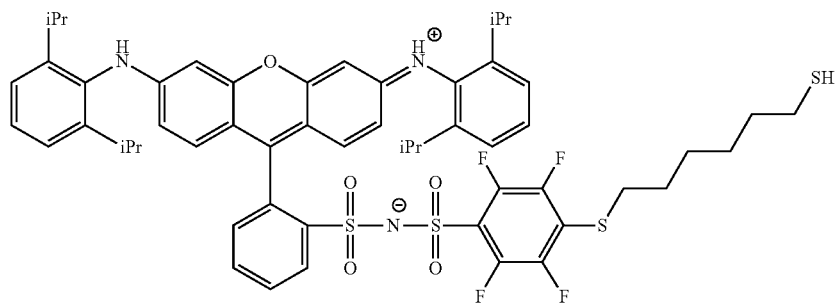

-continued
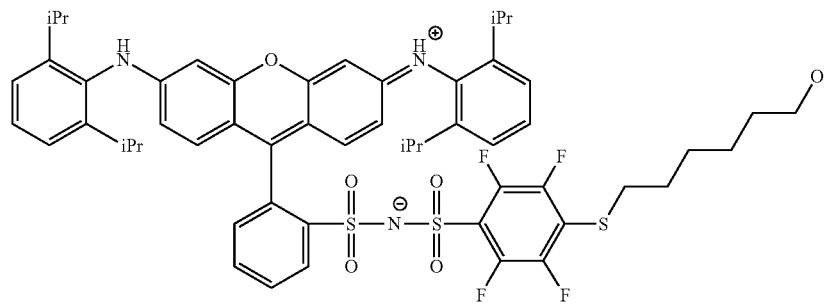
(A-50)
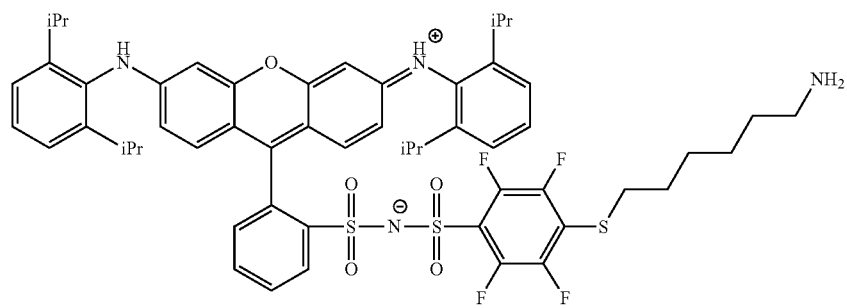
(A-51)
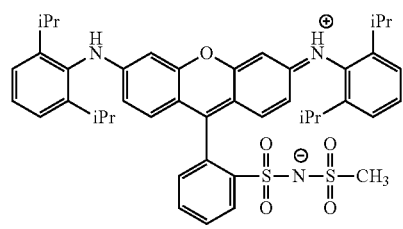
(A-52)
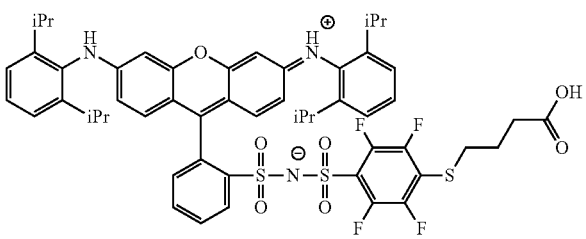
(A-53)
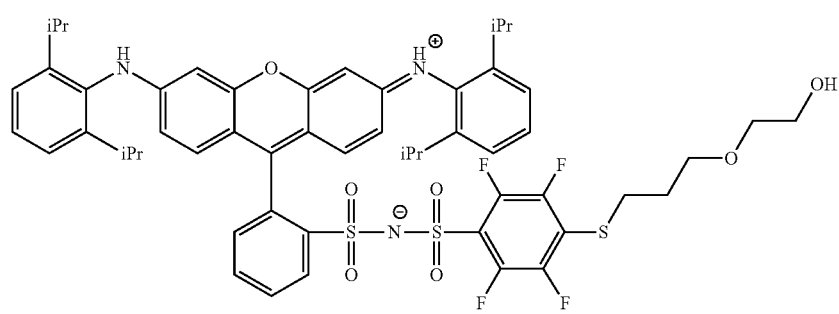
(A-54)
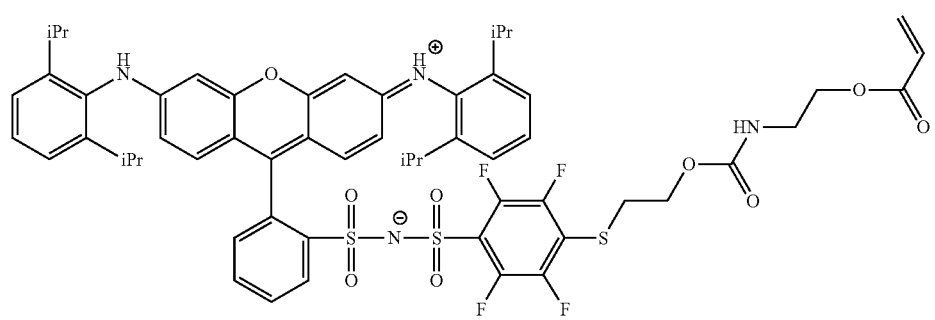
(A-55)

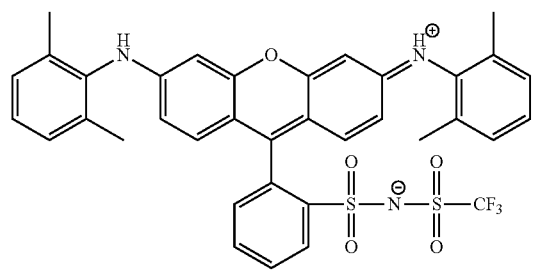
(A-1)
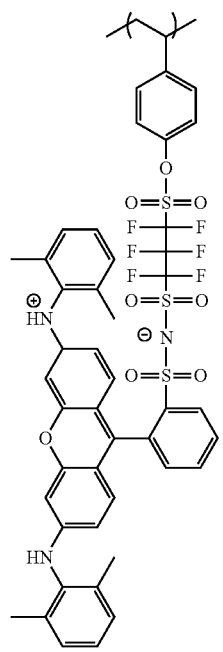
(A'-13)
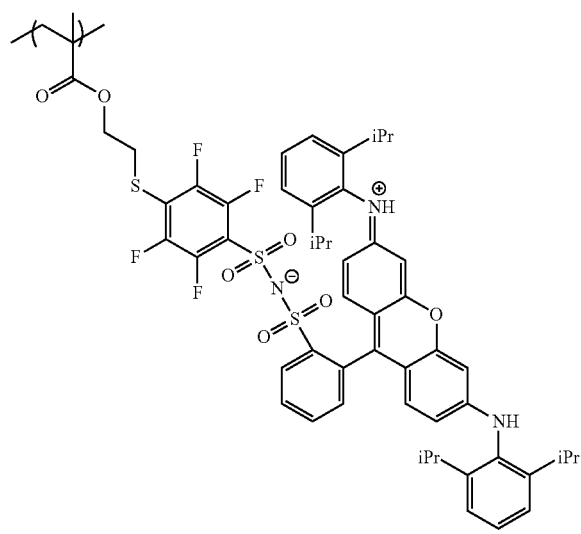
(A'-14)
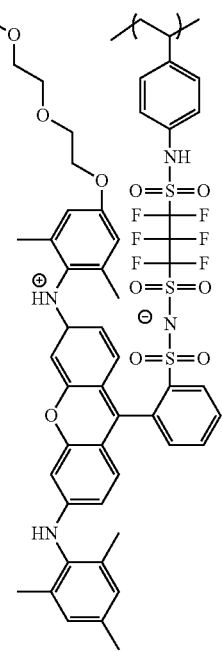
(A'-15)

-continued
(A'-16)
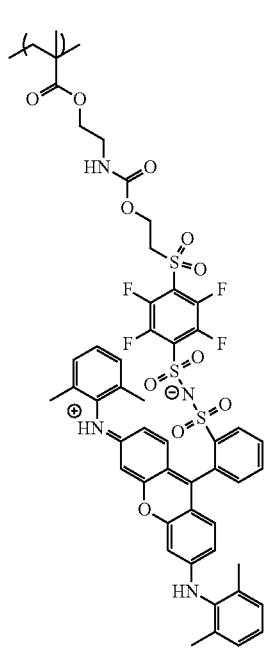
(A'-17)
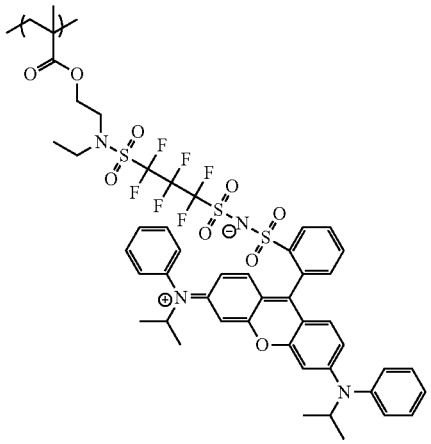
(A'-18)
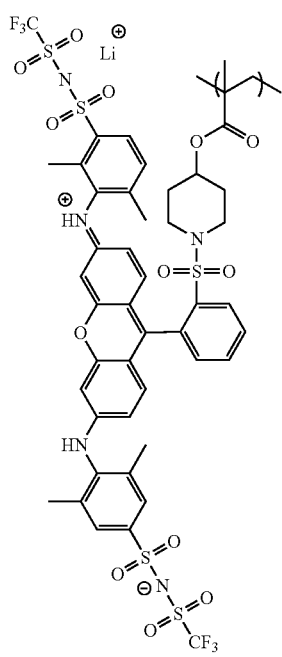
(A'-19)
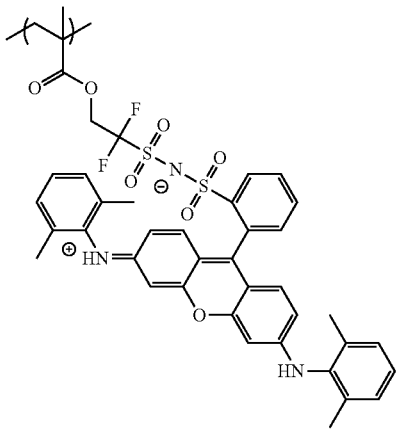

(A'-20)
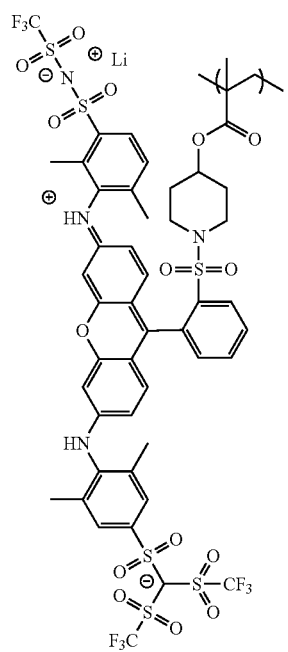
(A'-21)
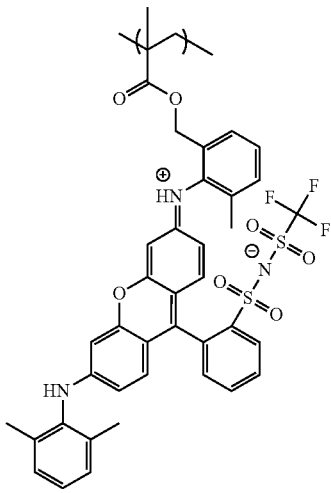
(A'-22)
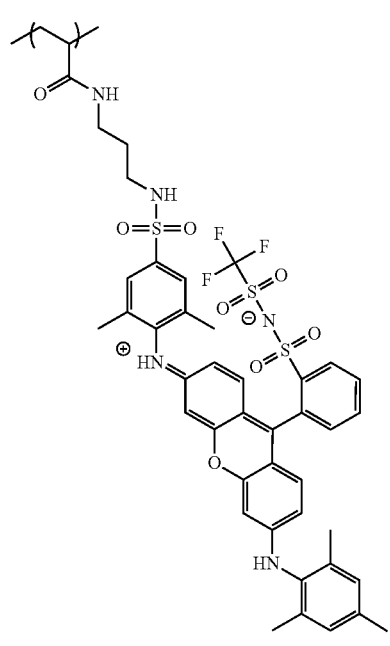
(A'-23)
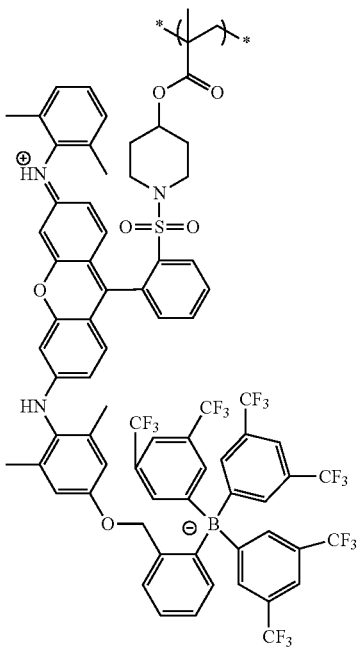

-continued
(A'-24)
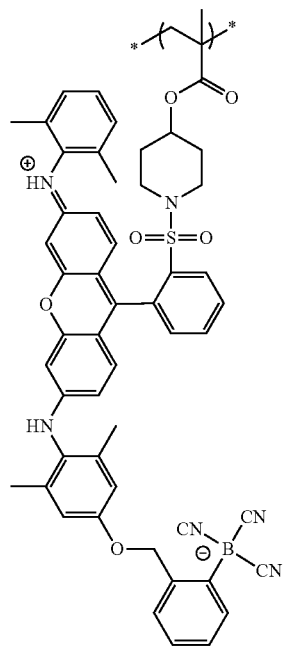
(A'-25)
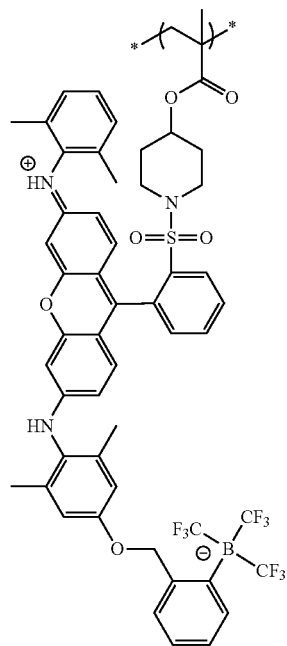
(A'-26)
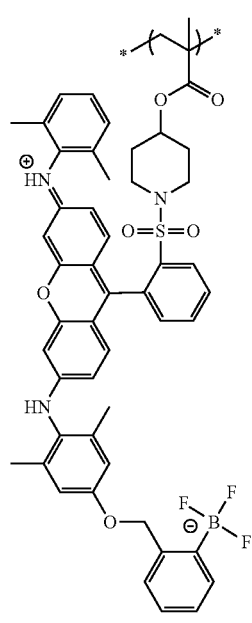
(A'-27)
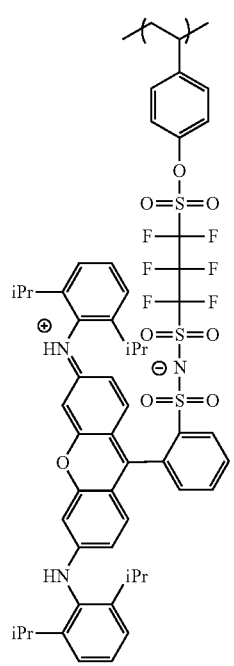

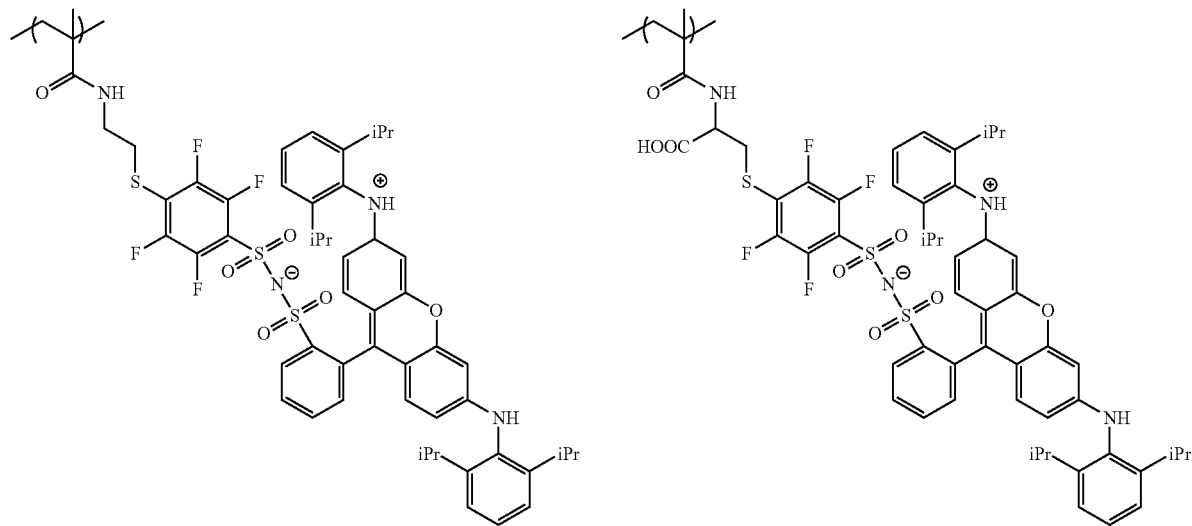
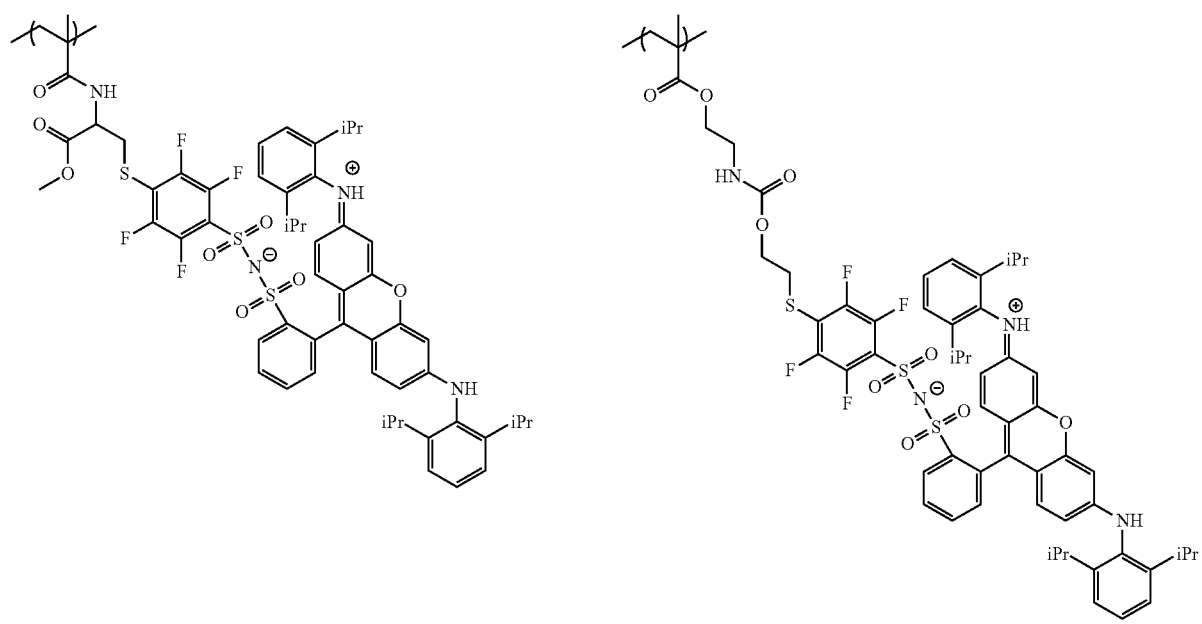

-continued
(A'-32)
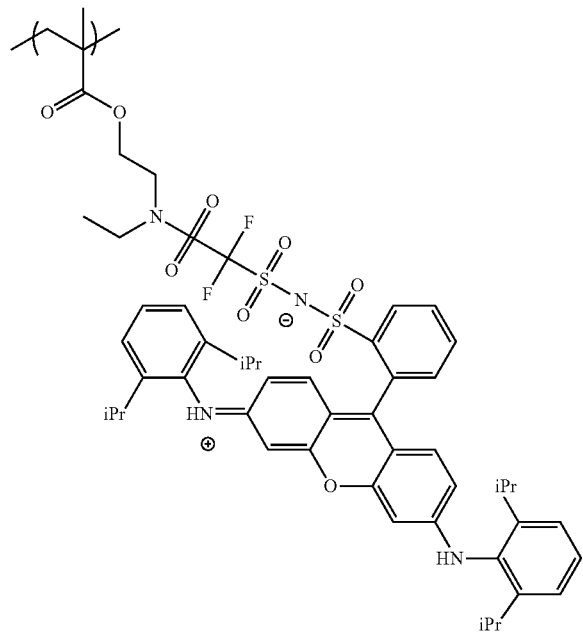
(A'-32)
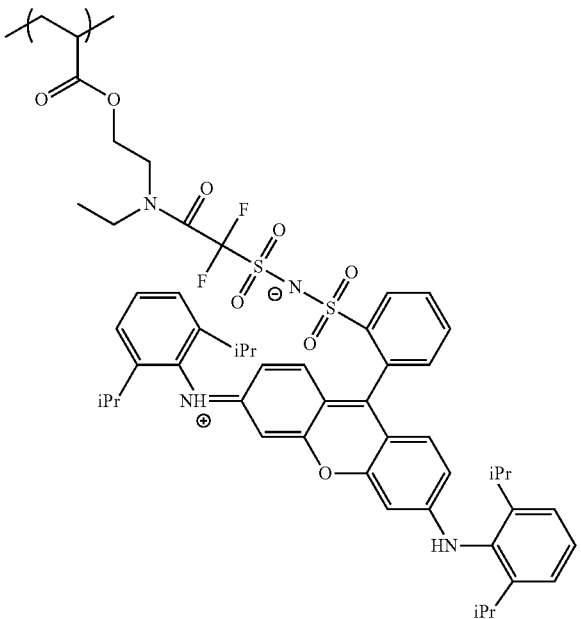
(A'-34)
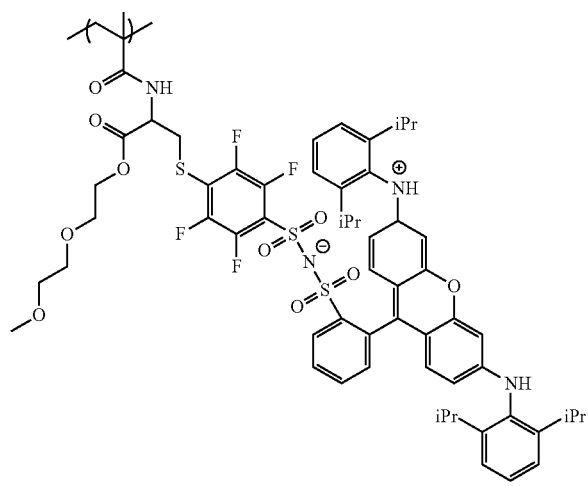
(A'-35)
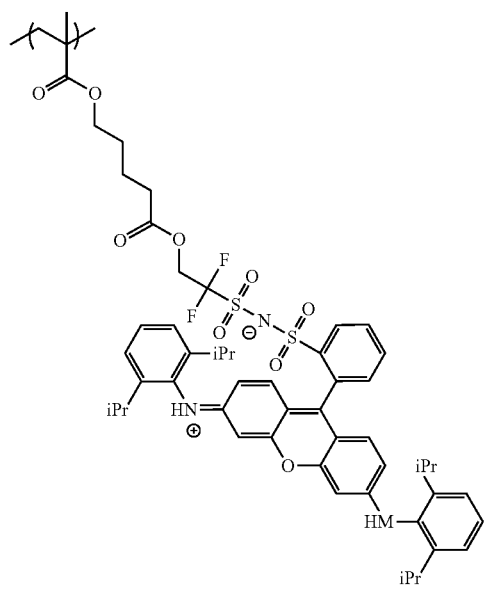

(A'-36)

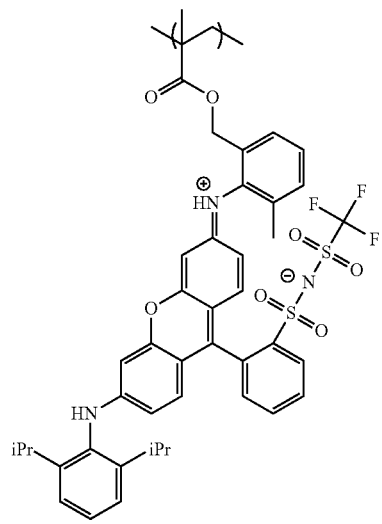

(A'-37)

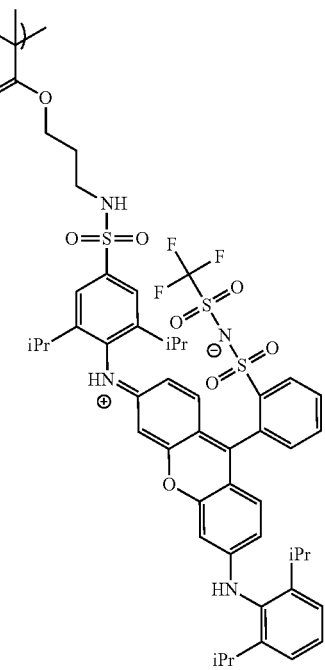

(A'-38)

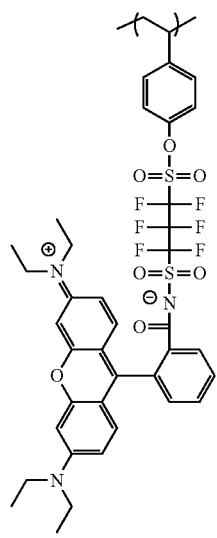

(A'-39)

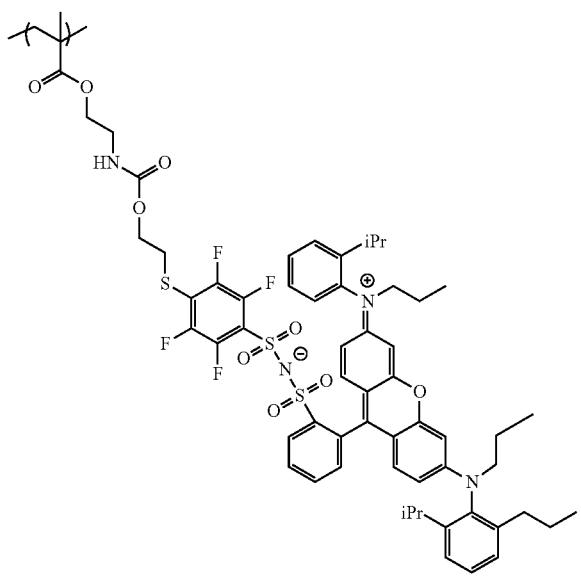

<<Cyanine Dye>>

One of the embodiments of the dye compound (A) is one having a partial structure derived from a cyanine dye (cyanine compound). Examples of the dye compound (A) include a dye compound which has a partial structure derived from a compound represented by the following General Formula (PM) (cyanine compound) as the partial structure of the dye site. The cyanine compounds in the present invention collectively refer to compounds having a dye site containing a cyanine skeleton in the molecule.

General Formula (PM)

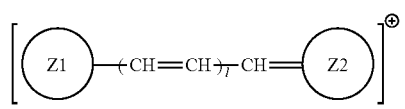

(In General Formula (PM), a ring Z1 and a ring Z2 each independently represent a heterocycle which may have a substituent. 1 represents an integer of 0 to 3.)

Examples of the ring Z1 and the ring Z2 each independently include oxazole, benzoxazole, oxazoline, thiazole, thiazoline, benzothiazole, indolenine, benzoindolenine, and 1,3-thiadiazine.

Examples of the substituents which may be contained in the ring Z1 and the ring Z2 include the substituent group A which will be described later.

The compound represented by General Formula (PM) is preferably a compound represented by the following General Formula (PM-2).

General Formula (PM-2)

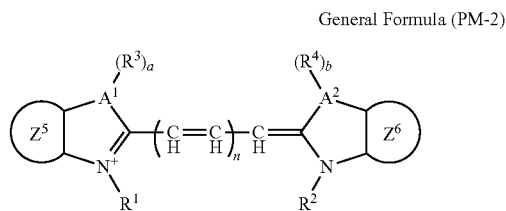

(In General Formula (PM-2), the ring $Z^5$ and the ring $Z^6$ each independently represent a benzene ring which may have a substituent or a naphthalene ring which may have a substituent.

n represents an integer of 0 to 3.

$A^1$ and $A^2$ each independently represent an oxygen atom, a sulfur atom, a selenium atom, a carbon atom, or a nitrogen atom.

$R^1$ and $R^2$ each independently represent a monovalent aliphatic hydrocarbon group having 1 to 20 carbon atoms, which may have a substituent.

$R^3$ and $R^4$ each independently represent a hydrogen atom, a monovalent aliphatic hydrocarbon group having 1 to 6 carbon atoms, or a divalent aliphatic hydrocarbon group having 2 to 6 carbon atoms, which is formed when one $R^3$ and one $R^4$ are combined with each other.

a and b each independently represent an integer of 0 to 2.)

The following (pm-1) to (pm-17) are examples of the dye structure of the cyanine compound, but the present invention is not limited thereto.

(pm-1)

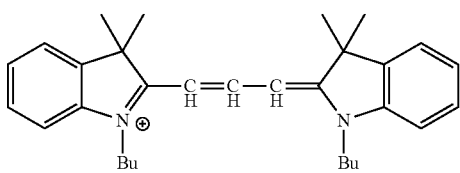

(pm-2)

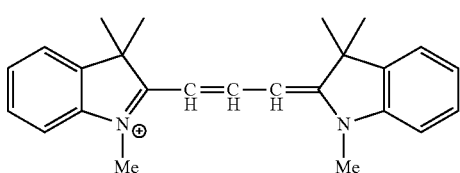

(pm-3)

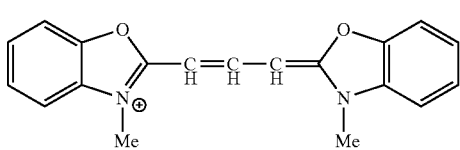

(pm-4)

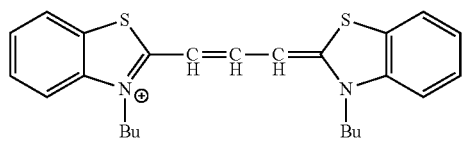

(pm-5)

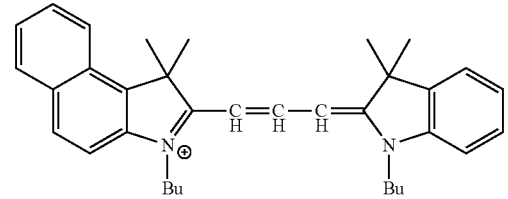

(pm-6)

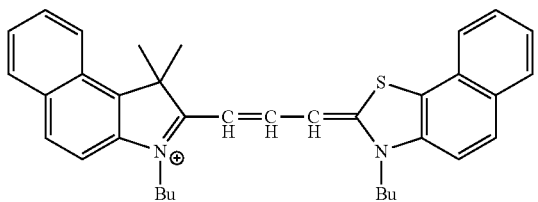

(pm-7)

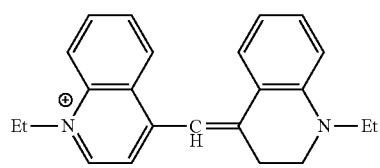

(pm-8)

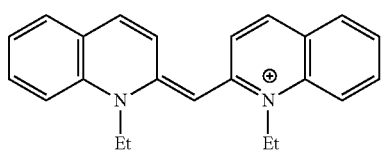

(pm-9)

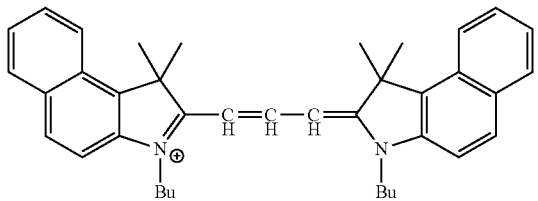

(pm-10)

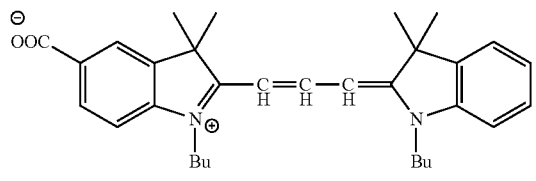

(pm-11)

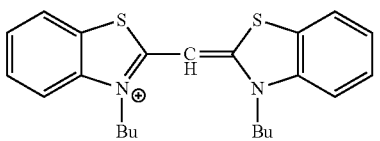

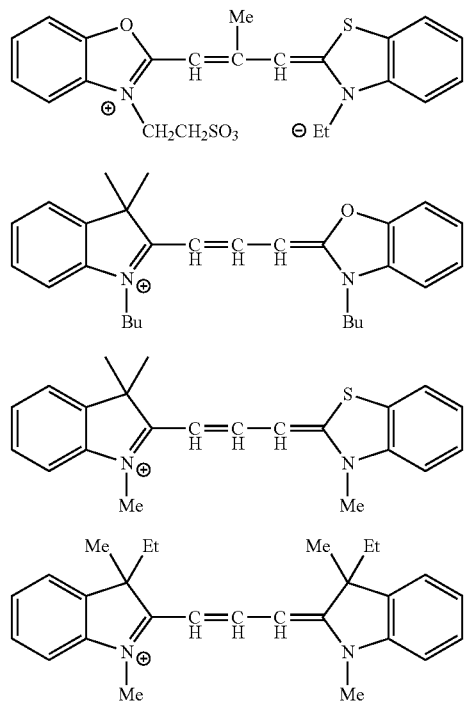
(pm-12)
(pm-13)
(pm-14)
(pm-15)
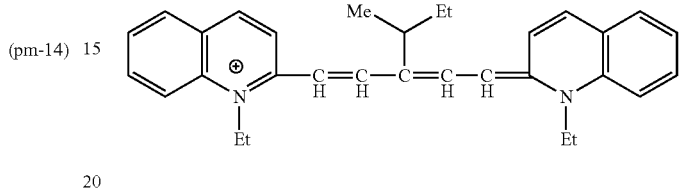
(pm-16)
(pm-17)
Furthermore, the following A-pm-1 to A-pm-4 are specific examples of the cyanine compound, but the present invention is not limited thereto. Further, polymers containing repeating units derived from compounds (A-pm-1, A-pm-2 and A-pm-4) containing a polymerizable group are also included in the dye compound (A) of the present invention.
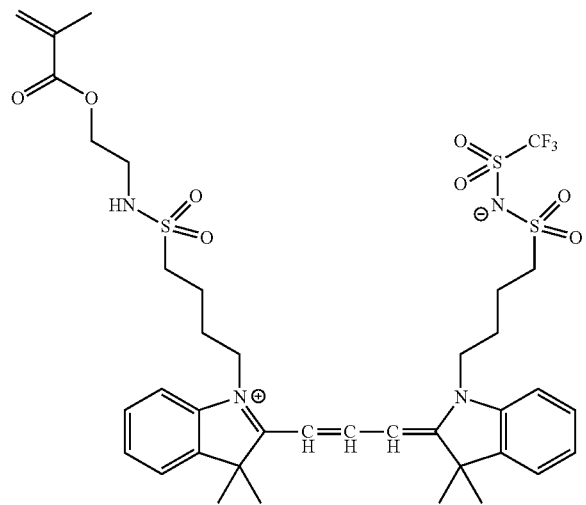
(A-pm-1)
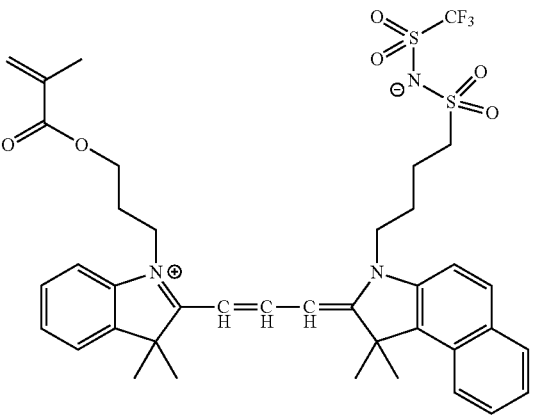
(A-pm-2)
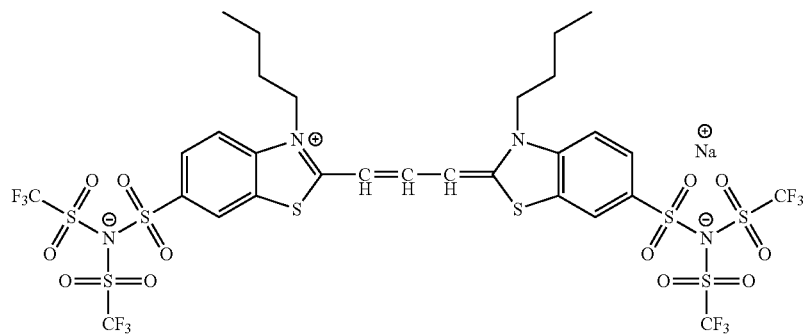
(A-pm-3)

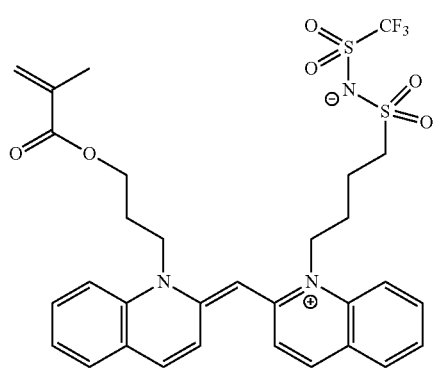

(A-pm-4)

<<Squarylium Dye>>

The dye compound (A) may have a squarylium dye structure. As the squarylium dye, a dye represented by the following General Formula (K) is preferable.

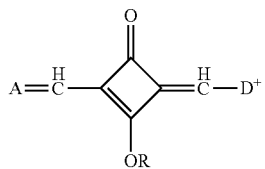

General Formula (K)

(In the formula, A and D each independently represent an aryl group or a heterocyclic group, R represents an alkyl group or an aryl group, and X⁻ represents a weakly nucleophilic anion structure.)

In General Formula (K), A and D each independently represent an aryl group or a heterocyclic group, and D is in a cationic structure. The aryl group is preferably an aryl group having 6 to 48 carbon atoms, and more preferably an aryl group having 6 to 24 carbon atoms, and examples thereof include phenyl and naphthyl. The heterocyclic group is preferably a heterocyclic group of a 5- or 6-membered ring, and examples thereof include pyrrolyl, imidazoyl, pyrazoyl, thienyl, pyridyl, pyrimidyl, pyridazyl, triazol-1-yl, thienyl, furyl, and thiadiazolyl. A and B may be a condensed ring of an aryl group and a heterocyclic group.

R represents an alkyl group or an aryl group. The alkyl group is preferably a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group). Examples of the aryl group include an aryl group preferably having 6 to 36 carbon atoms, and more preferably having 6 to 18 carbon atoms, for example, a phenyl group and a naphthyl group.

As the compound represented by General Formula (K), in particular, a compound represented by the following General Formula (K-1) or the following General Formula (K-2) is preferable.

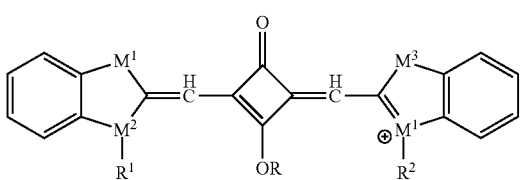

General Formula (K-1)

(In General Formula (K-1), $M^1$, $M^2$, $M^3$, and $M^4$ each independently represent an oxygen atom, a sulfur atom, or a nitrogen atom, and R, $R^1$, and $R^2$ each independently represent an alkyl group or an aryl group.)

In General Formula (K-1), $M^1$, $M^2$, $M^3$, and $M^4$ each independently represent an oxygen atom, a sulfur atom, or a nitrogen atom, among which a sulfur atom and a nitrogen atom are preferable. $M^1$ and $M^3$ are preferably the same atoms, and $M^2$ and $M^4$ are preferably the same atoms.

R, $R^1$, and $R^2$ in General Formula (K-1) have the same definitions as R in General Formula (K), and preferred ranges thereof are also the same.

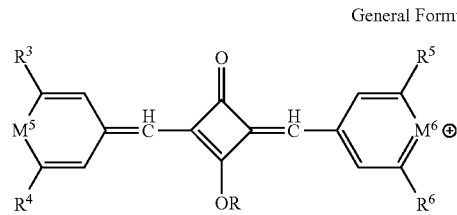

General Formula (K-2)

(In General Formula (K-2), $M^5$ and $M^6$ each independently represent an oxygen atom, a sulfur atom, or a nitrogen atom, and R, $R^1$, $R^2$, $R^3$, $R^4$, $R^5$, and $R^6$ each independently represent an alkyl group or an aryl group.)

In General Formula (K-2), $M^5$ and $M^6$ have the same definitions as $M^1$ to $M^4$ in General Formula (K-1), and preferred ranges thereof are also the same. $M^5$ and $M^6$ are preferably the same atoms.

R, $R^1$, $R^2$, $R^3$, $R^4$, $R^5$, and $R^6$ in General Formula (K-2) have the same definitions as R in General Formula (K), and preferred ranges thereof are also the same.

As the compound represented by General Formula (K-1), a compound represented by the following General Formula (K-3) is preferable, and as the compound represented by General Formula (K-2), a compound represented by the following General Formula (K-4) is preferable.

General Formula (K-3)

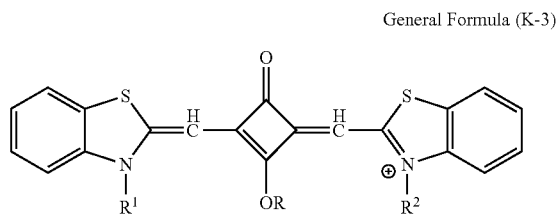

(In General Formula (K-3), R, $R^1$, and $R^2$ each independently represent an alkyl group or an aryl group.)

R, $R^1$, and $R^2$ in General Formula (K-3) have the same definitions as R in General Formula (K), and preferred ranges thereof are also the same.

General Formula (K-4)

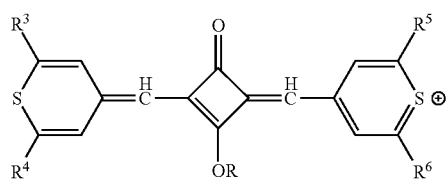

(In General Formula (K-4), R, $R^1$, $R^2$, $R^3$, $R^4$, $R^5$, and $R^6$ each independently represent an alkyl group or an aryl group.)

R, $R^1$, $R^2$, $R^3$, $R^4$, $R^5$, and $R^6$ in General Formula (K-4) have the same definitions as R in General Formula (K), and preferred ranges thereof are also the same.

The following (sm-1) and (sm-2) are the examples of the dye structure, but the present invention is not limited thereto.

(sm-1)

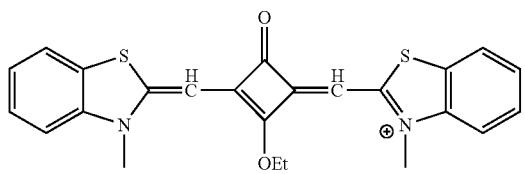

(sm-2)

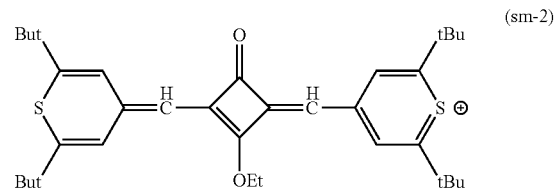

In addition, the following (sm-3) and (sm-4) are the examples of the squarylium compound, but the present invention is not limited thereto.

(sm-3)

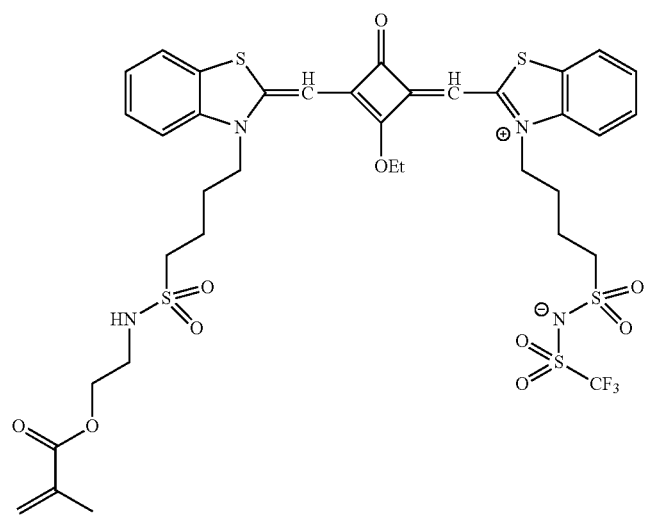

(sm-4)

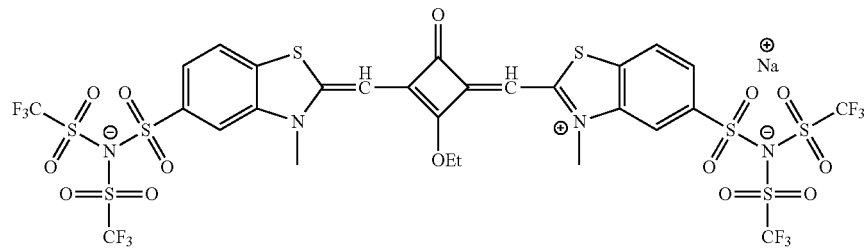

<<<Dipyrromethene Dye>>>
One of the embodiments of the dye compound (A) is a dye compound having a partial structure derived from a dipyrromethene dye shown below as the partial structure of a dye site.

As the dipyrromethene dye in the present invention, a dipyrromethene compound and a dipyrromethene metal complex compound obtained from a dipyrromethene compound with a metal or a metal compound are preferable.

Furthermore, in the present invention, a compound having a dipyrromethene structure is referred to as a dipyrromethene compound, and a complex in which a metal or a metal compound is coordinated to the compound having a dipyrromethene structure is referred to as a dipyrromethene metal complex compound.

As the dipyrromethene metal complex compound, a dipyrromethene metal complex compound obtained from a dipyrromethene compound represented by the following General Formula (M) with a metal or a metal compound and a tautomer thereof are preferable. Among these, a dipyrromethene metal complex compound represented by the following General Formula (7) and a dipyrromethene metal complex compound represented by the following General Formula (8) are exemplified as preferred embodiments, and the dipyrromethene metal complex compound represented by the following General Formula (8) is more preferable.

<<<Dipyrromethene Metal Complex Compound Obtained from Dipyrromethene Compound Represented by General Formula (M) with Metal or a Metal Compound, and Tautomer Thereof>>>

One of the preferred embodiments of the dye structure in the dye compound (A) is a dye structure which contains, as a dye site, a complex (hereinafter appropriately referred to as a "specific complex") in which a compound (dipyrromethene compound) represented by the following General Formula (M) or a tautomer thereof is coordinated to a metal or a metal compound. In the present invention, the following compound forms a cationic structure, and for example, a metal such as zinc, bonded to a nitrogen atom of General Formula (M), can form cation.

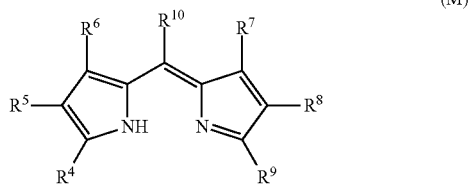

(M)

(In General Formula (M), $R^4$ to $R^{10}$ each independently represent a hydrogen atom or a monovalent substituent, provided that there is no case where $R^4$ and $R^9$ are bonded to each other to form a ring.)

In the case where the compound represented by General Formula (M) is introduced into structural units represented by General Formulae (A) to (C), or a multimer represented by General Formula (D), which will be described later, the introduction site is not particularly limited. However, in view of synthesis suitability, the compound is preferably introduced at any one site of $R^4$ to $R^9$, more preferably introduced at any one site of $R^4$, $R^6$, $R^7$, and $R^9$, and still more preferably introduced at any one site of $R^4$ and $R^9$.

In the case where $R^4$ to $R^9$ in General Formula (M) represent a monovalent substituent, examples of the monovalent substituent include the substituents exemplified in the section of the substituent group A as described above.

In the case where the monovalent substituents represented by $R^4$ to $R^9$ in General Formula (M) are each a group which can be further substituted, the group may further have the substituent(s) described for $R^4$ to $R^9$, and in the case where the group has two or more substituents, these substituents may be the same as or different from each other.

In General Formula (M), $R^4$ and $R^5$, $R^5$ and $R^6$, $R^7$ and $R^8$, and $R^8$ and $R^9$ may be each independently bonded to each other to form a 5-, 6-, or 7-membered saturated or unsaturated ring. There is no case where $R^4$ and $R^9$ are bonded to each other to form a ring. In the case where the formed 5-, 6-, or 7-membered ring is a group which can be further substituted, the ring may be substituted with the substituents described for $R^4$ to $R^9$, and in the case where the ring is substituted with two or more substituents, these substituents may be the same as or different from each other.

In General Formula (M), in the case where $R^4$ and $R^5$, $R^5$ and $R^6$, $R^7$ and $R^8$, and $R^8$ and $R^9$ are each independently bonded to each other to form a 5-, 6-, or 7-membered saturated or unsaturated ring not having a substituent, examples of the 5-, 6-, or 7-membered saturated or unsaturated ring not having a substituent include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring or a pyridine ring.

$R^{10}$ in General Formula (M) preferably represents a hydrogen atom, a halogen atom, an alkyl group, an aryl group, or a heterocyclic group. The halogen atom, the alkyl group, the aryl group, and the heterocyclic group have the same definitions as those of the halogen atom, the alkyl group, the aryl group, and the heterocyclic group, respectively, described in the section of the substituent group A as described above, and a preferred range thereof is also the same.

In the case where $R^{10}$ represents an alkyl group, an aryl group, or a heterocyclic group, if the alkyl group, the aryl group, and the heterocyclic group are groups which can be further substituted, they may be substituted with the substituents described in the section of the substituent group A as described above. In the case where the groups are substituted with two or more substituents, the substituents may be the same as or different from each other.

~Metal or Metal Compound~
The specific complex in the present invention is the complex in which the dipyrromethene compound represented by General Formula (M) as described above or a tautomer thereof is coordinated to a metal or a metal compound.

Here, the metal or metal compound may be any types of metal or metal compound as long as they can form a complex, and examples thereof include a divalent metal atom, a divalent metal oxide, a divalent metal hydroxide, and a divalent metal chloride. Examples of the metal or metal compound include metals such as Zn, Mg, Si, Sn, Rh, Pt, Pd, Mo, Mn, Pb, Cu, Ni, Co, and Fe, metal chlorides such as AlCl, InCl, FeCl, TiCl$_2$, SnCl$_2$, SiCl$_2$, and GeCl$_2$, metal oxides such as TiO and VO, and metal hydroxides such as Si(OH)$_2$.

Among these, in view of the stability, spectral characteristics, heat resistance, light fastness, and production suitability of the complex, Fe, Zn, Mg, Si, Pt, Pd, Mo, Mn, Cu, Ni, Co, TiO, or VO is preferable, Zn, Mg, Si, Pt, Pd, Cu, Ni, Co, or VO is more preferable, and Zn is particularly preferable.

Next, a more preferred range of the specific complex of the compound represented by General Formula (M) in the present invention will be described.

A preferred range of the specific complex in the present invention is a range in which in General Formula (M), $R^4$ and $R^9$ are each independently a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; $R^5$ and $R^8$ are each independently a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; $R^6$ and $R^7$ are each independently a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{10}$ is a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or V=O.

A more preferred range of the specific complex in the present invention is a range in which in General Formula (M), $R^4$ and $R^9$ are each a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, a ureido group, an imide group, an alkoxycarbonylamino group, an aryloxycarbonylamino group, a sulfonamide group, an azo group, an alkylsulfonyl group, an arylsulfonyl group, or a phosphinoylamino group; $R^5$ and $R^8$ are each independently an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an aryl sulfonyl group, or a sulfamoyl group; $R^6$ and $R^7$ are each independently a hydrogen atom, an alkyl group, an alkenyl group, an aryl group, a heterocyclic group, a cyano group, an acyl group, an alkoxycarbonyl group, a carbamoyl group, a carbonamide group, a ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group; $R^{10}$ is a hydrogen atom, a halogen atom, an alkyl group, an aryl group, or a heterocyclic group; and the metal or metal compound is Zn, Mg, Si, Pt, Pd, Cu, Ni, Co, or V=O.

A particularly preferred range of the specific complex in the present invention is a range in which in General Formula (M), $R^4$ and $R^9$ are each a hydrogen atom, an alkyl group, an aryl group, a heterocyclic group, an amino group, a heterocyclic amino group, a carbonamide group, a ureido group, an imide group, an alkoxycarbonylamino group, a sulfonamide group, an azo group, an alkylsulfonyl group, an arylsulfonyl group, or a phosphinoylamino group; $R^5$ and $R^8$ are each independently an alkyl group, an aryl group, a heterocyclic group, a cyano group, an acyl group, an alkoxycarbonyl group, a carbamoyl group, an alkylsulfonyl group, or an arylsulfonyl group; $R^6$ and $R^7$ are each independently a hydrogen atom, an alkyl group, an aryl group, or a heterocyclic group; $R^{10}$ is a hydrogen atom, an alkyl group, an aryl group, or a heterocyclic group; and the metal or metal compound is Zn, Cu, Co, or V=O.

Moreover, a dipyrromethene metal complex compound represented by General Formula (7) or (8), which will be described in detail below, is also a particularly preferred embodiment of the dipyrromethene dye.

<<Dipyrromethene Metal Complex Compound Represented by General Formula (7)>>

One of the suitable embodiments of the dye structure in the dye dimer (A) is a dye structure derived from a dipyrromethene metal complex compound represented by the following General Formula (7).

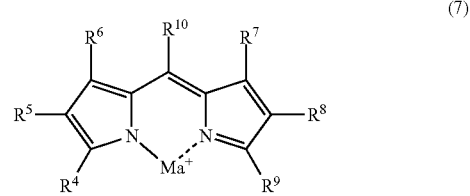

(In General Formula (7), $R^4$ to $R^9$ each independently represent a hydrogen atom or a monovalent substituent, and $R^{10}$ represents a hydrogen atom, a halogen atom, an alkyl group, an aryl group, or a heterocyclic group. Ma represents a metal atom or a metal compound, provided that there is no case where $R^4$ and $R^9$ are bonded to each other to form a ring.)

Incidentally, the dipyrromethene metal complex compound represented by General Formula (7) includes a tautomer.

In the case where the dipyrromethene metal complex compound represented by General Formula (7) is introduced into a multimer, the introduction site is not particularly limited. However, in view of synthesis suitability, the compound is preferably introduced at any one site of $R^4$ to $R^9$, more preferably introduced at any one site of $R^4$, $R^6$, $R^7$, and $R^9$, and still more preferably introduced at any one site of $R^4$ and $R^9$.

In the case where the dye structure has an alkali-soluble group, as a method for introducing the alkali-soluble group, a method for introducing the alkali-soluble group to one, two, or more substituents out of $R^4$ to $R^{10}$ in General Formula (7) can be used. Among these substituents, any one of $R^4$ to $R^9$ and $X^1$ is preferable, any one of $R^4$, $R^6$, $R^7$, and $R^9$ is more preferable, and any one of $R^4$ and $R^9$ is still more preferable.

The dipyrromethene metal complex compound represented by General Formula (7) may have a functional group other than the alkali-soluble group as long as the effects of the present invention are not diminished.

$R^4$ to $R^9$ in General Formula (7) have the same definitions as $R^4$ to $R^9$ in General Formula (M), and preferred embodiments thereof are also the same.

In General Formula (7), Ma represents a metal atom or a metal compound. The metal atom or metal compound may be any type as long as it is a metal atom or a metal compound which can form a complex, and examples thereof include a divalent metal atom a divalent metal oxide, a divalent metal hydroxide, or a divalent metal chloride.

Examples of the metal atom or metal compound include Zn, Mg, Si, Sn, Rh, Pt, Pd, Mo, Mn, Pb, Cu, Ni, Co, and Fe; metal chlorides such as AlCl, InCl, FeCl, $TiCl_2$, $SnCl_2$, $SiCl_2$, and $GeCl_2$; metal oxides such as TiO and V=O; and metal hydroxides such as $Si(OH)_2$.

Among these, in view of stability, spectral characteristics, heat resistance, light fastness, and production suitability of the complex, as the metal atom or metal compound, Fe, Zn, Mg, Si, Pt, Pd, Mo, Mn, Cu, Ni, Co, TiO, and V=O are preferable, Zn, Mg, Si, Pt, Pd, Cu, Ni, Co, and V=O are more preferable, Zn, Co, V=O, and Cu are still more preferable, and Zn is particularly preferable.

Furthermore, in General Formula (7). $R^{10}$ represents a hydrogen atom, a halogen atom, an alkyl group, an aryl group, or a heterocyclic group, and is preferably a hydrogen atom.

A preferred embodiment of the compound represented by General Formula (7) is an embodiment in which $R^4$ to $R^9$ are each independently the preferred embodiments as mentioned in the description of $R^4$ to $R^9$; and $R^{10}$ is the preferred embodiment as mentioned in the description of $R^{10}$, and Ma is Zn, Cu, Co, or V=O.

<<<Dipyrromethene Metal Complex Compound Represented by General Formula (8)>>> One of suitable embodiments of the dye structure in the dye compound (A) is a dye structure derived from a dipyrromethene metal complex compound represented by the following General Formula (8).

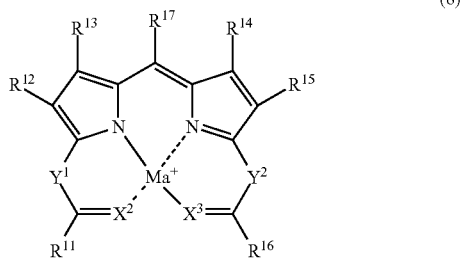

(8)

(In General Formula (8), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group. $R^{12}$ to $R^{15}$ each independently represent a hydrogen atom or a substituent. $R^{17}$ represents a hydrogen atom a halogen atom, an alkyl group, an aryl group, or a heterocyclic group. Ma represents a metal atom or a metal compound. $X^2$ and $X^3$ each independently represent NR (R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom $Y^1$ and $Y^2$ each independently represent NR (R represents a hydrogen atom, an alkyl group, an alkenyl group, an aryl group, a heterocyclic group, an acyl group, an alkylsulfonyl group, or an arylsulfonyl group), a nitrogen atom or a carbon atom $R^{11}$ and $Y^1$ may be bonded to each other to form a 5-, 6-, or 7-membered ring, and $R^{16}$ and $Y^2$ may be bonded to each other to form a 5-, 6-, or 7-membered ring.)

Incidentally, the dipyrromethene metal complex compound represented by General Formula (8) includes a tautomer.

The site at which the dipyrromethene metal complex compound represented by General Formula (8) is introduced into a multimer is not particularly limited as long as the effects of the present invention are not diminished. However, the site is preferably at least one of $R^{11}$ to $R^{17}$, and $Y^1$ to $Y^2$. Among these, in view of synthesis suitability, it is preferable that the compound is introduced at one of $R^{11}$ to $R^{16}$. In a more preferred embodiment, the compound is introduced at one of $R^{11}$, $R^{13}$, $R^{14}$, and $R^{16}$. In a still more preferred embodiment, the compound is introduced at one of $R^{11}$ and $R^{16}$.

In the case where the dye structure has an alkali-soluble group, if a dye monomer or a structural unit having the alkali-soluble group is used as a method for introducing the alkali-soluble group, it is possible to use a method for introducing the alkali-soluble group into one, two, or more substituents out of $R^{11}$ to $R^{17}$, and $Y^1$ to $Y^2$ in General Formula (8). Among these substituents, one of $R^{11}$ to $R^{16}$ is preferable, one of $R^{11}$, $R^{13}$, $R^{14}$, and $R^{16}$ is more preferable, and one of $R^{11}$ and $R^{16}$ is still more preferable.

The dipyrromethene metal complex compound represented by General Formula (8) may have a functional group other than the alkali-soluble group as long as the effects of the present invention are not diminished.

In General Formula (8), $R^{12}$ to $R^{15}$ have the same definitions as $R^5$ to $R^8$ in General Formula (M), and preferred embodiments thereof are also the same. $R^{17}$ has the same definition as $R^{10}$ in General Formula (M), and preferred embodiments thereof are also the same. Ma has the same definition as Ma in General Formula (7), and preferred ranges thereof are also the same.

More specifically, among $R^{12}$ to $R^{15}$ in General Formula (8), as $R^{12}$ and $R^{15}$, an alkoxycarbonyl group, an aryloxycarbonyl group, a carbamoyl group, an alkylsulfonyl group, an arylsulfonyl group, a nitrile group, an imide group, and a carbamoylsulfonyl group are preferable, an alkoxycarbonyl group, an aryloxycarbonyl group, a carbamoyl group, an alkylsulfonyl group, a nitrile group, an imide group, and a carbamoylsulfonyl group are more preferable, an alkoxycarbonyl group, an aryloxycarbonyl group, a carbamoyl group, a nitrile group, an imide group, and a carbamoylsulfonyl group are still more preferable, and an alkoxycarbonyl group, an aryloxycarbonyl group, and a carbamoyl group are particularly preferable.

As $R^{13}$ and $R^{14}$, a substituted or unsubstituted alkyl group, a substituted or unsubstituted aryl group, and a substituted or unsubstituted heterocyclic group are preferable, and a substituted or unsubstituted alkyl group and a substituted or unsubstituted aryl group are more preferable. Specific examples of the more preferable alkyl group, an aryl group, and heterocyclic group include the same specific examples as listed for $R^6$ and $R^7$ of General Formula (M).

In General Formula (8), $R^{11}$ and $R^{16}$ each represent an alkyl group (a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group), an alkenyl group (an alkenyl group preferably having 2 to 24 carbon atoms, and more preferably having 2 to 12 carbon atoms, for example, a vinyl group, an allyl group, and a 3-buten-1-yl group), an aryl group (an aryl group preferably having 6 to 36 carbon atoms, and more preferably having 6 to 18 carbon atoms, for example, a phenyl group and a naphthyl group), a heterocyclic group (a heterocyclic group preferably having 1 to 24 carbon atoms, and more preferably having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, and a benzotriazol-1-yl group), an alkoxy group (an alkoxy group preferably having 1 to 36 carbon atoms, and more preferably having 1 to 18 carbon atoms, for example, a methoxy group, an ethoxy group, a propyloxy group, a butoxy group, a hexyloxy group, a 2-ethylhexyloxy group, a dodecyloxy group, and a cyclohexyloxy group), an aryloxy group (an aryloxy group preferably having 6 to 24 carbon atoms, and more preferably having 1 to 18 carbon atoms, for example, a phenoxy group and a naphthyloxy group), an alkylamino group (an alkylamino group preferably having 1 to 36 carbon atoms, and more preferably having 1 to 18 carbon atoms, for example, a methylamino group, an ethylamino group, a propylamino group, a butylamino group, a hexylamino group, a 2-ethylhexylamino group, an isopropylamino group, a tert-butylamino group, a tert-octylamino group, a cyclohexylamino group, an N,N-diethylamino group, an N,N-dipropylamino group, an N,N-dibutylamino group, and an N-methyl-N-ethylamino group), an arylamino group (an arylamino group preferably having 6 to 36 carbon atoms, and more preferably having 6 to 18 carbon atoms, for example, a phenylamino group, a naphthylamino group, an N,N-diphenylamino group, and an N-ethyl-N-phenylamino group), or a heterocyclic amino group (a heterocyclic amino group preferably having 1 to 24 carbon atoms, and more preferably having 1 to 12 carbon atoms, for example, a 2-aminopyrrole group, a 3-aminopyrazole group, a 2-aminopyridine group, and a 3-aminopyridine group).

Among the above groups, as $R^{11}$ and $R^{16}$, an alkyl group, an alkenyl group, an aryl group, a heterocyclic group, an alkylamino group, an arylamino group, and a heterocyclic amino group are preferable, an alkyl group, an alkenyl group, an aryl group, and a heterocyclic group are more preferable, an alkyl group, an alkenyl group, and an aryl group are still more preferable, and an alkyl group is particularly preferable.

In General Formula (8), in the case where the alkyl group, the alkenyl group, the aryl group, the heterocyclic group, the alkoxy group, the aryloxy group, the alkylamino group, the arylamino group, or the heterocyclic amino group represented by $R^{11}$ and $R^{16}$ is a group which can be further substituted, the group may be substituted with the substituents described in the section of the substituent group A as described above. In the case where the group is substituted with two or more substituents, these substituents may be the same as or different from each other.

In General Formula (8), $X^2$ and $X^3$ each independently represent NR, a nitrogen atom, an oxygen atom, or a sulfur atom. Here, R represents a hydrogen atom, an alkyl group (a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group), an alkenyl group (an alkenyl group preferably having 2 to 24 carbon atoms, and more preferably having 2 to 12 carbon atoms, for example, a vinyl group, an allyl group, and a 3-buten-1-yl group), an aryl group (an aryl group preferably having 6 to 36 carbon atoms, and more preferably having 6 to 18 carbon atoms, for example, a phenyl group and a naphthyl group), a heterocyclic group (a heterocyclic group preferably having 1 to 24 carbon atoms, and more preferably having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), an acyl group (an acyl group preferably having 1 to 24 carbon atoms, and more preferably having 2 to 18 carbon atoms, for example, an acetyl group, a pivaloyl group, a 2-ethylhexyl group, a benzoyl group, and a cyclohexanoyl group), an alkylsulfonyl group (an alkylsulfonyl group preferably having 1 to 24 carbon atoms, and more preferably having 1 to 18 carbon atoms, for example, a methylsulfonyl group, an ethylsulfonyl group, an isopropylsulfonyl group, and a cyclohexylsulfonyl group), and an arylsulfonyl group (an arylsulfonyl group preferably having 6 to 24 carbon atoms, and more preferably having 6 to 18 carbon atoms, for example, a phenylsulfonyl group and a naphthylsulfonyl group).

In General Formula (8), $Y^1$ and $Y^2$ each independently represent NR, a nitrogen atom, or a carbon atom R has the same definition as R of $X^2$ and $X^3$, and the preferred embodiments thereof are also the same.

In General Formula (8), $R^{11}$ and $Y^1$ may be bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a pyridazine ring, a quinoline ring, and a quinazoline ring), or a 7-membered ring (for example, a cycloheptane ring and a hexamethylene imine ring) together with a carbon atom.

In General Formula (8), $R^{16}$ and $Y^2$ may be bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a pyridazine ring, a quinoline ring, and a quinazoline ring), or a 7-membered ring (for example, a cycloheptane ring and a hexamethyleneimine ring) together with a carbon atom.

In General Formula (8), in the case where the 5-, 6-, and 7-membered rings formed by mutual bonding of $R^{11}$ and $Y^1$ as well as $R^{16}$ and $Y^2$ are substitutable rings, the rings may be substituted with the substituents described in the section of the substituent group A as described above. In the case where the rings are substituted with two or more substituents, these substituents may be the same as or different from each other.

In General Formula (8), it is preferable that $R^{11}$ and $R^{16}$ are each independently a monovalent substituent of which an −Es' value as a steric parameter is 1.5 or more. The −Es' value is more preferably 2.0 or more, still more preferably 3.5 or more, and particularly preferably 5.0 or more.

Here, the −Es' value as a steric parameter is a parameter which represents steric bulkiness of a substituent. As the value, the −Es' value disclosed in the document (J. A. Macphee, et al. Tetrahedron. Vol. 34, pp 3553-3562, and Chemistry Special Edition 107, Structure-activity Correlation and Drug Design, edited by Toshio Fujita, published on Feb. 20, 1986 (Kagaku-Dojin Publishing Company, Inc)) is used.

A preferred embodiment of the compound represented by General Formula (8) is a preferred embodiment in which $R^{12}$ to $R^{15}$ are each independently one in the preferred embodiment cited in the description of $R^5$ to $R^8$ in General Formula (M), $R^{17}$ is one in the preferred embodiment cited in the description of $R^{10}$ in General Formula (M), Ma is Zn, Cu, Co, or V=O, $X^2$ is NR (in which R represents a hydrogen atom or an alkyl group), a nitrogen atom, or an oxygen atom, $X^3$ is NR (in which R represents a hydrogen atom or an alkyl group) or an oxygen atom, $Y^1$ is $NR^c$ (in which $R^c$ represents a hydrogen atom or an alkyl group), a nitrogen atom, or a carbon atom, $Y^2$ is a nitrogen atom or a carbon atom. $R^{11}$ and $R^{16}$ are each independently an alkyl group, an aryl group, a heterocyclic group, an alkoxy group, or an alkylamino group, $X^1$ is a group bonded via an oxygen atom. and a is 0 or 1. $R^{11}$ and $Y^1$ may be bonded to each other to form a 5- or 6-membered ring, or $R^{16}$ and $Y^2$ may be bonded to each other to form a 5- or 6-membered ring.

A more preferred embodiment of the compound represented by General Formula (8) is a preferred embodiment in which $R^{12}$ to $R^{15}$ are each independently one in the preferred embodiment cited in the description of $R^5$ to $R^8$ in the compound represented by General Formula (M), $R^{17}$ is one in the preferred embodiment cited in the description of $R^{10}$ in General Formula (M), Ma is Zn, $X^2$ and $X^3$ are each an oxygen atom. $Y^1$ is NH, $Y^2$ is a nitrogen atom, $R^{11}$ and $R^{16}$ are each independently an alkyl group, an aryl group, a heterocyclic group, an alkoxy group, or an alkylamino group, $X^1$ is a group bonded via an oxygen atom, and a is 0 or 1. $R^{11}$ and $Y^1$ may be bonded to each other to form a 5- or 6-membered ring, or $R^{16}$ and $Y^2$ may be bonded to each other to form a 5- or 6-membered ring.

From the viewpoint of coloring ability, the molar absorption coefficient of the dipyrromethene metal complex compound represented by General Formulae (7) and (8) is preferably as high as possible. Further, from the viewpoint of improving color purity, the maximum absorption wavelength λmax is preferably 520 nm to 580 nm, and more preferably 530 nm to 570 nm. If the value is within the above range, it is possible to manufacture a color filter having excellent color reproducibility by using the colored composition of the present invention.

Furthermore, an absorbance at the maximum absorption wavelength (λmax) of the dye compound (A) having a dye structure derived from a dipyrromethene dye is preferably 1,000 times or more, more preferably 10,000 times or more, and still more preferably 100,000 times or more the absorbance at 450 nm. If the ratio is within the above range, particularly in the case where a blue color filter is manufactured using the colored composition of the present invention, a color filter having a higher transmittance can be formed. Incidentally; the maximum absorption wavelength and the molar absorption coefficient are measured by a spectrophotometer Cary 5 (manufactured by Varian. Inc.).

From the viewpoint of solubility, it is preferable that the melting points of the dipyrromethene metal complex compounds represented by General Formulae (7) and (8) are not too high.

The dipyrromethene metal complex compounds represented by General Formulae (7) and (8) can be synthesized by the methods described in U.S. Pat. No. 4,774,339A, U.S. Pat. No. 5,433,896A, JP2001-240761A, JP2002-155052A, JP3614586B, Aust. J. Chem., 1965, 11, 1835-1845, J. H. Boger, et al., Heteroatom Chemistry, Vol. 1. No. 5,389 (1990), and the like. Specifically, the method described in paragraphs "0131" to "0157" of JP2008-292970A can be applied.

The following (PM-1) to (PM-10) are examples of the dye structure of the dipyrromethene compound, but the present invention is not limited thereto. In the specific examples, (PM-1) to (PM-10), Zn is a cation.

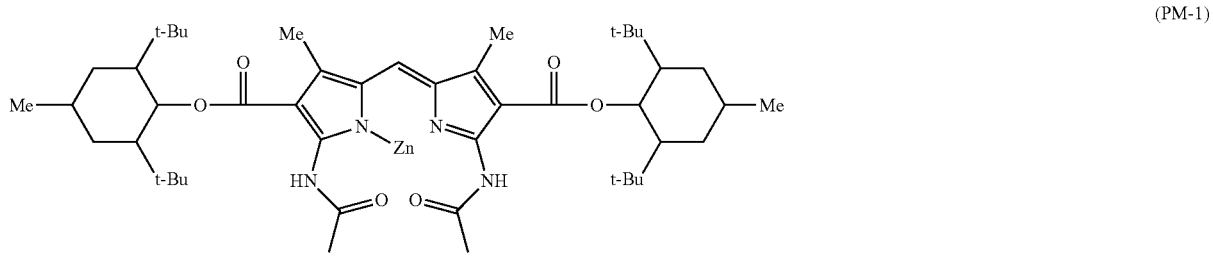

(PM-1)

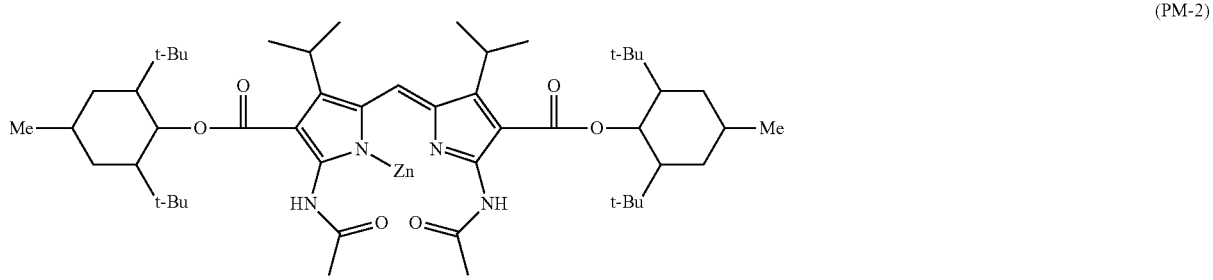

(PM-2)

(PM-3)
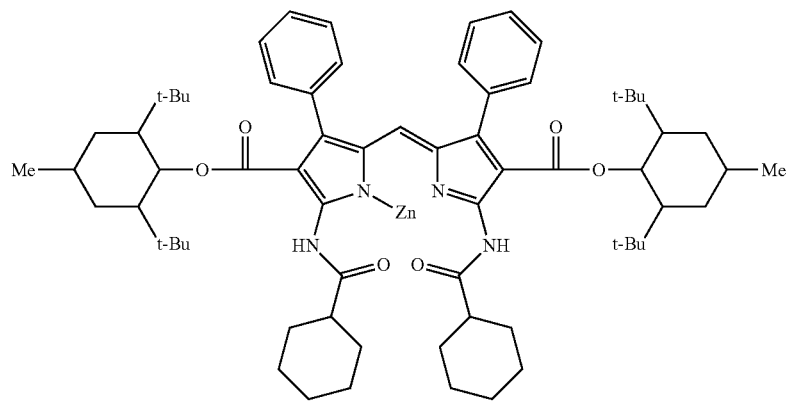
(PM-4)
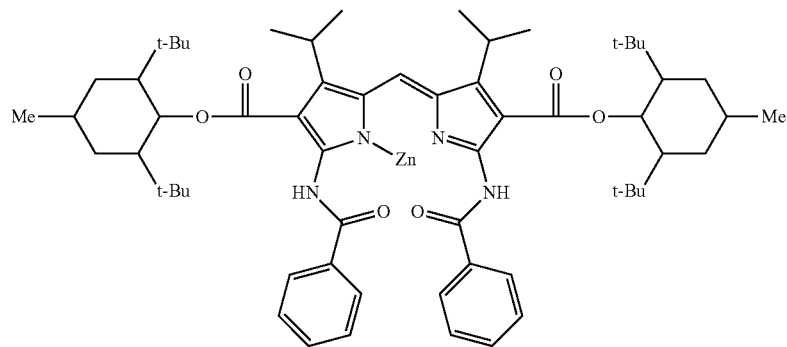
(PM-5)
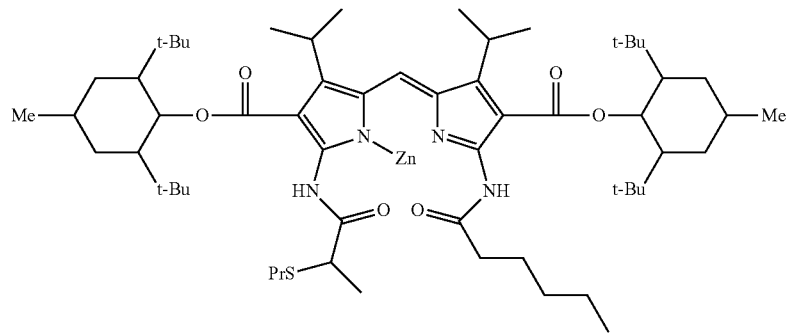

(PM-6)
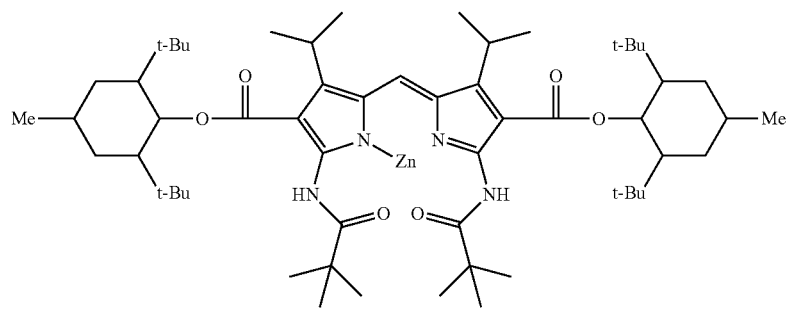
(PM-7)
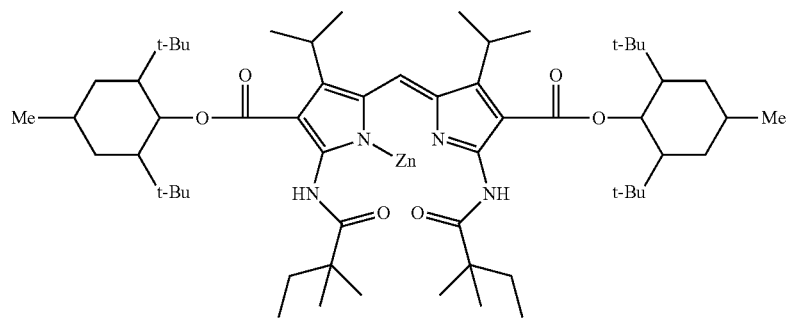
(PM-8)
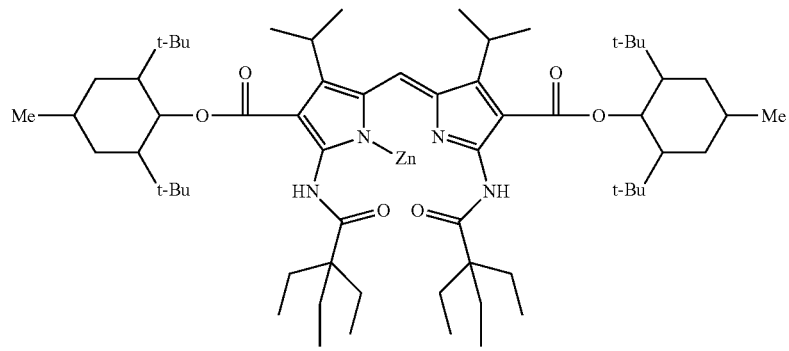
(PM-9)
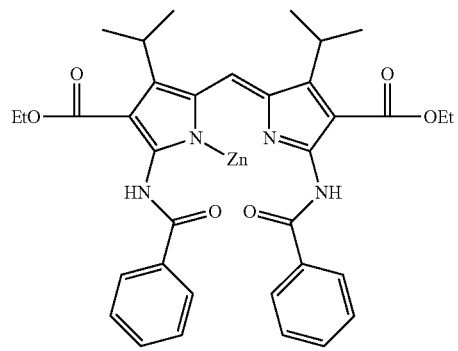
(PM-10)
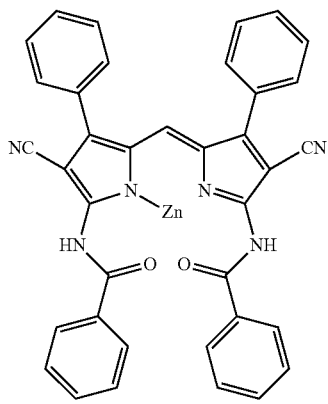
Furthermore, the following (A-PM-1) to (A-PM-4) are specific examples of the dipyrromethene compound, but the present invention is not limited thereto. Further, polymers containing repeating units derived from compounds (A-PM-1, A-PM-3, and A-PM-4) containing a polymerizable group are also included in the dye compound (A) of the present invention.

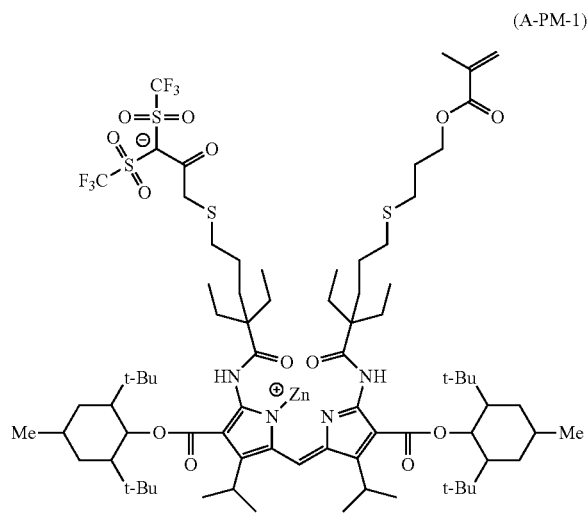

(A-PM-1)

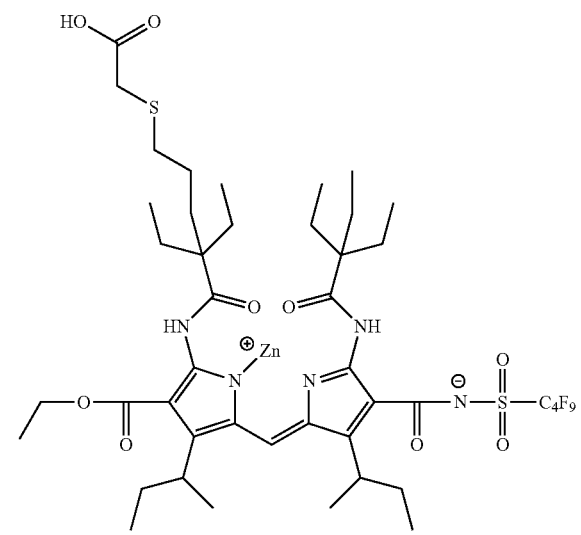

(A-PM-2)

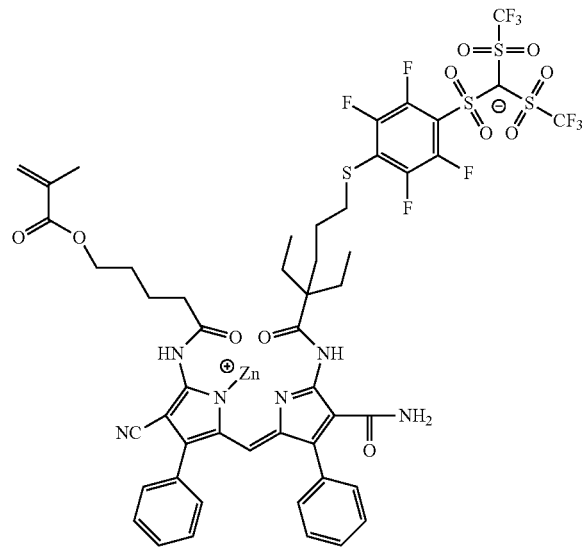

(A-PM-3)

(A-PM-4)

In the case where the dye compound which is used in the present invention is a xanthene dye, an azo dye, or a squarylium dye (preferably a xanthene dye), a red colored composition can be formed by using a combination of a red colorant (preferably a red pigment) and a yellow colorant (preferably a yellow pigment). In this case, the mass ratio of the dye compound which is used in the present invention to the red and/or yellow colorant is preferably 10:90 to 90:10.

The colored composition of the present invention is used for formation of a colored layer of the color filter. The colored composition used in the present invention preferably includes, in addition to the dye compound (A), a curable compound (B), and a solvent (C), and may include other components.

For example, in the case of forming a colored layer by a photoresist, the colored composition of the present invention is preferably a composition including a pigment and a photopolymerization initiator, in addition to the dye compound (A), an alkali-soluble resin as the curable compound, and a solvent. Further, the colored composition may include components such as a surfactant.

In addition, in the case of forming a colored layer by dry etching, the colored composition is preferably a composition including a pigment, and a photopolymerization initiator, in addition to the dye compound (A), a polymerizable compound as the curable compound, and a solvent. Further, the colored composition may include components such as a surfactant.

Details thereof will be described below.

<Curable Compound>

The colored composition of the present invention contains a curable compound. As the curable compound, known polymerizable compounds which can be crosslinked by a radical, an acid, or heat can be used. Examples thereof include polymerizable compounds having an ethylenically unsaturated bond, a cyclic ether (epoxy or oxetane), methylol, or the like. From the viewpoint of sensitivity, the polymerizable compound is suitably selected from compounds having at least one and preferably two or more terminal ethylenically unsaturated bonds. Among these, polyfunctional polymerizable compounds having 4 or more functional groups are preferable, and polyfunctional polymerizable compounds having 5 or more functional groups are more preferable.

Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a multimer thereof. The polymerizable compound in the present invention may be used alone or in combination of two or more kinds thereof.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, or a mercapto group and monofunctional or polyfunctional isocyanates or epoxies, products of a dehydration condensation reaction between the unsaturated carboxylic acid esters or amides and a monofunctional or polyfunctional carboxylic acid, and the like are also suitably used. In addition, products of an addition reaction between unsaturated carboxylic acid esters or amides having an electrophilic substituent such as an isocyanate group or an epoxy group and monofunctional or polyfunctional alcohols, amines, or thiols, and products of a substitution reaction between unsaturated carboxylic acid esters or amides having an eliminatable substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. "0095" to "0108" of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. Examples of the compound include a monofunctional acrylate or methacrylate such as polyethylene glycol mono(meth)acrylate, polypropylene glycol mono (meth)acrylate, and phenoxyethyl (meth)acrylate; a compound which is obtained by adding ethylene oxide or propylene oxide to a polyfunctional alcohol, and then (meth) acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerin, and trimethylolethane, the urethane (meth)acrylates described in JP1973-41708B (JP-S48-41708B), JP1975-6034B (JP-S50-6034B), and JP1976-37193A (JP-S51-37193A), the polyester acrylates described in JP1973-64183A (JP-S48-64183A), JP1974-43191B (JP-S49-43191B), and JP1977-30490B (JP-S52-30490B), a polyfunctional acrylate or methacrylate such as epoxy acrylate as a product of a reaction between an epoxy resin and a (meth)acrylic acid, and a mixture thereof.

Other examples thereof include a polyfunctional (meth) acrylate which is obtained by reacting a polyfunctional carboxylic acid with a compound having a cyclic ether group such as glycidyl (meth)acrylate, and an ethylenically unsaturated group.

Furthermore, as other preferred polymerizable compounds, the compounds having a fluorene ring and an ethylenically unsaturated group having 2 or more functional groups described in JP2010-160418A, JP2010-129825A, and JP4364216B, and a cardo resin can also be used.

Moreover, as the compound which has a boiling point of 100° C. or higher under normal pressure and has at least one addition-polymerizable ethylenically unsaturated group, compounds described in paragraph Nos. "0254" to "0257" of JP2008-292970A are also suitable.

In addition to those above, radically polymerizable monomers represented by the following General Formulae (MO-1) to (MO-5) can also be suitably used. Incidentally, in the case where T is an oxyalkylene group in the formulae, the terminal on a carbon atom side binds to R.

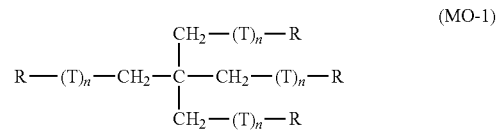

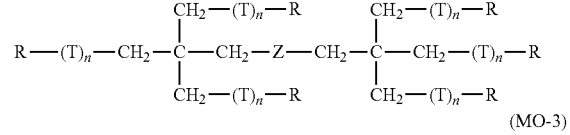

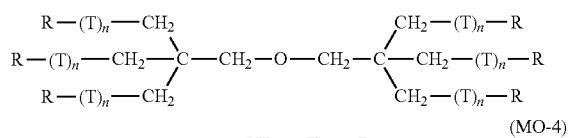

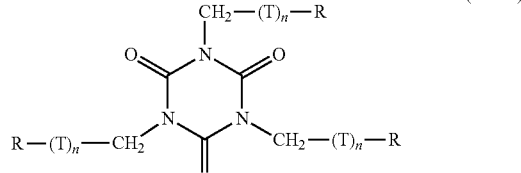

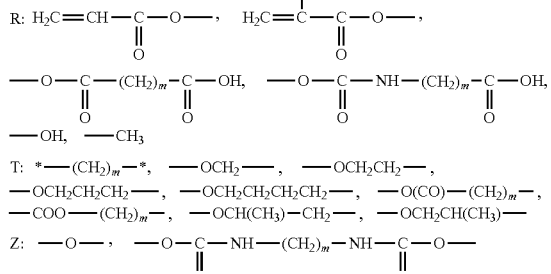

In General Formulae, n is 0 to 14 and m is 1 to 8. A plurality of R's and T's which are present in one molecule may be the same as or different from each other.

In each of the polymerizable compounds represented by General Formulae (MO-1) to (MO-5), at least one of the plurality of R's represents a group represented by —OC(=O)CH=CH$_2$ or —OC(=O)C(CH$_3$)=CH$_2$.

As specific examples of the polymerizable compounds represented by General Formulae (MO-1) to (MO-5), the compounds described in paragraph Nos. "0248" to "0251" of JP2007-269779A can also be suitably used in the present invention.

In addition, a compound which is obtained by adding ethylene oxide or propylene oxide to the polyfunctional alcohol, which is described as General Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), ethyleneoxy-modified dipentaerythritol hexaacrylate (A-DPH-12E as a commercially available product; manufactured by Shin-Nakamura Chemical Co., Ltd.), pentaerythritol ethoxylate tetraacrylate (KAYARAD RP-1040 as a commercially available product; manufactured by Nippon Kayaku Co., Ltd.), and a structure in which an ethylene glycol or propylene glycol residue is interposed between these (meth)acryloyl groups is preferable. Oligomer types of these can also be used.

The polymerizable compound is a polyfunctional monomer and may have an acid group such as a carboxyl group, a sulfonic acid group, and a phosphoric acid group. If an ethylenic compound has an unreacted carboxyl group as in the case where the ethylene compound is a mixture described above, this compound can be used as is, but if desired, a hydroxyl group of the aforementioned ethylenic compound may be reacted with a non-aromatic carboxylic anhydride so as to introduce an acid group. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride is preferable. A monomer in which the aliphatic polyhydroxy compound in the ester is pentaerythritol and/or dipentaerythritol is particularly preferable. Examples of commercially available products thereof include M-510 and M-520, which are polybasic modified acryl oligomers manufactured by TOAGOSEI, CO., LTD.

These monomers may be used alone, but since it is difficult to use a single compound in production, two or more kinds thereof may be used as a mixture. Moreover, if desired, a polyfunctional monomer not having an acid group and a polyfunctional monomer having an acid group may be used in combination therewith as the monomer.

The acid value of the polyfunctional monomer having an acid group is preferably 0.1 mgKOH/g to 40 mgKOH/g, and particularly preferably 5 mgKOH/g to 30 mgKOH/g. If the acid value of the polyfunctional monomer is too low, the development solubility characteristics deteriorate. If the acid value is too high, difficulty is caused in the production and handleability, hence a photopolymerization performance deteriorates, which leads to deterioration in curability such as surface smoothness of pixels. Therefore, in the case where a combination of two or more kinds of polyfunctional monomers having different acid groups is used, or in the case where a combination of polyfunctional monomers not having an acid group is used, it is preferable to adjust the acid value such that the acid value of all the polyfunctional monomers falls within the above range.

Furthermore, it is also a preferred embodiment that a polyfunctional monomer having a caprolactone structure is contained as a polymerizable compound.

The polyfunctional monomer having a caprolactone structure is not particularly limited as long as it has a caprolactone structure in the molecule, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polyfunctional monomer having a caprolactone structure represented by the following General Formula (Z-1) is preferable.

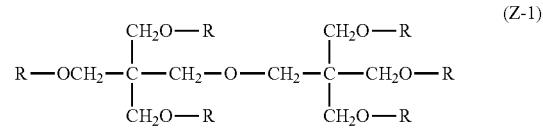

(Z-1)

In General Formula (Z-1), all of six R's are each a group represented by the following General Formula (Z-2). Alternatively, one to five out of six R's are a group represented by the following General Formula (Z-2), and the remainder is a group represented by the following General Formula (Z-3).

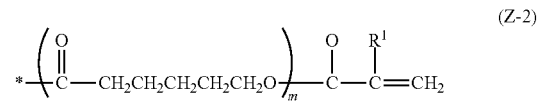

(Z-2)

In General Formula (Z-2), R$^1$ represents a hydrogen atom or a methyl group, m represents a number 1 or 2, and "*" represents a direct bond.

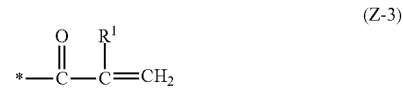

(Z-3)

In General Formula (Z-3), R$^1$ represents a hydrogen atom or a methyl group, and "*" represents a direct bond.

The polyfunctional monomer having such a caprolactone structure is commercially available from Nippon Kayaku Co., Ltd., as a KAYARAD DPCA series, and examples thereof include DPCA-20 (a compound in which m=1 in Formulae (Z-1) to (Z-3), the number of the group represented by Formula (Z-2)=2, and all of $R^1$'s are hydrogen atoms), DPCA-30 (a compound in which m=1 in Formulae (Z-1) to (Z-3), the number of the group represented by Formula (Z-2)=3, and all of $R^1$'s are hydrogen atoms), DPCA-60 (a compound in which m=1 in Formulae (Z-1) to (Z-3), the number of the group represented by Formula (Z-2)=6, and all of $R^1$'s are hydrogen atoms), and DPCA-120 (a compound in which m=2 in Formulae (Z-1) to (Z-3), the number of the group represented by Formula (Z-2)=6, and all of $R^1$'s are hydrogen atoms).

In the present invention, the polyfunctional monomer having a caprolactone structure can be used alone or as a mixture of two or more kinds thereof.

Moreover, the specific monomer in the present invention is preferably at least one kind selected from a group of compounds represented by the following General Formula (Z-4) or (Z-5).

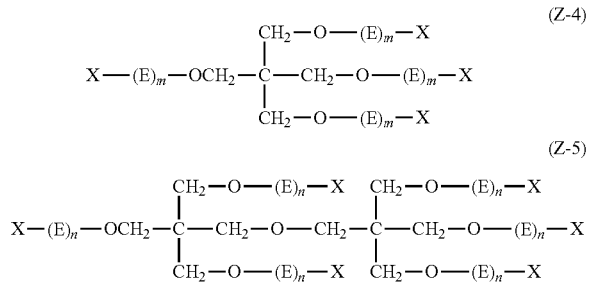

In General Formulae (Z-4) and (Z-5), E's each independently represent —$((CH_2)_y CH_2 O)$— or —$((CH_2)_y CH(CH_3)O)$—, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Here, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Here, in the case where the sum of the respective n's is 0, one of X's is a carboxyl group.

In General Formula (Z-4), m is preferably an integer of 0 to 6, and more preferably an integer of 0 to 4.

Moreover, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —$((CH_2)_y CH_2 O)$— or —$((CH_2)_y CH(CH_3)O)$— in General Formula (Z-4) or (Z-5) is preferably in the form in which the terminal on an oxygen atom side binds to X.

The compound represented by General Formula (Z-4) or (Z-5) may be used alone or in combination of two or more kinds thereof. In particular, a form in which all of six X's in General Formula (Z-5) are an acryloyl group is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of bonding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

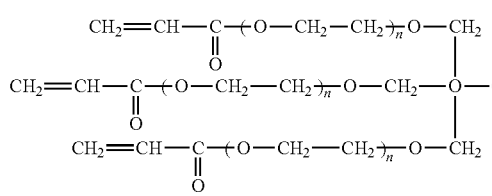 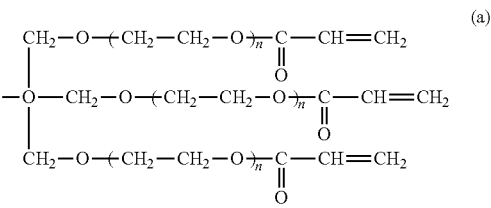

(a)

(the sum of the respective n's is 6)

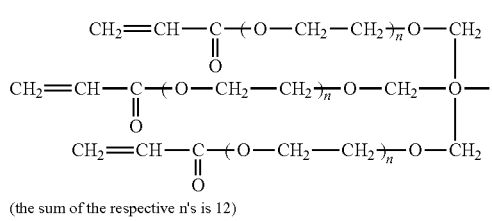 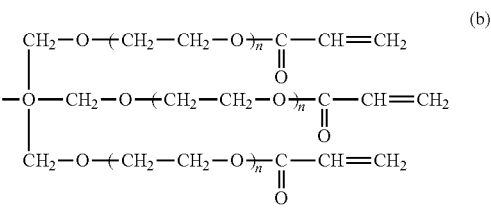

(b)

(the sum of the respective n's is 12)

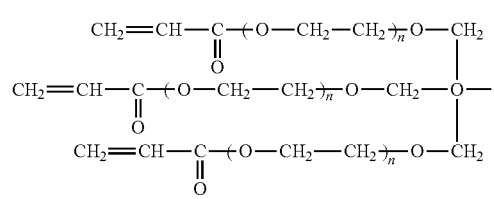 (c)
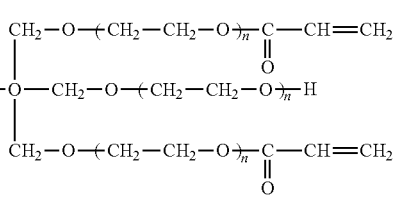

(the sum of the respective n's is 12)

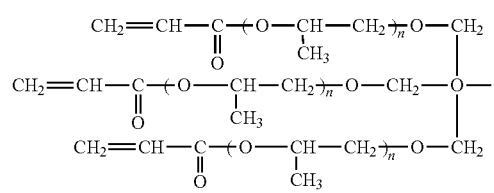 (d)
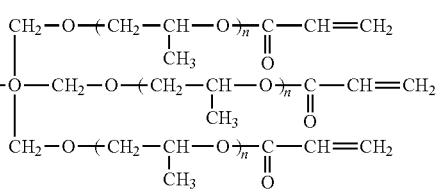

(the sum of the respective n's is 6)

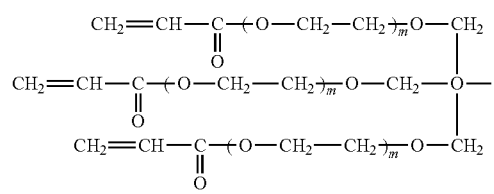 (e)
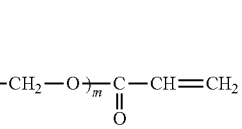

(the sum of the respective m's is 4)

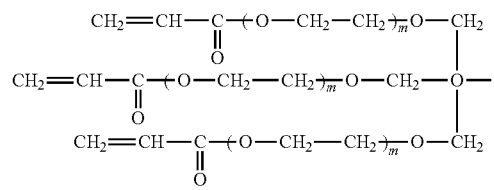 (f)
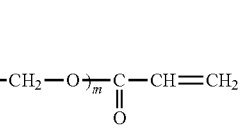

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer Company, Inc., and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-3061, AH-600, T-600, and AI-600 (manufactured by KYOEISHA CHEMICAL Co., Ltd.).

As the cyclic ether (epoxy or oxethane), examples of a bisphenol A type epoxy resin, which have an epoxy group, include JER-827, JER-828, JER-834, JER-1001, JER-1002, JER-1003, JER-1055, JER-1007, JER-1009, and JER-1010 (all manufactured by Japan Epoxy Resins Co., Ltd.), and EPICLON 840, EPICLON 860, EPICLON 1050, EPICLON 1051, and EPICLON 1055 (all manufactured by DIC Corporation); examples of a bisphenol F type epoxy resin include JER-806, JER-807, JER-4004, JER-4005, JER-4007, and JER-4010 (all manufactured by Japan Epoxy Resins Co., Ltd.), EPICLON 830 and EPICLON 835 (both manufactured by DIC Corporation), and LCE-21 and RE-602S (all manufactured by Nippon Kayaku Co., Ltd.); examples of a phenol novolac type epoxy resin include JER-152, JER-154, JER-157S70, and JER-157S65 (all manufactured by Japan Epoxy Resins Co., Ltd.), and EPICLON N-740, EPICLON N-770, and EPICLON N-775 (all manufactured by DIC Corporation); examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), EPICLON HP-7200 (manufactured by DIC Corporation), and EOCN-1020 (manufactured by Nippon Kayaku Co., Ltd.); and examples of an aliphatic epoxy resin include ADEKA RESIN EP-4080S, ADEKA RESIN EP-4085S, and ADEKA RESIN EP-4088S (all manufactured by ADEKA CORPORATION), CELLOXIDE 2021P, CELLOXIDE 2081, CELLOXIDE 2083, CELLOXIDE 2085, EHPE-3150 (a 1,2-epoxy-4-(2-oxylanyl(cyclohexane adduct of 2,2-bis(hydroxymethyl)-1-butanol). EPOLEAD PB 3600, and EPOLEAD PB 4700 (all manufactured by Daicel Corporation), DENACOL EX-211 L, EX-212L, EX-214L, EX-216L, EX-321L, and EX-850L (all manufactured by Nagase ChemteX Corporation), ADEKA RESIN EP-4000S, ADEKA RESIN EP-4003S, ADEKA RESIN EP-4010S, and ADEKA RESIN EP-4011S (all manufactured by ADEKA CORPORATION), NC-2000, NC-3000, NC-7300, XD-1000, EPPN-501, and EPPN-502 (all manufactured by ADEKA CORPORATION), and JER-1031S (manufactured by Japan Epoxy Resins Co., Ltd.). Such polymerizable compounds are suitable for a case of forming a pattern by a dry etching method.

Details of how to use these polymerizable compounds, such as the structure, whether the polymerizable compounds are used singly or used in combination thereof, and the amount of the polymerizable compounds added, can be arbitrarily set according to the designed final performance of the colored composition. For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the colored composition, it is preferable that the polymerizable compound has 3 or more functional groups. In addition, a method for adjusting both the sensitivity and the strength by using compounds which differ in the number of functional groups and have different polymerizable groups (for example, an acrylic acid ester, a methacrylic acid ester, a styrene-based compound, and a vinylether-based compound) in combination with the other components is also effective. Further, it is preferable to use polymerizable compounds having 3 or more functional groups and differing in the length of an ethylene oxide chain in combination with the other components since the developability of the colored composition can be adjusted, and excellent pattern formability is obtained.

In addition, from the viewpoints of the compatibility with other components (for example, a photopolymerization initiator, a substance to be dispersed, and an alkali-soluble resin) contained in the colored composition, and the dispersibility, how to select and use the polymerizable compound is an important factor. For example, if a low-purity compound is used or a combination of two or more kinds thereof is used, the compatibility can be improved in some cases. In addition, there are also cases where specific structures are selected from the viewpoint of improving the adhesiveness to a hard surface of a support or the like.

In the case where the polymerizable compound is blended into the colored composition of the present invention, the content of the polymerizable compound is preferably 5% by mass to 40% by mass, more preferably 7% by mass to 35% by mass, and particularly preferably 8% by mass to 30% by mass, with respect to the total solid contents of the colored composition.

The composition of the present invention may contain one kind or two or more kinds of polymerizable compound. In the case where the composition contains two or more kinds of the polymerizable compound, the total amount thereof is preferably within the above range.

<Polyfunctional Thiol Compound>

The colored composition of the present invention may contain polyfunctional thiol compounds having two or more mercapto groups in the molecule for the purpose of promoting the reaction of the polymerizable compounds. The polyfunctional thiol compounds are preferably secondary alkanethiols, and particularly preferably compounds having structures represented by the following General Formula (I).

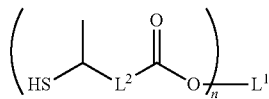

General Formula (I)

In General Formula (I), n represents an integer of 2 to 4, $L^1$ represents a divalent to tetravalent linking group, and $L^2$ represents a single bond or a divalent linking group. $L^1$ is preferably an aliphatic group having 2 to 12 carbon atoms, or a group formed by combination of an aliphatic group having 2 to 12 carbon atoms and a heterocyclic group. The heterocyclic group may be monocyclic or polycyclic, is preferably monocyclic. The heterocyclic group preferably contains a nitrogen atom as a hetero atom.

In the case where $L^2$ represents a divalent linking group, an alkylene group having 1 to 3 carbon atoms is preferable, and a methylene group is more preferable.

Specific examples of the polyfunctional thiol compound include the following compounds.

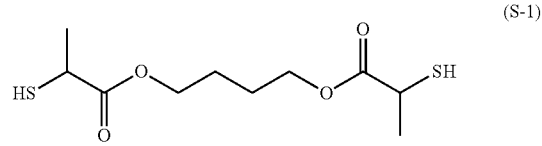

(S-1)

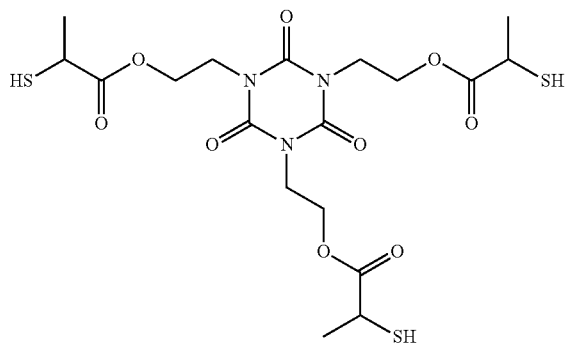

(S-2)

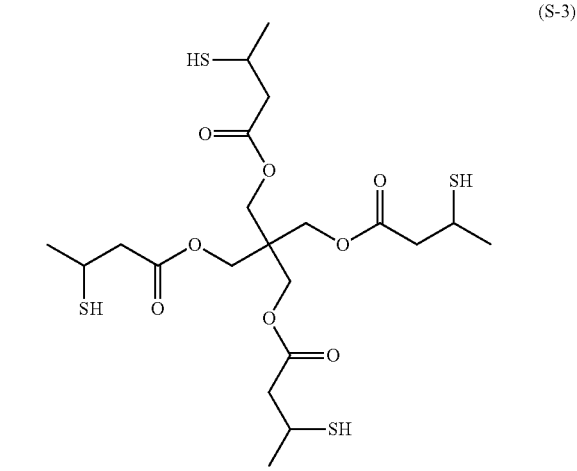

(S-3)

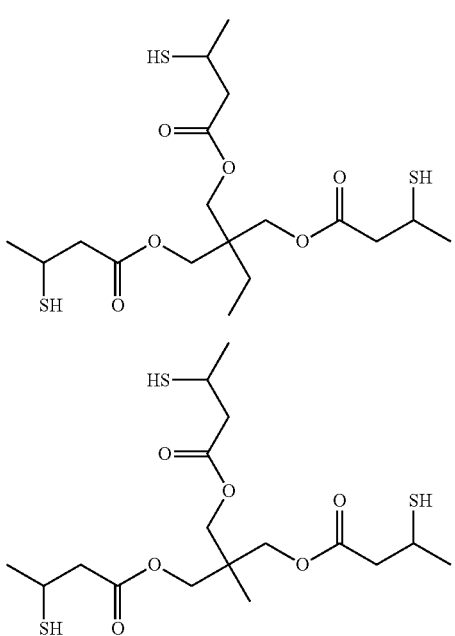

(S-4)

(S-5)

The content of the polyfunctional thiol compound in the colored composition of the present invention is preferably 0.01% by mass to 8.9% by mass, and more preferably 0.1% by mass to 6.4% by mass, with respect to the total solid content excluding the solvent.

The polyfunctional thiol may be used alone or in combination of two or more kinds thereof. In the case where the colored composition contains two or more kinds of polyfunctional thiol compound, the total amount is preferably within the above range.

<Solvent>

The colored composition of the present invention contains an organic solvent.

Basically, the organic solvent is not particularly limited as long as the solvent satisfies the solubility of the respective components or the coatability of the colored composition. In particular, it is preferable to select the organic solvent in consideration of the solubility, coatability, and safety of an ultraviolet absorber, the alkali-soluble resin, the dispersant, or the like. In addition, when the colored composition in the present invention is prepared, the composition preferably includes at least two kinds of organic solvents.

Suitable examples of the organic solvent include esters such as ethyl acetate, n-butyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, 3-heptanone, and cyclopentanone; and aromatic hydrocarbons such as toluene and xylene.

From the viewpoint of the solubility of an ultraviolet absorber and the alkali-soluble resin, and improvement of the shape of the coated surface, it is also preferable to mix two or more kinds of these organic solvents. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

From the viewpoint of coatability, the content of the organic solvent in the colored composition is set such that the concentration of the total solid contents of the composition becomes preferably 5% by mass to 80% by mass, more preferably 5% by mass to 60% by mass, and particularly preferably 10% by mass to 50% by mass.

The composition of the present invention may include one kind or two or more kinds of organic solvent. In the case where the composition includes two or more kinds of organic solvent, the total amount thereof is preferably within the above range.

<Pigment>

It is preferable that the colored composition of the present invention further includes a pigment, and more preferably includes a pigment having a phthalocyanine skeleton.

As the pigment used in the present invention, various inorganic or organic pigments known in the related art can be used, and organic pigments are preferably used. As the pigment, one having a high transmittance is preferable.

Examples of the inorganic pigment include black pigments such as carbon black and titanium black, metal compounds represented by a metal oxide, a metal complex salt, or the like, and specific examples thereof include metal oxides of iron, cobalt, aluminum, cadmium, lead, copper, titanium, magnesium, chromium, zinc, antimony, and the like, and complex oxides of metals.

Examples of the organic pigment include:

C. I. Pigment Yellow 11, 24, 31, 53, 83, 93, 99, 108, 109, 110, 138, 139, 147, 150, 151, 154, 155, 167, 180, 185, 199;

C. I. Pigment Orange 36, 38, 43, 71;

C. I. Pigment Red 81, 105, 122, 149, 150, 155, 171, 175, 176, 177, 179, 209, 220, 224, 242, 254, 255, 264, 270;

C. I. Pigment Violet 19, 23, 32, 39:

C. I. Pigment Blue 1, 2, 15, 15:1, 15:3, 15:6, 16, 22, 60, 66;

C. I. Pigment Green 7, 36, 37, 58;

C. I. Pigment Brown 25, 28; and

C. I. Pigment Black 1.

Examples of the pigment which can be preferably used in the present invention include the following ones, but the present invention is not limited thereto.

C. I. Pigment Yellow 11, 24, 108, 109, 110, 138, 139, 150, 151, 154, 167, 180, 185, C. I. Pigment Orange 36, 71, C. I. Pigment Red 122, 150, 171, 175, 177, 209, 224, 242, 254, 255, 264, C. I. Pigment Violet 19, 23, 32, C. I. Pigment Blue 15:1, 15:3, 15:6, 16, 22, 60, 66, C. I. Pigment Green 7, 36, 37, 58, and C. I. Pigment Black 1.

These organic pigments can be used alone or in various combinations for adjustment of spectrum or improvement of color purity. Specific examples of the combination are shown below. For example, as a red pigment, an anthraquinone-based pigment, a perylene-based pigment, or a diketopyrrolopyrrole-based pigment can be used alone or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigment with C. I. Pigment Yellow 139 is preferable. The mass ratio between the red pigment and the yellow pigment is preferably 100:5 to 100:50. If the mass ratio is 100:4 or less, it is difficult to reduce the light transmittance at 400 nm to 500 nm, and if it is 100:51 or more, a dominant wavelength moves closer to a short wavelength, so a color separating power cannot be improved in some cases. In particular, the mass ratio is optimally in a range of 100:10 to 100:30. Moreover, in the case of a combination of red pigments, the mass ratio can be adjusted according to the required spectrum.

In addition, as a green pigment, a halogenated phthalocyanine-based pigment can be used alone or as a mixture of this pigment with a disazo-based yellow pigment, a quinophthalone-based yellow pigment, an azomethine-based yellow pigment, or an isoindoline-based yellow pigment. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used alone or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

Moreover, as a pigment for a black matrix, carbon, titanium black, iron oxide, or titanium oxide may be used alone or as a mixture, and a combination of carbon with titanium black is preferable. The mass ratio between carbon and titanium black is preferably in a range of 100:0 to 100:60.

It is preferable to blend a pigment in other color than black into the colored composition of the present invention, with a blue pigment being preferable.

In the case where the pigment is used for a color filter, the primary particle size of the pigment is preferably 100) nm or less from the viewpoint of color unevenness or contrast. From the viewpoint of dispersion stability, the primary particle size is preferably 5 nm or more. The primary particle size of the pigment is more preferably 5 nm to 75 nm, still more preferably 5 nm to 55 nm, and particularly preferably 5 nm to 35 nm.

The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, 58. C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are most preferable.

In the case where a pigment is blended into the colored composition of the present invention, the content of the pigment is preferably 10% by mass to 70% by mass, more preferably 20% by mass to 60% by mass, and still more preferably 25% by mass to 50% by mass, with respect to the total amount of components excluding a solvent, contained in the colored composition.

The composition of the present invention may contain one kind or two or more kinds of pigment. In the case where the composition contains two or more kinds, the total amount thereof is preferably within the above range.

The colored composition of the present invention may include known dyes. For example, the dyes disclosed in JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. No. 4,808,501A, U.S. Pat. No. 5,667,920A. US505950A, U.S. Pat. No. 5,667,920A. JP1993-333207A (JP-H05-333207A), JP1994-35183A (JP-H06-35183A), JP1994-51115A (JP-H06-51115A), and JP1994-194828A (JP-H06-194828A) can be used. With respect to the chemical structure, dyes such as a pyrazoleazo based-dye, a pyrromethene based-dye, an anilinoazo based-dye, a triphenylmethane based-dye, an anthraquinone based-dye, a benzylidene based-dye, an oxonol based-dye, a pyrazoletriazole azo based-dye, a pyridoneazo based-dye, a cyanine based-dye, a phenothiazine based-dye, and a pyrrolopyrazoleazomethine-based dye can be used.

In addition, a dye multimer may also be used as the dye. Examples of the dye multimer include the compounds described in JP2011-213925A, JP2013-041097A, and the like.

<Photopolymerization Initiator>

From the viewpoint of further improving sensitivity, it is preferable that the colored composition of the present invention contains a photopolymerization initiator.

The photopolymerization initiator is not particularly limited as long as the photopolymerization initiator has an ability of initiating polymerization of the polymerizable compound, and can be appropriately selected from known photopolymerization initiators. For example, photopolymerization initiators sensitive to light rays in a range from the ultraviolet region to visible light are preferable. In addition, the photopolymerization initiator may be either an activator which interacts with a photo-excited sensitizer in any way and generates active radicals or an initiator which initiates cationic polymerization according to the type of monomer.

Furthermore, it is preferable that the photopolymerization initiator contains at least one kind of compound having at least a molar absorption coefficient of about 50 in a range of about 300 nm to 800 nm (more preferably 330 nm to 500 nm).

Examples of the photopolymerization initiator include halogenated hydrocarbon derivatives (for example, a derivative having a triazine skeleton, and a derivative having an oxadiazole skeleton), acyl phosphine compounds such as acyl phosphine oxide, oxime compounds such as hexaaryl biimidazole and oxime derivatives, organic peroxides, thio compounds, ketone compounds, aromatic onium salts, ketoxime ethers, aminoacetophenone compounds, and hydroxyacetophenone, among which oxime compounds are preferable.

Furthermore, from the viewpoint of exposure sensitivity, the compound is preferably a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound.

The compound is more preferably a trihalomethyl triazine compound, an α-aminoketone compound, an acyl phosphine compound, a phosphine oxide compound, an oxime compound, a triallylimidazole dimer, a triarylimidazole compound, a benzoimidazole compound, an onium compound, a benzophenone compound, or an acetophenone compound, and particularly preferably at least one kind of compound selected from a group consisting of a trihalomethyl triazine compound, an α-aminoketone compound, an oxime compound, a triallylimidazole compound, a benzophenone compound, a triarylimidazole compound, and a benzoimidazole compound, Further, the triarylimidazole compound may be a mixture thereof with benzoimidazole.

Specifically, the trihalomethyltriazine compound is exemplified as follows. Incidentally, Ph is a phenyl group.

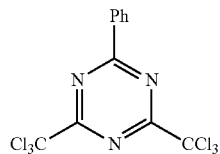

As the triarylimidazole compound and the benzoimidazole compound, the following compounds are exemplified.

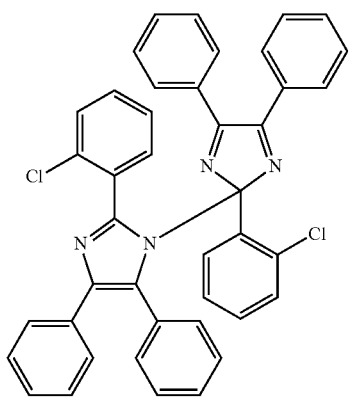

(I-6a)

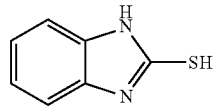

(I-6b)

As the trihalomethyltriazine compound, a commercially available product can also be used, and for example, TAZ-107 (manufactured by Midori Kagaku Co., Ltd.) can also be used.

Particularly, in the case where the colored composition of the present invention is used for the manufacture of a color filter included in a solid-state imaging element, a fine pattern needs to be formed in a sharp shape. Accordingly, it is important that the composition has curability and is developed without residues in an unexposed area. From this viewpoint, it is particularly preferable to use an oxime compound as a polymerization initiator. In particular, in the case where a fine pattern is formed in the solid-state imaging element, stepper exposure is used for exposure for curing. However, the exposure machine used at this time is damaged by halogen in some cases, so it is necessary to reduce the amount of a polymerization initiator added. In consideration of this point, in order to form a fine pattern as in a solid-state imaging element, it is particularly preferable to use an oxime compound as the photopolymerization initiator (D).

Examples of the halogenated hydrocarbon compound having a triazine skeleton include the compounds described in Wakabayashi, et al., Bull. Chem. Soc. Japan, 42, 2924 (1969), the compounds described in UK1388492B, the compounds described in JP1978-133428A (JP-S53-133428A), the compounds described in GE3337024B, the compound described in F. C. Schaefer, et al., J. Org. Chem; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A, in particular, the compounds described in paragraph No. "0075" of JP2013-077009A.

In addition, as photopolymerization initiators other than those above, acridine derivatives are exemplified. Specific examples thereof include the compound described in paragraph No. "0076" of JP2013-077009A, the contents of which are incorporated herein.

Examples of the ketone compound include the compound described in paragraph No. "0077" of JP2013-077009A, the contents of which are incorporated herein.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (product names, all manufactured by BASF) can be used. As the aminoacetophenone-based initiator, IRGACURE-907, IRGACURE-369, and IRGACURE-379 (product names, all manufactured by BASF) which are commercially available products can be used. In addition, as the aminoacetophenone-based initiator, the compound described in JP2009-191179A, of which an absorption wavelength matches a light source with a long wavelength of 365 nm, 405 nm, or the like can be used. Moreover, as the acyl phosphine-based initiator, IRGACURE-819 or DAROCUR-TPO (product names, both manufactured by BASF) which are commercially available products can be used.

Examples of the photopolymerization initiator more preferably include oxime compounds. As specific examples of the oxime compounds, the compound described in JP2001-233842A, the compound described in JP2000-80068A, or the compound described in JP2006-342166A can be used.

Examples of the oxime compound such as an oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include the compounds described in J. C. S. Perkin 11 (1979), pp. 1653-1660, J. C. S. Perkin II (1979), pp. 156-162, Journal of Photopolymer Science and Technology (1995), pp. 202-232, and JP2000-66385A; and the compounds described respectively in JP2000-80068A, JP2004-534797A, and JP2006-342166A.

As the commercially available product, IRGACURE-OXE01 (manufactured by BASF) and IRGACURE-OXE02 (manufactured by BASF) are also suitably used.

In addition, commercially available products such as TRONLY TR-PBG-304, TRONLY TR-PBG-309, and TRONLY TR-PBG-305 (all manufactured by CHANGZHOU TRONLY NEW ELECTRONIC MATERIALS CO., LTD.), and ADEKA ARKLS NCI-831 and ADEKA ARKLS NCI-930 (manufactured by ADEKA CORPORATION) can also be used.

Furthermore, as oxime compounds other than those as described above, the compound described in JP2009-519904A in which oxime is linked to an N-position of carbazole, the compound described in U.S. Pat. No. 7,626,957B in which a hetero-substituent is introduced into a benzophenone site, the compounds described in JP2010-15025A and US2009/292039A in which a nitro group is introduced into a dye structure, the ketoxime compound described in WO2009/131189A, the compound described in U.S. Pat. No. 7,556,910B which contains a triazine skeleton and an oxime skeleton in the same molecule, the compound described in JP2009-221114A, which has maximum absorption at 405 nm and has excellent sensitivity to a g-ray light source, and the like may be used.

The cyclic oxime compounds described in JP2007-231000A and JP2007-322744A can also be suitably used. Among the cyclic oxime compounds, the cyclic oxime compounds ring-fused to a carbazole dye, which are described in JP2010-32985A and JP2010-185072A, are preferable from the viewpoint of high sensitivity since these compounds have high light absorptivity.

Furthermore, the compound described in JP2009-242469A, which is an oxime compound having an unsaturated bond in a specific moiety, can also be suitably used since this compound makes it possible to improve sensitivity by reproducing active radicals from polymerization-inactive radicals.

Particularly preferred examples of the oxime compounds include the oxime compound having a specific substituent described in JP2007-269779A and the oxime compound having a thioaryl group described in JP2009-191061A.

Specifically, the oxime compound which is a photopolymerization initiator is preferably a compound represented by the following General Formula (OX-1). Incidentally, the compound may be an oxime compound in which an N—O bond of oxime forms an (E) isomer, an oxime compound in which the N—O bond forms a (Z) isomer, or a mixture in which the N—O bonds form a mixture of an (E) isomer and a (Z) isomer.

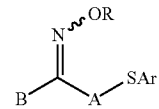

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the above substituents may further be substituted with other substituents.

Examples of the substituents include a halogen atom, an aryloxy group, an alkoxycarbonyl or aryloxycarbonyl group, an acyloxy group, an acyl group, an alkyl group, and an aryl group.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, an octaphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group, an aromatic or aliphatic heterocycle having a nitrogen atom, an oxygen atom, a sulfur atom, or a phosphorus atom is preferable.

Specific examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In General Formula (OX-1), the monovalent substituent represented by B represents an aryl group, a heterocyclic group, an arylcarbonyl group, or a heterocyclic carbonyl group. These groups may have one or more substituents, and examples of the substituents include the substituents described above. In addition, the substituents described above may be further substituted with other substituents.

Among these, the structures shown below are particularly preferable.

In the following structures, Y, X, and n have the same definitions as Y, X, and n, respectively, in General Formula (OX-2) which will be described later, and the preferred examples thereof are also the same.

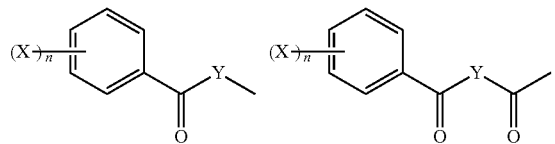

In Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. Further, the substituents described above may be further substituted with other substituents.

Among these, as A in Formula (OX-1), from the viewpoints of improving sensitivity and inhibiting coloring caused by elapse of time during heating, an unsubstituted alkylene group, an alkylene group substituted with an alkyl group (for example, a methyl group, an ethyl group, a tert-butyl group, and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group, and a styryl group) are preferable.

In Formula (OX-1), the aryl group represented by Ar is preferably an aryl group having 6 to 30 carbon atoms, and may have a substituent. Examples of the substituent include the same ones as the substituents introduced into the substituted aryl groups, which are exemplified above as specific examples of the aryl group which may have a substituent.

Among these, from the viewpoints of improving sensitivity and inhibiting coloration caused by elapse of time during heating, a substituted or unsubstituted phenyl group is preferable.

In Formula (OX-1), a structure "SAr" formed of Ar and S adjacent thereto in Formula (OX-1) is preferably the following structure from the viewpoint of sensitivity. Incidentally, Me represents a methyl group, and Et represents an ethyl group.

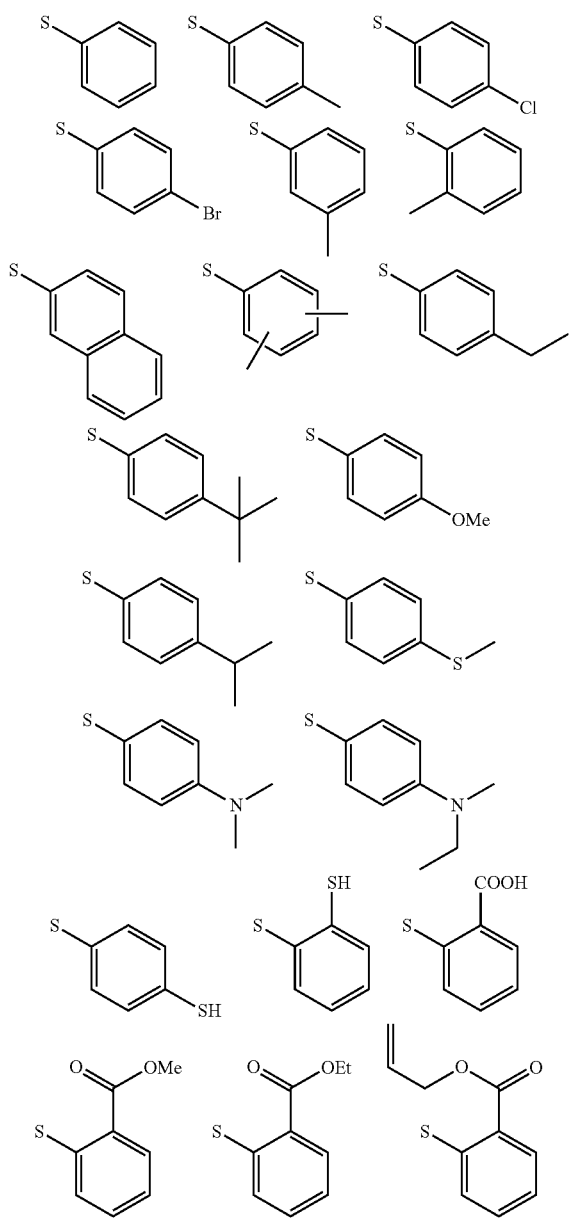

The oxime compound is preferably a compound represented by the following General Formula (OX-2).

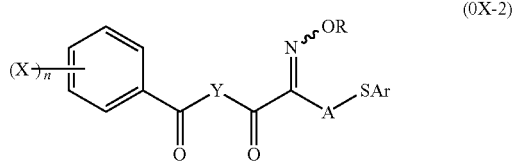

In General Formula (OX-2), R and X each independently represent a monovalent substituent, A and Y each independently represent a divalent organic group. Ar represents an aryl group, and n represents an integer of 0 to 5. R, A, and Ar in General Formula (OX-2) have the same definitions as R, A, and Ar, respectively, in General Formula (OX-1), and the preferred examples thereof are also the same.

Examples of the monovalent substituent represented by X in General Formula (OX-2) include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents, and examples of the substituents include the substituents described above. Moreover, the substituents described above may be further substituted with other substituents.

Among these, from the viewpoints of improving solubility in solvents and absorption efficiency in a long-wavelength region, X in General Formula (OX-2) is preferably an alkyl group.

Furthermore, n in Formula (2) represents an integer of 0 to 5 and preferably represents an integer of 0 to 2.

Examples of the divalent organic group represented by Y in General Formula (OX-2) include the following structures. In the following groups, "*" represents a position where Y binds to a carbon atom adjacent thereto in Formula (OX-2).

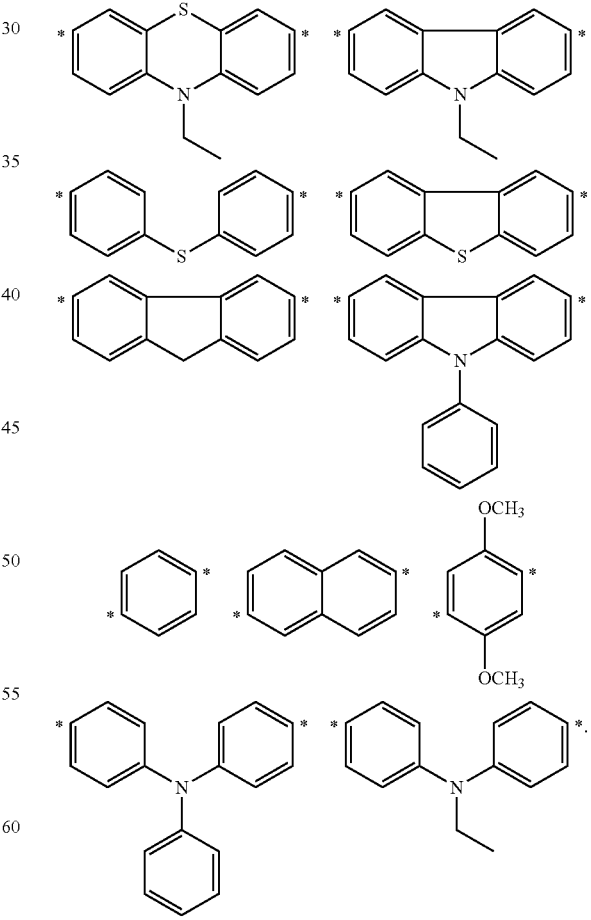

Among these, from the viewpoint of improving sensitivity, the structures shown below are preferable.

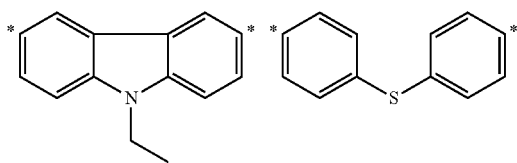

Moreover, the oxime compound is preferably a compound represented by the following General Formula (OX-3) or (OX-4).

(OX-3)

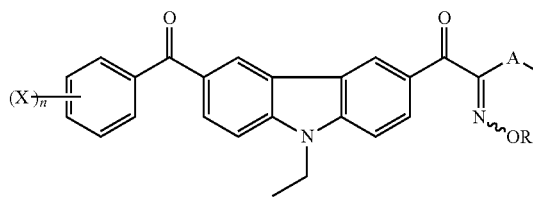

(OX-4)

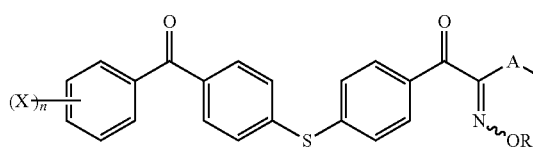

In General Formula (OX-3) or (OX-4), R and X each independently represent a monovalent substituent, A represents a divalent organic group, Ar represents an aryl group, and n represents an integer of 0 to 5.

R, X, A, Ar, and n in General Formula (OX-3) or (OX-4) have the same definitions as R, X, A, Ar, and n, respectively, in General Formula (OX-2), and the preferred examples thereof are also the same.

Specific examples (C-4) to (C-13) of the oxime compound which are preferably used are shown below, but the present invention is not limited thereto.

(C-4)

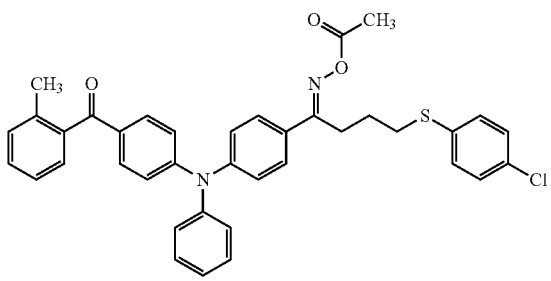

(C-5)

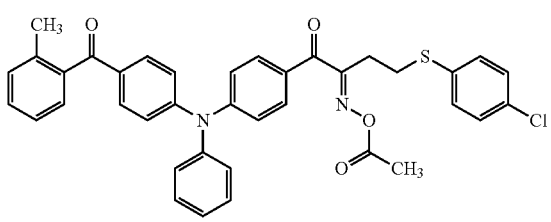

(C-6)

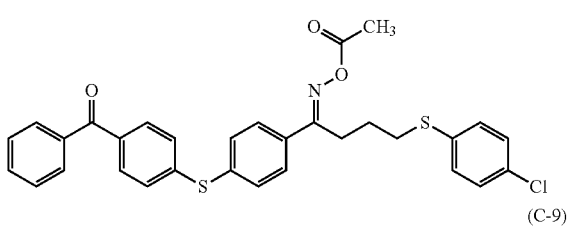

(C-7)

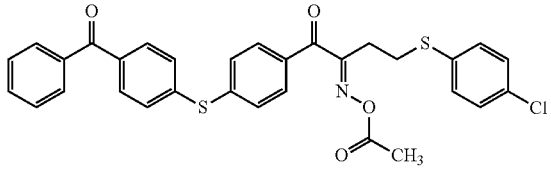

(C-8)

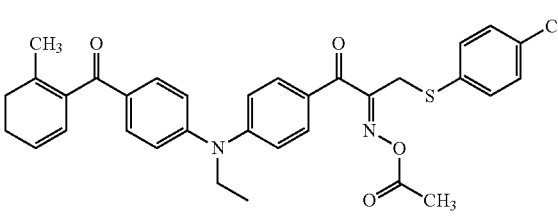

(C-9)

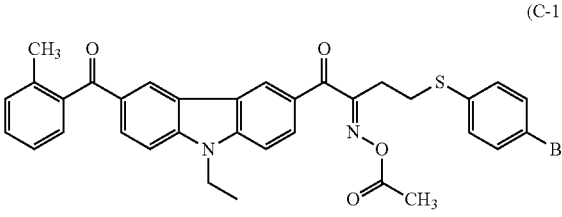

(C-10)

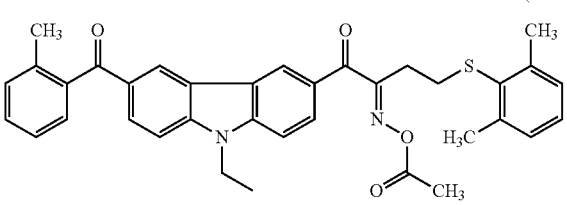

(C-11)

(C-12)

-continued (C-13)

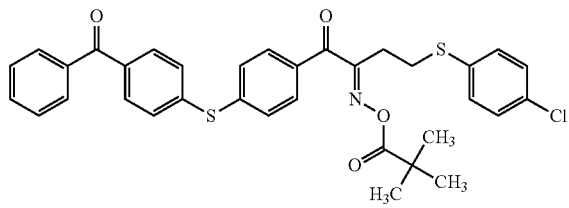

The oxime compound has a maximum absorption wavelength in a wavelength region of 350 nm to 500 nm, and preferably has an absorption wavelength in a wavelength region of 360 nm to 480 nm, and an oxime compound showing a high absorbance at 365 nm and 455 nm is particularly preferable.

From the viewpoint of sensitivity, the molar absorption coefficient at 365 nm or 405 nm of the oxime compound is preferably 1,000 to 300,000, and more preferably 2,000 to 300,000, and particularly preferably 5,000 to 200,000.

The molar absorption coefficient of the compound can be measured using a known method, but specifically, it is preferable to measure the molar absorption coefficient by means of, for example, an ultraviolet-visible spectrophotometer (Carry-5 spectrophotometer manufactured by Varian) by using an ethyl acetate solvent at a concentration of 0.01 g/L.

In the case where the colored composition of the present invention contains a photopolymerization initiator, the content of the photopolymerization initiator is preferably from 0.1% by mass to 50% by mass, more preferably from 0.5% by mass to 30% by mass, and still more preferably from 1% by mass to 20% by mass, with respect to the total solid contents of the colored composition. Better sensitivity and pattern formability are obtained within the above range.

The composition of the present invention may contain one kind or two or more kinds of photopolymerization initiator. In the case where the composition contains two or more kinds, the total amount thereof is preferably within the above range.

<Dispersant Resin Agent>

In the case where the colored composition of the present invention has a pigment, a dispersant resin agent (pigment dispersant) can be used in combination with other components, as desired.

Examples of the dispersant resin agent which can be used in the present invention include polymer dispersants [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate], surfactants such as a polyoxyethylene alkyl phosphoric acid ester, a polyoxyethylene alkylamine, and an alkanolamine; and pigment derivatives.

The polymer dispersants can be further classified into straight-chain polymers, terminal-modified polymers, graft polymers, and block polymers, according to the structure.

Examples of the terminal-modified polymers which have a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H09-77994A), and the like. Moreover, a polymer obtained by introducing two or more moieties (acid groups, basic groups, partial skeletons of an organic dye, or heterocycles) anchored to the pigment surface into a polymer terminal as described in JP2007-277514A is also preferable since this polymer is excellent in dispersion stability.

Examples of the graft polymers having a moiety anchored to the pigment surface include polyester-based dispersant and the like, and specific examples thereof include a product of a reaction between a poly(lower alkyleneimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, WO2010/1110491A, and the like, a graft polymer having a partial skeleton or a heterocycle of an organic dye, which is described in JP2003-238837A, JP2008-9426A, JP2008-81732A, and the like, and a copolymer of a macromonomer and an acid group-containing monomer, which is described in JP2010-106268A, and the like. From the viewpoint of dispersibility of a pigment dispersion, dispersion stability, and developability which a colored composition using the pigment exhibits, an amphoteric dispersion resin having basic and acid groups, which is described in JP2009-203462A, is particularly preferable.

As the macromonomer used in production of a graft polymer having a moiety anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI, CO., LTD.; Placcel FM5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by Daicel Corporation; a polyester-based macromonomer described in JP1990-272009A (JP-H02-272009A), and the like. Among these, from the viewpoint of dispersibility of the pigment dispersion, dispersion stability, and the developability which the colored composition using the pigment dispersion exhibits, the polyester-based macromonomer excellent in flexibility and solvent compatibility is particularly preferable. Further, a polyester-based macromonomer represented by the polyester-based macromonomer described in JP1990-272009A (JP-H02-272009A) is most preferable.

As the block polymer having a moiety anchored to the pigment surface, block polymers described in JP2003-49110A, JP2009-52010A, and the like are preferable.

It is preferable that an oligoimine-based dispersant including a nitrogen atom in at least one of the main chain and the side chain is also used as the pigment dispersant. As the oligoimine-based dispersant, a resin which has a repeating unit having a partial structure X having a functional group with a pKa of 14 or less, and a side chain including a side chain Y having 40 to 10,000 atoms, and also has a basic nitrogen atom in at least one of the main chain or the side chain, is preferable.

With respect to the oligoimine-based dispersant, reference can be made to the descriptions in paragraphs "0225" to "0267" of JP2014-063125A, the contents of which are incorporated herein.

The dispersant resin agent which can be used in the present invention can be obtained in the form of commercially available products, and specific examples thereof include "DA-7301" manufactured by Kusumoto Chemicals, Ltd., "Disperbyk-101 (polyamidamine phosphate), 107 (carboxylic acid ester), 110 and 111 (copolymer including an acid group), 130 (polyamide), 161, 162, 163, 164, 165, 166, and 170 (polymeric copolymer)", and "BYK-P104 and P105 (high-molecular-weight unsaturated polycarboxylic acid)", manufactured by BYK-Chemie, "EFKA 4047, 4050, 4010, and 4165 (polyurethane-based), EFKA 4330 to 4340 (block copolymer), 4400 to 4402 (modified polyacrylate), 5010 (polyesteramide), 5765 (high-molecular-weight polycarboxylic acid salt), 6220 (aliphatic polyester), 6745 (phthalocyanine derivative), and 6750 (azo pigment derivative)" manufactured by EFKA, "Ajisper PB821, PB822, PB880, and PB881" manufactured by Ajinomoto Fine-Techno Co., Inc., "Flowlen TG-710 (urethane oligomer)" and "Polyflow No. 50E, No. 300 (acrylic copolymer)" manufactured by KYOE-ISHA CHEMICAL Co., LTD., "Disparlon KS-860, 873SN, 874, #2150 (aliphatic polyvalent carboxylic acid), #7004 (polyether ester), DA-703-50, DA-705, and DA-725", manufactured by Kusumoto Chemicals, Ltd., "Demol RN, N (naphthalene sulfonate formaldehyde condensate). MS, C, SN-B (aromatic sulfonate formaldehyde condensate)", "Homogenol L-18 (polymeric polycarboxylic acid)", "Emulgen 920, 930, 935, and 985 (polyoxyethylene nonyl phenyl ether)", and "Acetamine 86 (stearylamine acetate)", manufactured by Kao Corporation, "Solsperse 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by The Lubrizol Corporation, "Nikkol T106 (polyoxyethylene sorbitan monooleate) and MYS-IEX (polyoxyethylene monostearate)" manufactured by NIKKO CHEMICALS Co., Ltd., "Hinoact T-8000E" and the like manufactured by Kawaken Fine Chemicals Co., Ltd., "Organosiloxane Polymer KP341" manufactured by Shin-Etsu Chemical Co., Ltd., "W001: Cationic Surfactant" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA SANGYO Corporation, polymer dispersants such as "Disperse Aid 6, Disperse Aid 8, Disperse Aid 15, and Disperse Aid 9100" manufactured by SAN NOPCO Ltd., "Adeka Pluronic L31, F38, L42, L44, L61, L64, F68, L72, P95, F77, P84, F87, P94, L101, P103, F108, L121, and P-123" manufactured by ADEKA CORPORATION, and "Ionet (product name) S-20" manufactured by Sanyo Chemical Industries, Ltd.

These dispersant resin agents may be used alone or in combination of two or more kinds thereof. In the present invention, it is particularly preferable to use a combination of a pigment derivative and a polymer dispersant. Further, the dispersant resin agent may be used in combination with an alkali-soluble resin, together with a terminal-modified polymer having a moiety anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161 A) are also preferable.

As the dispersant resin agent, the following compound can also be used.

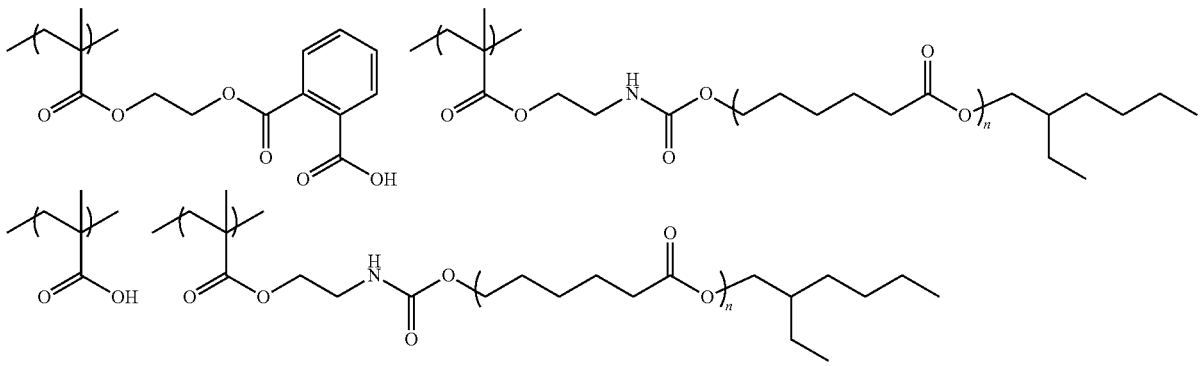

In the case where the colored composition contains a dispersant resin agent, the total content of the dispersant resin agent is preferably from 1 part by mass to 80 parts by mass, more preferably from 5 parts by mass to 70 parts by mass, and still more preferably from 10 parts by mass to 60 parts by mass, with respect to 100 parts by mass of the pigment.

The composition of the present invention may include one kind or two or more kinds of dispersant resin agent. In the case where the composition includes two or more kinds of the dispersant resin agent, the total amount thereof is preferably within the above range.

Specifically, in the case where a polymer dispersant is used, the amount of the polymer dispersant used is preferably 5 parts by mass to 100 parts by mass, and more preferably 10 parts by mass to 80 parts by mass, with respect to 100 parts by mass of the pigment.

Moreover, in the case where a pigment derivative is used in combination with other components, the amount of the pigment derivative used is preferably 1 part by mass to 30 parts by mass, more preferably 1 part by mass to 25 parts by mass, and particularly preferably 1 part by mass to 20 parts by mass, with respect to 100 parts by mass of the pigment.

In the colored composition, from the viewpoint of curing sensitivity and color density, the total content of the components of the dye and the dispersant is preferably 30% by mass to 90% by mass, more preferably 35% by mass to 80% by mass, and still more preferably 40% by mass to 75% by mass, with respect to the total solid contents constituting the colored composition.

<<Alkali-Soluble Resin>>

It is preferable that the colored composition of the present invention further contains an alkali-soluble resin.

The alkali-soluble resin can be appropriately selected from alkali-soluble resins which are linear organic high molecular-weight polymers and have at least one group enhancing alkali-solubility in a molecule (preferably, a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acrylic resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include a (meth)acrylic acid. These acid groups may be used alone or in combination of two or more kinds thereof.

Examples of the monomer which can give the acid group after polymerization include monomers having a hydroxyl group, such as 2-hydroxyethyl (meth)acrylate, monomers having an epoxy group, such as glycidyl (meth)acrylate, and monomers having an isocyanate group, such as 2-isocyanatoethyl (meth)acrylate. The monomers for introducing these acid groups may be used alone or in combination of two or more kinds thereof. In order to introduce the acid group into the alkali-soluble resin, for example, the monomer having the acid group and/or the monomer which can give the acid group after polymerization (hereinafter referred to as a "monomer for introducing an acid group" in some cases) may be polymerized as a monomer component.

Incidentally, in the case where a monomer which can give the acid group after polymerization is used as a monomer component to introduce the acid group, a treatment for giving the acid group, as will be described later, needs to be performed after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Incidentally, other monomers copolymerizable with a (meth)acrylic acid may be used alone or in combination of two or more kinds thereof.

It is also preferable that the colored composition contains, as the alkali-soluble resin, a polymer (a) obtained by polymerizing monomer components including a compound represented by the following General Formula (ED) and/or a compound represented by the following General Formula (ED2) (each of which may be hereinafter referred to as an "ether dimer" in some cases) as an essential component.

General Formula (ED)

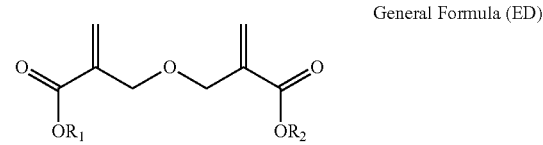

In General Formula (ED), $R_1$ and $R_2$ each independently represent a hydrogen atom or a hydrocarbon group having 1 to 25 carbon atoms, which may have a substituent.

General Formula (ED2)

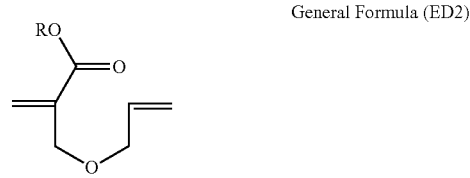

Thus, the colored composition of the present invention can form a cured coating film which has extremely excellent heat resistance as well as transparency. In General Formula (ED) which represents the ether dimer, the hydrocarbon group having 1 to 25 carbon atom, represented by $R_1$ and $R_2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy such as 1-methoxyethyl and 1-ethoxyethyl; and alkyl groups substituted with an aryl group such as benzyl. Among these, from the viewpoints of heat resistance, substituents of primary or secondary carbon, which are not easily eliminated by an acid or heat, such as methyl, ethyl, cyclohexyl, and benzyl, are preferable.

In General Formula (ED2), R represents a hydrogen atom or an organic group having 1 to 30 carbon atoms. With respect to the specific examples of General Formula (ED2), reference may be made to the description of JP2010-168539A.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2.2.2-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used alone or in combination of two or more kinds thereof. The structure derived from the compound represented by General Formula (ED) may be copolymerized with other monomers.

In addition, it is preferable to incorporate an ethylenically unsaturated monomer (a) represented by the following Formula (X) as a monomer to be copolymerized with the alkali-soluble resin.

Formula (X)

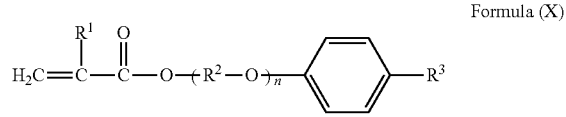

(In Formula (X), $R^1$ represents a hydrogen atom or a methyl group, $R^2$ represents an alkylene group having 2 to 10 carbon atoms, $R^3$ represents hydrogen atom or an alkyl group having 1 to 20 carbon atoms, which may contain a benzene ring. n represents an integer of 1 to 15.)

In Formula (X), the number of carbon atoms of the alkylene group of $R^2$ is preferably 2 to 3. Further, the number of carbon atoms of the alkyl group of $R^3$ is 1 to 20, and more preferably 1 to 10, and the alkyl group of $R^3$ may contain a benzene ring. Examples of the alkyl group containing a benzene ring, represented by $R^3$, include a benzyl group and a 2-phenyl(iso)propyl group.

Examples of the ethylenically unsaturated monomer (a) include ethylene oxide (EO)-modified (meth)acrylate of phenol, EO- or propylene oxide (PO)-modified (meth)acrylate of paracumylphenol, EO-modified (meth)acrylate of nonylphenol, and PO-modified (meth)acrylate of nonylphenol. Among these compounds, the EO- or PO-modified (meth)acrylate of paracumylphenol has a higher dispersion effect.

Moreover, in order to improve the crosslinking efficiency of the colored composition in the present invention, an alkali-soluble resin having a polymerizable group may be used. As the alkali-soluble resin having a polymerizable group, an alkali-soluble resins and the like containing an allyl group, a (meth)acryl group, an allyloxyalkyl group, and the like on a side chain thereof are useful. Examples of the polymer containing the above polymerizable group include Dianal NR series (manufactured by Mitsubishi Rayon Co., Ltd). Photomer 6173 (a polyurethane acrylic oligomer containing COOH, manufactured by Diamond Shamrock Co., Ltd.), Biscoat R-264 and KS Resist 106 (all manufactured by OSAKA ORGANIC CHEMICAL INDUSTRY LTD.), Cyclomer P series and Placcel CF200 series (all manufactured by DAICEL Corporation), and Ebecryl 3800 (manufactured by DAICEL-UCB Co., Ltd.). As the alkali-soluble resin containing a polymerizable group, a polymerizable double bond-containing acrylic resin modified with urethane, which is a resin obtained by a reaction of an isocyanate group and an OH group in advance to leave an unreacted isocyanate group and performing a reaction between a compound having a (meth)acryloyl group and an acrylic resin having a carboxyl group, an unsaturated bond-containing acrylic resin which is obtained by a reaction between an acrylic resin having a carboxyl group and a compound having both an epoxy group and a polymerizable double bond in a molecule, a polymerizable double bond-containing acrylic resin which is obtained by a reaction between an acid pendant type epoxy acrylate resin, an acrylic resin having an OH group, and a dibasic acid anhydride having a polymerizable double bond, a resin obtained by a reaction between an acrylic resin having an OH group and a compound having isocyanate and a polymerizable group, a resin which is obtained by treating a resin, which has an ester group having an elimination group such as a halogen atom or a sulfonate group in an α-position or a β-position described in JP2002-229207A and JP2003-335814A on a side chain, with a base, and the like are preferable.

As the alkali-soluble resin, particularly, a benzyl (meth)acrylate/(meth)acrylic acid copolymer or a multicomponent copolymer including benzyl (meth)acrylate/(meth)acrylic acid/other monomers is suitable. Examples thereof also include a benzyl (meth)acrylate/(meth)acrylic acid/2-hydroxyethyl (meth)acrylate copolymer obtained by copolymerizing 2-hydroxyethyl methacrylate, a 2-hydroxypropyl (meth)acrylate/a polystyrene macromonomer/benzyl methacrylate/methacrylic acid copolymer described in JP1995-140654A (JP-H07-140654A), a 2-hydroxy-3-phenoxypropyl acrylate/a polymethyl methacrylate macromonomer/benzyl methacrylate/methacrylic acid copolymer, a 2-hydroxyethyl methacrylate/a polystyrene macromonomer/ methyl methacrylate/methacrylic acid copolymer, and a 2-hydroxyethyl methacrylate/a polystyrene macromonomer/benzyl methacrylate/methacrylic acid copolymer, and particularly preferably, a copolymer of benzyl methacrylate/methacrylic acid.

With respect to the alkali-soluble resin, reference can be made to the descriptions in paragraphs "0558" to "0571" of JP2012-208494A ("0685" to "0700" of the corresponding to US2012/0235099A), the contents of which are incorporated herein.

Furthermore, it is preferable to use the copolymers (B) described in paragraph Nos. "0029" to "0063" of JP2012-32767A and the alkali-soluble resins used in Examples of the document; the binder resins described in paragraph Nos. "0088" to "0098" of JP2012-208474A and the binder resins used in Examples of the document, the binder resins described in paragraph Nos. "0022" to "0032" of JP2012-137531A and the binder resins in Examples of the document, the binder resins described in paragraph Nos. "0132" to "0143" of JP2013-024934A and the binder resins used in Examples of the document, the binder resins described in paragraph Nos. "0092" to "0098" of JP2011-242752A and used in Examples of the document, or the binder resins described in paragraph Nos. "0030" to 0072" of JP2012-032770A, the contents of which are incorporated herein. More Specifically, the following resins are preferable.

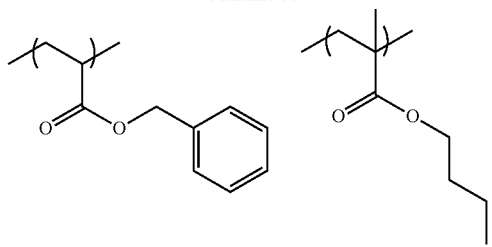

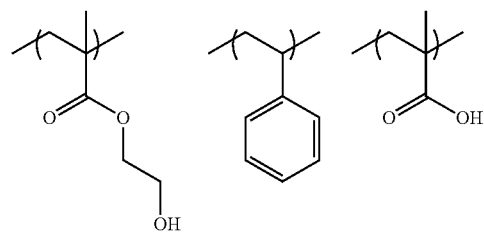

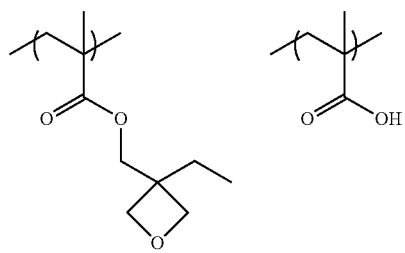

-continued

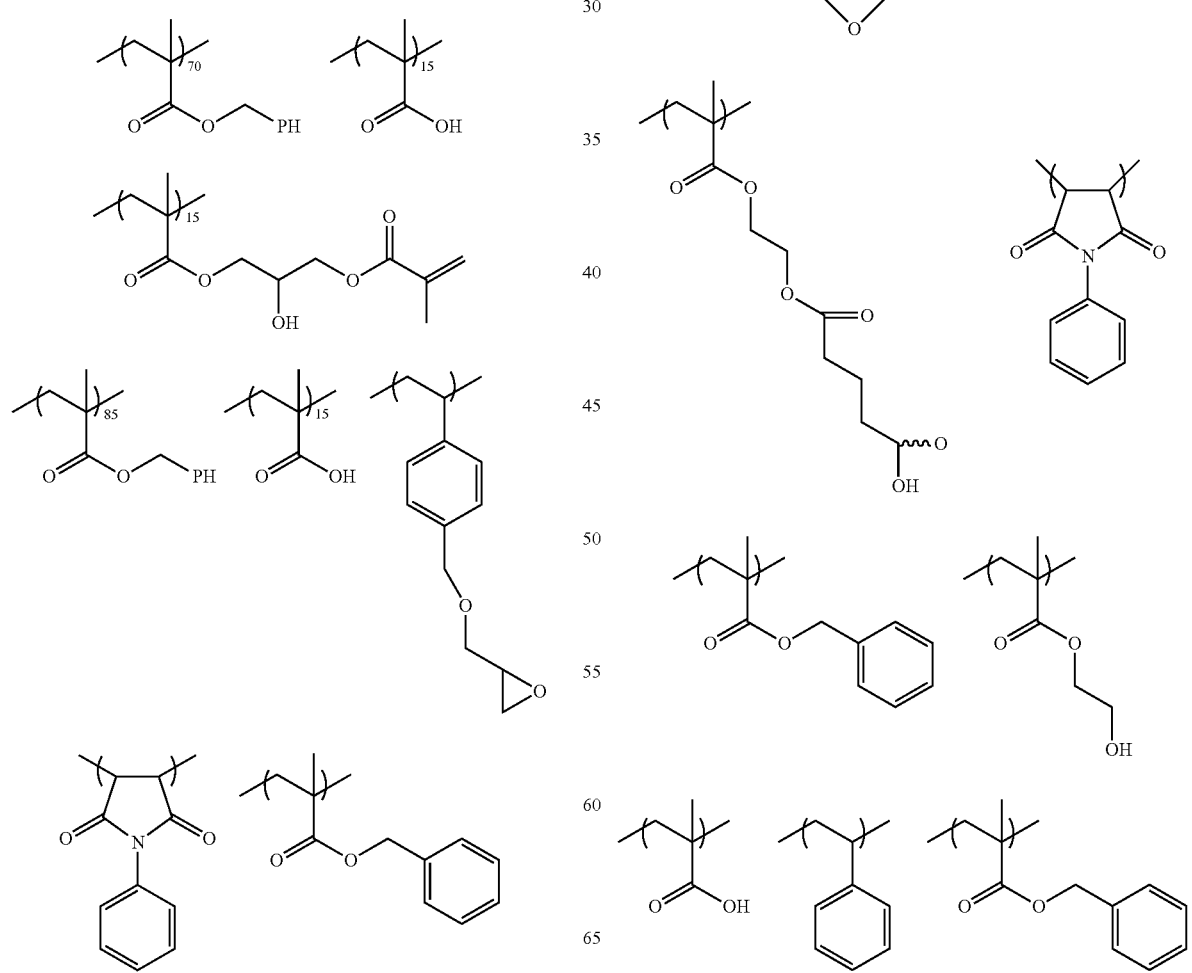

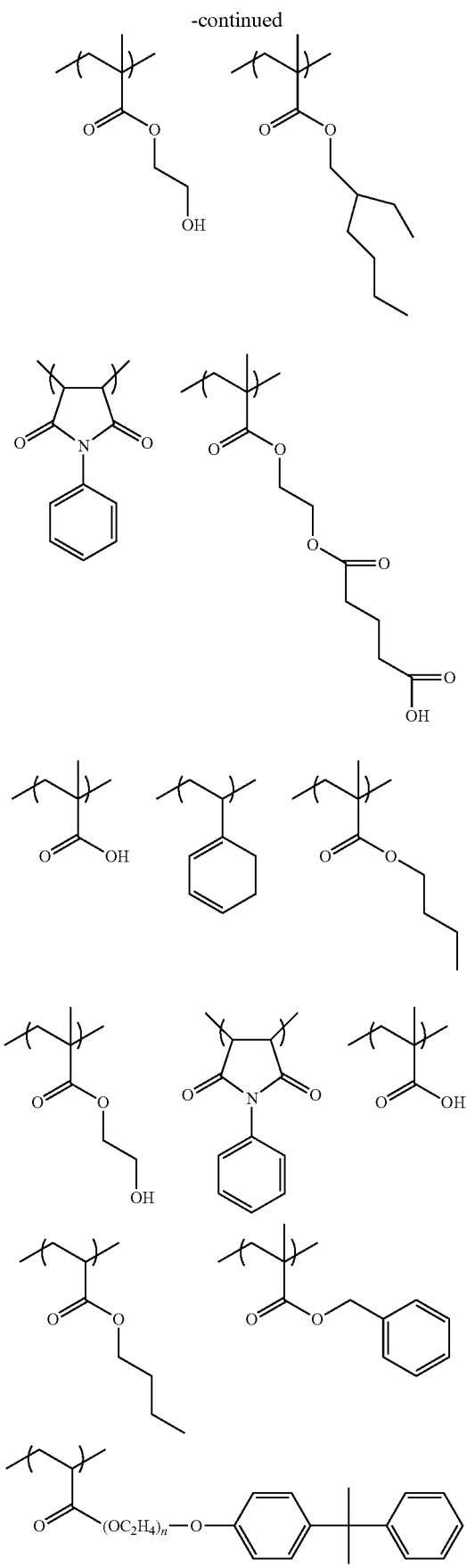
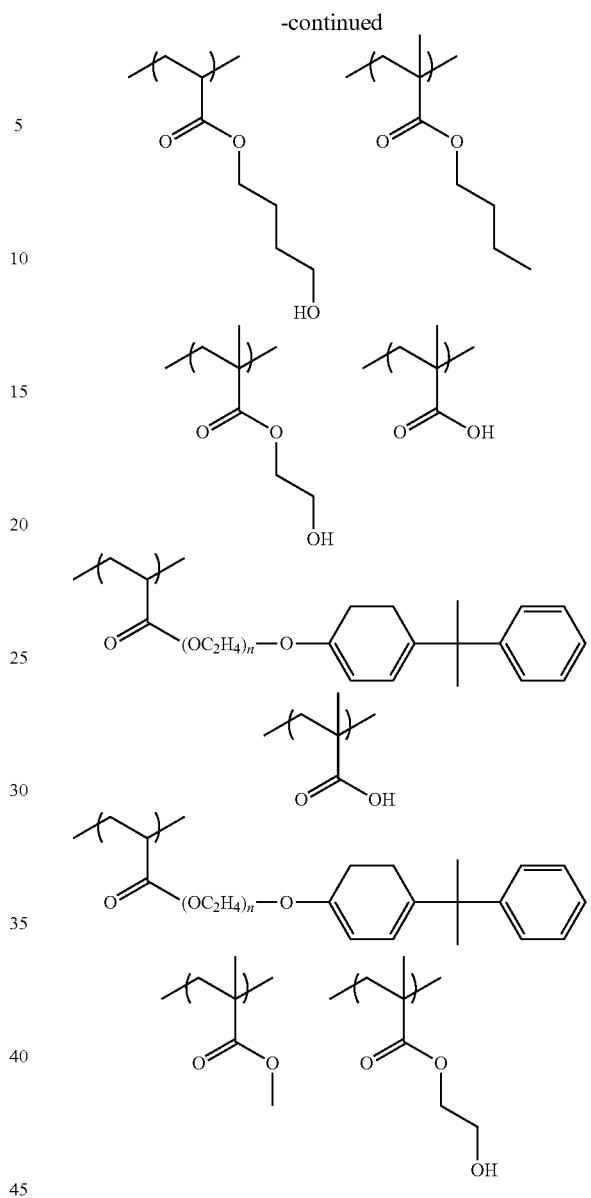

The acid value of the alkali-soluble resin is preferably 30 mgKOH/g to 200 mgKOH/g, more preferably 50 mgKOH/g to 150 mgKOH/g, and particularly preferably 70 mgKOH/g to 120 mgKOH/kg.

Furthermore, the weight-average molecular weight (Mw) of the alkali-soluble resin is preferably 2,000 to 50,000, more preferably 5,000 to 30,000, and particularly preferably 7,000 to 20,000.

In the case where the colored composition contains an alkali-soluble resin, the content of the alkali-soluble resin is preferably 1% by mass to 30% by mass, more preferably 1% by mass to 25% by mass, and particularly preferably 1% by mass to 20% by mass, with respect to the total solid contents of the colored composition.

The colored composition of the present invention may include one kind or two or more kinds of alkali-soluble resin. In the case where the colored composition includes two or more kinds of the alkali-soluble resin, the total amount thereof is preferably within the range.

<<Crosslinking Agent>>

It is also possible to improve the hardness of the cured film obtained by curing the colored composition by using a crosslinking agent complementarily in the colored composition of the present invention.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to the details of specific examples and the like of the crosslinking agent, reference can be made to the description of paragraphs "0134" to "0147" of JP2004-295116A.

In the case where the colored composition of the present invention contains a crosslinking agent, the blending amount of the crosslinking agent is not particularly limited, but is preferably 1% by mass to 30% by mass, and more preferably 1% by mass to 25% by mass, with respect to the total solid contents of the composition.

The colored composition of the present invention may include one kind or two or more kinds of crosslinking agent. In the case where the colored composition includes two or more kinds of the crosslinking agent, the total amount thereof is preferably within the range.

<<Polymerization Inhibitor>>

It is preferable to add a small amount of a polymerization inhibitor to the colored composition of the present invention in order to suppress unnecessary thermal polymerization of the polymerizable compound during production or storage of the colored composition.

Examples of the polymerization inhibitor which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and cerium (III) N-nitrosophenyl hydroxylamine.

In the case where the colored composition of the present invention contains a polymerization inhibitor, the amount of the polymerization inhibitor added is preferably about 0.01% by mass to about 5% by mass with respect to the mass of the entire composition.

The composition of the present invention may include one kind or two or more kinds of polymerization inhibitor. In the case where the composition includes two or more kinds of the polymerization inhibitor, the total amount thereof is preferably within the range.

<<Surfactant>>

From the viewpoint of further improving coatability, various surfactants may be added to the colored composition of the present invention. As the surfactants, it is possible to use various surfactants such as a fluorine-based surfactant, a nonionic surfactant, a cationic surfactant, an anionic surfactant, and a silicone-based surfactant.

Particularly, if the colored composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the colored composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the colored composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within the above range is effective in terms of the evenness of the thickness of the coating film or liquid saving properties, and the solubility of the surfactant in the colored composition is also good.

Examples of the fluorine-based surfactant include Megaface F171, Megaface F172, Megaface F173, Megaface F176, Megaface F177, Megaface F141, Megaface F142, Megaface F143, Megaface F144. Megaface R30, Megaface F437, Megaface F475, Megaface F479, Megaface F482, Megaface F554, Megaface F780, and Megaface F781 (all manufactured by DIC Corporation), Fluorad FC430, FC431, and FC171 (all manufactured by Sumitomo 3M), and Surflon S-382, Surflon SC-101, Surflon SC-103, Surflon SC-104, Surflon SC-105, Surflon SC1068, Surflon SC-381, Surflon SC-383, Surflon 393, and Surflon KH-40 (all manufactured by ASAHI GLASS Co., Ltd.).

Specific examples of the nonionic surfactant include glycerol trimethylolpropane, trimethylolethane, and ethoxylate and propoxylate thereof (for example, glycerol propoxylate and glycerin ethoxylate), polyoxyethylene lauryl ether, polyoxyethylene steallyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L0, L31, L61, L62, 10R5, 17R2, and 25R2, and Tetronic 304, 701, 704, 901, 904, and 150R1 manufactured by BASF), and Solseperse 20000 (manufactured by The Lubrizol Corporation).

Specific examples of the cationic surfactant include phthalocyanine derivatives (product name: EFKA-745 manufactured by MORISHITA SANGYO Corporation), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "Toray Silicone DC3PA", "Toray Silicone SH7PA", "Toray Silicone DC11PA", "Toray Silicone SH21PA", "Toray Silicone SH28PA". "Toray Silicone SH29PA", "Toray Silicone SH30PA", and "Toray Silicone SH8400", manufactured by Dow Corning Toray. "TSF-4440", "TSF-4300", "TSF-4445". "TSF-4460", and "TSF-4452", manufactured by Momentive Performance Materials Inc., "KP341". "KF6001", and "KF6002", manufactured by Shin-Etsu Silicones, and "BYK307", "BYK323", and "BYK330", manufactured by BYK-Chemie.

The surfactants may be used alone or in combination of two or more kinds thereof.

In the case where the colored composition of the present invention contains a surfactant, the amount of the surfactant added is preferably 0.001% by mass to 2.0% by mass and more preferably 0.005% by mass to 1.0% by mass, with respect to the total mass of the colored composition.

The composition of the present invention may include one kind or two or more kinds of surfactant. In the case where the composition includes two or more kinds of the surfactant, the total amount thereof is preferably within the range.

<<Organic Carboxylic Acid and Organic Carboxylic Anhydride>>

The colored composition of the present invention may contain an organic carboxylic acid having a molecular weight of 1000 or less, and/or an organic carboxylic anhydride.

Specific examples of the organic carboxylic acid compound include an aliphatic carboxylic acid and an aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly those having a molecular weight of 50 to 500, and specifically, maleic acid, malonic acid, succinic acid, and itaconic acid are preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, and naphthalic anhydride. Among these, those having a molecular weight of 600 or less, particularly having a molecular weight of 50 to 500, specifically, for example, maleic anhydride, succinic anhydride, citraconic anhydride, and itaconic anhydride, are particularly preferable.

In the case where the colored composition of the present invention contains an organic carboxylic acid or an organic carboxylic anhydride, the amount of these organic carboxylic acids and/or the organic carboxylic anhydrizdes added is generally in a range of 0.01% by mass to 10% by mass, preferably 0.03% by mass to 5% by mass, and more preferably 0.05% by mass to 3% by mass in the total solid contents.

The composition of the present invention may include one kind or two or more kinds of each of organic carboxylic acids and/or inorganic carboxylic acids. In the case where the composition includes two or more kinds of the carboxylic acids, the total amount thereof is preferably within the above range.

By adding these organic carboxylic acids and/or the organic carboxylic anhydrides having a molecular weight of 1000 or less, it is possible to further reduce the amount of the residual undissolved substance of the colored composition while maintaining high pattern adhesiveness.

If desired, various additives such as a filler, an adhesion promoting agent, an antioxidant, an ultraviolet absorber, and an anti-aggregation agent may be blended into the colored composition. Examples of these additives include those described in paragraphs "0155" and "0156" of JP2004-295116A.

The colored composition of the present invention can contain the sensitizer or the light stabilizer described in paragraph "0078" of JP2004-295116A, and the thermal polymerization inhibitor described in paragraph "0081" of JP2004-295116A.

The composition of the present invention may include one kind or two or more kinds of the components. In the case where the composition includes two or more kinds of the components, the total amount thereof is preferably within the range.

<Method for Producing Colored Composition>

The colored composition of the present invention is prepared by mixing the aforementioned components.

Incidentally, when the colored composition is prepared, the respective components constituting the colored composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the composition. Alternatively, if desired, the respective components may be appropriately prepared as two or more solutions and dispersions and mixed at the time of use (at the time of coating) to prepare the composition.

The colored composition of the present invention is preferably filtered through a filter for the purpose of removing foreign substances, decreasing defectiveness, and the like. As the filter, filters which are traditionally used for filtration or the like can be used without particular limitation. Examples thereof include filters formed of fluororesins such as polytetrafluoroethylene (PTFE), polyamide-based resins such as nylon-6 and nylon-6.6, and polyolefin resins (including those with a high density and an ultrahigh molecular weight) such as polyethylene and polypropylene (PP). Among these materials, polypropylene (including high-density polypropylene) are preferable.

The pore diameter of the filter is suitably about 0.01 μm to 7.0 μm, preferably 0.01 μm to 3.0 μm, more preferably 0.01 μm to 2.5 μm, still more preferably 0.01 μm to 2.0 μm, and particularly preferably 0.05 μm to 0.5 μm Within the above range, it becomes possible to remove minute foreign substances which hinder the preparation of a uniform and smooth colored radiation-sensitive composition layer.

When using the filter, different filters may be used in combination. At this time, the filtering in the first filtration may be carried out only once or twice or more times in the first filter.

In addition, filters having different pore diameters within the aforementioned range may be combined with each other. Here, with respect to the pore diameter, reference can be made to values officially measured by a filter maker. As a commercially available filter, the filter can be selected from various filters supplied from Pall Corporation Japan, ADVANTEC Co., Ltd., Japan Entegris, Inc. (formerly Japan Microlis), KITZ MICRO FILTER CORPORATION, or the like.

As a second filter, a filter formed of the same material or the like as that of the aforementioned first filter can be used.

For example, the filtering in the first filtration is carried out only for a dispersion, and the second filtering may be carried out.

The colored composition of the present invention is preferably used for forming a colored layer of a color filter. More specifically, since the colored composition of the present invention can form a cured film having excellent heat resistance and color characteristics, the colored composition of the present invention is suitably used for forming a colored pattern (colored layer) of a color filter. Further, the colored composition of the present invention can be suitably used for forming a colored pattern of a color filter or the like used in a solid-state imaging element (for example, a CCD and a CMOS) or an image display device such as a liquid crystal display (LCD). Further, the composition can also be suitably used in an application of the manufacture of a print ink, an ink jet ink, a coating material, or the like. Among these, the composition can be suitably used in an application of the manufacture of a color filter for a solid-state imaging element such as a CCD and a CMOS.

The present invention also relates to a polymer having the repeating unit(s) represented by General Formula (A4-1) and/or (A4-3). Further, the present invention also relates to a xanthene dye represented by General Formula (A5).

<Cured Film, Pattern Forming Method, Color Filter, and Method for Producing Color Filter>

Next, the cured film, the pattern forming method, and the color filter in the present invention will be described in detail with reference to production methods thereof.

The cured film of the present invention is formed by curing the colored composition of the present invention. Such a cured film is preferably used in a color filter.

In the pattern forming method of the present invention, a colored composition layer is formed on a support using the colored composition of the present invention, and undesired areas are removed to form a colored pattern.

The pattern forming method of the present invention can be suitably applied for forming a colored pattern (pixel) which a color filter has.

With the composition of the present invention, a color filter may be manufactured by forming a pattern by so-called photolithography, or a pattern can be formed by a dry etching method.

That is, as a first method for manufacturing a color filter, a method for manufacturing a color filter, including, applying the colored composition of the present invention onto a support to form a colored composition layer, a step of patternwise exposing the colored composition layer, and a step of removing an unexposed area by development to form a colored pattern, is exemplified.

Furthermore as a second method for manufacturing a color filter, a method for manufacturing a color filter, including, a step of applying the colored composition of the present invention onto a support to form a colored composition layer and curing the colored composition layer to form a colored layer, a step of forming a photoresist layer on the colored layer, a step of patterning the photoresist layer by exposure and development to obtain a resist pattern, and a step of dry-etching the colored layer using the resist pattern as an etching mask to form a colored pattern.

In the present invention, it is more preferable that the color filter is manufactured by photolithography.

Details thereof will be described below.

Hereinafter, the respective steps in the pattern forming method of the present invention will be described will be described in detail with respect to the method for manufacturing a color filter for a solid-state imaging element, but the present invention is not limited to the method. Hereinafter, the color filter for a solid-state imaging element may be simply referred to as a "color filter" in some cases.

<Step of Forming Colored Composition Layer>

In the step of forming a colored composition layer, the colored composition of the present invention is applied onto a support to form a colored composition layer.

As the support which can be used in the present step, for example, a substrate for a solid-state imaging element, which is formed by providing an imaging element (light-receiving element) such as a charge coupled device (CCD) or a complementary metal-oxide semiconductor (CMOS) onto a substrate (for example, a silicon substrate) can be used.

The colored pattern in the present invention may be formed on the surface (front surface) on which an imaging element is formed or on the surface (back surface) where an imaging element is not formed, of a substrate for a solid-state imaging element.

A light shielding film may be disposed between the colored patterns in a solid-state imaging element or on the back surface of the substrate for a solid-state imaging element.

In addition, if desired, an undercoat layer may be disposed onto the support in order to improve adhesiveness between the support and the upper layer, prevent diffusion of substances, or planarize the substrate surface. A solvent, an alkali-soluble resin, a polymerizable compound, a polymerization inhibitor, a surfactant, a photopolymerization initiator, or the like can be blended into the undercoat layer, and it is preferable that these respective components are appropriately selected from the components blended into the composition of the present invention.

As the method for applying the colored composition of the present invention onto the support, various coating methods such as slit coating, ink jet coating, spin coating, cast coating, roll coating, and screen printing can be applied.

Drying (pre-baking) of the colored composition layer applied onto the support can be carried out in a hot plate, an oven, or the like at a temperature of 50° C. to 140° C. for 10 seconds to 300 seconds.

<<Case of Forming Pattern by Photolithography>>
<<<Exposing Step>>>

In the exposing step, the colored composition layer formed in the colored composition layer forming step is patternwise exposed through a mask having a predetermined mask pattern by using, for example, an exposure device such as a stepper. Thus, a cured film is obtained.

As radiation (light) usable in exposure, particularly, ultraviolet rays such as a g-ray and an i-ray are preferably used (particularly, an i-ray is preferably used). The irradiation dose (exposure dose) is preferably 30 mJ/cm$^2$ to 1500 mJ/cm$^2$, more preferably 50 mJ/cm$^2$ to 1000 mJ/cm$^2$, and most preferably 80 mJ/cm$^2$ to 500 mJ/cm$^2$.

The film thickness of the cured film (colored film) is preferably 1.0 μm or less, more preferably 0.1 μm to 0.9 μm, and still more preferably 0.2 μm to 0.8 μm.

It is preferable to set the film thickness to 1.0 μm or less since high resolution and high adhesiveness are obtained.

Moreover, in this step, a cured film having a small film thickness of 0.7 μm or less can be suitably formed. Further, if the obtained cured film is subjected to a development treatment in a pattern forming step which will be described later, it is possible to obtain a colored pattern which is a thin film and exhibits excellent developability and reduced surface roughness with an excellent pattern shape.

<<Developing Step>>>

Thereafter, by performing an alkaline developing treatment, the colored composition layer in an area not irradiated with light in the exposing step is eluted into an aqueous alkaline solution, and as a result, only a photocured area remains.

As a developing liquid, an organic alkaline developing liquid not damaging an imaging element, a circuit, or the like in an underlayer is preferable. The development temperature is usually 20° C. to 30° C., and the development time is 20 seconds to 90 seconds in the related art. In order to further remove residues, development is recently carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent used for the developing liquid include organic alkaline compounds such as aqueous ammonia, ethylamine, diethylamine, dimethyl ethanolamine, tetramethyl ammonium hydroxide, tetraethyl ammonium hydroxide, tetrapropyl ammonium hydroxide, tetrabutyl ammonium hydroxide, benzyltrimethyl ammonium hydroxide, choline, pyrrole, piperidine, and 1,8-diazabicyclo-[5.4.0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (post-baking) after drying. If a multi-colored pattern is formed, the above steps can be sequentially repeated for each color to produce a cured film Thus, a color filter is obtained.

The post-baking is a heating treatment performed after development so as to complete curing, and in the post-baking, a thermal curing treatment is carried out usually at 100° C. to 240° C., and preferably at 200° C. to 240° C.

The post-baking treatment can be carried out on the coating film obtained after development in a continuous or batch manner, by using heating means such as a hot plate, a convection oven (a hot-air circulation type drier), and a high-frequency heater under the conditions described above.

<Case of Forming Pattern by Dry Etching Method>

In the case of forming a pattern by a dry etching method, the method preferably includes a step of applying the colored composition of the present invention onto a support to form a colored composition layer and curing the colored composition layer to form a colored layer, a step of forming a photoresist layer on the colored layer, a step of patterning the photoresist layer by exposure and development to obtain a resist pattern, and a step of dry-etching the colored layer using the resist pattern as an etching mask.

For the colored layer, the dry etching can be carried out with an etching gas, using a patterned photoresist layer as a mask. Specifically, a positive-type or negative-type radiation-sensitive composition is applied onto the colored layer and dried to form a photoresist layer. In the formation of the photoresist layer, it is preferable to further carry out a pre-baking treatment. In particular, as a process for forming a photoresist, a configuration in which a post-exposure heating treatment (PEB) or a post-development heating treatment (post-baking treatment) is carried out is preferable.

As the photoresist, for example, a positive-type radiation-sensitive composition is used. As the positive-type radiation-sensitive composition, a positive-type resist composition suitable for a positive-type photoresist, which responds to radiation, for example, an ultraviolet ray (a g-ray, an h-ray, or an i-ray), a far ultraviolet ray including an excimer laser and the like, an electron beam, an ion beam, or an X-ray, can be used. Among the radiations, a g-ray, an h-ray, or an i-ray is preferable, among which the i-ray is more preferable.

Specifically, as the positive-type radiation-sensitive composition, a composition containing a quinonediazide compound and an alkali-soluble resin is preferable. The positive-type radiation-sensitive composition containing a quinonediazide compound and an alkali-soluble resin utilizes a quinonediazide group being decomposed to generate a carboxyl group by light irradiation at a wavelength of 500 nm or less, and as a result, the quinonediazide compound is shifted from an alkali-insoluble state to an alkali-soluble state. Since this positive-type photoresist is remarkably excellent in the resolving power, it is used for the manufacture of an integrated circuit, for example, IC and LSI. Examples of the quinonediazide compound include a naphthoquinonediazide compound. Examples of commercially available products thereof include "FHi622BC" (manufactured by FUJIFILM Electronics Materials Co., Ltd.).

The thickness of the photoresist layer is preferably 0.1 pan to 3 μm, more preferably 0.2 μm to 2.5 μm, and still more preferably 0.3 μm to 2 μm Incidentally, coating of the photoresist layer can be suitably carried out using the coating method described with respect to the above-described colored layer.

Next, a resist pattern (patterned photoresist layer) in which a resist through-hole group is disposed is formed by exposing and developing the photoresist layer. The formation of the resist pattern can be carried out by appropriately optimizing heretofore known techniques of photolithography without particular limitation. By providing the resist through-hole group in the photoresist layer by exposure and development, the resist pattern which is used as an etching mask in the subsequent etching is provided on the colored layer.

Exposure of the photoresist layer can be carried out by exposing a positive-type or negative-type radiation-sensitive composition to a g-ray, an h-ray, or an i-ray, and preferably to an i-ray through a predetermined mask pattern. After the exposure, a development treatment is carried out using a developing liquid to remove the photoresist corresponding to the region where a colored pattern is to be formed.

As the developing liquid, any developing liquid which does not affect a colored layer containing a coloring agent and dissolves the exposed area of a positive resist or the uncured area of a negative resist may be used, and for example, a combination of various organic solvents or an aqueous alkaline solution is used. As the aqueous alkaline solution, an aqueous alkaline solution prepared by dissolving an alkaline compound to yield a concentration of 0.001% by mass to 10% by mass, and preferably 0.01% by mass to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylemanolamine, tetramethylammonium hydroxide, tetraethylammonium hydroxide, choline, pyrrole, piperidine, and 1,8-diazabicyclo-[5.4.0]-7-undecene. Incidentally, in the case where an aqueous alkaline solution is used as the developing liquid, a cleaning treatment with water is generally carried out after development.

Next, the colored layer is patterned by dry etching so as to form a through-hole group in the colored layer using the resist pattern as an etching mask. Thus, a colored pattern is formed. The through-hole group is provided checkerwise in the colored layer. Thus, a first colored pattern having the through-hole group provided in the colored layer has a plurality of first quadrangular colored pixels checkerwise.

Specifically, in the dry etching, the colored layer is dry-etched using a resist pattern as an etching mask. Representative examples of the dry etching include the methods described in the respective gazettes of JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), JP1986-41102A (JP-S61-41102A), and the like.

It is preferable that the dry etching is carried out in a configuration as described below from the viewpoint of forming a pattern cross-section closer to that of a rectangle or of further reducing damage to a support.

A configuration is preferable, which includes a first-stage etching of etching up to an area (depth) where the support is not revealed by using a mixed gas of a fluorine-based gas and an oxygen gas ($O_2$), a second-stage etching of preferably etching up to the vicinity of an area (depth) where the support is revealed by using a mixed gas of a nitrogen gas ($N_2$) and an oxygen gas ($O_2$) after the first-stage etching, and an over-etching carried out after the support has been revealed. A specific manner of the dry etching as well as the first-stage etching, the second-stage etching, and the over-etching will be described below.

The dry etching is carried out by determining the etching conditions in advance in the following manner.

(1) An etching rate (nm/min) in the first-stage etching and an etching rate (nm/min) in the second-stage etching are calculated, respectively. (2) A time for etching a predetermined thickness in the first-stage etching and a time for etching a predetermined thickness in the second-stage etching are calculated, respectively. (3) The first-stage etching is carried out according to the etching time calculated in (2) above. (4) The second-stage etching is carried out according to the etching time calculated in (2) above. Alternatively, an etching time is determined by endpoint detection, and the second-stage etching may be carried out according to the determined etching time. (5) The over-etching time is calculated in response to the total time of (3) and (4) above, and the over-etching is carried out.

The mixed gas used in the first-stage etching step preferably contains a fluorine-based gas and an oxygen gas (02) from the viewpoint of processing an organic material of the film to be etched into a rectangle shape. The first-stage etching step may avoid damage to the support by adopting the configuration of etching up to an area where the support is not revealed. After the etching is carried out up to an area where the support is not revealed by the mixed gas of a fluorine-based gas and an oxygen gas in the first-stage etching step, etching treatment in the second-stage etching step and etching treatment in the over-etching step are preferably carried out by using the mixed gas of a nitrogen gas and an oxygen gas from the viewpoint of avoiding damage to the support.

It is important that a ratio between the etching amount in the first-stage etching step and the etching amount in the second-stage etching step is determined so as not to deteriorate the linearity by the etching treatment in the first-stage etching step. Incidentally, the ratio of the etching amount in the second-stage etching step in the total etching amount (the sum of the etching amount in the first-stage etching step and the etching amount in the second-stage etching step) is preferably in a range of more than 0% and 50% or less, and more preferably 10% to 20%. The etching amount means an amount determined by a difference between the remaining film thickness of the etched film and the film thickness of the film before the etching.

Furthermore, the etching preferably includes an over-etching treatment. The over-etching treatment is preferably carried out by determining an over-etching rate. The over-etching rate is preferably calculated from an etching treatment time which is carried out at first. Although the over-etching rate may be arbitrarily determined, it is preferably 30% or less, more preferably 5% to 25%, and particularly preferably 10% to 15%, of the etching processing time in the etching steps, from the viewpoint of etching resistance of the photoresist and preservation of the linearity of the etched pattern.

Next, the resist pattern (that is, the etching mask) remaining after the etching is removed. The removal of the resist pattern preferably includes a step of supplying a peeling solution or a solvent on the resist pattern to make the resist pattern be in a removable state, and a step of removing the resist pattern using cleaning water.

The step of supplying a peeling solution or a solvent on the resist pattern to make the resist pattern be in a removable state includes, for example, a step of paddle development by supplying a peeling solution or a solvent at least on the resist pattern and retaining for a predetermined time. The time for retaining the peeling solution or a solvent is not particularly limited, and is preferably several tens of seconds to several minutes.

Moreover, the step of removing the resist pattern using cleaning water includes, for example, a step of removing the resist pattern by spraying cleaning water from a spray-type or shower-type spray nozzles onto the resist pattern. As the cleaning water, pure water is preferably used. The spray nozzles include spray nozzles having a spray area which covers the entire support and mobile spray nozzles having a mobile area which covers the entire support. In the case where the spray nozzles are mobile spray nozzles, the resist pattern can be more effectively removed by moving the mobile spray nozzles twice or more from the center of support to the edge of the support to spray cleaning water in the step of removing the resist pattern.

The peeling solution generally contains an organic solvent and may further contain an inorganic solvent. Examples of the organic solvent include 1) a hydrocarbon-based compound, 2) a halogenated hydrocarbon-based compound, 3) an alcohol-based compound, 4) an ether- or acetal-based compound, 5) a ketone- or aldehyde-based compound, 6) an ester-based compound, 7) a polyhydric alcohol-based compound, 8) a carboxylic acid- or its acid anhydride-based compound, 9) a phenol-based compound, 10) a nitrogen-containing compound, 11) a sulfur-containing compound, and 12) a fluorine-containing compound. The peeling solution preferably contains a nitrogen-containing compound, and more preferably contains an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, and triethanolamine, among which monoethanolamine, diethanolamine, and triethanolamine are preferable, and monoethanolamine ($H_2NCH_2CH_2OH$) is more preferable. Further, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine. N-methyl-2-pyrrolidone, N-phenyl morpholine, 2,4-lutidine, and 2,6-lutidine, among which N-methyl-2-pyrrolidone and N-ethyl morpholine are preferable, and N-methyl-2-pyrrolidone (NMP) is more preferable.

The peeling solution preferably includes both the acyclic nitrogen-containing compound and the cyclic nitrogen-containing compound, more preferably contains at least one selected from monoethanolamine, diethanolamine, and triethanolamine as the acyclic nitrogen-containing compound, and at least one selected from N-methyl-2-pyrrolidone and N-ethyl morpholine as the cyclic nitrogen-containing compound, and still more preferably contains monoethanolamine and N-methyl-2-pyrrolidone.

In the removal with the peeling solution, it is sufficient that the resist pattern formed on the first colored pattern is removed, and in the case where a deposit of an etching product is attached to the side wall of the first colored pattern, it is not always necessary to completely remove the deposit. The deposit means an etching product attached and deposited to the side wall of colored layer.

For the peeling solution, it is preferable that the content of the acyclic nitrogen-containing compound is 9 parts by mass to 11 parts by mass with respect to 100 parts by mass of the peeling solution, and the content of the cyclic nitrogen-containing compound is 65 parts by mass to 70 parts by mass with respect to 100 parts by mass of the peeling solution. The peeling solution is preferably one prepared by diluting a mixture of the acyclic nitrogen-containing compound and the cyclic nitrogen-containing compound with pure water.

Incidentally, the method for manufacturing a color filter of the present invention may have a step known as a method for manufacturing a color filter for a solid-state imaging element, if desired, as a step other than the above steps. For example, the method may include a curing step of curing the formed colored pattern by heating and/or exposure, if desired, after the colored composition layer forming step, the exposing step, and the pattern forming step are carried out.

Moreover, in the case of using the colored composition of the present invention, there are some cases where the contamination caused when a nozzle of an ejection portion or a piping portion of a coating device is clogged, or the colored composition or a pigment adheres to or is precipitated or dried inside the coating machine may occur. Thus, in order to efficiently clean off the contamination caused by the colored composition of the present invention, it is preferable to use the solvent relating to the present configuration as described above as a cleaning liquid. In addition, the cleaning liquids described in JP1995-128867A (JP-H07-128867A). JP1995-146562A (JP-H07-146562A), JP1996-278637A (JP-H08-278637A), JP2000-273370A, JP2006-85140A. JP2006-291191 A, JP2007-2101 A, JP2007-2102A, JP2007-281523A, and the like can also be suitably used as a liquid for removing the colored composition according to the present invention by cleaning.

Among the above, alkylene glycol monoalkyl ether carboxylate and alkylene glycol monoalkyl ether are preferable.

These solvents may be used alone or as a mixture of two or more kinds thereof. In the case where two or more kinds thereof are mixed, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and still more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Incidentally, in order to improve the permeability of the cleaning liquid with respect to the contaminant, the aforementioned surfactants relating to the present composition may be added to the cleaning liquid.

Since the color filter of the present invention uses the colored composition of the present invention, exposure having an excellent exposure margin can be carried out, and the formed colored pattern (colored pixel) has an excellent pattern shape. Further, since the surface roughness of the pattern and the amount of residues in a developed area are inhibited, excellent color characteristics are exhibited.

The color filter of the present invention can be suitably used for a solid-state imaging element such as a CCD and a CMOS, and is suitably preferable for a CCD, a CMOS, and the like with a high resolution, having more than 1,000,000 pixels. The color filter for a solid-state imaging element of the present invention can be used as, for example, a color filter disposed between a light-receiving portion of each pixel constituting a CCD or a CMOS and a microlens for condensing light.

Incidentally, the film thickness of the colored pattern (colored pixel) in the color filter of the present invention is preferably 2.0 μm or less, more preferably 1.0 μm or less, and still more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Imaging Element>

The solid-state imaging element of the present invention includes the color filter of the present invention. The constitution of the solid-state imaging element of the present invention is not particularly limited as long as the solid-state imaging element is constituted to include the color filter in the present invention and functions as a solid-state imaging element. However, for example, the solid-state imaging element can be constituted as below.

That is, the constitution is as follows: a plurality of photodiodes forming a light-receiving area of a solid-state imaging element (a CCD image sensor, a CMOS image sensor, or the like) and a transmission electrode formed of polysilicon or the like are provided on a support; a light-shielding film which is made of, for example, tungsten and has openings corresponding to only light-receiving portions of the photodiodes is provided on the photodiodes and the transmission electrode; a device protecting film which is made of, for example, silicon nitride is formed on the light-shielding film so as to cover the entire surface of the light-shielding film and the light-receiving portions of the photodiodes; and the color filter for a solid-state imaging element according to the present invention is provided on the device protecting film.

In addition, the solid-state imaging element may also be configured, for example, such that it has a light-collecting unit (for example, a microlens or the like, which shall apply hereinafter) provided on the device protecting film and under a color filter (on the side closer to a support) or has a light-collecting unit on a color filter.

<Image Display Device>

The color filter of the present invention can be used not only for a solid-state imaging element, but also for an image display device such as a liquid crystal display device and an organic EL display device. In particular, the color filter is suitable for the applications of a liquid crystal display device. The liquid crystal display device including the color filter of the present invention can display a high-quality image showing a good tone of the display image and having excellent display characteristics.

The definition of display devices or details of the respective display devices are described in, for example, "Electronic Display Device (Akio Sasaki, Kogyo Chosakai Publishing Co., Ltd., published in 1990)". "Display Device (Toshiyuki Ibuki, Sangyo Publishing Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, a dye multimer having an excellent hue is used. Accordingly, the color purity, light-transmitting properties, and the like are good, and the tone of the colored pattern (pixel) is excellent. Consequently, a liquid crystal display device of a COA system which has a high resolution and is excellent in long-term durability can be provided. Incidentally, in order to satisfy the characteristics required for a low dielectric constant, a resin coat may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

Furthermore, in the present invention, the color filter can also be preferably used for display in a micro-OLED system. These image display systems are described in, for example, p. 43 of "EL, PDP and LCD Display Technologies and Recent Trend in Market (TORAY RESEARCH CENTER. Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the literature, and the like.

If the color filter in the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

EXAMPLES

Hereinafter, the present invention will be described in more detail with reference to Examples, but is not limited to the Examples below as long as there is no deviation from the gist of the present invention. Incidentally, "%" and "part(s)" are based on mass unless otherwise specified.

<Synthesis Examples of Dye Compound A-1>

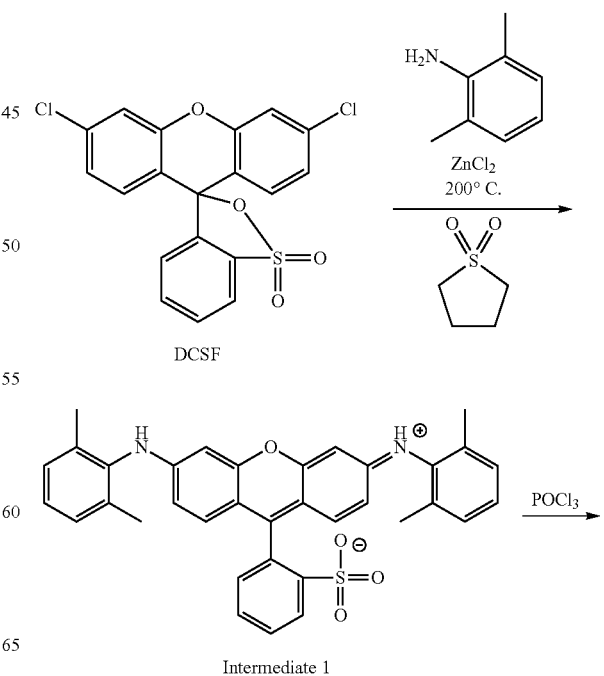

Intermediate 1

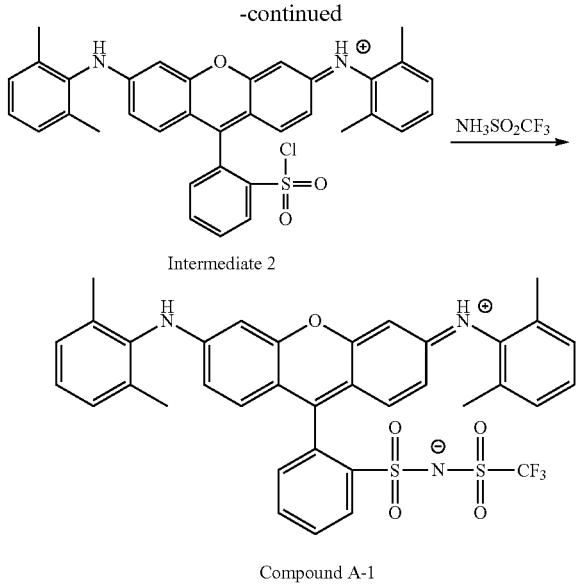

Intermediate 2

Compound A-1

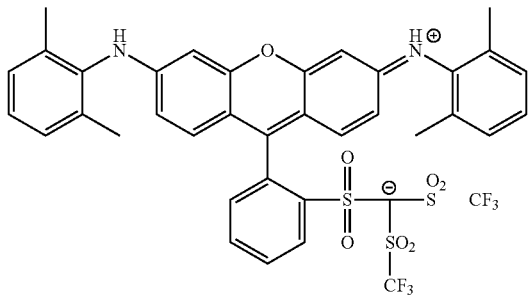

(A-2)

<Synthesis of Intermediate 1>

50 parts of DCSF (manufactured by Chugai Kasei Co Ltd.), 74.76 parts of 2,6-dimethylaniline, 27.58 parts of zinc chloride, and 200 parts of sulfolane were put into a flask and the mixture was stirred at an external temperature of 200° C. for 4 hours. Thereafter, the obtained reaction solution was left to be cooled to room temperature and added dropwise to 500 parts of 2 N hydrochloric acid, and the precipitated crystal was separated by filtration. The crystal was dispersed and washed with 300 parts of acetonitrile at 40° C., collected by filtration, and air-dried for 10 hours to obtain 46.5 parts (yield: 65.6%) of an intermediate 1.

<Synthesis of Intermediate 2>

20 parts of the intermediate 1 and 106 parts of phosphorus oxychloride were put into a flask and the mixture was stirred at 60° C. for 2 hours. The obtained reaction solution was left to be cooled to room temperature, the reaction solution was added dropwise to 1500 parts of ice water, and the mixture was stirred for 30 minutes. The obtained crystal was separated by filtration, washed with 200 parts of water, and air-dried for 10 hours to obtain 18.5 parts (yield: 89.4%) of an intermediate 2.

<Synthesis of Dye Compound A-1>

7 parts of the intermediate 2 and 1.94 parts of trifluoromethylsulfonamide were dissolved in 40 parts of chloroform, 1.55 parts of triethylamine was added dropwise, and the mixture was stirred at room temperature for 1 hour. Thereafter, 100 parts of water was added to the obtained reaction solution to perform water-washing and then the organic layer was collected by separation. The organic layer was dried over sodium sulfate, purified by column chromatography, and concentrated under reduced pressure to obtain a dye compound A-1 (3 parts (yield: 36%)).

The dye compound A-1 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 2.15-2.25 (12H, m), 5.95-6.31 (4H, m), 6.95-7.4 (8H, m), 7.4-7.53 (1H, m), 7.7-7.9 (2H, m), 8.11-8.25 (1H, m), 9.93-10.12 (2H, m).

<Synthesis of Dye Compound A-2>

A dye compound A-2 was synthesized in the same manner as in the method for synthesizing the dye compound A-1 except that trifluoromethylsulfonamide was changed to the same moles of bistrifluoromethylsulfonylmethane in the method for synthesizing the dye compound A-1.

<Synthesis of Intermediate 3>

50 parts of p-acetoxystyrene, 150 parts of ethyl acetate, and 89.2 parts of a 28% methanol solution of sodium methoxide were put into a flask, and the mixture was stirred at room temperature for 1 hour. To the obtained reaction solution was added 500 parts of a 1 N hydrochloric acid solution, and then the ethyl acetate layer was collected by separation. The ethyl acetate layer was washed and the ethyl acetate layer after washing was dried over magnesium sulfate. 4.63 parts of triethylamine was added to the solution after drying and the mixture was cooled to 0° C. 13.8 parts of 1,3-bis(fluorosulfonyl)-1,1,2,2,3,3-hexafluorobutane (EF-3000 manufactured by Mitsubishi Materials Electronic Chemicals Co., Ltd.) was added dropwise thereto under cooling and the mixture was stirred for 30 minutes. Thereafter, 500 parts of aqueous ammonia was added thereto and the mixture was stirred for 30 minutes. The reaction solution was neutralized with a 1 N hydrochloric acid solution, then washed with 500 parts of saturated physiologicalsaline, dried over magnesium sulfate, and concentrated under reduced pressure. The residue was purified by silica gel column chromatography (a developing solvent of chloroform/methanol=8/2) to obtain 3.0 parts of an Intermediate 3.

Intermediate 3

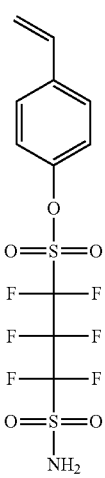

<Compound A-13>

The intermediate 3 (3 parts) and 0.7 parts of triethylamine were dissolved in 12 parts of methylene chloride, 4.6 parts of the intermediate 2 was added thereto, and the mixture was stirred at room temperature for 1 hour. To the obtained reaction solution was added 50 parts of water to perform water-washing, and the reaction solution after water-washing was dried over magnesium sulfate and then purified by silica gel column chromatography (a developing solvent of chloroform/methanol=8/2) to obtain 0.8 parts of A-13.

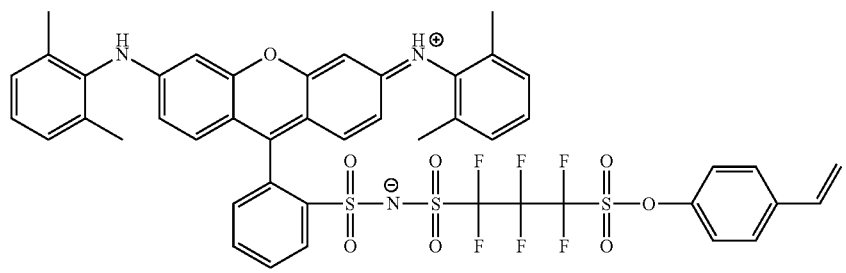

(A-13)

<Synthesis of Dye Compound P-1>

2.7 parts of cyclohexanone was stirred at 90° C. and to the solution was added dropwise a solution obtained by adding 2 parts of A-13, 0.43 parts of methacrylic acid, and V601 (0.42 parts) manufactured by Wako Pure Chemical Industry Ltd. to 6.4 parts of cyclohexanone, for 1 hour. Then, the mixture was stirred at 90° C. for 3 hours. The obtained reaction solution was left to be cooled to room temperature. Thereafter, this reaction solution was added dropwise to 100 parts of methanol. The obtained crystal was separated by filtration, washed with 30 parts of methanol, and dried under reduced pressure at 40° C. to obtain 1.8 parts of P-1.

The dye compound P-1 was subjected to $^1$H NMR spectrum measurement. The measurement was carried out using 400 MHz and dimethyl sulfoxide (DMSO). Product name: AV-400, manufactured by Bruker Co. Ltd., was used as a measurement device. The measurement results are shown in FIG. 1.

<Synthesis Examples of Dye Compounds P-2 to P-44>

Dye compounds P-2 to P-44 were synthesized in the same manner as in the synthesis of the dye compound P-1 except that the repeating unit in the dye compound P-1 was changed into those described in the following tables.

Figure 2:
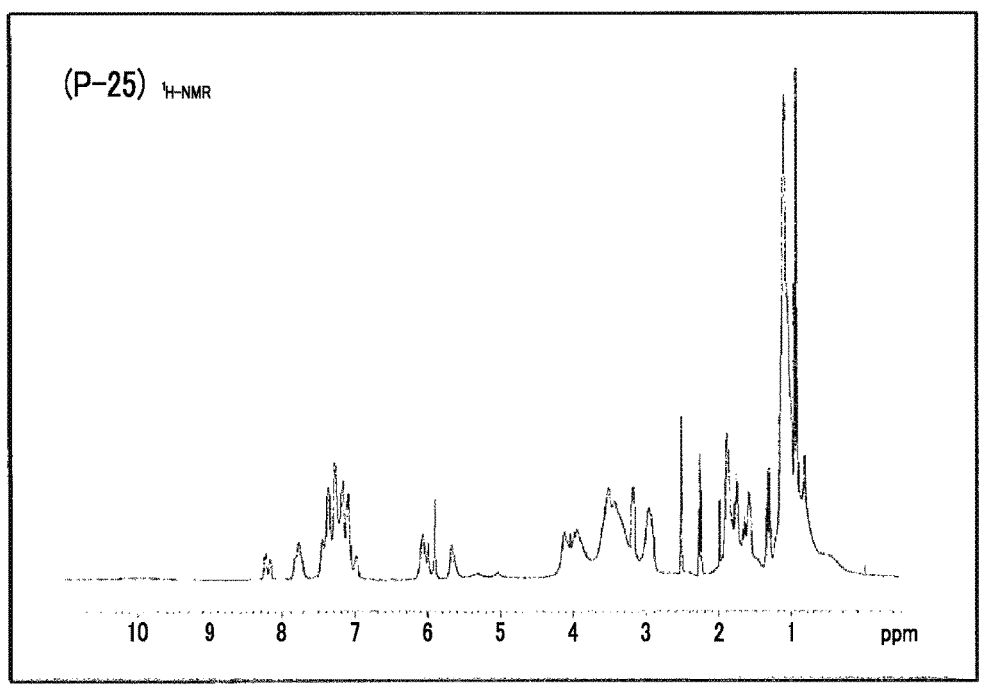
FIG. 2 is a view showing the $^1$H-NMR spectrum of a xanthene dye compound (P-25).
Figure 3:
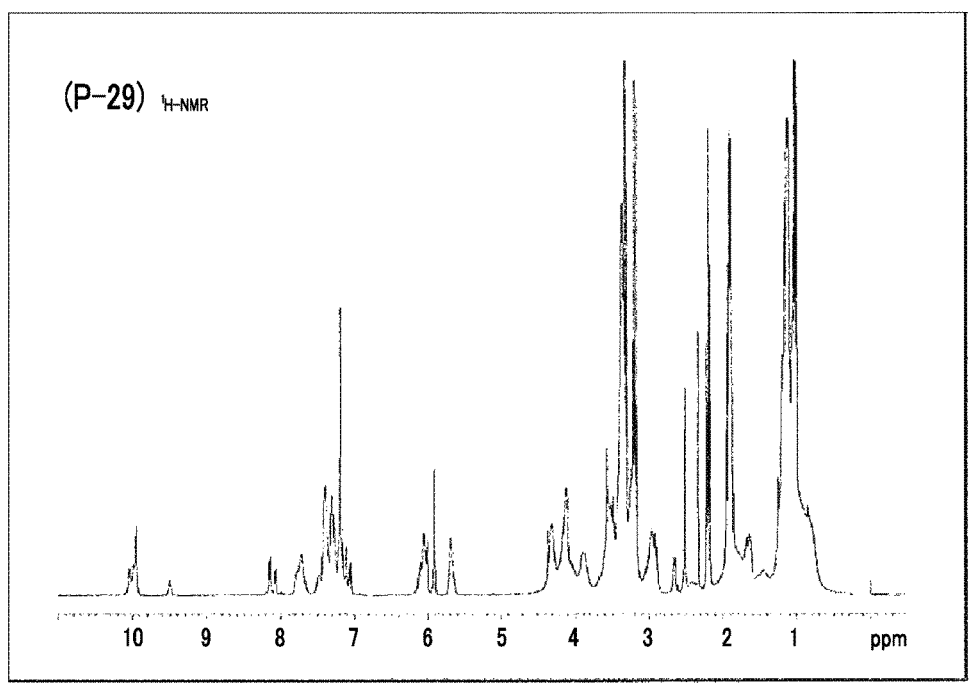
FIG. 3 is a view showing the $^1$H-NMR spectrum of a xanthene dye compound (P-29).

The dye compounds P-25 and P-29 was subjected to $^1$H NMR spectrum measurement. The measurement was carried out using 400 MHz and dimethyl sulfoxide (DMSO). Product name: AV-400, manufactured by Bruker Co. Ltd., was used as a measurement device. The measurement results are shown in FIGS. 2 and 3.

As a comparative compound-1 to a Comparative compound-3, the following compounds were used.

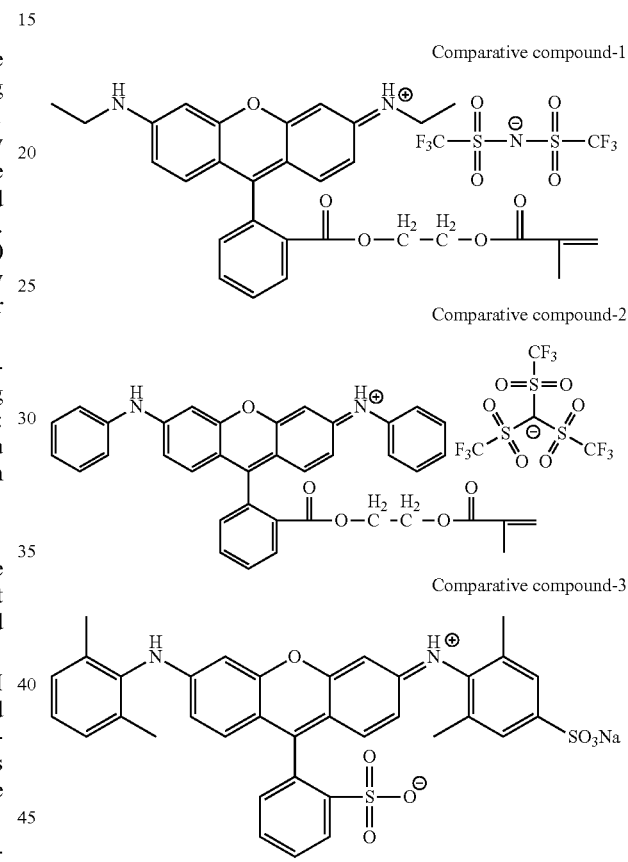

Comparative compound-1

Comparative compound-2

Comparative compound-3

TABLE 3

| Dye compound (dye multimer) | Repeating unit 1 | % by mole | Repeating unit 2 | % by mole | Repeating unit 3 | % by mole | Repeating unit 4 | % by mole | Mw | Mw/Mn | λmax |
|---|---|---|---|---|---|---|---|---|---|---|---|
| P-1 | A'-13 | 25 | B-1 | 75 | — | — | — | — | 10600 | 1.85 | 538 |
| P-2 | A'-14 | 30 | B-1 | 35 | B-18 | 35 | — | — | 11000 | 1.88 | 532 |
| P-3 | A'-15 | 50 | B-2 | 30 | B-19 | 20 | — | — | 15700 | 1.79 | 544 |
| P-4 | A'-16 | 30 | B-1 | 40 | B-18 | 30 | — | — | 20100 | 1.82 | 531 |
| P-5 | A'-17 | 20 | B-1 | 30 | B-19 | 50 | — | — | 6700 | 1.86 | 538 |
| P-6 | A'-18 | 90 | B-1 | 5 | B-18 | 5 | — | — | 8800 | 1.81 | 533 |
| P-7 | A'-19 | 35 | B-1 | 50 | B-19 | 15 | — | — | 24300 | 1.81 | 537 |
| P-8 | A'-20 | 80 | B-2 | 10 | B-18 | 10 | — | — | 7700 | 1.87 | 535 |
| P-9 | A'-21 | 10 | B-1 | 50 | A-14 | 40 | — | — | 13100 | 1.76 | 539 |
| P-10 | A'-22 | 50 | B-1 | 50 | — | — | — | — | 17800 | 1.83 | 541 |
| P-11 | A'-13 | 50 | B-1 | 40 | B-8 | 10 | — | — | 11900 | 1.87 | 538 |
| P-12 | A'-14 | 35 | B-1 | 40 | B-9 | 20 | B-3 | 5 | 12000 | 1.78 | 532 |
| P-13 | A'-15 | 60 | B-1 | 20 | B-10 | 20 | — | — | 17300 | 1.82 | 544 |
| P-14 | A'-16 | 25 | B-7 | 60 | B-11 | 10 | B-5 | 5 | 26300 | 1.85 | 531 |

TABLE 3-continued
| | | | | | | | | | | |
|---|---|---|---|---|---|---|---|---|---|---|
| P-15 | A'-17 | 25 | B-1 | 60 | B-15 | 15 | — | — | 16100 | 1.88 | 538 |
| P-16 | A'-18 | 70 | B-1 | 10 | B-16 | 15 | B-7 | 5 | 13200 | 1.81 | 533 |
| P-17 | A'-19 | 30 | B-1 | 60 | B-17 | 10 | — | — | 24100 | 2 | 537 |
| P-18 | A'-20 | 70 | B-7 | 20 | B-22 | 10 | — | — | 7800 | 1.95 | 535 |
| P-19 | A'-21 | 20 | B-1 | 60 | B-21 | 20 | — | — | 10600 | 1.89 | 539 |
| P-20 | A'-22 | 40 | B-1 | 40 | B-23 | 20 | — | — | 18400 | 1.92 | 541 |
| P-21 | A'-23 | 25 | B-1 | 60 | B-18 | 15 | — | — | 6800 | 1.93 | |
| P-22 | A'-24 | 25 | B-2 | 60 | B-19 | 15 | — | — | 14000 | 1.84 | |
| P-23 | A'-25 | 25 | B-3 | 60 | B-20 | 15 | — | — | 13500 | 1.83 | |
| P-24 | A'-26 | 25 | B-4 | 60 | B-21 | 15 | — | — | 9800 | 1.94 | |
| P-25 | A'-27 | 20 | B-1 | 40 | B-26 | 10 | B-18 | 30 | 14200 | 1.84 | 538 |
| P-26 | A'-28 | 20 | B-1 | 40 | B-27 | 10 | B-18 | 30 | 12100 | 1.95 | 532 |
| P-27 | A'-29 | 20 | B-1 | 40 | B-27 | 10 | B-18 | 30 | 12700 | 1.86 | 533 |
| P-28 | A'-30 | 25 | B-2 | 20 | B-24 | 20 | B-18 | 35 | 14800 | 1.82 | 531 |
| P-29 | A'-31 | 20 | B-1 | 40 | B-26 | 10 | B-33 | 30 | 15500 | 1.87 | 531 |
| P-30 | A'-31 | 20 | B-1 | 40 | B-26 | 10 | B-33 | 30 | 8300 | 1.91 | 531 |
| P-31 | A'-32 | 30 | B-1 | 35 | B-25 | 5 | B-18 | 30 | 9800 | 1.97 | 539 |
| P-32 | A'-33 | 28 | B-1 | 20 | B-28 | 22 | B-33 | 30 | 15700 | 1.93 | 537 |
| P-33 | A'-34 | 15 | B-7 | 30 | B-29 | 5 | B-18 | 47 | 10300 | 1.79 | 530 |
| P-34 | A'-35 | 22 | B-1 | 25 | B-30 | 15 | B-18 | 38 | 11900 | 1.85 | 537 |
| P-35 | A'-36 | 15 | B-1 | 30 | B-31 | 5 | B-19 | 50 | 8900 | 1.88 | 541 |
| P-36 | A'-37 | 18 | B-1 | 30 | B-32 | 25 | B-18 | 27 | 10100 | 1.95 | 541 |
| P-37 | A'-36 | 20 | B-1 | 25 | B-26 | 25 | B-18 | 30 | 9100 | 1.83 | 541 |
| P-38 | A'-37 | 20 | B-1 | 40 | B-26 | 10 | B-18 | 30 | 17500 | 1.92 | 541 |
| P-39 | A'-14 | 20 | B-1 | 40 | B-26 | 10 | B-33 | 30 | 7800 | 1.86 | 532 |
| P-40 | A-pm-1 | 20 | B-1 | 40 | B-18 | 40 | — | — | 12050 | 1.88 | |
| P-41 | sm-3 | 20 | B-1 | 40 | B-18 | 40 | — | — | 11500 | 1.94 | |
| P-42 | A-PM-1 | 20 | B-1 | 40 | B-18 | 40 | — | — | 11300 | 1.95 | |
| P-43 | A'-38 | 20 | B-1 | 40 | B-18 | 40 | — | — | 10400 | 1.92 | 555 |
| P-44 | A'-39 | 20 | B-1 | 40 | B-18 | 40 | — | — | 10200 | 1.96 | 548 |
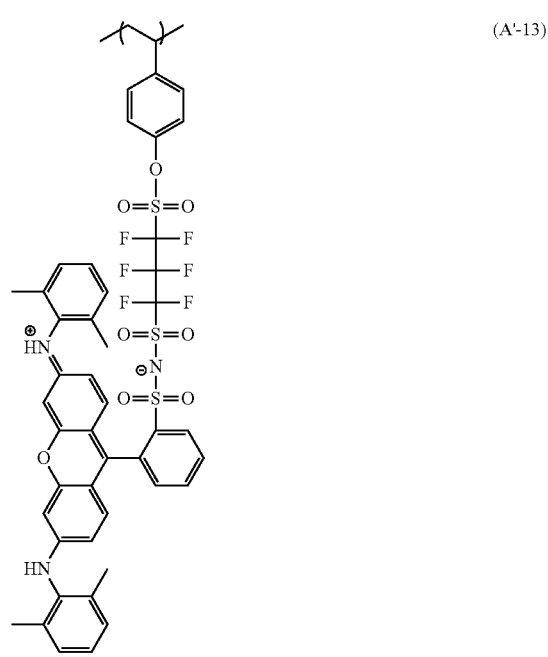
(A'-13)

TABLE 3-continued
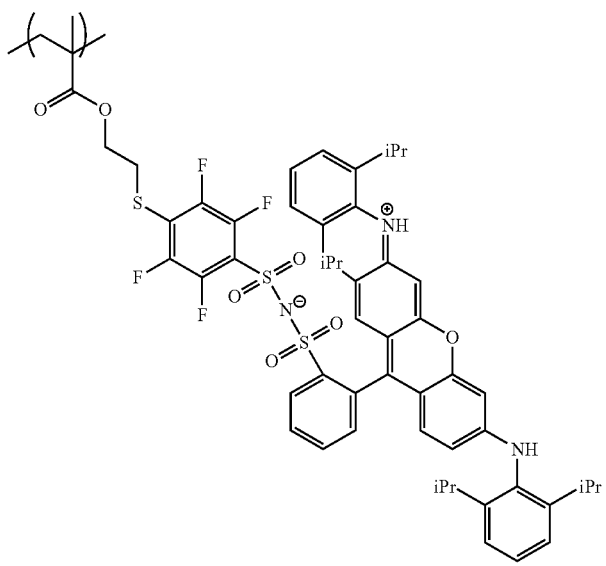
(A'-14)
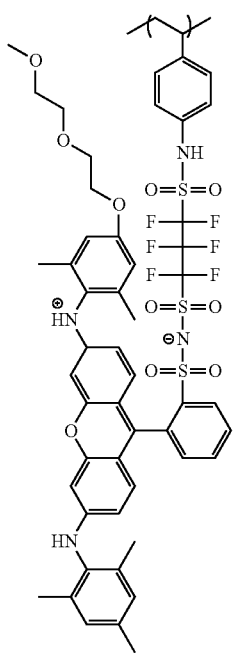
(A'-15)
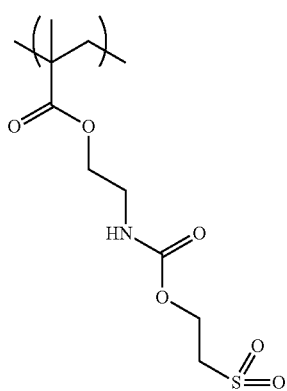
(A'-16)

TABLE 3-continued
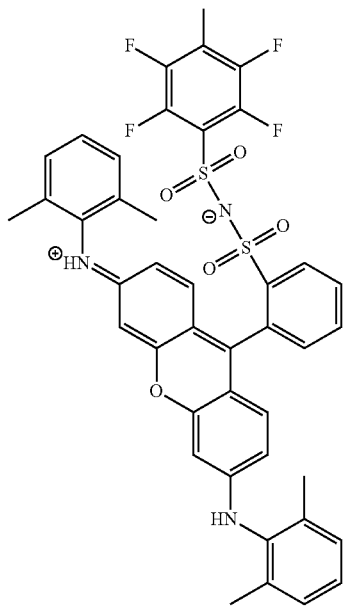
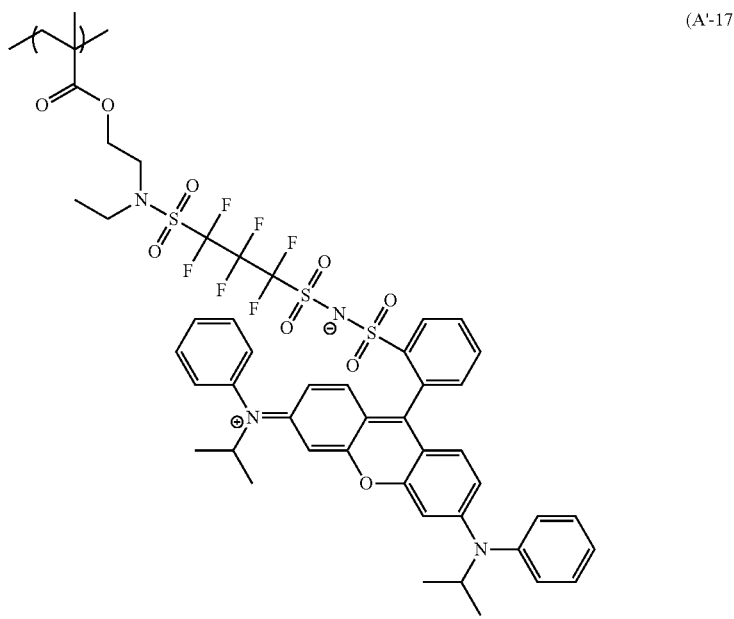
(A'-17)

TABLE 3-continued
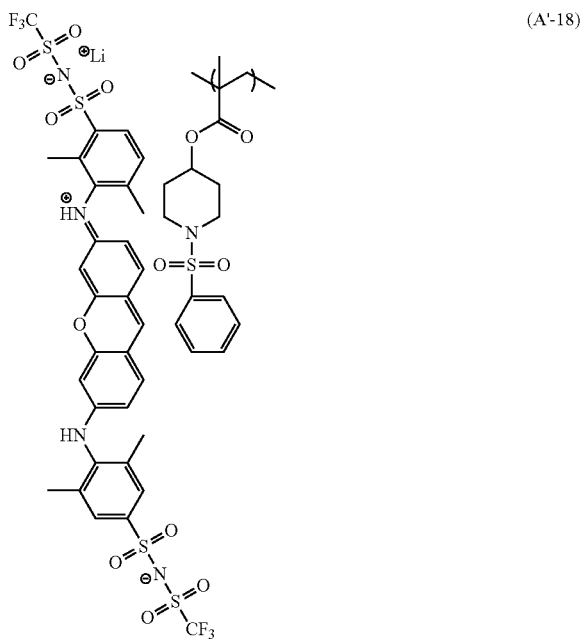
(A'-18)
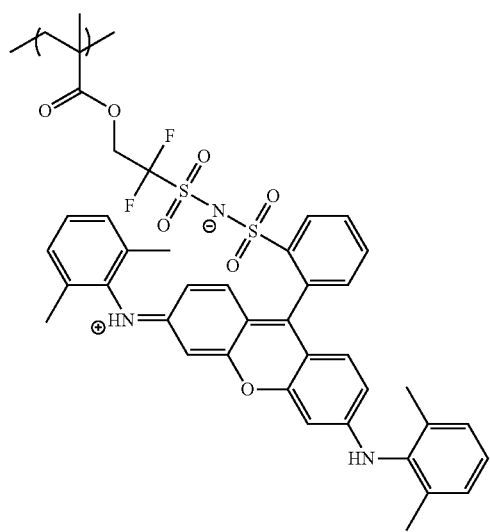
(A'-19)

TABLE 3-continued
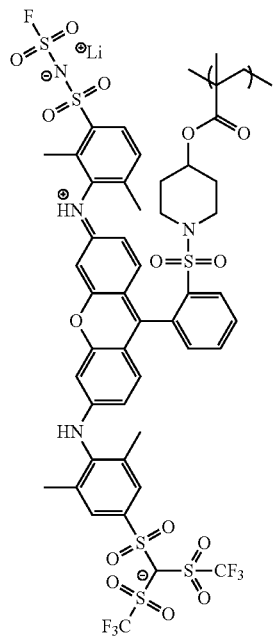
(A'-20)
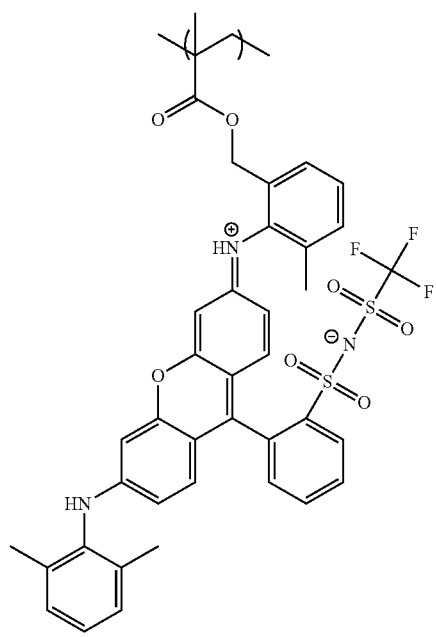
(A'-21)

TABLE 3-continued
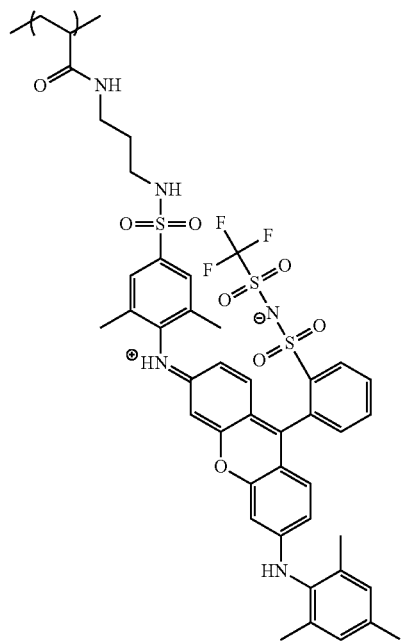
(A'-22)
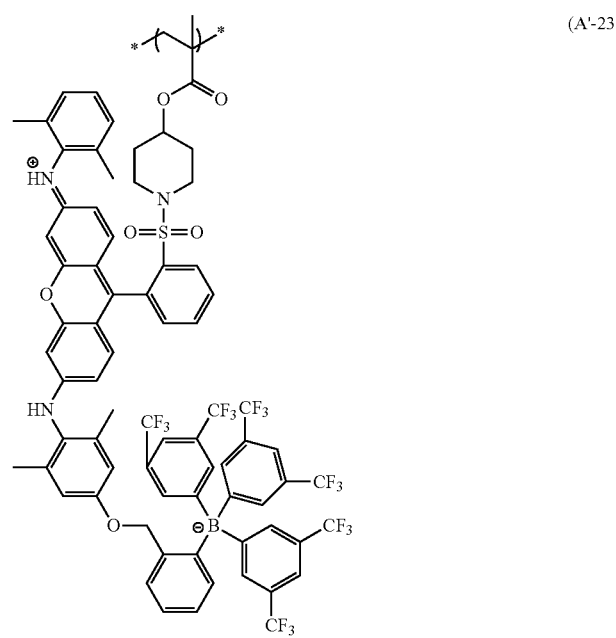
(A'-23)

TABLE 3-continued
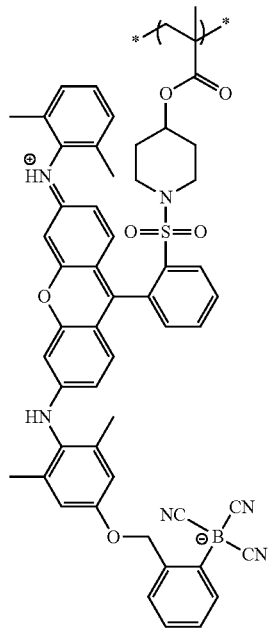
(A'-24)
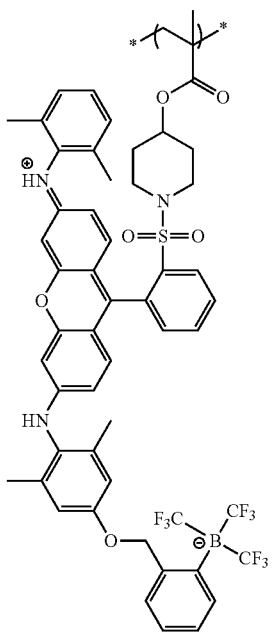
(A'-25)

TABLE 3-continued
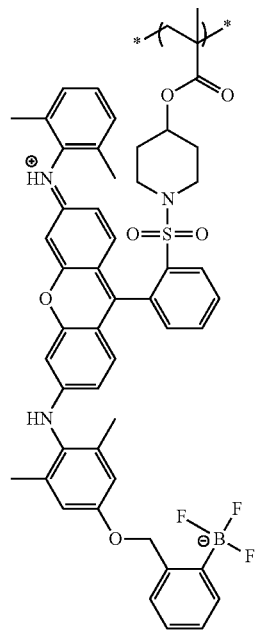
(A'-26)
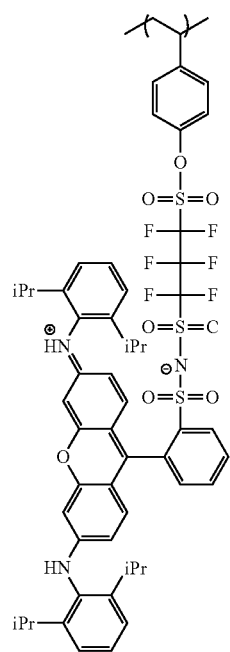
(A'-27)

TABLE 3-continued
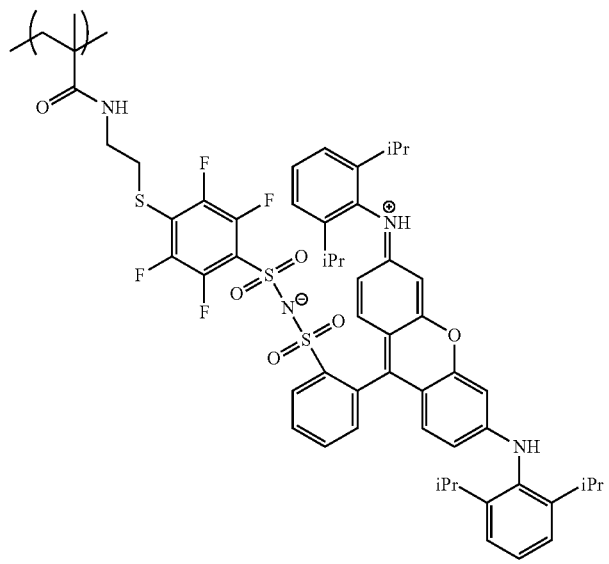
(A'-28)
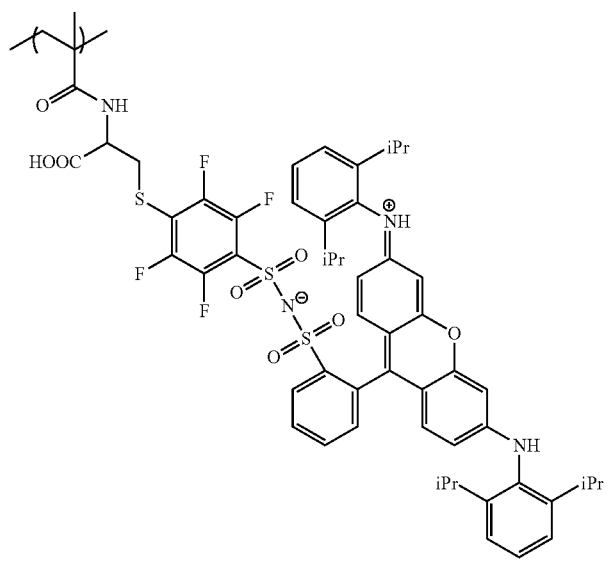
(A'-29)
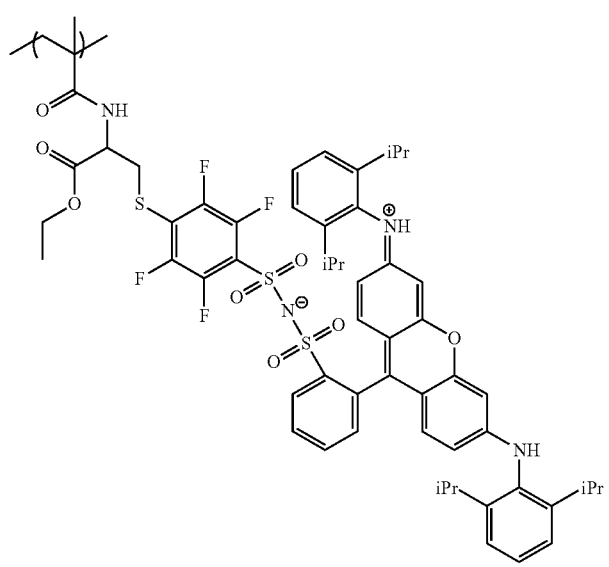
(A'-30)

TABLE 3-continued
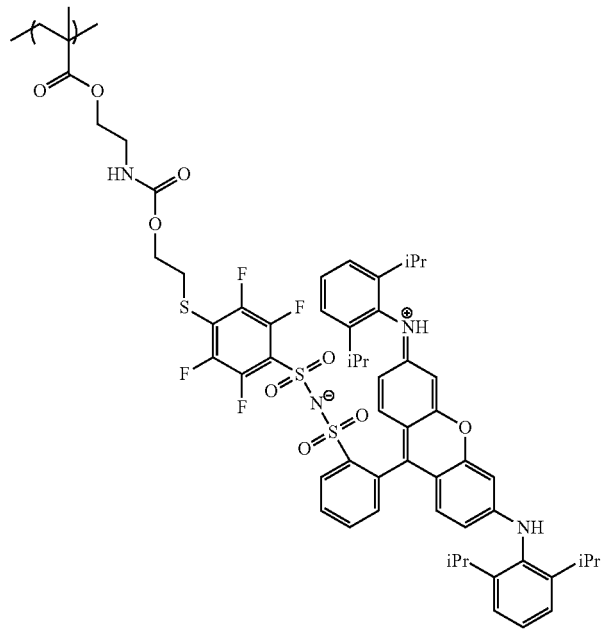
(A'-31)
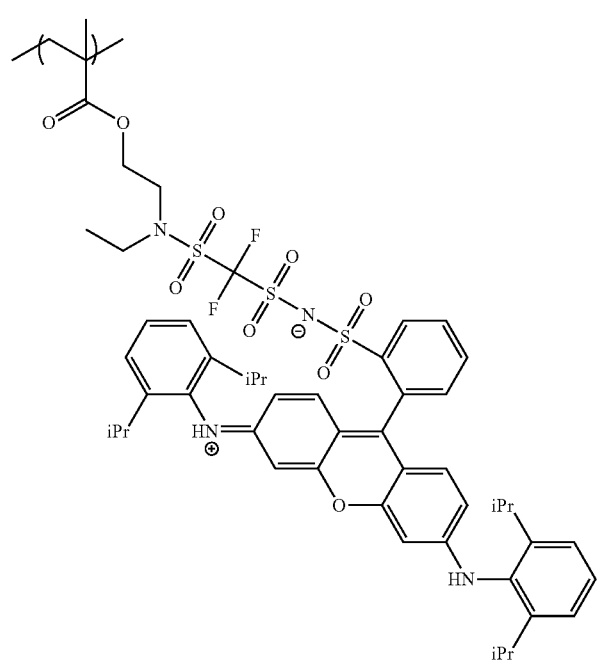
(A'-32)

TABLE 3-continued
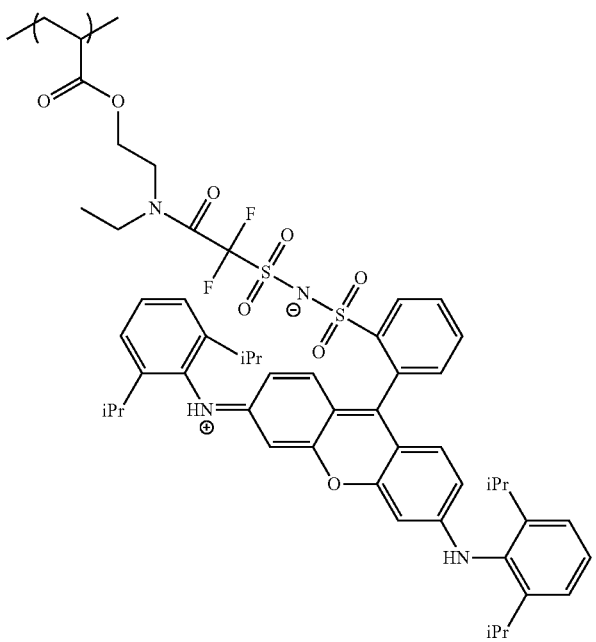
(A'-33)
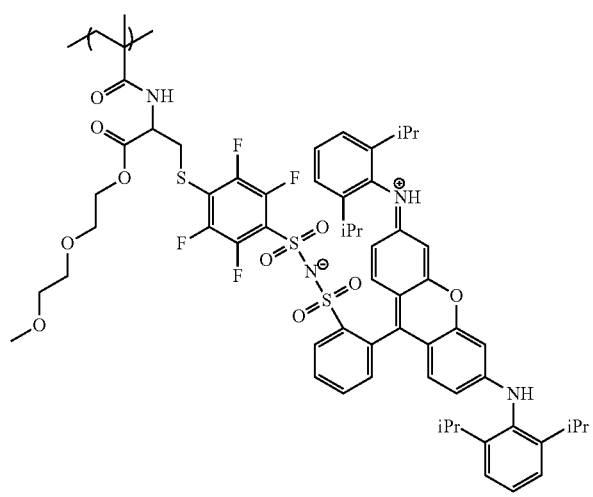
(A'-34)

TABLE 3-continued
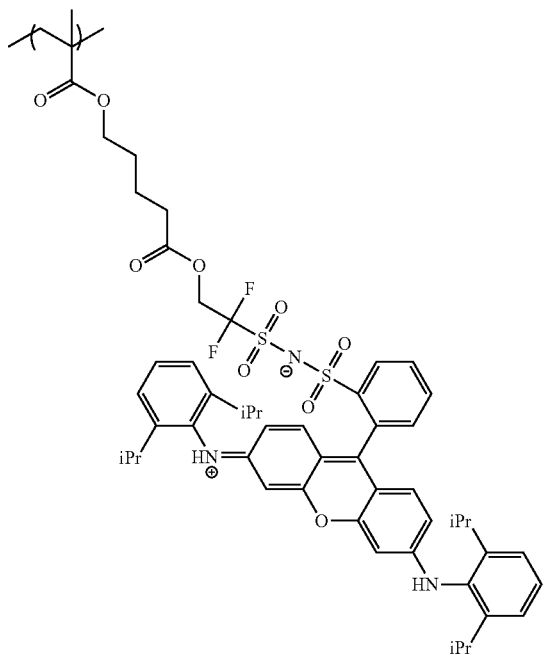
(A'-35)
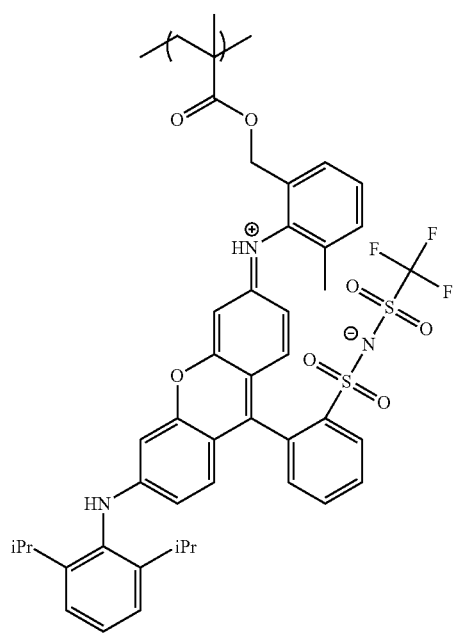
(A'-36)

TABLE 3-continued
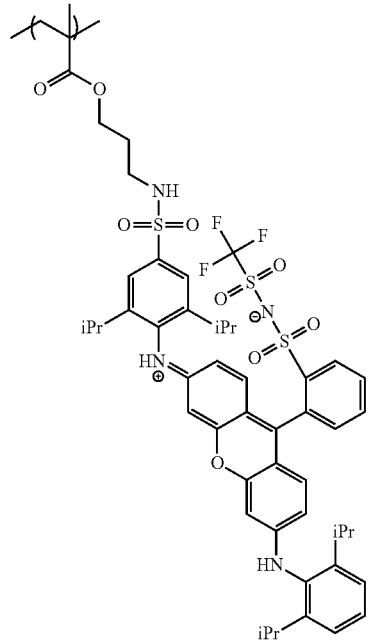
(A'-37)
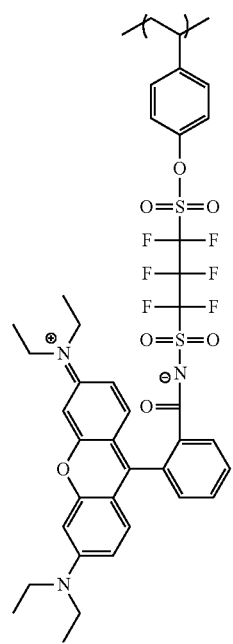
(A'-38)

TABLE 3-continued
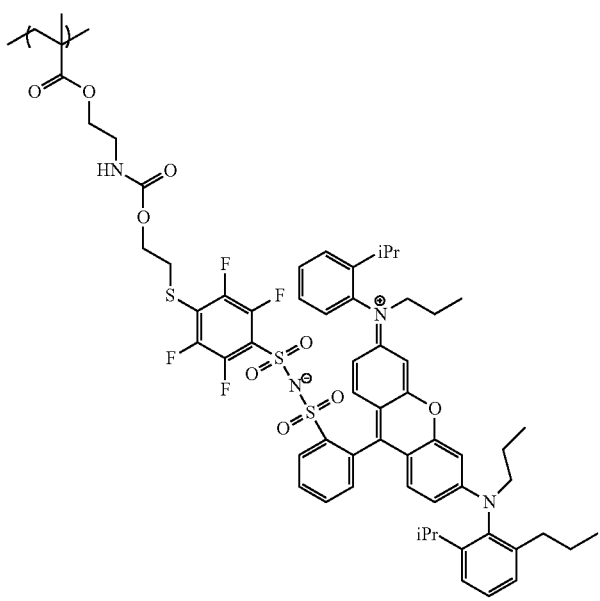
(A'-39)
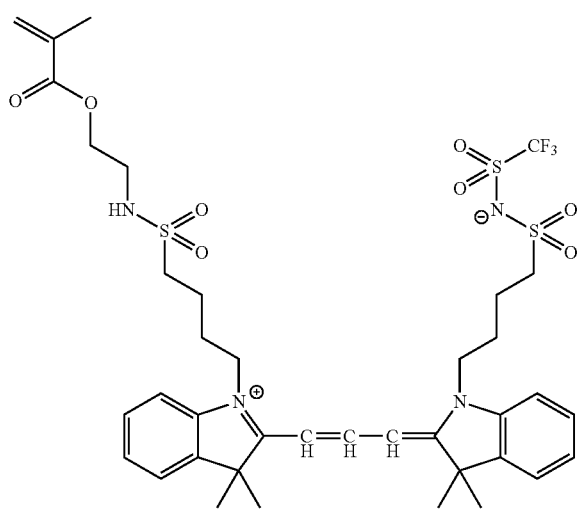 [SMILES: C=C(C)C(=O)OCCNS(=O)(=O)CCCC[N+]1=C(C=CC=C2N(CCCCS(=O)(=O)[N-]S(=O)(=O)C(F)(F)F)c3ccccc3C2(C)C)C(C)(C)c2ccccc21]
(A-pm-1)
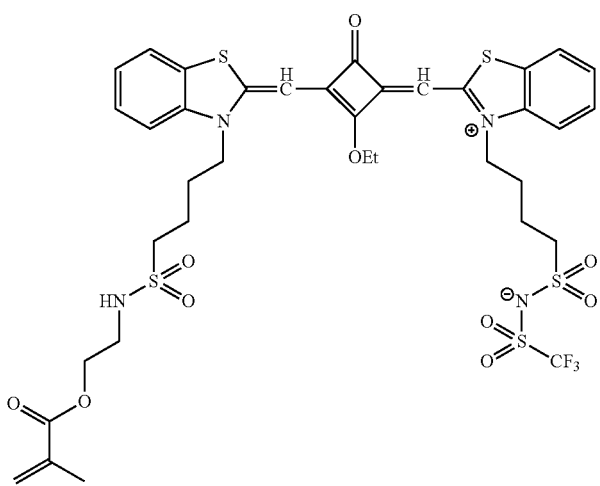 [SMILES: C=C(C)C(=O)OCCNS(=O)(=O)CCCCN1C(=CC2=C(OCC)C(=Cc3sc4ccccc4[n+]3CCCCS(=O)(=O)[N-]S(=O)(=O)C(F)(F)F)C2=O)Sc2ccccc21]
(sm-1)

TABLE 3-continued
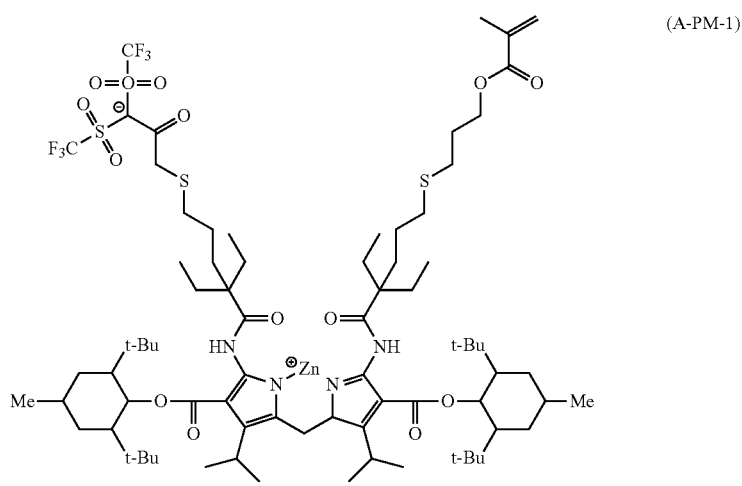
(A-PM-1)
(B-1)
(B-2)
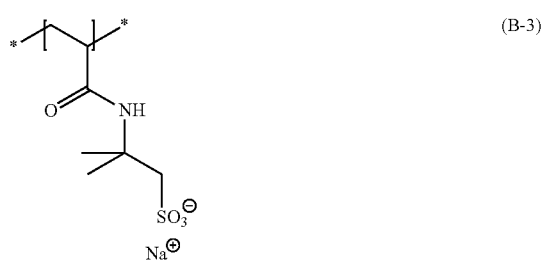
(B-3)
(B-4)
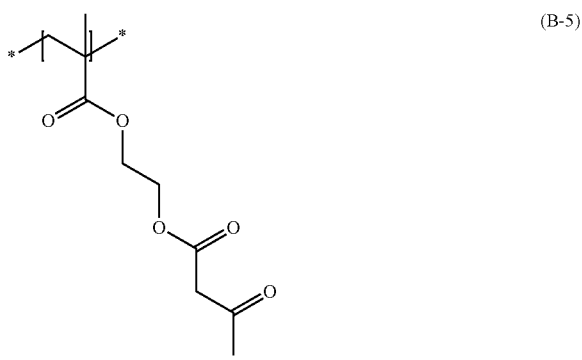
(B-5)

TABLE 3-continued
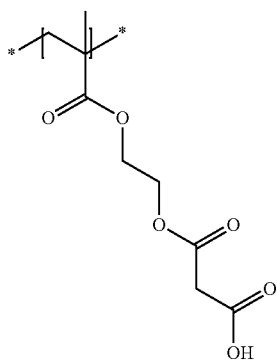
(B-7)
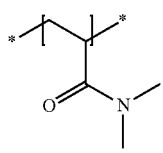
(B-8)
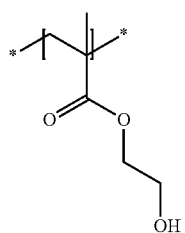
(B-9)
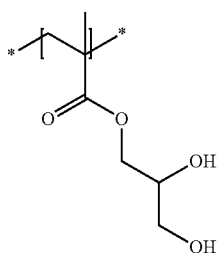
(B-10)
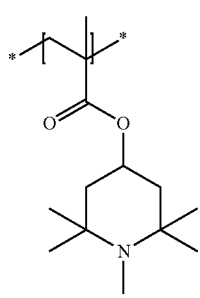
(B-11)
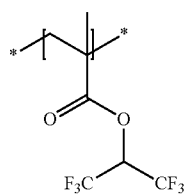
(B-14)

TABLE 3-continued
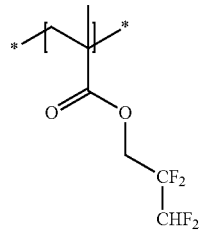
(B-15)
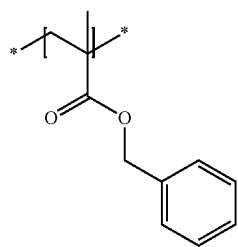
(B-16)
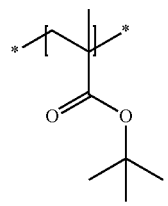
(B-17)
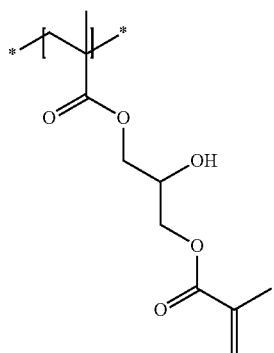
(B-18)
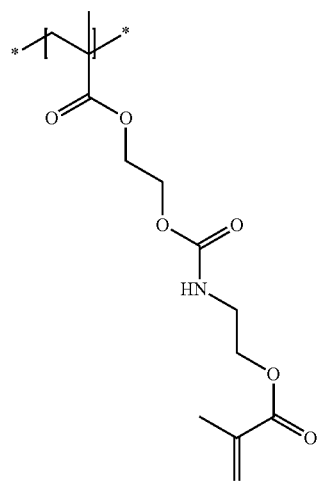
(B-19)

TABLE 3-continued
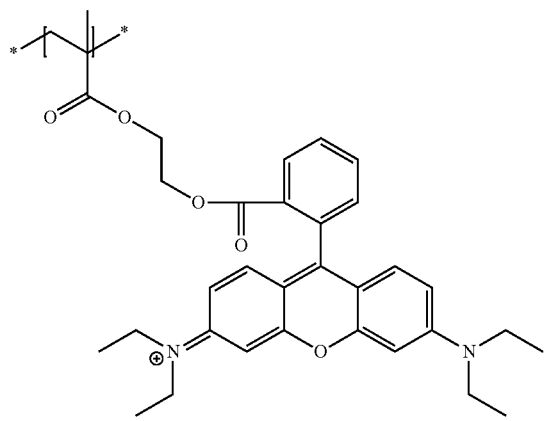
(B-20)
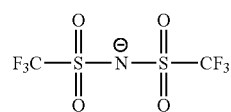
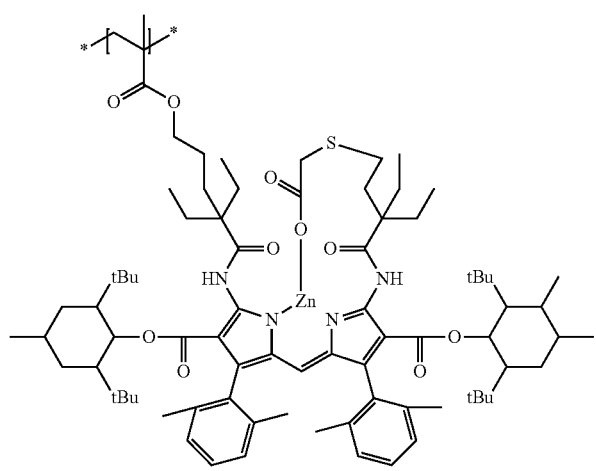
(B-21)
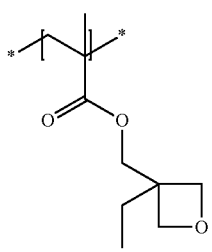
(B-22)
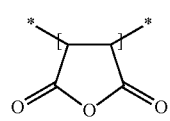
(B-23)
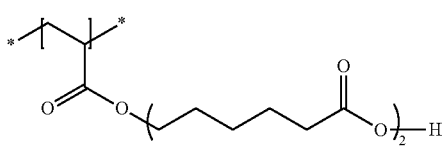
(B-24)

TABLE 3-continued
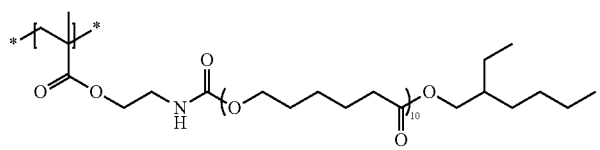 (B-25)
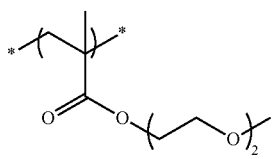 (B-26)
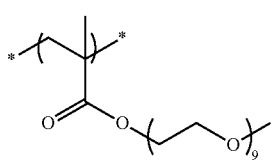 (B-27)
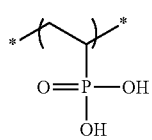 (B-28)
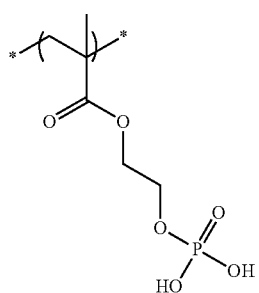 (B-29)
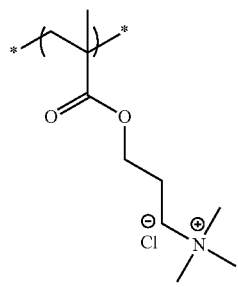 (B-30)
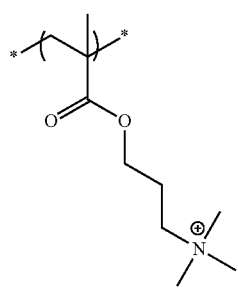 (B-31)
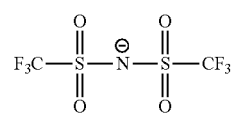

TABLE 3-continued

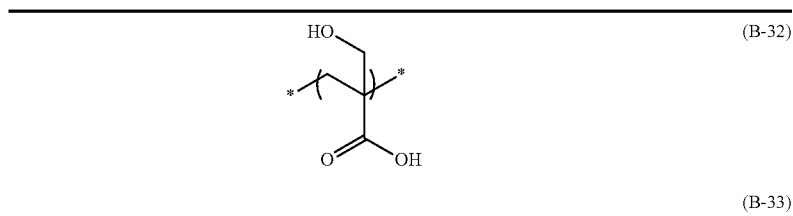

(B-32)

(B-33)

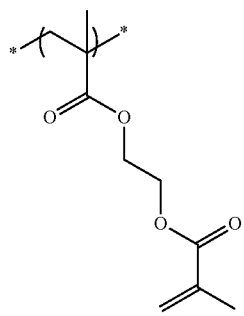

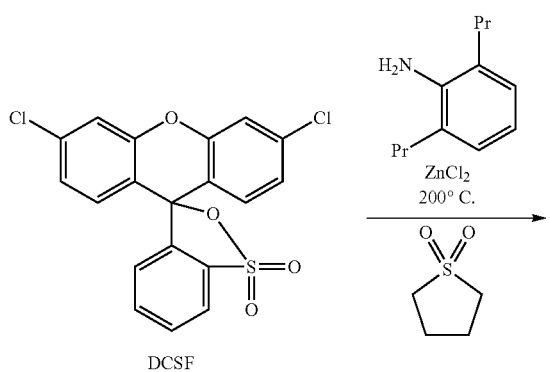

DCSF

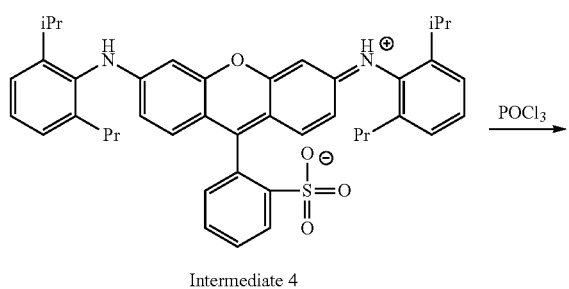

Intermediate 4

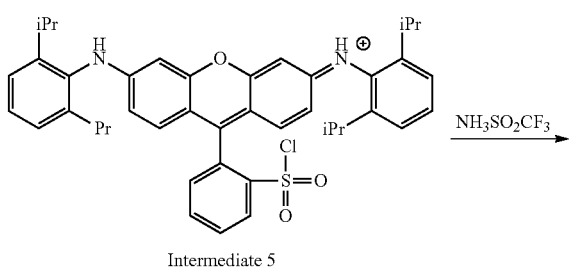

Intermediate 5

-continued

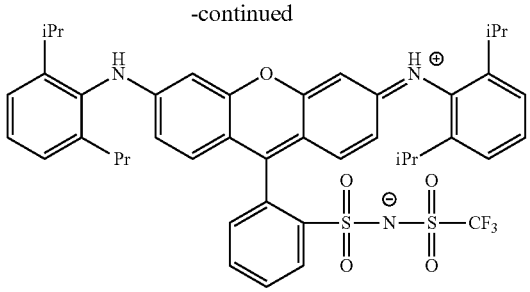

Compound A-40

<Synthesis Examples of Intermediate 4>

10 parts of DCSF (manufactured by Chugai Kasei Co Ltd.), 10.5 parts of 2,6-diisopropylaniline, and 40 parts of sulfolane were put into a flask and the mixture was stirred at an internal temperature of 80° C. for 5 hours. Thereafter, 33.2 parts of 2,6-diisopropylaniline and 3.88 parts of magnesium chloride were added to the reaction solution, and the mixture was stirred at 125° C. for 48 hours. The obtained reaction solution was left to be cooled to room temperature and added dropwise to 400 parts of 2 N hydrochloric acid, and the precipitated crystal was separated by filtration. The crystal was dispersed in and washed with 200 parts of acetonitrile, collected by filtration, and air-dried for 10 hours to obtain 12 parts (yield: 70.8%) of an intermediate 4.

<Synthesis Examples of Intermediate 5>

An intermediate 5 was synthesized by the same procedure as for the intermediate 2 except that the intermediate 4 was used instead of the intermediate 1 used in the synthesis of the intermediate 2.

<Synthesis Example of Dye Compound (A-40)>

A dye compound (A-40) was synthesized by the same procedure as for the dye compound (A-1) except that the intermediate 5 was used instead of the intermediate 2 used in the synthesis of the dye compound (A-1).

<Synthesis Example of Dye Compound A-41>

A dye compound (A-41) was synthesized by the same procedure as for the dye compound (A-40) except that DCSF which is a raw material for the dye compound (A-40) was changed to fluorescein chloride.

<Synthesis Example of Dye Compound A-42>

The synthesis was carried out by the same procedure as for the dye compound (A-40) except that pentafluorobenzene sulfonylamide was used instead of trifluoromethane sulfonylamide used for the synthesis of the dye compound (A-40). The pentafluorobenzene sulfonylamide was synthesized by, for example, the method described in Bioorganic and Medicinal Chemistry, 2013, vol. 21, #7 p. 2093 to 2106.

The dye compound A-42 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.93-1.35 (24H, m), 2.85-3.13 (4H, m), 5.98-6.28 (2H, m), 7.02-7.43 (11H, m), 7.44-8.28 (3H, m), 9.87-10.08 (2H, m).

<Synthesis Example of Dye Compound A-43>

The synthesis was carried out by the same procedure as for the dye compound (A-40) except that benzene sulfonylamide was used instead of trifluoromethane sulfonylamide used for the synthesis of the dye compound (A-40) and 1,8-diazabicyclo[5.4.0]undec-7-ene (DBU) was used instead of triethylamine.

The dye compound A-43 was subjected to $^1$H NMR spectrum measurement. The measurement was carried out using 400 MHz and dimethyl sulfoxide (DMSO). Product name: AV-400, X manufactured by Bruker Co. Ltd., was used as a measurement device.

δ 0.9-1.34 (24H, m), 2.87-3.18 (4H, m), 5.88-6.14 (2H, m), 7.07-7.53 (16H, m), 7.53-8.21 (3H, m), 9.88-10.04 (2H, m).

<Synthesis Example of Dye Compound A-44>

3 parts of the dye compound (A-48) and 15 parts of N,N-dimethylacetamide were put into a 3-neck flask, and the mixture was stirred at room temperature. 0.3 parts of acrylic acid chloride was added dropwise thereto and the mixture was stirred at room temperature for 1 hour. Thereafter, the reaction solution was added dropwise to 100 parts of 1 M aqueous hydrochloric acid and the obtained crystal was separated by filtration. The crystal was washed with 50 parts of acetonitrile, and after filtration, the obtained crystal was dried for 10 hours using an air dryer set to 40° C. to obtain 3 parts (yield 95%) of a dye compound (A-44).

The dye compound A-44 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.94-1.34 (24H, m), 2.82-3.14 (6H, m), 4.24-4.29 (2H, t), 5.76-6.14 (7H, m), 7.04-7.53 (8H, m), 7.54-8.16 (4H, m), 9.88-10.06 (2H, m).

<Synthesis Example of Dye Compound A-45>

150 parts of pentafluorobenzene sulfonylamide, 49.8 parts of 2-mercaptoethanol, and 1000 parts of methanol were added to a 3-neck flask, and the mixture was stirred at room temperature. 64.5 parts of triethylamine was added dropwise thereto and the mixture was stirred at room temperature for 1 hour. Methanol was concentrated under reduced pressure and the residue was extracted by the addition of 900 parts of ethyl acetate, 900 parts of saturated physiologicalsaline, and 100 parts of a saturated aqueous sodium hydrogen carbonate solution. The organic layer was dried over magnesium sulfate and then the filtrate obtained by filtration was concentrated to obtain 169 parts (yield 91%) of 2,3,5,6-tetrafluoro-4-((2-hydroxyethyl)thio)benzenesulfonamide.

50 parts of 2,3,5,6-tetrafluoro-4-((2-hydroxyethyl)thio)benzenesulfonamide, 165 parts of N,N-dimethylacetamide, 28 parts of 2-isocyanatoethyl methacrylate (Karenz MOI manufactured by Showa Denko K. K.), and 0.01 parts of Neostann U-600 (manufactured by Chemical Industry Co., Ltd.) were put into to a 3-neck flask, and the mixture was stirred at 60° C. for 2 hours. The reaction liquid was left to be cooled to room temperature and then subjected to liquid separation with 600 parts of ethyl acetate and 600 parts of water. The organic layer was dried over magnesium sulfate and the filtrate obtained by filtration was concentrated under reduced pressure. To the obtained residue was added 200 parts of chloroform and the mixture was stirred. The obtained crystal was filtered and air-dried at 40° C. for 10 hours to obtain 62.3 parts (yield 86%) of 3-(((2-((2,3,5,6-tetrafluoro-4-sulfamoylphenyl)thio)carbonyl)amino)propyl methacrylate.

A dye compound (A-45) was synthesized by the same procedure as for the dye compound (A-40) except that 3-(((2-((2,3,5,6-tetrafluoro-4-sulfamoylphenyl)thio)carbonyl)amino)propyl methacrylate was used instead of trifluoromethane sulfonylamide used for the synthesis of the dye compound (A-40).

The dye compound A-45 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.95-1.35 (24H, m), 1.84-1.9 (3H, s), 2.85-3.15 (4H, m), 3.15-3.3 (4H, m), 4.0-4.18 (4H, m), 5.62-6.18 (4H, m), 7.03-7.43 (11H, m), 7.43-8.18 (3H, m), 9.89-10.08 (2H, m).

<Synthesis Example of Dye Compound A-46>

The synthesis was carried out in the same manner as for the dye compound (A-13) except that the intermediate 2 which is a raw material for the dye compound (A-13) was changed to the intermediate 5.

The dye compound A-46 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.95-1.38 (24H, m), 2.83-3.12 (4H, m), 5.33-5.39 (1H, d), 5.85-6.16 (3H, m), 6.73-7.52 (14H, m), 7.6-7.68 (2H, m), 7.7-7.9 (3H, m), 9.9-10.08 (2H, m).

<Synthesis Example of Dye Compound A-47>

20 parts of dye compound (A-42), 3.08 parts of 6-mercaptohexanol, and 70 parts of N,N-dimethyl formamide were added to a 3-neck flask and the mixture was stirred in an ice bath. 11 parts of DBU was added dropwise thereto and the mixture was at room temperature for 30 minutes. The mixture was extracted with 200 parts of 1 M aqueous hydrochloric acid and 300 parts of ethyl acetate, and then extracted with 400 parts of water. Then, the organic layer was dried over magnesium sulfate and then the filtrate obtained by filtration was concentrated under reduced pressure. To the residue was added 80 parts of acetonitrile and the mixture was stirred at 70° C. for 1 hour and then filtered. The obtained crystal was air-dried at 40° C. for 10 hours to obtain 18 parts (yield 80%) of an analogous intermediate of the dye compound (A-54).

52 parts of the analogous intermediate of the dye compound (A-54) and 390 parts of pyridine were put into to a 3-neck flask and the mixture was stirred in an ice bath, and 28.8 parts of tosyl chloride was dividedly added in the form of powder. Thereafter, the mixture was subjected to liquid separation with 600 parts of 2 M aqueous hydrochloric acid and 400 parts of chloroform, pyridine was extracted from the organic layer, followed by liquid separation with 600 parts of a saturated aqueous sodium hydrogen carbonate solution, the organic layer was dried over magnesium sulfate, and the filtrate obtained by filtration was concentrated. To the residue was added 500 parts of acetonitrile and the mixture was stirred under heating and refluxing and filtered, and the obtained crystal was air-dried at 40° C. for 10 hours to obtain 51 parts (yield 85.3%) of a dye compound (A-47).

The dye compound A-47 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.95-1.33 (28H, m), 1.33-1.55 (4H, m), 2.83-3.12 (6H, m), 4.0-4.04 (2H, m), 5.89-6.14 (2H, m), 7.01-7.82 (17H, m), 8.06-8.17 (1H, m), 9.9-10.08 (2H, m).

<Synthesis Example of Dye Compound A-48>

The synthesis was carried out by the same procedure as the synthesis of the analogous intermediate of the dye compound (A-54) except that the 6-mercaptohexanol used for the synthesis of the analogous intermediate of the dye compound (A-54) described in Synthesis Example of the dye compound (A-47) was changed to 2-mercaptoethanol.

The dye compound A-48 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.95-1.36 (24H, m), 2.83-3.15 (6H, m), 3.45-3.58 (3H, m), 5.89-6.14 (2H, m), 7.01-7.55 (11H, m), 7.63-8.17 (3H, m), 9.95-10.09 (2H, m).

<Synthesis Example of Dye Compound A-49>

The synthesis was carried out by the same procedure as the synthesis of the analogous intermediate of the dye compound (A-54) except that the 6-mercaptohexanol used for the synthesis of the analogous intermediate of the dye compound (A-54) described in Synthesis Example of the dye compound (A-47) was changed to 1,6-hexanedithiol.

<Synthesis Example of Dye Compound A-50>

A dye compound (A-50) was obtained by adding tetrabutylammonium chloride to the dye compound (A-47) and substituting a tosyl group with a chloride ion.

<Synthesis Example of Dye Compound A-51>

A dye compound (A-51) was obtained by adding potassium phthalimide to the dye compound (A-47) or the dye compound (A-50) and using the method described in Chem. Eur. J. 2010, 16, 10021 to 10029 for protection with hydrazine.

<Synthesis Example of Dye Compound A-52>

The synthesis was carried out by the same procedure as for the dye compound (A-40) except that methane sulfonylimide was used instead of trifluoromethane sulfonylamide used for the synthesis of the dye compound (A-40) and DBU was used instead of triethylamine.

The dye compound A-52 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.96-1.36 (24H, m), 2.58-2.64 (3H, s), 2.85-3.15 (4H, m), 5.91-6.14 (2H, m), 7.07-7.52 (11H, m), 7.58-8.22 (3H, m), 9.85-10.04 (2H, m).

<Synthesis Example of Dye Compound A-53>

The synthesis was carried out by the same procedure as the synthesis of the analogous intermediate of the dye compound (A-54) except that the 6-mercaptohexanol used for the synthesis of the analogous intermediate of the dye compound (A-54) described in Synthesis Example of the dye compound (A-47) was changed to 4-mercaptobutyric acid.

<Synthesis Example of Dye Compound A-54>

The synthesis was carried out by the same procedure as the synthesis of the analogous intermediate of the dye compound (A-54) except that the 6-mercaptohexanol used for the synthesis of the analogous intermediate of the dye compound (A-54) described in Synthesis Example of the dye compound (A-47) was changed to 2-(3-mercaptopropoxy)ethanol.

The dye compound A-54 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.96-1.36 (26H, m), 1.63-1.8 (2H, m), 2.83-3.11 (6H, m), 3.4-3.5 (4H, m), 4.46-4.55 (1H, s), 5.84-6.17 (2H, m), 6.93-7.53 (11H, m), 7.63-8.18 (3H, m), 9.85-10.15 (2H, br).

<Synthesis Example of Dye Compound A-55>

The synthesis was carried out by the same procedure as the synthesis of the dye compound (A-45) except that the 2-isocyanatoethyl methacrylate (Karenz MOI manufactured by Showa Denko K. K.) used for the synthesis of the dye compound (A-45) was changed to 2-isocyanatoethyl acrylate (Karenz AOI manufactured by Showa Denko K. K.).

The dye compound A-55 was subjected to $^1$H NMR spectrum measurement. The measurement was carried out using 400 MHz and dimethyl sulfoxide (DMSO). Product name: AV-400, manufactured by Bruker Co. Ltd., was used as a measurement device.

δ 0.95-1.35 (24H, m), 2.85-3.15 (4H, m), 3.15-3.28 (4H, m), 4.0-4.16 (4H, m), 5.88-6.36 (5H, m), 7.03-7.54 (11H, m), 7.63-8.18 (3H, m), 9.91-10.08 (2H, m).

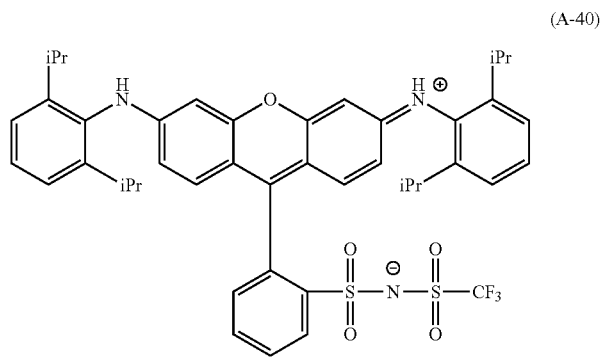

(A-40)

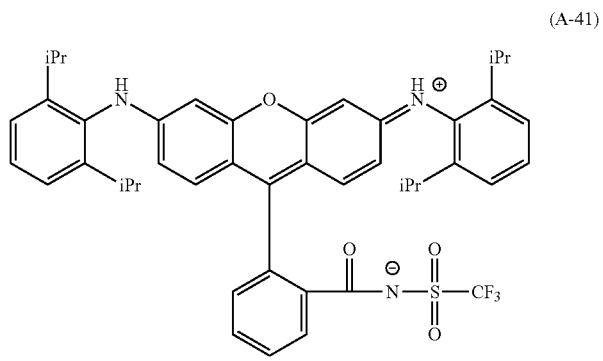

(A-41)

-continued
(A-42)
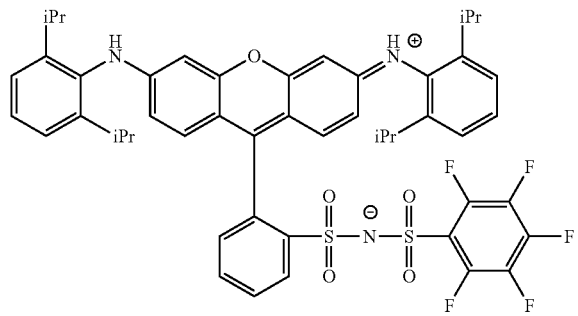
(A-43)
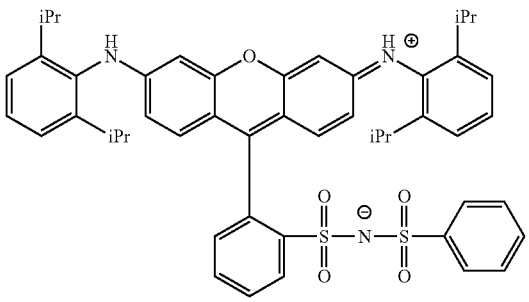
(A-44)
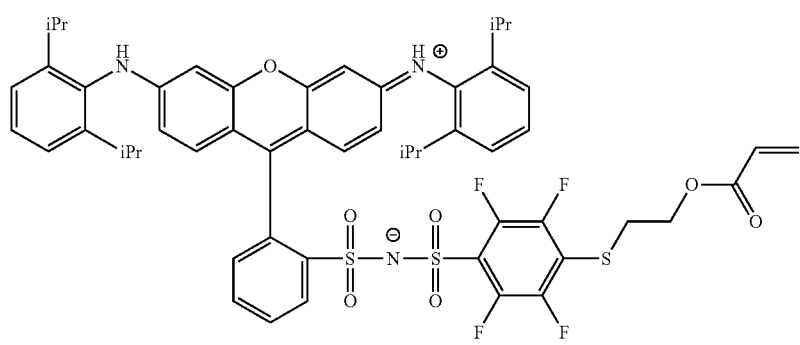
(A-45)
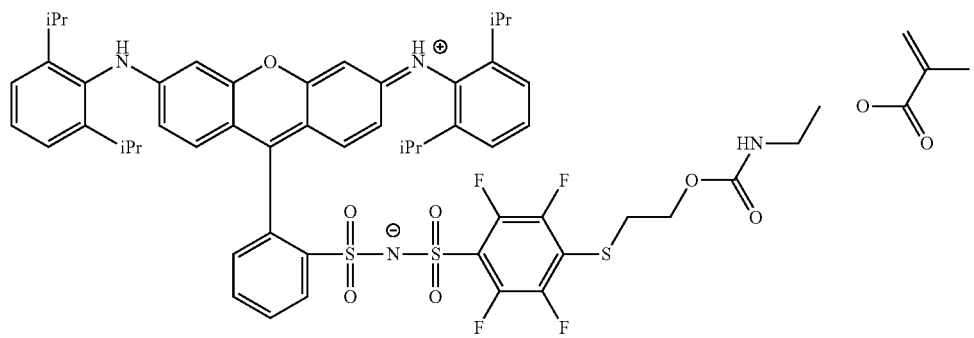
(A-46)
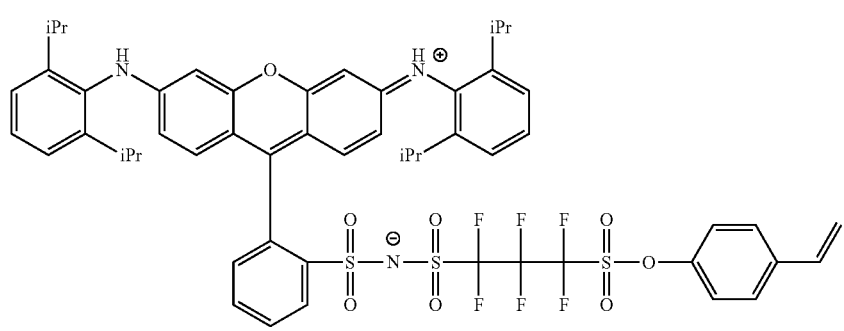

-continued
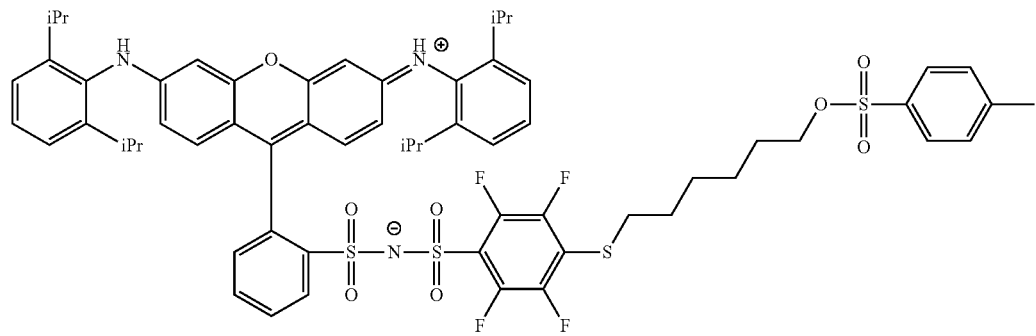
(A-47)
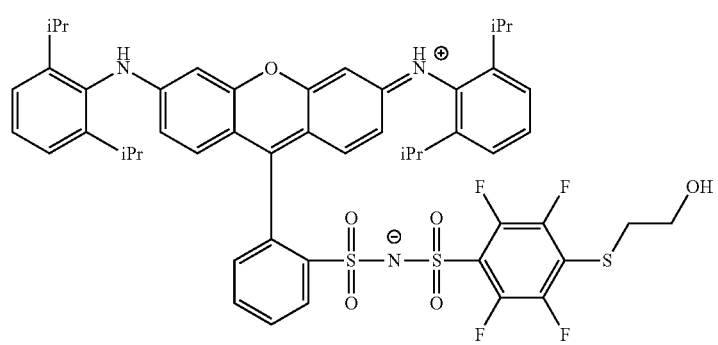
(A-48)
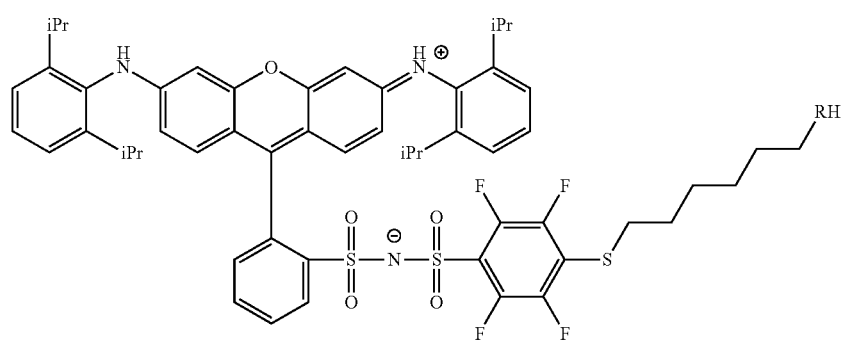
(A-49)
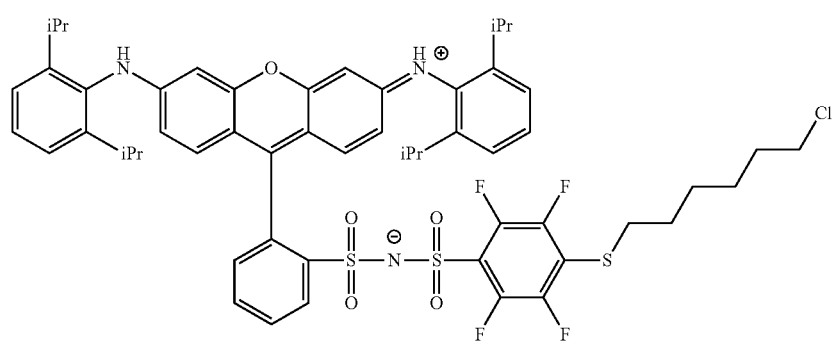
(A-50)

(A-51)
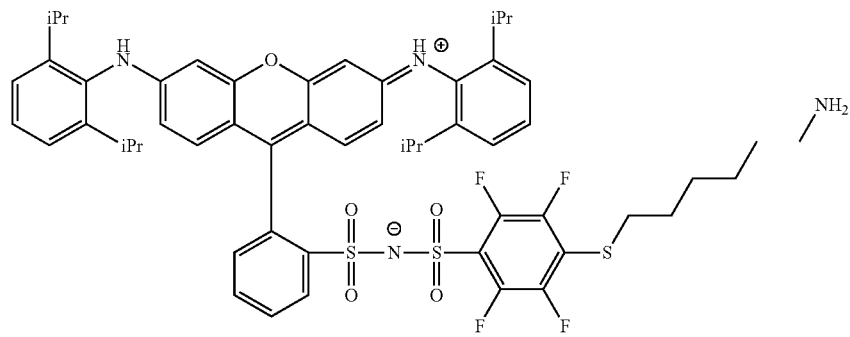
(A-52)
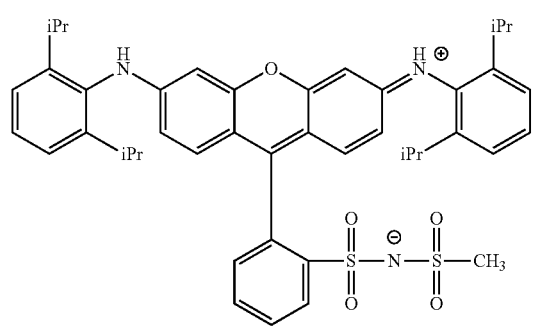
(A-53)
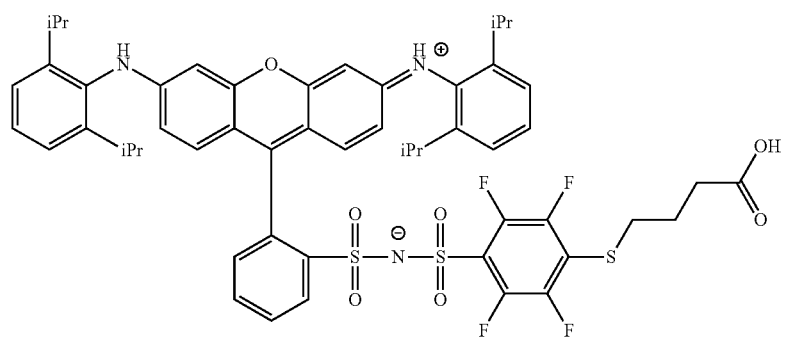
(A-54)
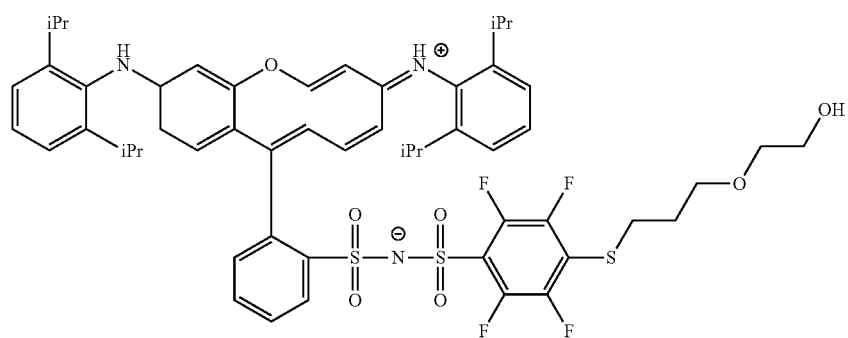

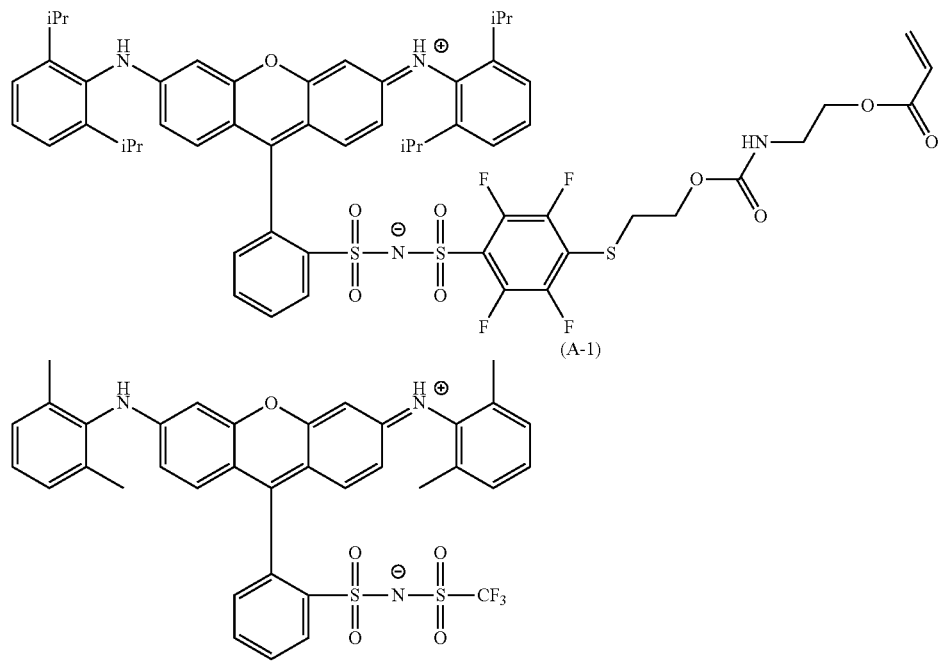

(A-55)

(A-1)

TABLE 4

| Dye compound | [M + H]+ | λmax (nm) |
|---|---|---|
| A-40 | 818.3 | 540 |
| A-41 | 782.3 | 526 |
| A-42 | 916.3 | 528 |
| A-43 | 826.3 | 527 |
| A-44 | 1028.3 | 531 |
| A-45 | 1129.3 | 531 |
| A-46 | 1082.3 | 538 |
| A-47 | 1184.4 | 531 |
| A-48 | 974.3 | 531 |
| A-49 | 1046.3 | 531 |
| A-50 | 1048.3 | 531 |
| A-51 | 1029.3 | 531 |
| A-52 | 763.31 | 527 |
| A-53 | 1016.3 | 531 |
| A-54 | 1032.3 | 531 |
| A-55 | 1115.3 | 531 |
| A-1 | 706.2 | 535 |

Examples and Comparative Examples

1. Preparation of Resist Solution

Components having the following composition were mixed and dissolved to prepare a resist solution for an undercoat layer.

<Composition of Resist Solution for Undercoat Layer>

| | |
|---|---|
| Solvent: propylene glycol monomethyl ether acetate | 19.20 parts |
| Solvent: ethyl lactate | 36.67 parts |
| Alkali-soluble resin: 40% PGMEA solution of benzyl methacrylate/methacrylic acid/2-hydroxyethyl methacrylate copolymer (molar ratio = 60/22/18, weight-average molecular weight of 15,000, number-average molecular weight of 9,000) | 30.51 parts |
| Ethylenically unsaturated double bond-containing compound: dipentaerythritol hexaacrylate | 12.20 parts |
| Polymerization inhibitor: p-methoxyphenol | 0.0061 parts |
| Fluorine-based surfactant: F-475, manufactured by DIC Corporation | 0.83 parts |
| Photopolymerization initiator: trihalomethyl triazine-based photopolymerization initiator (TAZ-107 manufactured by Midori Kagaku Co., Ltd.) | 0.586 parts |

2. Manufacture of Undercoat Layer-Attached Silicon Wafer Substrate

A 6-inch silicon wafer was heated in an oven at 200° C. for 30 minutes. Next, the resist solution was applied onto this silicon wafer such that the dry film thickness became 1.5 μm. Further, the resultant was further heated and dried in an oven at 220° C. for 1 hour to form an undercoat layer, thereby obtaining an undercoat layer-attached silicon wafer substrate.

3. Preparation of Colored Composition

3-1. Preparation of Blue Pigment Dispersion

<Preparation of Blue Pigment Dispersion P1>

A blue pigment dispersion P1 was prepared in the following manner.

A mixed solution consisting of 13.0 parts (blue pigment, average particle size of 55 nm) of C. I. Pigment Blue 15:6 (blue pigment; hereinafter referred to as "PB 15:6"), 5.0 parts of Disperbyk111 as a pigment dispersant, and 82.0 parts of PGMEA was mixed and dispersed for 3 hours by a beads mill (zirconia beads having a diameter of 0.3 mm) to prepare a pigment dispersion. Thereafter, the pigment dispersion was further subjected to a dispersion treatment under a pressure of 2000 kg/cm$^3$ and at a flow rate of 500 g/min, by using a high-pressure dispersing machine equipped with a depressurizing mechanism. NANO-3000-10 (manufactured by Nihon B.E.E Co., Ltd.). This dispersion treatment was repeated 10 times to obtain a blue pigment dispersion P1 (a dispersion of C. I. Pigment Blue 15:6, pigment concentration of 13%) used in the colored compositions of Examples or Comparative Examples.

For the obtained blue pigment dispersion P1, the particle size of the pigment was measured using a dynamic light scattering method (Microtrac Nanotrac UPA-EX150 (manufactured by Nikkiso Co., Ltd.)), and as a result, was found to be 24 nm.

In the same manner as the preparation of the blue pigment dispersion P1 except that a combination of a pigment shown below and dispersant resin agent, Disperbyk111, was used instead of a combination of C. I. Pigment Blue 15:6 used as a blue pigment in the blue pigment dispersion P1 and a dispersant resin agent, Disperbyk111 in "3-1. Preparation of (zirconia beads having a diameter of 0.3 mm). Thereafter, the mixed solution was further subjected to a dispersing treatment under a pressure of 2000 kg/cm$^3$ and at a flow rate of 500 g/min by using a depressurizing mechanism-attached high-pressure dispersing machine NANO-3000-10 (manufactured by Nihon B.E.E Co., Ltd.). The dispersing treatment was repeated 10 times, thereby obtaining a PB 15:6 dispersion as a pigment dispersion. For the obtained PB 15:6 dispersion, the average primary particle size of the pigment was measured using a dynamic light scattering method (Microtrac Nanotrac UPA-EX150 manufactured by Nikkiso Co., Ltd.) and found to be 24 nm.

<Preparation of Blue Pigment Dispersion P3>

A blue pigment dispersion P2 was prepared by the same method as in Preparation of Blue Pigment Dispersion P2 above except that the following dispersant resin agent D1 was used as a dispersant resin agent.

Dispersant resin agent D1

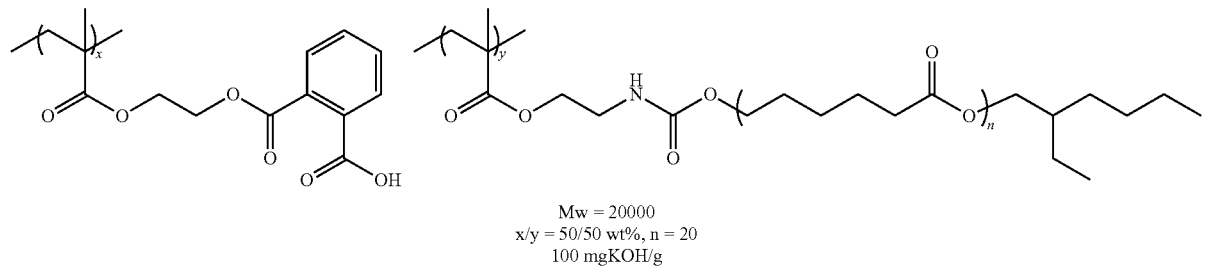

Mw = 20000
x/y = 50/50 wt%, n = 20
100 mgKOH/g

Blue Pigment Dispersion", a red pigment dispersion, a green pigment dispersion, and a yellow pigment dispersion were prepared.

Pigment for a red pigment dispersion: C. I. Pigment Red 246 (PR246)

Pigment for a yellow pigment dispersion: C. I. Pigment Yellow 139 (PY139)

Pigment for a green pigment dispersion: C. I. Pigment Green 58 (PG58)

The acid value of the dispersant resin agent D1 was 100 mgKOH/g. Further, the weight average molecular weight of the dispersant resin agent D1 was 20000. Further, the mass ratio of x to y in the structure of the dispersant resin agent D1 was 50:50 and n was 20.

<Preparation of Blue Pigment Dispersion P4>

A blue pigment dispersion P4 was prepared by the same method as in Preparation of Blue Pigment Dispersion P2 above except that the following dispersant resin agent D2 was used as a dispersant resin agent.

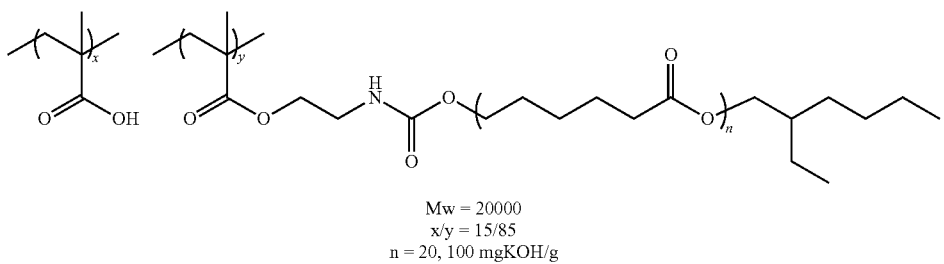

Mw = 20000
x/y = 15/85
n = 20, 100 mgKOH/g

<Preparation of Blue Pigment Dispersion P2>

A mixed solution consisting of 19.4 parts by mass of PB 15:6 (average primary particle size of 55 nm), 2.95 parts by mass of a dispersant resin agent BYK-161 (manufactured by BYK-Chemie), 2.95 parts by mass in terms of solid contents (9.93 parts by mass of a solution) of an alkali-soluble resin 1 (a copolymer of benzyl methacrylate/methacrylic acid, 30% PGMEA solution), and 165.3 parts by mass of PGMEA was mixed and dispersed for 3 hours by using a beads mill The acid value of the dispersant resin agent D2 was 100 mgKOH/g. Further, the weight average molecular weight of the dispersant resin agent D2 was 20000. Further, the mass ratio of x to y in the structure of the dispersant resin agent D2 was 15:85 and n was 20.

<Preparation of Blue Pigment Dispersion P5>

A pigment dispersion P5 was prepared by the same method as the pigment dispersion P2 except in Preparation of Blue Pigment Dispersion P2 above that C. I. Pigment Red 254 was used instead of PB 15:6 as a pigment. The average primary particle size of the pigment (C. I. Pigment Red 254) was measured using a dynamic light scattering method (Microtrac Nanotrac UPA-EX150 manufactured by Nikkiso Co., Ltd.) and found to be 26 nm.

3-2. Preparation of Colored Composition

<Colored Compositions of Examples 1 to 27 and Comparative Examples 1 to 3>

The following respective components were mixed and dissolved to obtain the respective colored compositions of Examples and Comparative Examples.

| | |
|---|---|
| Dye compound (A) (the compound described in the following table) in terms of a solid content | 0.04 parts |
| Solvent (PGMEA) | 1.133 parts |
| Alkali-soluble resin (J1 or J2 shown below) | 0.03 parts |
| Dispersant (Solsperse 20000: (1% cyclohexane solution, manufactured by The Lubrizol Corporation)) | 0.125 parts |
| Photopolymerization initiator (compounds of C-4 to C-13 below) | 0.012 parts |
| Pigment dispersion P1 (pigment concentration of 13%) | 0.615 parts |
| Curable compound | 0.07 parts |
| Surfactant (glycerol propoxylate: (1% cyclohexane solution)) | 0.048 parts |

<Colored Compositions of Examples 28 to 93 and Comparative Examples 4 to 6>

The following respective components were mixed and dissolved to obtain the respective colored compositions of Examples and Comparative Examples.

| | |
|---|---|
| Solvent (cyclohexanone) | 17.12 parts |
| Alkali-soluble resin 1 (a copolymer of benzyl methacrylate (BzMA) and methacrylic acid (MAA), 30% PGMEA solution) | 1.23 parts |
| Alkali-soluble resin 2 (ACRYCURE-RD-F8 (manufactured by Nippon Shokubai Co., Ltd.)) | 0.23 parts |
| Photopolymerization initiator I-2 (IRGACURE OXE-02) | 0.975 parts |
| Cyclohexanone solution of dye multimer (solid content concentration of 12.3%) | 24.57 parts |
| Pigment dispersion (solid content concentration of 12.8%) | 51.40 parts |
| Curable compound | 1.96 parts |
| Polymerization inhibitor (p-methoxyphenol) | 0.0007 parts |
| Photopolymerization inhibitor (p-methoxyphenol) | |
| Fluorine-based surfactant (F475 manufactured by DIC Corporation, 1% PGMEA solution) | 2.50 parts |

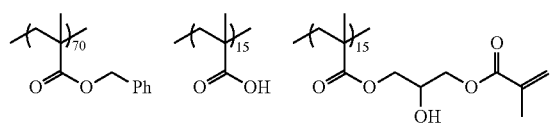

(J1)

Mw 15,000

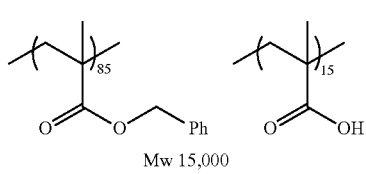

(J2)

Mw 15,000

-continued

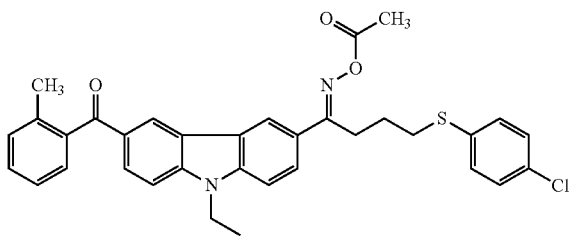

(C-4)

(C-5)

(C-6)

(C-7)

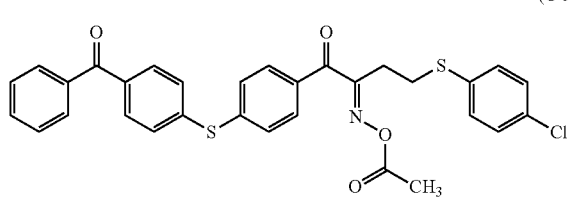

(C-8)

(C-9)

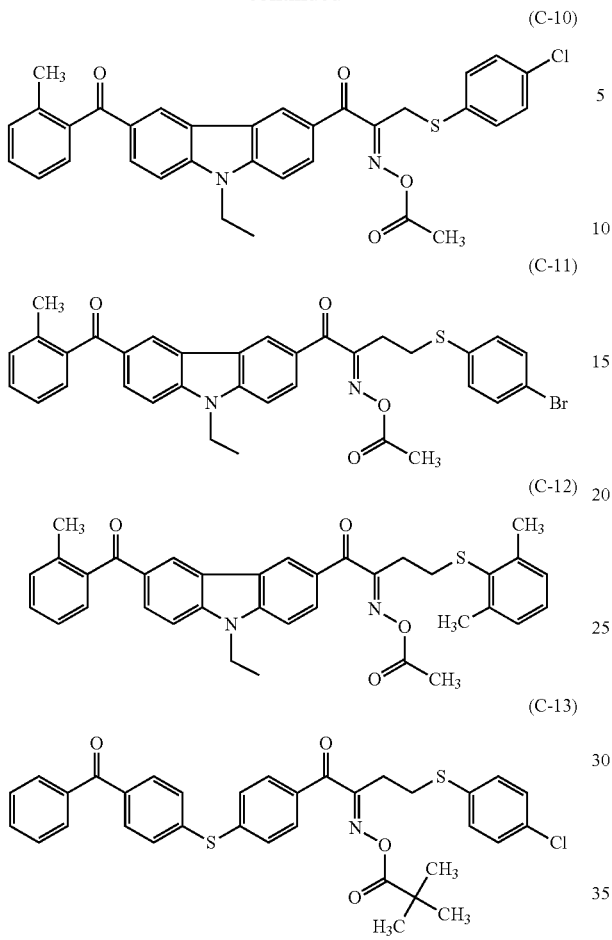

Curable compound dipentaerythritol hexaacrylate (manufactured by Shin-Nakamura Chemical Co., Ltd.)

NK Ester A-DPH-12E (manufactured by Shin-Nakamura Chemical Co., Ltd.)

KAYARAD RP-1040 (manufactured by Nippon Kayaku Co., Ltd.)

Polyfunctional thiol compound (chain transfer agent): compounds of the following S-1 to S-5

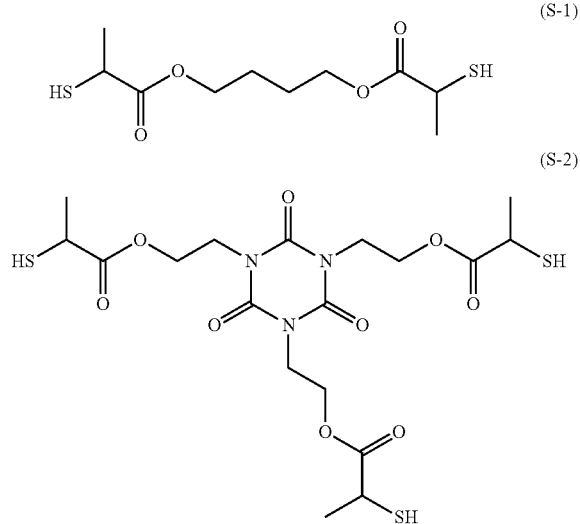

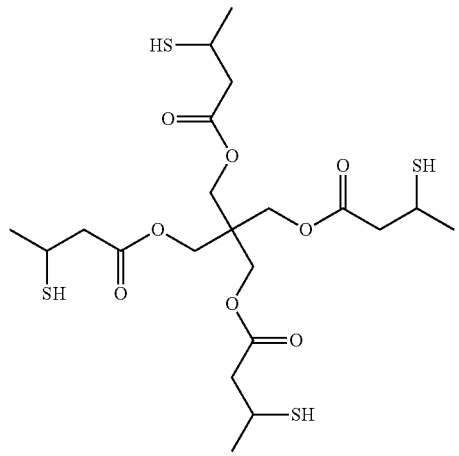

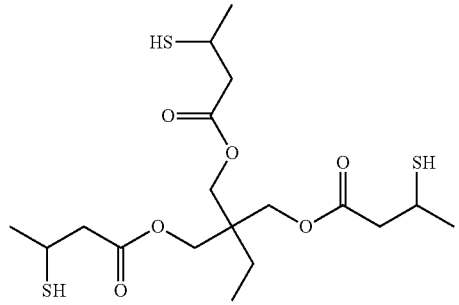

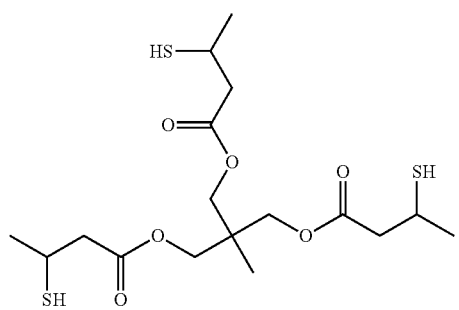

Epoxy Compounds

E-1: EHPE3150, manufactured by Daicel Chemical Industries, Ltd.

E-2: EPICLON 840 (manufactured by DIC Corporation)

E-3: EPICLON N660 (manufactured by DIC Corporation)

E-4: EPICLON HP7200 (manufactured by DIC Corporation)

4. Manufacture of Color Filter Using Colored Composition

<Manufacture of Color Filter Using Colored composition by Photolithography>

<<Pattern Formation>>

Each of the colored compositions of Examples and Comparative Examples, which had been prepared as above, was applied onto the undercoat layer of the undercoat layer-attached silicon wafer substrate obtained in the above section 2, thereby forming a colored composition layer (coating film). Then, a heating treatment (pre-baking) was carried out for 120 seconds by using a hot plate at 100° C. such that the dry film thickness of the coating film became 0.6 nm.

Next, by using an i-ray stepper exposure device FPA-3000i5+ (manufactured by CANON Inc.), the wafer was exposed at a wavelength of 365 nm through an island pattern mask having a 1.0 μm×1.0 μm pattern, by varing the exposure dose in a range from 50 mJ/cm² to 1200 mJ/cm².

Subsequently, the silicon wafer substrate, which had been irradiated with light and had a coating film formed thereon, was loaded onto a horizontal spin table of a spin shower developing machine (Model DW-30, manufactured by Chemitronics Co., Ltd), and subjected to paddle development at 23° C. for 60 seconds by using CD-2000 (manufactured by FUJIFILM Electronic Materials CO., LTD.), thereby forming a colored pattern on the silicon wafer substrate.

The silicon wafer on which the colored pattern had been formed was fixed onto the horizontal spin table by a vacuum chuck method, and the silicon wafer substrate was rotated at a rotation frequency of 50 r.p.m. by using a rotation device. In this state, from the position above the rotation center, pure water was supplied onto the wafer from a spray nozzle in the form of shower so as to perform rinsing treatment, and then the wafer was spray-dried.

In the manner described above, a monochromic color filter having the colored pattern formed of the colored compositions of Examples or Comparative Examples were manufactured.

Thereafter, the size of the colored pattern was measured by using a length measuring SEM "S-9260A" (manufactured by Hitachi, Ltd.). An exposure dose at which the pattern size became 1.0 μm was determined as an optimal exposure dose.

<Manufacture of Color Filter Using Colored Curable Composition by Dry Etching Method>

A colored layer was manufactured by applying he colored compositions of Examples and Comparative Examples, which had been prepared as above, onto a 7.5 cm×7.5 cm glass substrate using a spin coater such that the film thickness became 0.5 μm, followed by heating at 200° C. for 5 minutes using a hotplate, and curing the coating film. The film thickness of the colored layer was 0.5 μm.

Subsequently, a positive type photoresist "FHi622BC" (manufactured by FUJIFILM Electronic Materials Co., Ltd.) was applied and subjected to a pre-baking treatment at 90° C. for 1 minute to form a photoresist layer having a film thickness of 0.8 μm.

Next, the photoresist layer was patternwise exposed at an exposure dose of 350 mJ/cm² using an i-ray stepper (manufactured by Canon Inc.) and then subjected to a heating treatment at a photoresist layer temperature or the atmospheric temperature of 90° C. for 1 minute. Thereafter, a developing treatment was carried out for 1 minute with a developer "FHD-5" (manufactured by FUJIFILM Electronic Materials Co., Ltd.) and further subjected to a post-baking treatment at 110° C. for 1 minute to form a resist pattern. The size of the resist pattern was formed at 1.0 μm on one side, in consideration of the etching conversion difference (reduction in the pattern width due to etching).

Subsequently, the glass substrate after resist pattern formation was adhered to an 8-inch silicon wafer and subjected to a first stage etching treatment for 80 seconds with a dry etching apparatus (U-621, manufactured by Hitachi High-Technologies Corporation) under conditions of an RF power: 800 W, an antenna bias: 400 W, a wafer bias: 200 W, the internal pressure of the chamber: 4.0 Pa, a substrate temperature: 50° C., and the gas kind and the flow rate of a mixed gas: $CF_4$: 80 mL/min., $O_2$: 40 mL/min., and Ar: 800 mL/min.

Next, a second stage etching treatment, that is, an over-etching treatment, was carried out for 28 seconds using the same etching chamber under conditions of a chamber RF power: 600 W, an antenna bias: 100 W, a wafer bias: 250 W, the internal pressure of a chamber: 2.0 Pa, a substrate temperature: 50° C., and the gas kind and the flow rate of a mixed gas: $N_2$: 500 mL/min., $O_2$: 50 mL % min., and Ar: 500 mL/min ($N_2/O_2$/Ar=10/1/10).

After carrying out dry etching under the above conditions, the resist was removed by performing a peeling process for 120 seconds at 50° C. using a photoresist peeling solution "MS230C" (manufactured by FUJIFILM Electronic Materials Co., Ltd.), and a green color pattern was formed. Washing with pure water and spin drying were further performed, and thereafter a dehydration baking process was performed for 2 minutes at 100° C. thereby obtaining a color filter.

5. Evaluation of Performance 5-1. Heat Resistance

The glass substrate on which the colored composition obtained above had been applied was loaded onto a hot plate at 200° C. such that it came into contact with the substrate surface, and was heated for 1 hour. Then, the color difference (ΔE*ab value) before and after the heating was measured using a colorimeter MCPD-1000 (manufactured by Otsuka Electronics Co., Ltd.), and used as an index for evaluating the heat fastness, and the index was evaluated in accordance with the following evaluation criteria. A smaller ΔE*ab value indicates better heat resistance. Incidentally, the ΔE*ab value is a value determined from the following color-difference formula according to CIE 1976 (L*, a*, b*) color space (New Edition of Color Science Handbook (1985) p. 266, edited by The Color Science Association of Japan).

ΔE*ab={(ΔL*)2+(Δa*)2+(Δb*)2}1/2 was evaluated under the following criteria.

A: The value of ΔE*ab value is 0 or more and less than 1.0.
B: The value of ΔE*ab value is 1.0 or more and less than 3.0.
C: The value of ΔE*ab value is 3.0 or more.

5-2. PGMEA Solubility

The solvent solubility of the obtained colored composition with respect to PGMEA was evaluated in accordance with the following criteria.

A: A case showing a solubility of 20% by mass or more.
B: A case showing a solubility of 10% by mass or more and less than 20% by mass.
C: A case showing a solubility of 5% by mass or more and less than 10% by mass.
D: A case showing a solubility of less than 5% by mass.

5-3. Cyclohexanone Solubility

The solvent solubility of the obtained colored composition with respect to cyclohexanone was evaluated in accordance with the following criteria.

A: A case showing a solubility of 20% by mass or more.
B: A case showing a solubility of 10% by mass or more and less than 20% by mass.
C: A case showing a solubility of 5% by mass or more and less than 10% by mass.
D: A case showing a solubility of less than 5% by mass.

5-4. Evaluation of Color Migration

The absorbance of the colored pattern in each of the color filters was measured by MCPD-3000 (manufactured by Otsuka Electronics Co., Ltd.) (Absorbance A).

A CT-2000L solution (a transparent undercoating agent, manufactured by FUJIFILM Electronics Materials Co., Ltd.) was applied onto the surface, on which the colored pattern of the color filter had been formed, such that the dried film thickness became 1 μm, and dried to form a transparent film, and the film was subjected to a heating treatment at 280° C. for 5 minutes.

After the completion of heating, the absorbance of the transparent film adjacent to the colored pattern was measured by MCPD-3000 (manufactured by Otsuka Electronics Co., Ltd.) (Absorbance B).

The ratio [%] of the absorbance B value of the obtained transparent film to the absorbance A value of the colored pattern which had been measured before heating was calculated [the following (Equation A)]. The ratio was used as an index for evaluating the color migration to adjacent pixels.

Color migration(%)=Absorbance $B$/Absorbance $A$×100         (Equation A)

A: The value of Equation A is 0 or more and less than 2.
B: The value of Equation A is 2 or more and less than 5.
C: The value of Equation A is 5 or more.

5-5. Spectral Evaluation Before and after Development

A CT-4000L solution (a transparent undercoating agent, manufactured by FUJIFILM Electronic Materials Co., Ltd.) was applied onto a glass wafer such that the dry film thickness became 0.1 μm and dried to form a transparent film, and the film was subjected to a heating treatment at 220° C. for 5 minutes.

The colored composition was applied using a spin coater such that the film thickness became 0.6 μm, and then subjected to a heating treatment (pre-baking) by using a hotplate at 100° C. for 120 seconds.

Next, the coating film was exposed at an exposure dose of 500 mJ/cm$^2$ at a wavelength of 365 nm using an i-ray stepper exposure apparatus FPA-3000i5+(manufactured by Canon Inc.).

The transmittance of the color filter thus obtained at a wavelength region from 300 nm to 800 nm was measured by using an ultraviolet-visible near-infrared spectrophotometer UV3600 (manufactured by Shimadzu Corporation) as a spectrophotometer (reference glass substrate).

The color filter which had been subjected to transmittance measurement was placed on a horizontal turntable of a spin shower development machine (model DW-30, manufactured by Chemtronics Co., Ltd.) and subjected to puddle development at 23° C. for 60 seconds by using CD-2000 (manufactured by FUJIFILM Electronics Materials Co., Ltd.). While the silicon wafer substrate was rotated by a rotation device at a rotation number of 50 r.p.m., pure water was supplied by showering from an ejection nozzle above the rotation center to carry out a rinse treatment, followed by spray-drying. After drying, a spectral measurement was carried out again to evaluate a change in the transmittance between before and after development (a value represented by an equation of |T0−T1| in the case where the transmittance before development is defined as T0 and the transmittance after development is T1).

AA: Good. A case where the change in the transmittance before and after development is less than 2% in the entire region ranging from 300 nm to 800 nm.

A: Satisfactory. A case where the change in the transmittance before and after development is 2% or more and less than 5% in the entire region ranging from 300 nm to 800 nm.

B: Sufficient. A case where the change in the transmittance before and after development is 5% or more and less than 10% in the entire region ranging from 300 nm to 800 nm.

C: Insufficient. A case where the change in the transmittance before and after development is 10% or more in the entire region ranging from 300 nm to 800 nm.

TABLE 5

| | Method for manufacturing color filter | Dye compound (A) | Curable compound (B) | Solvent (C) | Pigment dispersion | Photo-polymerization initiator | Alkali-soluble resin |
|---|---|---|---|---|---|---|---|
| Example 1 | Photolithography | A-1 | Dipentaerythritol hexaacrylate | PGMEA | P1 | C-4 | J1 |
| Example 2 | Photolithography | A-2 | Dipentaerythritol hexaacrylate | PGMEA | P1 | C-5 | J1 |
| Example 3 | Photolithography | A-13 | Dipentaerythritol hexaacrylate | PGMEA | P1 | C-4 | J1 |
| Example 4 | Photolithography | P-1 | Dipentaerythritol hexaacrylate | PGMEA/ cyclohexanone = 60/40 | P1 | C-9 | J1 |
| Example 5 | Photolithography | P-2 | Dipentaerythritol hexaacrylate | PGMEA | P1 | C-7 | J1 |
| Example 6 | Photolithography | P-3 | Dipentaerythritol hexaacrylate | PGMEA | P1 | C-13 | J1 |
| Example 7 | Photolithography | P-4 | Dipentaerythritol hexaacrylate | PGMEA | P1 | C-9 | J1 |
| Example 8 | Photolithography | P-5 | Dipentaerythritol hexaacrylate | PGMEA | P1 | C-10 | J1 |
| Example 9 | Photolithography | P-6 | Dipentaerythritol hexaacrylate | PGMEA/ cyclopentanone = 70/30 | P1 | C-11 | J1 |
| Example 10 | Photolithography | P-7 | Dipentaerythritol hexaacrylate | PGMEA | P1 | C-12 | J1 |
| Example 11 | Photolithography | P-8 | Dipentaerythritol hexaacrylate | PGMEA | P1 | C-13 | J1 |
| Example 12 | Photolithography | P-9 | Dipentaerythritol hexaacrylate | PGMEA | P1 | C-4 | J1 |
| Example 13 | Photolithography | P-10 | Dipentaerythritol hexaacrylate | PGMEA | P1 | C-9 | J1 |

TABLE 5-continued

| | Method for manufacturing color filter | Dye compound (A) | Curable compound (B) | Solvent (C) | Pigment dispersion | Photo-polymerization initiator | Alkali-soluble resin |
|---|---|---|---|---|---|---|---|
| Example 14 | Photolithography | P-11 | Dipentaerythritol hexaacrylate | PGMEA/cyclopentanone = 50/50 | P1 | C-5 | J1 |
| Example 15 | Photolithography | P-12 | Dipentaerythritol hexaacrylate | PGMEA | P1 | C-13 | J1 |
| Example 16 | Photolithography | P-13 | Dipentaerythritol hexaacrylate | PGMEA | P1 | C-10 | J1 |
| Example 17 | Photolithography | P-14 | Dipentaerythritol hexaacrylate | PGMEA | P1 | C-8 | J2 |
| Example 18 | Photolithography | P-15 | Dipentaerythritol hexaacrylate | PGMEA | P1 | C-6 | J1 |
| Example 19 | Photolithography | P-16 | Dipentaerythritol hexaacrylate | PGMEA | P1 | C-11 | J1 |
| Example 20 | Photolithography | P-17 | Dipentaerythritol hexaacrylate | PGMEA | P1 | C-9 | J1 |
| Example 21 | Photolithography | P-18 | Dipentaerythritol hexaacrylate | PGMEA | P1 | C-12 | J1 |
| Example 22 | Photolithography | P-19 | Dipentaerythritol hexaacrylate | PGMEA | P1 | C-10 | J1 |
| Example 23 | Photolithography | P-20 | Dipentaerythritol hexaacrylate | PGMEA | P1 | C-4 | J1 |
| Example 24 | Photolithography | P-21 | Dipentaerythritol hexaacrylate | PGMEA | P1 | C-9 | J1 |
| Example 25 | Photolithography | P-22 | Dipentaerythritol hexaacrylate | PGMEA | P1 | C-10 | J1 |
| Example 26 | Photolithography | P-23 | Dipentaerythritol hexaacrylate | PGMEA | P1 | C-4 | J1 |
| Example 27 | Photolithography | P-24 | Dipentaerythritol hexaacrylate | PGMEA | P1 | C-13 | J1 |
| Comparative Example 1 | Photolithography | Comparative compound-1 | Dipentaerythritol hexaacrylate | PGMEA | P1 | C-9 | J1 |
| Comparative Example 2 | Photolithography | Comparative compound-2 | Dipentaerythritol hexaacrylate | PGMEA | P1 | C-9 | J1 |
| Comparative Example 3 | Photolithography | Comparative compound-3 | Dipentaerythritol hexaacrylate | PGMEA | P1 | C-9 | J1 |

TABLE 6

| | Heat resistance | PGMEA solvent solubility | Color migration | Change in spectrum between before and after development |
|---|---|---|---|---|
| Example 1 | B | A | B | C |
| Example 2 | B | A | B | C |
| Example 3 | B | A | A | C |
| Example 4 | A | A | A | AA |
| Example 5 | A | A | A | AA |
| Example 6 | A | A | A | AA |
| Example 7 | A | A | A | AA |
| Example 8 | A | A | A | AA |
| Example 9 | A | A | A | AA |
| Example 10 | A | A | A | AA |
| Example 11 | A | A | A | AA |
| Example 12 | A | A | A | AA |
| Example 13 | A | A | A | AA |
| Example 14 | A | A | A | AA |
| Example 15 | A | A | A | AA |
| Example 16 | A | A | A | AA |
| Example 17 | A | A | A | AA |
| Example 18 | A | A | A | AA |
| Example 19 | A | A | A | AA |
| Example 20 | A | A | A | AA |
| Example 21 | A | A | A | AA |
| Example 22 | A | A | A | AA |
| Example 23 | A | A | A | AA |
| Example 24 | A | A | A | AA |
| Example 25 | A | A | A | AA |
| Example 26 | A | A | A | AA |
| Example 27 | A | A | A | AA |
| Comparative Example 1 | C | B | C | C |
| Comparative Example 2 | C | B | C | C |
| Comparative Example 3 | C | D | C | C |

TABLE 7

| | Method for manufacturing color filter | Dye compound (A) | Curable compound (B) | Solvent (C) | Pigment dispersion | Photopolymerization initiator | Chain transfer agent (S) | Parts by mass | Epoxy compound (E) | Parts by mass | Alkali-soluble resin |
|---|---|---|---|---|---|---|---|---|---|---|---|
| Example 28 | Photolithography | A-1 | Dipentaerythritol hexaacrylate | PGMEA/cyclohexanone = 50/50 (wt) | P2 | C-4 | — | — | — | — | J1 |
| Example 29 | Photolithography | A-2 | Dipentaerythritol hexaacrylate | PGMEA/cyclohexanone = 50/50 (wt) | P2 | C-5 | — | — | — | — | J1 |

TABLE 7-continued

| | Method for manufacturing color filter | Dye compound (A) | Curable compound (B) | Solvent (C) | Pigment dispersion | Photopolymerization initiator | Chain transfer agent (S) | Parts by mass | Epoxy compound (E) | Parts by mass | Alkali-soluble resin |
|---|---|---|---|---|---|---|---|---|---|---|---|
| Example 30 | Photolithography | A-14 | Dipentaerythritol hexaacrylate | PGMEA | P3 | C-4 | — | — | — | — | J1 |
| Example 31 | Photolithography | P-1 | Dipentaerythritol hexaacrylate | PGMEA/cyclohexanone = 60/40 (wt) | P2 | C-9 | — | — | — | — | J1 |
| Example 32 | Photolithography | P-2 | Dipentaerythritol hexaacrylate | PGMEA | P2 | C-7 | — | — | — | — | J1 |
| Example 33 | Photolithography | P-3 | Dipentaerythritol hexaacrylate | PGMEA | P2 | C-13 | — | — | — | — | J1 |
| Example 34 | Photolithography | P-4 | Dipentaerythritol hexaacrylate | PGMEA | P2 | C-9 | — | — | — | — | J1 |
| Example 35 | Photolithography | P-5 | Dipentaerythritol hexaacrylate | PGMEA | P2 | C-10 | — | — | — | — | J1 |
| Example 36 | Photolithography | P-6 | Dipentaerythritol hexaacrylate | PGMEA/cyclopentanone = 70/30 | P2 | C-11 | — | — | — | — | J1 |
| Example 37 | Photolithography | P-7 | Dipentaerythritol hexaacrylate | PGMEA | P4 | C-12 | — | — | — | — | J1 |
| Example 38 | Photolithography | P-8 | Dipentaerythritol hexaacrylate | PGMEA | P2 | C-13 | — | — | — | — | J1 |
| Example 39 | Photolithography | P-9 | Dipentaerythritol hexaacrylate | PGMEA | P2 | C-4 | — | — | — | — | J1 |
| Example 40 | Photolithography | P-10 | Dipentaerythritol hexaacrylate | PGMEA | P2 | C-9 | — | — | — | — | J1 |
| Example 41 | Photolithography | P-11 | Dipentaerythritol hexaacrylate | PGMEA/cyclopentanone = 50/50 (wt) | P2 | C-5 | — | — | — | — | J1 |
| Example 42 | Photolithography | P-12 | Dipentaerythritol hexaacrylate | PGMEA | P2/P4 = 50/50 (wt) | C-13 | — | — | — | — | J1 |
| Example 43 | Photolithography | P-13 | Dipentaerythritol hexaacrylate | PGMEA | P2 | C-10 | — | — | — | — | J1 |
| Example 44 | Photolithography | P-14 | Dipentaerythritol hexaacrylate | PGMEA | P2 | C-8 | — | — | — | — | J2 |
| Example 45 | Photolithography | P-15 | Dipentaerythritol hexaacrylate | PGMEA | P2 | C-6 | — | — | — | — | J1 |
| Example 46 | Photolithography | P-16 | Dipentaerythritol hexaacrylate | PGMEA | P2 | C-11 | — | — | — | — | J1 |
| Example 47 | Photolithography | P-17 | Dipentaerythritol hexaacrylate | PGMEA | P2 | C-9 | — | — | — | — | J1 |
| Example 48 | Photolithography | P-18 | Dipentaerythritol hexaacrylate | PGMEA | P2 | C-12 | — | — | — | — | J1 |
| Example 49 | Photolithography | P-19 | Dipentaerythritol hexaacrylate | PGMEA | P2 | C-10 | — | — | — | — | J1 |
| Example 50 | Photolithography | P-20 | Dipentaerythritol hexaacrylate | PGMEA | P4 | C-4 | — | — | — | — | J1 |
| Example 51 | Photolithography | P-21 | Dipentaerythritol hexaacrylate | PGMEA | P2 | C-9 | — | — | — | — | J1 |
| Example 52 | Photolithography | P-22 | Dipentaerythritol hexaacrylate | PGMEA | P2 | C-10 | | | | | J1 |
| Example 53 | Photolithography | P-23 | Dipentaerythritol hexaacrylate | PGMEA | P2 | C-4 | — | — | — | — | J1 |
| Example 54 | Photolithography | P-24 | Dipentaerythritol hexaacrylate | PGMEA | P2/P4 = 50/50 (wt) | C-13 | — | — | — | — | J1 |
| Comparative Example 4 | Photolithography | Comparative compound-1 | Dipentaerythritol hexaacrylate | PGMEA | P2 | C-9 | — | — | — | — | J1 |
| Comparative Example 5 | Photolithography | Comparative compound-2 | Dipentaerythritol hexaacrylate | PGMEA | P2 | C-9 | — | — | — | — | J1 |
| Comparative Example 6 | Photolithography | Comparative compound-3 | Dipentaerythritol hexaacrylate | PGMEA | P2 | C-9 | — | — | — | — | J1 |

TABLE 8

| | Heat resistance | Cyclohexanone solvent solubility | Color migration | Change in spectrum between before and after development |
|---|---|---|---|---|
| Example 28 | B | A | B | C |
| Example 29 | B | A | B | C |
| Example 30 | B | A | A | C |
| Example 31 | A | A | A | AA |
| Example 32 | A | A | A | AA |
| Example 33 | A | A | A | AA |

TABLE 8-continued

| | Heat resistance | Cyclohexanone solvent solubility | Color migration | Change in spectrum between before and after development |
|---|---|---|---|---|
| Example 34 | A | A | A | AA |
| Example 35 | A | A | A | AA |
| Example 36 | A | A | A | AA |
| Example 37 | A | A | A | AA |
| Example 38 | A | A | A | AA |
| Example 39 | A | A | A | AA |
| Example 40 | A | A | A | AA |
| Example 41 | A | A | A | AA |
| Example 42 | A | A | A | AA |
| Example 43 | A | A | A | AA |
| Example 44 | A | A | A | AA |
| Example 45 | A | A | A | AA |
| Example 46 | A | A | A | AA |
| Example 47 | A | A | A | AA |
| Example 48 | A | A | A | AA |
| Example 49 | A | A | A | AA |
| Example 50 | A | A | A | AA |
| Example 51 | A | A | A | AA |
| Example 52 | A | A | A | AA |
| Example 53 | A | A | A | AA |
| Example 54 | A | A | A | AA |
| Comparative Example 4 | C | B | C | C |
| Comparative Example 5 | C | B | C | C |
| Comparative Example 6 | C | D | C | C |

TABLE 9

| | Method for manufacturing color filter | Dye compound (A) | Curable compound (B) | Solvent (C) | Pigment dispersion | Photopolymerization initiator | Chain transfer agent (S) | Parts by mass | Epoxy compound (E) | Parts by mass | Alkali-soluble resin |
|---|---|---|---|---|---|---|---|---|---|---|---|
| Example 55 | Photolithography | P-25 | A-DPH-12E | PGMEA/cyclohexanone = 50/50 (wt) | P2 | C-9 | S-1 | 0.02 | — | — | J1 |
| Example 56 | Photolithography | P-26 | A-DPH-12E | PGMEA/cyclohexanone = 50/50 (wt) | P2 | C-9 | S-2 | 0.02 | — | — | J1 |
| Example 57 | Photolithography | P-27 | KAYARAD RP-1040 | PGMEA/cyclohexanone = 60/40 (wt) | P2 | C-4 | S-3 | 0.01 | — | — | J1 |
| Example 58 | Photolithography | P-28 | A-DPH-12E | PGMEA/cyclopentanone = 50/50 (wt) | P2 | C-9 | S-4 | 0.01 | — | — | J1 |
| Example 59 | Photolithography | P-29 | KAYARAD RP-1040 | PGMEA/cyclohexanone = 50/50 (wt) | P2 | C-5 | S-5 | 0.01 | — | — | J2 |
| Example 60 | Photolithography | P-30 | KAYARAD RP-1040 | PGMEA/cyclohexanone = 50/50 (wt) | P2 | C-9 | S-1 | 0.01 | — | — | J1 |
| Example 61 | Photolithography | P-31 | A-DPH-12E | PGMEA/cyclohexanone = 50/50 (wt) | P4 | C-9 | — | — | — | — | J1 |
| Example 62 | Photolithography | P-32 | A-DPH-12E | PGMEA/cyclohexanone = 50/50 (wt) | P2 | C-9 | — | — | — | — | J1 |
| Example 63 | Photolithography | P-33 | KAYARAD RP-1040 | PGMEA/cyclopentanone = 50/50 (wt) | P2 | C-9 | — | — | — | — | J1 |
| Example 64 | Photolithography | P-34 | A-DPH-12E | PGMEA/cyclohexanone = 50/50 (wt) | P2 | C-9 | — | — | E1 | 0.3 | J1 |
| Example 65 | Photolithography | P-35 | A-DPH-12E | PGMEA/cyclohexanone = 50/50 (wt) | P2 | C-9 | — | — | E1/E3 = 1/1 | 0.3 | J2 |
| Example 66 | Photolithography | P-36 | A-DPH-12E | PGMEA/cyclohexanone = 50/50 (wt) | P4 | C-9 | — | — | — | — | J1 |
| Example 67 | Photolithography | P-37 | A-DPH-12E | PGMEA/cyclohexanone = 50/50 (wt) | P2 | C-9 | — | — | — | — | J1 |
| Example 68 | Photolithography | P-38 | KAYARAD RP-1040 | PGMEA/cyclohexanone = 50/50 (wt) | P2 | C-9 | — | — | — | — | J1 |
| Example 69 | Photolithography | P-38 | A-DPH-12E | PGMEA/cyclohexanone = 50/50 (wt) | P2/P3 = 50/50 (wt) | C-9 | — | — | — | — | J1 |
| Example 70 | Photolithography | P-39 | A-DPH-12E | PGMEA/cyclohexanone = 40/60 (wt) | P2 | C-9 | — | — | — | — | J1 |

TABLE 9-continued

| | Method for manufacturing color filter | Dye compound (A) | Curable compound (B) | Solvent (C) | Pigment dispersion | Photopolymerization initiator | Chain transfer agent (S) | Parts by mass | Epoxy compound (E) | Parts by mass | Alkali-soluble resin |
|---|---|---|---|---|---|---|---|---|---|---|---|
| Example 71 | Photolithography | P-31 | A-DPH-12E | PGMEA/cyclohexanone = 50/50 (wt) | P2 | C-9 | — | — | — | — | J1 |
| Example 72 | Photolithography | P-32 | A-DPH-12E | PGMEA/cyclohexanone = 50/50 (wt) | P2 | C-9 | — | — | — | — | J2 |
| Example 73 | Photolithography | P-31 | KAYARAD RP-1040 | PGMEA/cyclopentanone = 50/50 (wt) | P2 | C-9/C-5 = 50/50 (wt) | S-3 | 0.01 | — | — | J1 |
| Example 74 | Photolithography | P-32 | A-DPH-12E | PGMEA/cyclopentanone = 50/50 (wt) | P2 | C-9/C-5 = 50/50 ) (wt) | — | — | E2 | 0.3 | J1 |
| Example 75 | Photolithography | P-27 | A-DPH-12E | PGMEA/cyclohexanone = 50/50 (wt) | P2 | C-9 | — | — | E2/E4 = 1/1 | 0.3 | J1 |
| Example 76 | Photolithography | P-27 | A-DPH-12E | PGMEA/cyclopentanone = 50/50 (wt) | P2 | C-9 | S-1 | 0.01 | — | — | J2 |
| Example 77 | Photolithography | P-27 | A-DPH-12E | PGMEA/cyclohexanone = 50/50 (wt) | P2 | C-9/C-5 = 50/50 (wt) | S-1 | 0.01 | — | — | J1 |
| Example 78 | Photolithography | P-40 | KAYARAD RP-1040 | PGMEA/cyclohexanone = 50/50 (wt) | P2 | C-9 | — | — | — | — | J1 |
| Example 79 | Photolithography | P-41 | KAYARAD RP-1040 | PGMEA/cyclohexanone = 50/50 (wt) | P2 | C-9 | — | — | — | — | J1 |
| Example 80 | Photolithography | P-42 | KAYARAD RP-1040 | PGMEA/cyclohexanone = 50/50 (wt) | P2 | C-9 | — | — | — | — | J1 |
| Example 81 | Photolithography | P-29 | KAYARAD RP-1040 | PGMEA/cyclohexanone = 50/50 (wt) | P5 | C-9 | — | — | — | — | J1 |
| Example 82 | Photolithography | P-30 | KAYARAD RP-1040 | PGMEA/cyclohexanone = 50/50 (wt) | P5 | C-9 | — | — | — | — | J1 |
| Example 83 | Dry etching | A-40 | A-DPH-12E | PGMEA/cyclopentanone = 50/50 (wt) | P2 | C-9 | — | — | — | — | J1 |
| Example 84 | Dry etching | A-41 | Dipentaerythritol hexaacrylate | PGMEA/cyclohexanone = 50/50 (wt) | P2 | C-9 | — | — | — | — | J1 |
| Example 85 | Dry etching | A-42 | KAYARAD RP-1040 | PGMEA/cyclohexanone = 50/50 (wt) | P2 | C-9 | — | — | — | — | J1 |
| Example 86 | Dry etching | A-43 | KAYARAD RP-1040 | PGMEA/cyclohexanone = 50/50 (wt) | P2 | C-9 | — | — | — | — | J1 |
| Example 87 | Dry etching | P-40 | KAYARAD RP-1040 | PGMEA/cyclohexanone = 50/50 (wt) | P2 | C-9 | — | — | — | — | J1 |
| Example 88 | Dry etching | P-41 | KAYARAD RP-1040 | PGMEA/cyclohexanone = 50/50 (wt) | P2 | C-9 | — | — | — | — | J1 |
| Example 89 | Dry etching | P-42 | KAYARAD RP-1040 | PGMEA/cyclohexanone = 50/50 (wt) | P2 | C-9 | — | — | — | — | J1 |
| Example 90 | Dry etching | P-43 | Dipentaerythritol hexaacrylate | PGMEA/cyclohexanone = 50/50 (wt) | P2 | C-9 | — | — | — | — | J1 |
| Example 91 | Dry etching | P-44 | Dipentaerythritol hexaacrylate | PGMEA/cyclohexanone = 50/50 (wt) | P2 | C-9 | — | — | — | — | J1 |
| Example 92 | Dry etching | P-27 | A-DPH-12E | PGMEA/cyclohexanone = 50/50 (wt) | P2 | C-9 | — | — | — | — | J1 |
| Example 93 | Dry etching | P-31 | A-DPH-12E | PGMEA/cyclohexanone = 50/50 (wt) | P2 | C-9 | — | — | — | — | J1 |

TABLE 10

| | Heat resistance | Cyclohexanone solvent solubility | Color migration | Change in spectrum between before and after development |
|---|---|---|---|---|
| Example 55 | A | A | A | AA |
| Example 56 | A | A | A | AA |
| Example 57 | A | A | A | AA |
| Example 58 | A | A | A | AA |
| Example 59 | A | A | A | AA |
| Example 60 | A | A | A | AA |
| Example 61 | A | A | A | AA |
| Example 62 | A | A | A | AA |
| Example 63 | A | A | A | AA |
| Example 64 | A | A | A | AA |
| Example 65 | A | A | A | AA |
| Example 66 | A | A | A | AA |
| Example 67 | A | A | A | AA |
| Example 68 | A | A | A | AA |
| Example 69 | A | A | A | AA |
| Example 70 | A | A | A | AA |
| Example 71 | A | A | A | AA |
| Example 72 | A | A | A | AA |
| Example 73 | A | A | A | AA |
| Example 74 | A | A | A | AA |
| Example 75 | A | A | A | AA |
| Example 76 | A | A | A | AA |
| Example 77 | A | A | A | AA |
| Example 78 | A | A | A | AA |
| Example 79 | A | A | A | AA |
| Example 80 | A | A | A | AA |
| Example 81 | A | A | A | AA |
| Example 82 | A | A | A | AA |
| Example 83 | B | A | B | C |
| Example 84 | B | A | B | C |
| Example 85 | B | A | B | C |
| Example 86 | B | A | B | C |
| Example 87 | A | A | A | AA |
| Example 88 | A | A | A | AA |
| Example 89 | A | A | A | AA |
| Example 90 | A | A | A | AA |
| Example 91 | A | A | A | AA |
| Example 92 | A | A | A | AA |
| Example 93 | A | A | A | AA |

It could be seen that in the case where a color filter is manufactured using the compositions of Examples, the heat resistance is excellent. Further, it could also be seen that the compositions of Examples have excellent solvent resistance and color migration, and small change in spectrum between before and after development, whereas the compositions of Comparative Examples have deterioration in those properties.

What is claimed is:

1. A colored composition comprising:
   a dye compound having
      a dye structure having
      a cationic moiety, and
      an anionic moiety including at least one of a structure represented by the following General Formula (A1), a structure represented by the following General Formula (A2), and a structure containing a boron atom,
   in which the anionic moiety and the cationic moiety are bonded to each other via a covalent bond and present in the same molecule; and
   the anionic moiety has a structure in which at least anyone of a fluorine atom, an aliphatic hydrocarbon group containing a fluorine atom, and an aromatic hydrocarbon group containing a fluorine atom is directly bonded to at least one of $R^1$ to $R^5$ in the structure represented by the General Formula (A1) or the General Formula (A2) via a covalent bond;
   a curable compound; and
   a solvent;

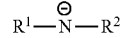
General Formula (A1)

in General Formula (A1), $R^1$ and $R^2$ each independently represent —$SO_2$— or —CO—;

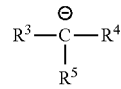
General Formula (A2)

in General Formula (A2), $R^3$ represents —$SO_2$— or —CO—; $R^4$ and $R^5$ each independently represent —$SO_2$—, —CO—, or —CN,
wherein the dye structure having a cationic moiety is a dye structure selected from the group consisting of a xanthene dye, a squarylium dye, and a dipyrromethene dye, and
in the case where the dye structure having a cationic moiety is the xanthene dye structure, the anionic moiety in the xanthene dye structure is represented by the General Formula (A1), and when the dye structure having a cationic moiety is the dipyrromethene dye, the anionic moiety in the dipyrromethene dye does not contain a boron atom.

2. The colored composition according to claim 1, wherein the dye structure having a cationic moiety is a xanthene structure.

3. The colored composition according to claim 1, wherein the anionic moiety has a structure represented by the following General Formula (A3-1) or (A3-2):

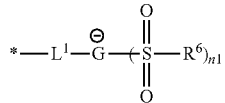
General Formula (A3-1)

in General Formula (A3-1), $L^1$ represents —$SO_2$— or —CO—; G represents a carbon atom or a nitrogen atom; n1 represents 2 in the case where G is a carbon atom and represents 1 in the case where G is a nitrogen atom; $R^6$ represents an alkyl group containing a fluorine atom or an aryl group containing a fluorine atom; in the case where n1 is 2, two $R^6$'s may be the same as or different from each other; and * represents a site bonding to another site;

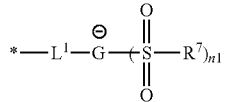
General Formula (A3-2)

in General Formula (A3-2), $L^1$ represents —$SO_2$— or —CO—; G represents a carbon atom or a nitrogen atom; n1 represents 2 in the case where G is a carbon atom and represents 1 in the case where G is a nitrogen atom; $R^7$ represents an alkylene group containing a fluorine atom or an arylene group containing a fluorine atom; * represents a site bonding to another site; and in the case where n1 is 2, two $R^7$'s may be the same as or different from each other, wherein, in the case where the dye structure having a cationic moiety has a xanthene dye structure, G represents a nitrogen atom.

4. The colored composition according to claim 3, wherein, in the General Formula (A3-1) or in the General Formula (A3-2), G represents a nitrogen atom and n1 represents 1.

5. The colored composition according to claim 1, wherein the dye compound is a dye multimer having two or more dye structures having a cationic moiety in the molecule.

6. The colored composition according to claim 5, wherein the dye compound is a polymer having a repeating unit represented by General Formula (A4-1) and/or General Formula (A4-3):

General Formula (A4-1)

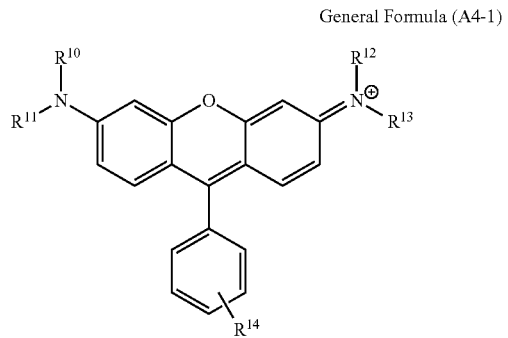

in General Formula (A4-1), one of $R^{10}$ to $R^{14}$ is a repeating unit represented by the following General Formula (A4-1-2), at least one of $R^{10}$ to $R^{14}$ is a group represented by the following General Formula (A4-1-1), and the remainders of $R^{10}$ to $R^{14}$ each independently represent a hydrogen atom, an aliphatic hydrocarbon group, or an aromatic hydrocarbon group;

General Formula (A4-1-1)

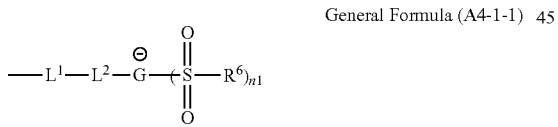

in General Formula (A4-1-1), $L^1$ represents a single bond or a divalent linking group; $L^2$ represents —$SO_2$— or —CO—; G represents a nitrogen atom; n1 represents 1; and $R^6$ represents an alkyl group containing a fluorine atom or an aryl group containing a fluorine atom;

General Formula (A4-1-2)

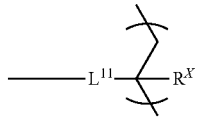

in General Formula (A4-1-2), $L^{11}$ represents a single bond or a divalent linking group; and $R^X$ represents a hydrogen atom, a methyl group, a hydroxymethyl group, or an alkoxymethyl group;

General Formula (A4-3)

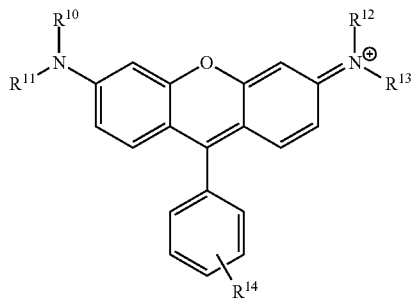

in General Formula (A4-3), four of $R^{10}$ to $R^{14}$ each independently represent a hydrogen atom, an aliphatic hydrocarbon group, or an aromatic hydrocarbon group, and one of $R^{10}$ to $R^{14}$ is a repeating unit represented by the following General Formula (A4-3-1);

General Formula (A4-3-1)

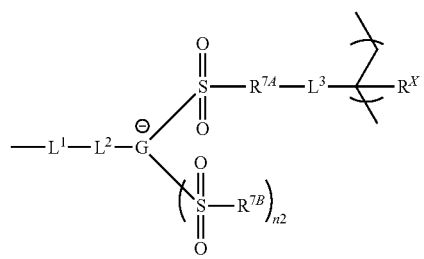

in General Formula (A4-3-1), $L^1$ represents a single bond or a divalent linking group; $L^2$ represents —$SO_2$— or —CO—; $L^3$ represents a divalent linking group; G represents a nitrogen atom; n2 represents 0; $R^{7A}$ and $R^{7B}$ each independently represent an alkylene group containing a fluorine atom or an arylene group containing a fluorine atom; and $R^x$ represents a hydrogen atom, a methyl group, a hydroxymethyl group, or an alkoxymethyl group.

7. The colored composition according to claim 6, wherein the dye compound is a polymer having the repeating unit represented by General Formula (A4-3).

8. The colored composition according to claim 1, wherein the dye compound has a polymerizable group.

9. The colored composition according to claim 1, wherein the dye compound has an alkali-soluble group.

10. The colored composition according to claim 1, further comprising a photopolymerization initiator.

11. The colored composition according to claim 1, further comprising a pigment having a phthalocyanine skeleton.

12. A cured film obtained by curing the colored composition according to claim 1.

13. A color filter comprising the cured film according to claim 12.

14. A solid-state imaging element comprising the color filter according to claim 13.

15. An image display device comprising the color filter according to claim 13.

16. A method for manufacturing a color filter, comprising: applying the colored composition according to claim 1 onto a support to form a colored composition layer; patternwise exposing the colored composition layer; and developing an unexposed area of the exposed colored composition layer.

17. A method for manufacturing a color filter, comprising:
applying the colored composition according to claim 1 onto a support to form a colored composition layer and curing the colored composition layer to form a colored layer;
forming a photoresist layer on the colored layer;
patterning the photoresist layer by exposure and development to obtain a resist pattern; and
dry-etching the colored layer using the resist pattern as an etching mask.

18. The colored composition according to claim 1, wherein the anionic moiety is the anionic moiety including the structure represented by the General Formula (A1) and at least any one of a fluorine atom, an aliphatic hydrocarbon group containing a fluorine atom, and an aromatic hydrocarbon group containing a fluorine atom is directly bonded to at least one of $R^1$ and $R^2$ in the structure represented by the General Formula (A1) via a covalent bond.

19. A colored composition comprising:
a dye compound having
a dye structure having a cationic moiety, and
an anionic moiety including at least one of a structure represented by the following General Formula (A1), a structure represented by the following General Formula (A2), and a structure containing a boron atom,
in which the anionic moiety and the cationic moiety are bonded to each other via a covalent bond and present in the same molecule; and
a curable compound; and
a solvent;

General Formula (A1)

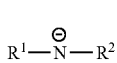

in General Formula (A1), $R^1$ and $R^2$ each independently represent —$SO_2$— or —CO—, General Formula (A2)

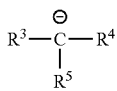

in General Formula (A2), $R^3$ represents —$SO_2$— or —CO—; $R^4$ and $R^5$ each independently represent —$SO_2$—, —CO—, or CN, wherein the dye compound is a polymer having a repeating unit represented by General Formula (A4-3):

General Formula (A4-3)

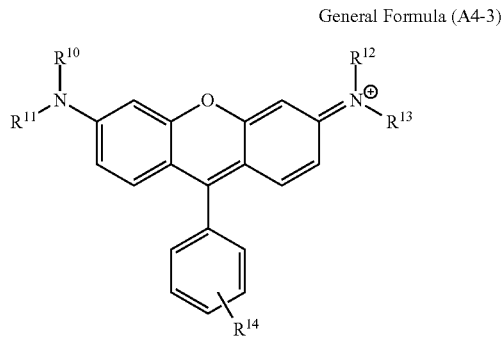

in General Formula (A4-3), four of $R^{10}$ to $R^{14}$ each independently represent a hydrogen atom, an aliphatic hydrocarbon group, or an aromatic hydrocarbon group, and one of $R^{10}$ to $R^{14}$ is a repeating unit represented by the following General Formula (A4-3-1);

General Formula (A4-3-1)

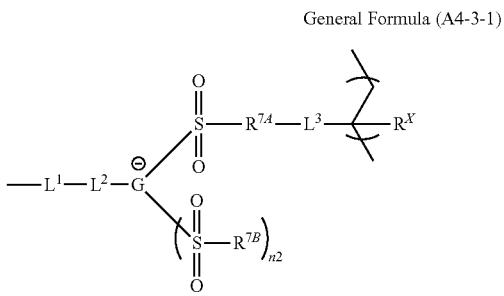

in General Formula (A4-3-1), $L^1$ represents a single bond or a divalent linking group; $L^2$ represents —$SO_2$— or —CO—; $L^3$ represents a divalent linking group; G represents a carbon atom or a nitrogen atom; in the case where G is a carbon atom, n2 represents 1, and in the case where G represents a nitrogen atom, n2 represents 0; $R^{7A}$ and $R^{7B}$ each independently represent an alkylene group containing a fluorine atom or an arylene group containing a fluorine atom; and
$R^X$ represents a hydrogen atom, a methyl group, a hydroxymethyl group, or an alkoxymethyl group.

* * * * *